US012721031B2

(12) United States Patent
Lee et al.

(10) Patent No.: US 12,721,031 B2
(45) **Date of Patent: *Aug. 25, 2026**

(54) ORGANIC ELECTROLUMINESCENCE DEVICE

(71) Applicant: Samsung Display Co., Ltd., Yongin-si (KR)

(72) Inventors: Yoonkyoo Lee, Seoul (KR); Heechoon Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 939 days.

This patent is subject to a terminal disclaimer.

(21) Appl. No.: 18/060,205

(22) Filed: Nov. 30, 2022

(65) Prior Publication Data

US 2023/0129565 A1 Apr. 27, 2023

Related U.S. Application Data

(63) Continuation-in-part of application No. 17/445,804, filed on Aug. 24, 2021, now Pat. No. 12,268,085.

(30) Foreign Application Priority Data

Oct. 7, 2020 (KR) ........................ 10-2020-0129664

(51) Int. Cl.

| | |
|---|---|
| ***H10K 85/30*** | (2023.01) |
| ***C07F 15/00*** | (2006.01) |
| ***H10K 50/11*** | (2023.01) |

(52) U.S. Cl.

CPC ....... *H10K 85/346* (2023.02); *C07F 15/0086* (2013.01); *H10K 50/11* (2023.02)

(58) Field of Classification Search

CPC .................................................... H01K 85/346

See application file for complete search history.

(56) References Cited

U.S. PATENT DOCUMENTS

| | | | |
|---|---|---|---|
| 8,652,656 | B2 | 2/2014 | Zeng et al. |
| 9,947,880 | B2 | 4/2018 | Xia et al. |
| 11,552,261 | B2 | 1/2023 | Chen et al. |

(Continued)

FOREIGN PATENT DOCUMENTS

| | | | |
|---|---|---|---|
| DE | 102012220691 | B4 | 10/2019 |
| KR | 10-2016-0034528 | A | 3/2016 |

(Continued)

OTHER PUBLICATIONS

US Notice of Allowance dated Nov. 6, 2024, issued in U.S. Appl. No. 17/445,804 (10 pages).

*Primary Examiner* — Chanceity N Robinson

(74) *Attorney, Agent, or Firm* — Womble Bond Dickinson (US) LLP

(57) ABSTRACT

An organic electroluminescence device of an embodiment includes a first electrode, a hole transport region on the first electrode, an emission layer on the hole transport region, an electron transport region on the emission layer, and a second electrode on the electron transport region, wherein the emission layer includes a first host compound represented by Formula 1, a second host compound represented by Formula 2, and a dopant compound comprising an organometallic complex including Pt, Au, or Cu as a central metal element, and may show improved life characteristics.

14 Claims, 9 Drawing Sheets

(56) References Cited

U.S. PATENT DOCUMENTS

| | | | |
|---|---|---|---|
| 2012/0223634 | A1 | 9/2012 | Xia |
| 2016/0087227 | A1 | 3/2016 | Kim et al. |
| 2017/0309831 | A1 | 10/2017 | Kim et al. |
| 2018/0331305 | A1 | 11/2018 | Kim et al. |
| 2020/0168812 | A1 | 5/2020 | Wolohan et al. |
| 2020/0168819 | A1 | 5/2020 | Ahn et al. |
| 2020/0251670 | A1* | 8/2020 | Thompson ............. H10K 50/12 |
| 2021/0376262 | A1 | 12/2021 | Ahn et al. |

FOREIGN PATENT DOCUMENTS

| | | | |
|---|---|---|---|
| KR | 10-1872349 | B1 | 6/2018 |
| KR | 10-2018-0124195 | A | 11/2018 |
| KR | 10-2019-0000812 | A | 1/2019 |
| KR | 10-2020-0003255 | A | 1/2020 |
| KR | 10-2072210 | B1 | 1/2020 |
| KR | 10-2090896 | B1 | 3/2020 |
| KR | 10-2020-0064932 | A | 6/2020 |
| KR | 10-2020-0066228 | A | 6/2020 |

* cited by examiner

DD-C
BL
CF3
BFL2
CFL
BMP
BFL1
CCL
TFE
DP-ED
OH
PDL
DP-CL
BS
DP
NPXA
PXA-B
NPXA
PXA-G
NPXA
PXA-R
NPXA
CF1
CF2
SP BR3
CCP3
BR2
SP
QD2
CCP2
EL2
CGL1 OL-C1
CGL2 OL-B1
CGL3 OL-B2
EL1 OL-B3
ED-CT
BR1
QD1
SP
CCP1
I
I'
DR1
DR3

ORGANIC ELECTROLUMINESCENCE DEVICE

CROSS-REFERENCE TO RELATED APPLICATION

This application is a continuation-in-part of U.S. application Ser. No. 17/445,804, filed Aug. 24, 2021, which claims priority to and the benefit of Korean Patent Application No. 10-2020-0129664, filed on Oct. 7, 2020, the entire contents of both of which are hereby incorporated by reference.

BACKGROUND

1. Field

Embodiments of the present disclosure herein relate to an organic electroluminescence device, and for example, to an organic electroluminescence device including multiple light-emitting materials in an emission layer.

2. Description of Related Art

Recently, the development of an organic electroluminescence display as an image display is being actively conducted. The organic electroluminescence display is different from a liquid crystal display and is so-called a self-luminescent display in which holes and electrons injected from a first electrode and a second electrode recombine in an emission layer so that a light-emitting material including an organic compound in the emission layer emits light to achieve display.

In the application of an organic electroluminescence device to a display, the increase of the emission efficiency and the life of the organic electroluminescence device are required, and development of materials for an organic electroluminescence device stably achieving the requirements is being continuously conducted.

SUMMARY

Embodiments of the present disclosure provide an organic electroluminescence device showing good emission efficiency and excellent device life.

An embodiment of the present disclosure provides an organic electroluminescence including a first electrode, a hole transport region on the first electrode, an emission layer on the hole transport region, an electron transport region on the emission layer, and a second electrode on the electron transport region, wherein the emission layer includes a first host compound represented by Formula 1 below, a second host compound represented by Formula 2 below, and an organometallic complex including Pt, Au, or Cu as a central metal element.

Formula 1

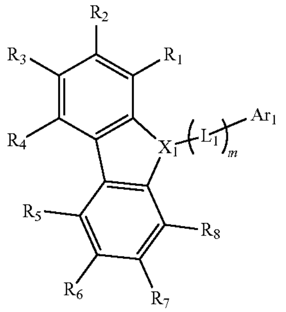

In Formula 1, $X_1$ is N or $CR_9$, $R_1$ to $R_9$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $L_1$ is a substituted or unsubstituted arylene group of 6 to 30 ring-forming carbon atoms, or a substituted or unsubstituted heteroarylene group of 2 to 30 ring-forming carbon atoms, or combined with an adjacent group to form a ring, $Ar_1$ is a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and m is 1 or 2, where at least one selected from among $R_1$ to $R_8$ and $Ar_1$ is a substituted or unsubstituted silyl group, or an aryl group of 6 to 30 ring-forming carbon atoms, which is substituted with a substituted or unsubstituted silyl group.

Formula 2

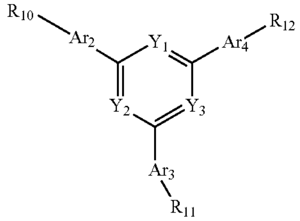

In Formula 2, $Y_1$ to $Y_3$ are each independently N or $CR_{13}$, where at least one selected from among $Y_1$ to $Y_3$ is N, $Ar_2$ to $Ar_4$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_{10}$ to $R_{12}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $R_{13}$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, where at least one selected from among $R_{10}$ to $R_{12}$ includes a substituted or unsubstituted silyl group.

In an embodiment, the dopant compound may be represented by Formula 3 below.

Formula 3

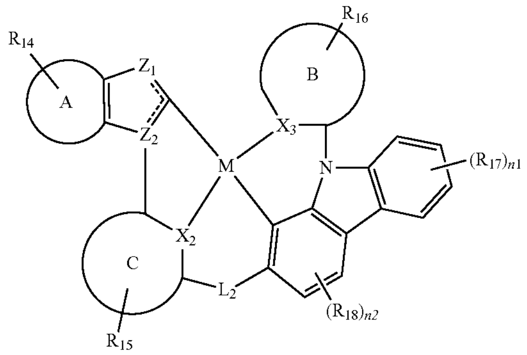

In Formula 3, M is Pt, Au, or Cu, $Z_1$ is $NR_{19}$ or $CR_{20}R_{21}$, $X_2$, $X_3$, and $Z_2$ are each independently N or C, $L_2$ is O or S, $R_{14}$ to $R_{18}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, $R_{19}$ to $R_{21}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, ring A to ring C are each independently a substituted or unsubstituted monocyclic or polycyclic hydrocarbon ring group of 6 to 30 ring-forming carbon atoms, or a substituted or unsubstituted monocyclic or polycyclic heterocyclic group of 2 to 30 ring-forming carbon atoms, n1 is an integer of 0 to 4, and n2 is an integer of 0 to 2.

In an embodiment, Formula 1 may be represented by any one selected from among Formula 4-1 to Formula 4-3 below.

Formula 4-1

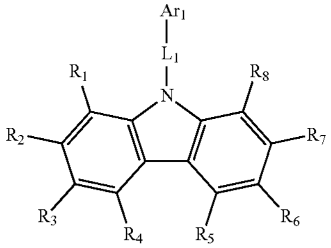

-continued

Formula 4-2

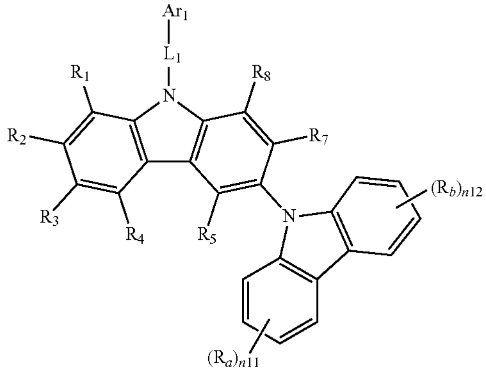

Formula 4-3

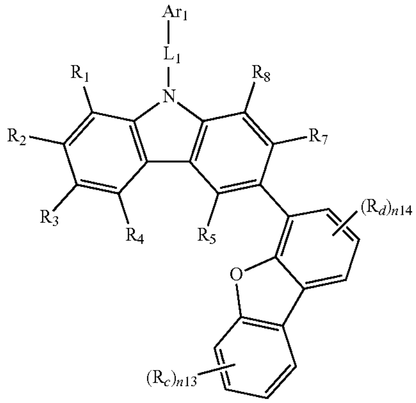

In Formula 4-1 to Formula 4-3, $R_a$ to $R_d$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n11 to n13 are each independently an integer of 0 to 4, n14 is an integer of 0 to 3, and $R_1$ to $R_8$, $L_1$, and $Ar_1$ are the same as defined with respect to Formula 1.

In an embodiment, $L_1$ of Formula 1 may be represented by Formula 5-1 or Formula 5-2 below.

Formula 5-1

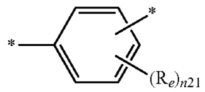

Formula 5-2

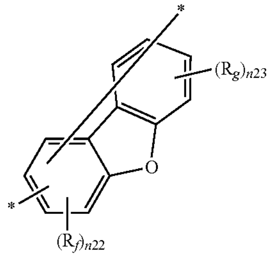

In Formula 5-1 and Formula 5-2, $R_e$ to $R_g$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n21 and n23 are each independently an integer of 0 to 4, and n22 is an integer of 0 to 3, where a sum of n22 and n23 is 6 or less.

In an embodiment, $Ar_2$ to $Ar_4$ of Formula 2 may be each independently a direct linkage or represented by Formula 6-1 or Formula 6-2 below.

Formula 6-1

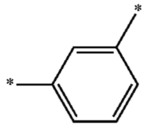

Formula 6-2

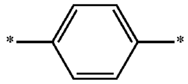

In an embodiment, Formula 2 may be represented by any one selected from among Formula 7-1 to Formula 7-4 below.

Formula 7-1

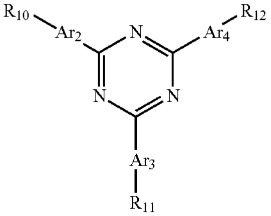

Formula 7-2

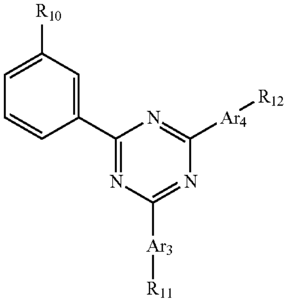

Formula 7-3

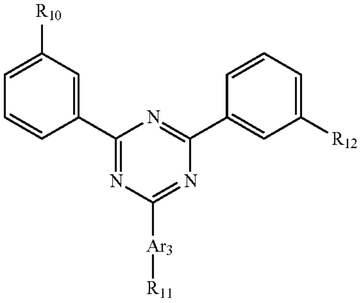

-continued

Formula 7-4

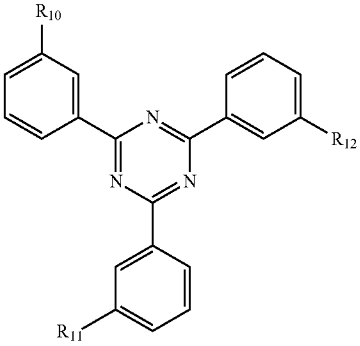

In Formula 7-1 to Formula 7-4, $Ar_2$ to $Ar_4$, and $R_{10}$ to $R_{12}$ are the same as defined with respect to Formula 2.

In an embodiment, Formula 3 may be represented by Formula 8 below.

Formula 8

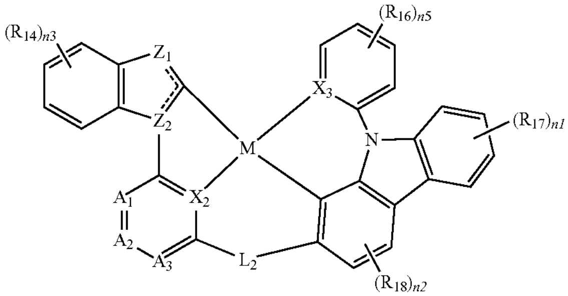

In Formula 8, $A_1$ to $A_3$ are each independently N, B, or $CR_{22}$, $R_{22}$ is a hydrogen atom, a deuterium atom, a halogen atom, a substituted or unsubstituted silyl group, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, n3 and n5 are each independently an integer of 0 to 4, and M, $L_2$, $X_2$, $X_3$, $Z_1$, $Z_2$, $R_{14}$, $R_{16}$ to $R_{18}$, n1, and n2 are the same as defined with respect to Formula 3.

In an embodiment, Formula 3 may be represented by Formula 9 below.

Formula 9

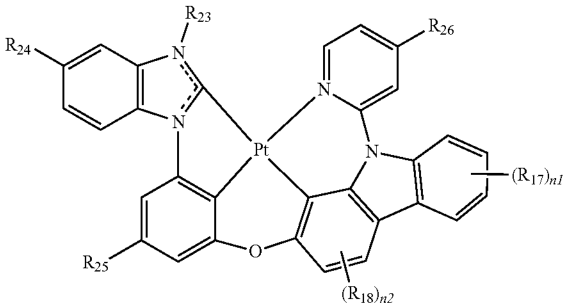

In Formula 9, $R_{23}$ is a hydrogen atom, a deuterium atom, a halogen atom, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, $R_{24}$ to $R_{26}$ are each independently a hydrogen atom, a deuterium atom, a substituted or unsubstituted silyl group, or a substituted or unsubstituted alkyl group of 1 to 30 carbon atoms, and $R_{17}$, $R_{18}$, n1 and n2 are the same as defined with respect to Formula 3.

In an embodiment, the emission layer may be a phosphorescence emission layer emitting blue light.

In an embodiment, a weight ratio of the first host compound and the second host compound may be from about 3:7 to about 7:3.

In an embodiment of the present disclosure, there is provided an organic electroluminescence device including a first electrode, a hole transport region on the first electrode, an emission layer on the hole transport region, an electron transport region on the emission layer, and a second electrode on the electron transport region, wherein the emission layer includes a first host compound represented by Formula 1 below, a second host compound including a silyl group as a substituent and a heteroaryl group containing N, and a dopant compound represented by Formula 3 below.

Formula 1

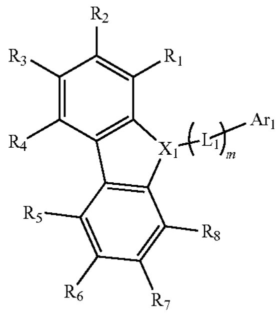

In Formula 1, $X_1$ is N or $CR_9$, $R_1$ to $R_9$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $L_1$ is a substituted or unsubstituted arylene group of 6 to 30 ring-forming carbon atoms, or a substituted or unsubstituted heteroarylene group of 2 to 30 ring-forming carbon atoms, or combined with an adjacent group to form a ring, $Ar_1$ is a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and m is 1 or 2, where at least one selected from among $R_1$ to $R_8$ and $Ar_1$ is a substituted or unsubstituted silyl group, or an aryl group of 6 to 30 ring-forming carbon atoms, which is substituted with a substituted or unsubstituted silyl group.

Formula 3

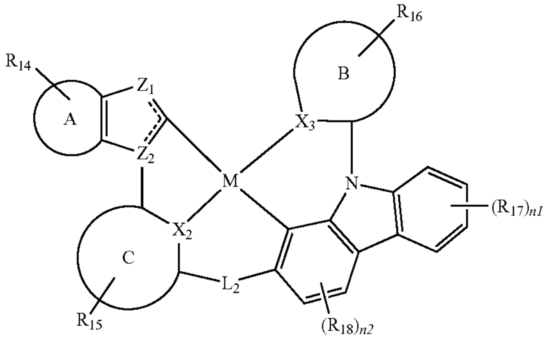

In Formula 3, M is Pt, Au, or Cu, $Z_1$ is $NR_{19}$ or $CR_{20}R_{21}$, $X_2$, $X_3$, and $Z_2$ are each independently N or C, $L_2$ is O or S, $R_{14}$ to $R_{18}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, $R_{19}$ to $R_{21}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, ring A to ring C are each independently a substituted or unsubstituted monocyclic or polycyclic hydrocarbon ring group of 6 to 30 ring-forming carbon atoms, or a substituted or unsubstituted monocyclic or polycyclic heterocyclic group of 2 to 30 ring-forming carbon atoms, n1 is an integer of 0 to 4, and n2 is an integer of 0 to 2.

In an embodiment, the second host compound may be represented by Formula 2 below.

Formula 2

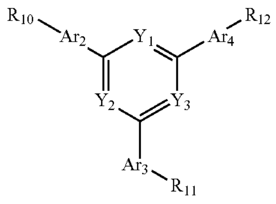

In Formula 2, $Y_1$ to $Y_3$ are each independently N or $CR_{13}$, where at least one selected from among $Y_1$ to $Y_3$ is N, $Ar_2$ to $Ar_4$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_{10}$ to $R_{12}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $R_{13}$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, where at least one selected from among $R_{10}$ to $R_{12}$ includes a substituted or unsubstituted silyl group.

In an embodiment, Formula 1 may be represented by any one selected from among Formula 4-1 to Formula 4-3 below.

Formula 4-1

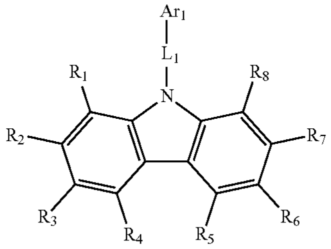

Formula 4-2

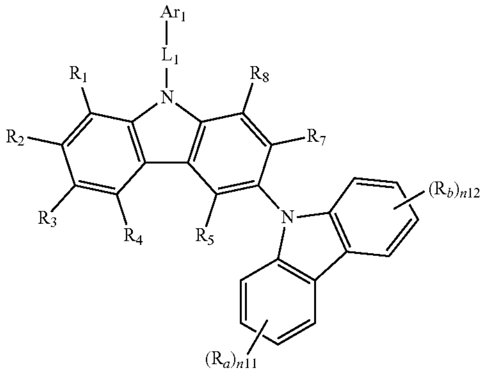

Formula 4-3

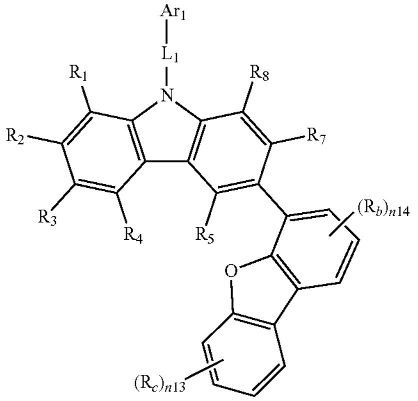

In Formula 4-1 to Formula 4-3, $R_a$ to $R_d$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n11 to n13 are each independently an integer of 0 to 4, n14 is an integer of 0 to 3, and $R_1$ to $R_8$, $L_1$, and $Ar_1$ are the same as defined with respect to Formula 1.

In an embodiment, $L_1$ of Formula 1 may be represented by Formula 5-1 or Formula 5-2 below.

Formula 5-1

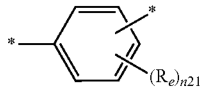

Formula 5-2

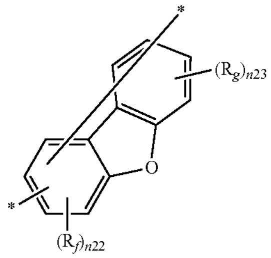

In Formula 5-1 and Formula 5-2, $R_e$ to $R_g$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n21 and n23 are each independently an integer of 0 to 4, and n22 is an integer of 0 to 3, where a sum of n22 and n23 is 6 or less.

In an embodiment, Formula 3 may be represented by Formula 8 below.

Formula 8

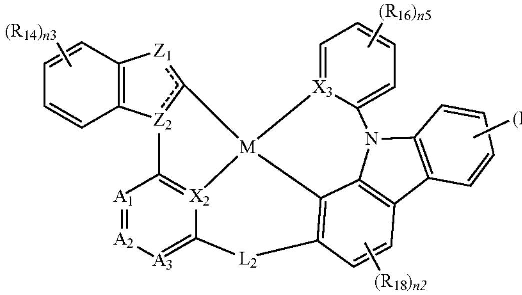

In Formula 8, $A_1$ to $A_3$ are each independently N, B, or $CR_{22}$, $R_{22}$ is a hydrogen atom, a deuterium atom, a halogen atom, a substituted or unsubstituted silyl group, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, n3 and n5 are each independently an integer of 0 to 4, and M, $L_2$, $X_2$, $X_3$, $Z_1$, $Z_2$, $R_{14}$, $R_{16}$ to $R_{18}$, n1, and n2 are the same as defined with respect to Formula 3.

In an embodiment, Formula 3 may be represented by Formula 9 below.

Formula 9

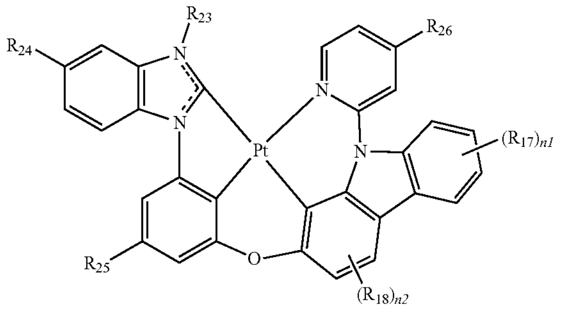

In Formula 9, $R_{23}$ is a hydrogen atom, a deuterium atom, a halogen atom, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, $R_{24}$ to $R_{26}$ are each independently a hydrogen atom, a deuterium atom, a substituted or unsubstituted silyl group, or a substituted or unsubstituted alkyl group of 1 to 30 carbon atoms, $R_{17}$, $R_{18}$, n1 and n2 are the same as defined with respect to Formula 3.

In an embodiment, Formula 2 may be represented by any one selected from among Formula 7-1 to Formula 7-4 below.

Formula 7-1

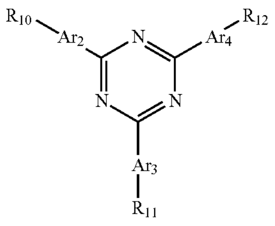

Formula 7-2

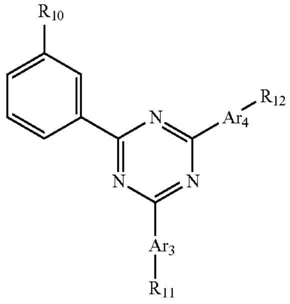

Formula 7-3

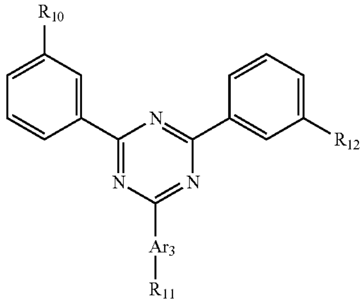

-continued

Formula 7-4

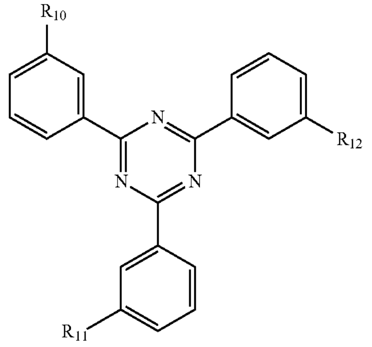

In Formula 7-1 to Formula 7-4, $Ar_2$ to $Ar_4$, and $R_{10}$ to $R_{12}$ are the same as defined with respect to Formula 2.

In an embodiment, the first host compound represented by Formula 1 may be any one selected from among the compounds represented in Compound Group 1.

In an embodiment, the second host compound represented by Formula 2 may be any one selected from among the compounds represented in Compound Group 2.

In an embodiment, the dopant compound represented by Formula 3 may be any one selected from among the compounds represented in Compound Group 3.

BRIEF DESCRIPTION OF THE FIGURES

The accompanying drawings are included to provide a further understanding of the subject matter of the present disclosure and are incorporated in and constitute a part of this specification. The drawings illustrate example embodiments of the present disclosure and, together with the description, serve to explain principles of subject matter of the present disclosure. In the drawings.

DETAILED DESCRIPTION

Figure 1:
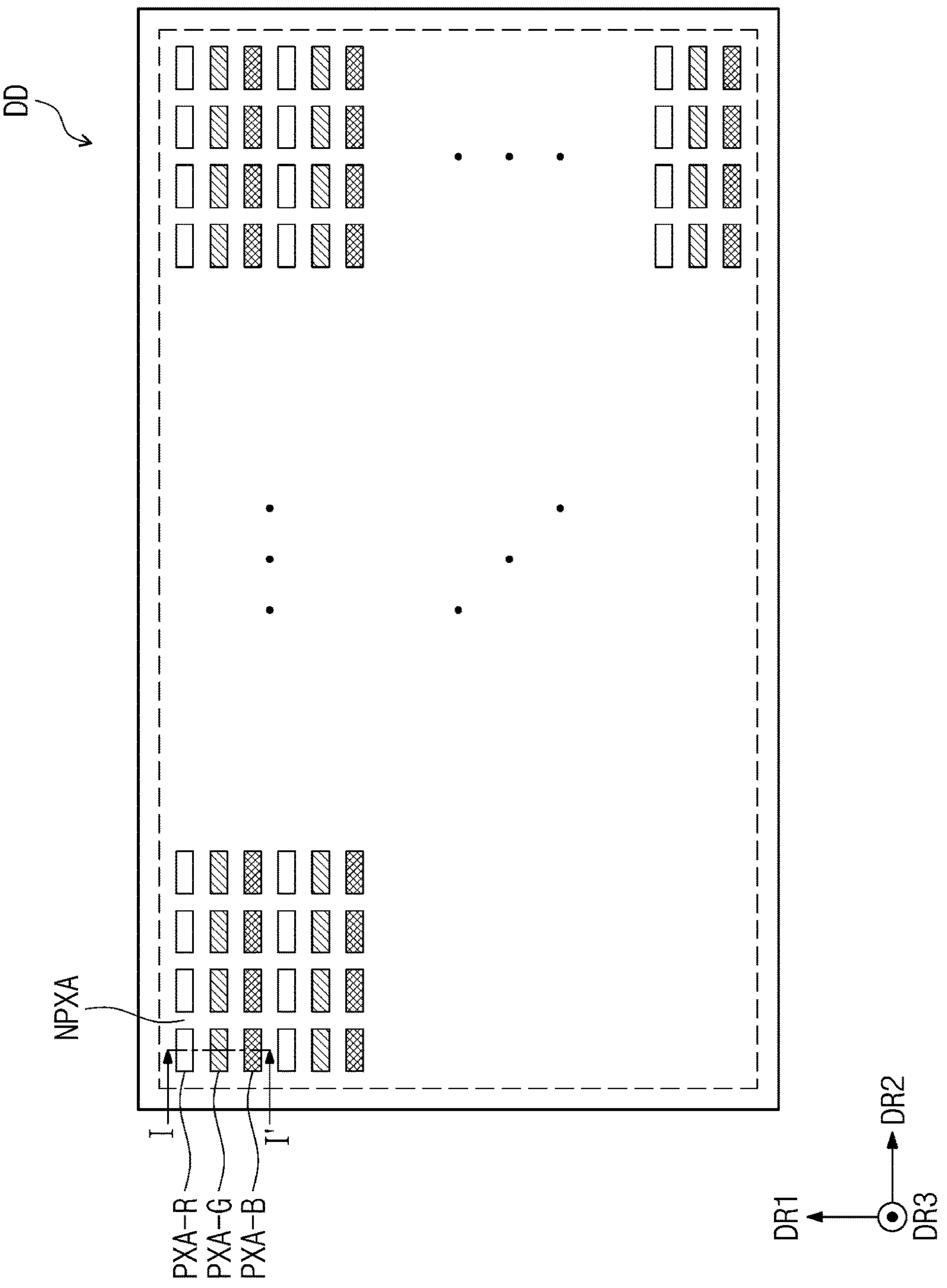
FIG. 1 is a plan view showing a display apparatus according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

In the present description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the present description, when a layer, a film, a region, a plate, etc. is referred to as being "on" or "above" another part, it can be "directly on" the other part, or intervening layers may also be present. Similarly, when a layer, a film, a region, a plate, etc. is referred to as being "under" or "below" another part, it can be "directly under" the other part, or intervening layers may also be present. Also, when an element is referred to as being "on" another element, it can be under the other element.

Hereinafter, embodiments of the present disclosure will be explained with reference to the attached drawings.

Figure 2:
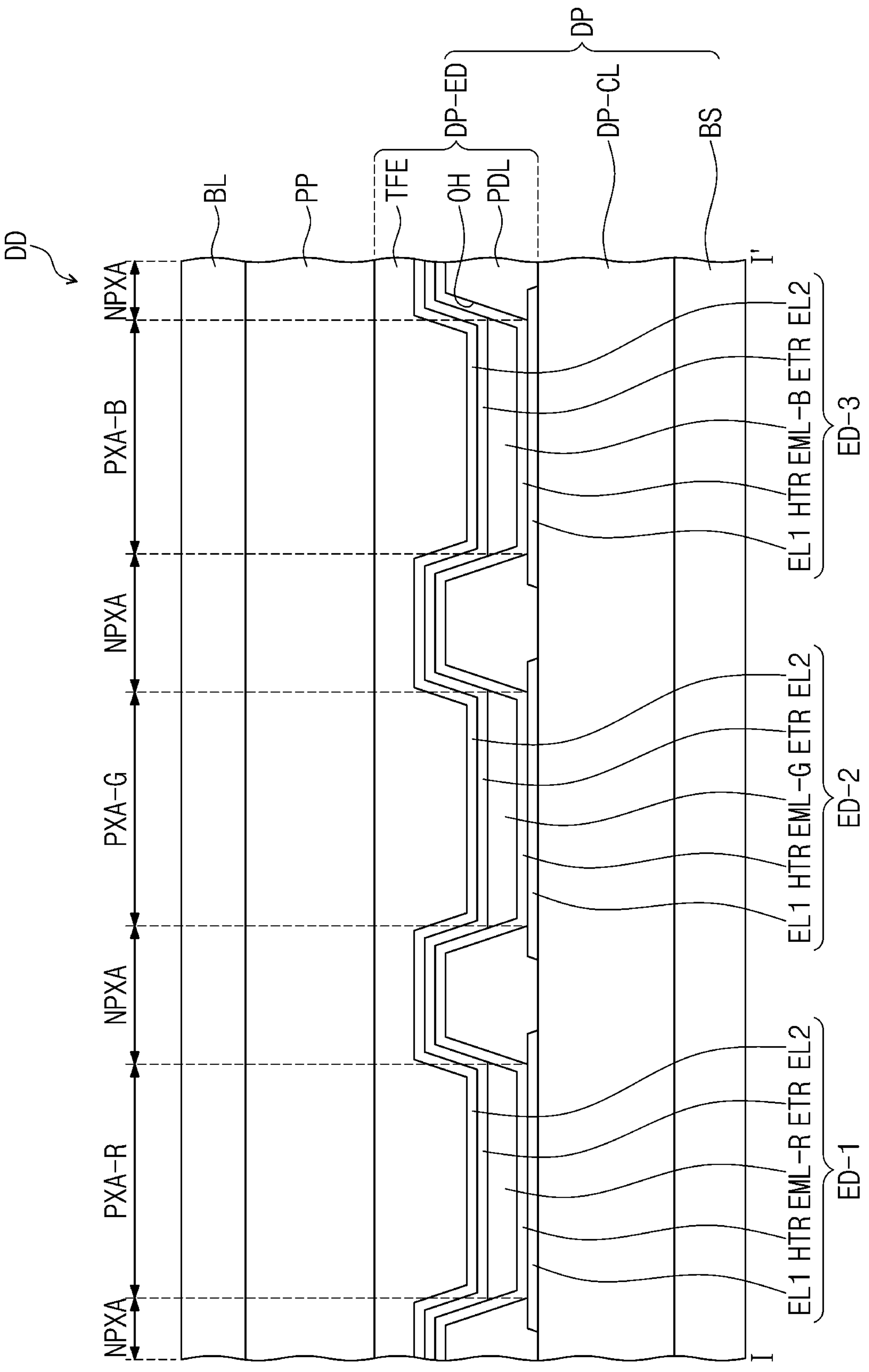
FIG. 2 is a cross-sectional view showing a display apparatus according to an embodiment of the present disclosure.

FIG. 1 is a plan view showing an embodiment of a display apparatus DD. FIG. 2 is a cross-sectional view showing a display apparatus DD of an embodiment. FIG. 2 is a cross-sectional view showing a part corresponding to line I-I' in FIG. 1.

A display apparatus DD may include a display panel DP and an optical layer PP on the display panel DP. The display panel DP may include organic electroluminescence devices ED-1, ED-2 and ED-3. The display apparatus DD may include multiple organic electroluminescence devices ED-1, ED-2 and ED-3. The optical layer PP may be on the display panel DP and control reflected light by external light at the display panel DP. The optical layer PP may include, for example, a polarization layer or a color filter layer. In one or more embodiments, the optical layer PP may be omitted in the display apparatus DD of an embodiment.

A base substrate BL may be on the optical layer PP. The base substrate BL may be a member providing a base surface for disposing the optical layer PP. The base substrate BL may be a glass substrate, a metal substrate, a plastic substrate, etc. However, an embodiment of the present disclosure is not limited thereto. The base substrate BL may be an inorganic layer, an organic layer, or a composite material layer including an inorganic material and an organic material. In addition, different from the drawings, the base substrate BL may be omitted in an embodiment.

The display apparatus DD according to an embodiment may further include a filling layer. The filling layer may be between a display device layer DP-ED and a base substrate BL. The filling layer may be an organic layer. The filling layer may include at least one selected from among an acrylic resin, a silicon-based resin and an epoxy-based resin.

The display panel DP may include a base layer BS, a circuit layer DP-CL and a display device layer DP-ED provided on the base layer BS. The display device layer DP-ED may include a pixel definition layer PDL, organic electroluminescence devices ED-1, ED-2 and ED-3 between the pixel definition layers PDL, and an encapsulating layer TFE on the organic electroluminescence devices ED-1, ED-2 and ED-3.

The base layer BS may be a member providing a base surface where the display device layer DP-ED is located. The base layer BS may be a glass substrate, a metal substrate, a plastic substrate, etc. However, an embodiment of the present disclosure is not limited thereto, and the base layer BS may be an inorganic layer, an organic layer or a composite material layer.

In an embodiment, the circuit layer DP-CL is on the base layer BS, and the circuit layer DP-CL may include multiple transistors. Each of the transistors may include a control electrode, an input electrode, and an output electrode. For example, the circuit layer DP-CL may include switching transistors and driving transistors for driving the organic electroluminescence devices ED-1, ED-2 and ED-3 of the display device layer DP-ED.

Each of the organic electroluminescence devices ED-1, ED-2 and ED-3 may have the structure of an organic electroluminescence device ED of an embodiment according to FIG. 3 to FIG. 6, which will be explained later. Each of the organic electroluminescence devices ED-1, ED-2 and ED-3 may include a first electrode EL1, a hole transport region HTR, emission layers EML-R, EML-G and EML-B, an electron transport region ETR, and a second electrode EL2.

In FIG. 2, shown is an embodiment where the emission layers EML-R, EML-G and EML-B of the organic electroluminescence devices ED-1, ED-2 and ED-3, which are in opening parts OH defined in the pixel definition layer PDL, are located, and the hole transport region HTR, the electron transport region ETR and the second electrode EL2 are provided as common layers in all organic electroluminescence devices ED-1, ED-2 and ED-3. However, an embodiment of the present disclosure is not limited thereto. Different from FIG. 2, in an embodiment, the hole transport region HTR and the electron transport region ETR may be patterned and provided in the opening parts OH defined in the pixel definition layer PDL. For example, in an embodiment, the hole transport region HTR, the emission layers EML-R, EML-G and EML-B, and the electron transport region ETR of the organic electroluminescence devices ED-1, ED-2 and ED-3 may be patterned by an ink jet printing method and provided.

The encapsulating layer TFE may cover the organic electroluminescence devices ED-1, ED-2 and ED-3. The encapsulating layer TFE may encapsulate the display device layer DP-ED. The encapsulating layer TFE may be a thin film encapsulating layer. The encapsulating layer TFE may be one layer or formed by laminating a plurality of layers.

The encapsulating layer TFE may include at least one insulating layer. The encapsulating layer TFE according to an embodiment may include at least one inorganic layer (hereinafter, encapsulating inorganic layer). In addition, the encapsulating layer TFE according to an embodiment may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be on the second electrode EL2 and may be included while charging an opening part OH.

Referring to FIG. 1 and FIG. 2, the display apparatus DD may include a non-luminous area NPXA and luminous areas PXA-R, PXA-G and PXA-B. The luminous areas PXA-R, PXA-G and PXA-B may be areas emitting light produced from the organic electroluminescence devices ED-1, ED-2 and ED-3, respectively. The luminous areas PXA-R, PXA-G and PXA-B may be separated from each other on a plane.

The luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In one or more embodiments, each of the luminous areas PXA-R, PXA-G and PXA-B may correspond to each pixel. The pixel definition layer PDL may divide the organic electroluminescence devices ED-1, ED-2 and ED-3. The emission layers EML-R, EML-G and EML-B of the organic electroluminescence devices ED-1, ED-2 and ED-3 may be included and divided in the opening parts OH defined in the pixel definition layer PDL.

The luminous areas PXA-R, PXA-G and PXA-B may be divided into numbers of groups according to the color of light produced from the organic electroluminescence devices ED-1, ED-2 and ED-3. In the display apparatus DD of an embodiment, shown in FIG. 1 and FIG. 2, three luminous areas PXA-R, PXA-G and PXA-B emitting red light, green light and blue light are illustrated as an embodiment.

For example, the display apparatus DD of an embodiment may include a red luminous area PXA-R, a green luminous area PXA-G and a blue luminous area PXA-B, which are separated from each other.

In the display apparatus DD according to an embodiment, multiple organic electroluminescence devices ED-1, ED-2 and ED-3 may emit light having different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. In one or more embodiments, each of the red luminous area PXA-R, the green luminous area PXA-G, and the blue luminous area PXA-B of the display apparatus DD may correspond to the first organic electroluminescence device ED-1, the second organic electroluminescence device ED-2, and the third organic electroluminescence device ED-3.

However, an embodiment of the present disclosure is not limited thereto, and the first to third organic electroluminescence devices ED-1, ED-2 and ED-3 may emit light in the same wavelength region, or at least one thereof may emit light in a different wavelength region. For example, all the first to third organic electroluminescence devices ED-1, ED-2 and ED-3 may emit blue light.

The luminous areas PXA-R, PXA-G and PXA-B in the display apparatus DD according to an embodiment may be arranged in a stripe shape. Referring to FIG. 1, multiple red luminous areas PXA-R, multiple green luminous areas PXA-G and multiple blue luminous areas PXA-B may be arranged along a second directional axis DR2. In addition, the red luminous area PXA-R, the green luminous area PXA-G and the blue luminous area PXA-B may be arranged by turns along a first directional axis DR1.

In FIG. 1 and FIG. 2, the areas of the luminous areas PXA-R, PXA-G and PXA-B are shown similar, but an embodiment of the present disclosure is not limited thereto. The areas of the luminous areas PXA-R, PXA-G and PXA-B may be different from each other according to the wavelength region of light emitted. In one or more embodiments, the areas of the luminous areas PXA-R, PXA-G and PXA-B may mean areas on a plane defined by the first directional axis DR1 and the second directional axis DR2.

In one or more embodiments, the arrangement type of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various combinations according to the properties of display quality required for the display apparatus DD. For example, the arrangement type of the luminous areas PXA-R, PXA-G and PXA-B may be a PENTILE® arrangement structure (e.g., an RGBG matrix, RGBG structure, or RGBG matrix structure), or a diamond arrangement type. PENTILE® is a duly registered trademark of Samsung Display Co., Ltd.

In addition, the areas of the luminous areas PXA-R, PXA-G and PXA-B may be different from each other. For example, in an embodiment, the area of the green luminous area PXA-G may be smaller than the area of the blue luminous area PXA-B, but an embodiment of the present disclosure is not limited thereto.

Hereinafter, FIG. 3 to FIG. 6 are cross-sectional views schematically showing organic electroluminescence devices according to example embodiments. The organic electroluminescence device ED according to an embodiment may include a first electrode EL1, a hole transport region HTR, an emission layer EML, an electron transport region ETR, and a second electrode EL2, stacked in order.

Figure 3:
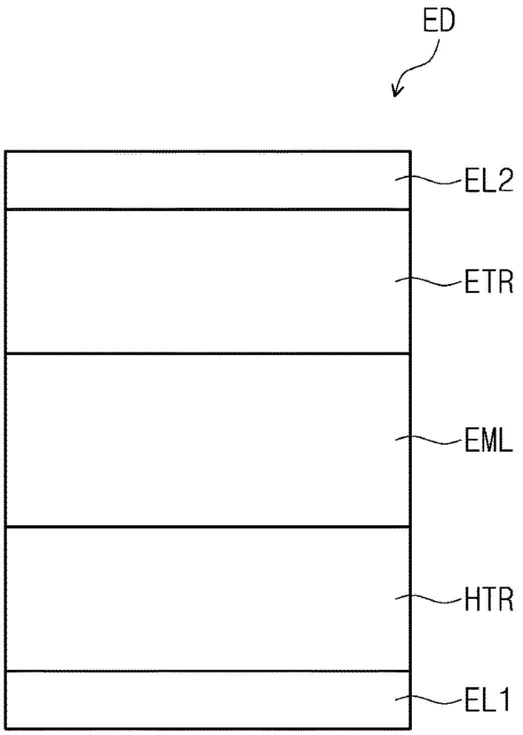
FIG. 3 is a cross-sectional view schematically showing an organic electroluminescence device according to an embodiment of the present disclosure.
Figure 4:
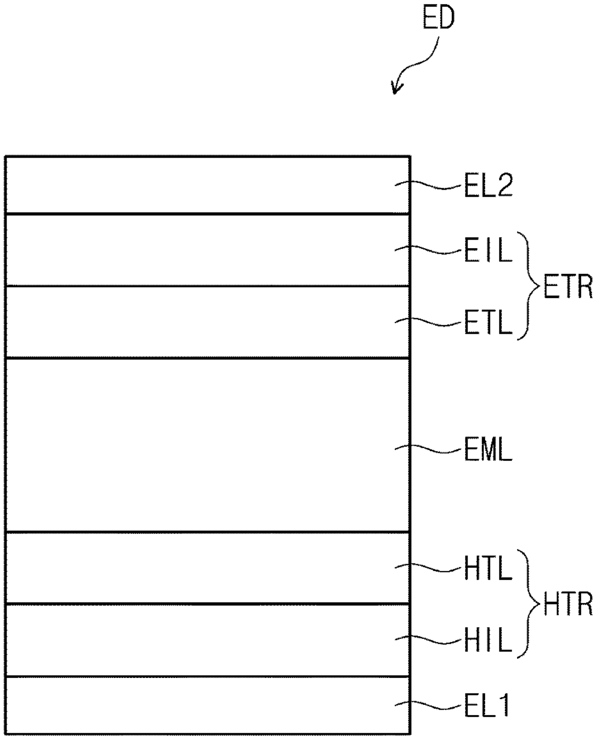
FIG. 4 is a cross-sectional view schematically showing an organic electroluminescence device according to an embodiment of the present disclosure.
Figure 5:
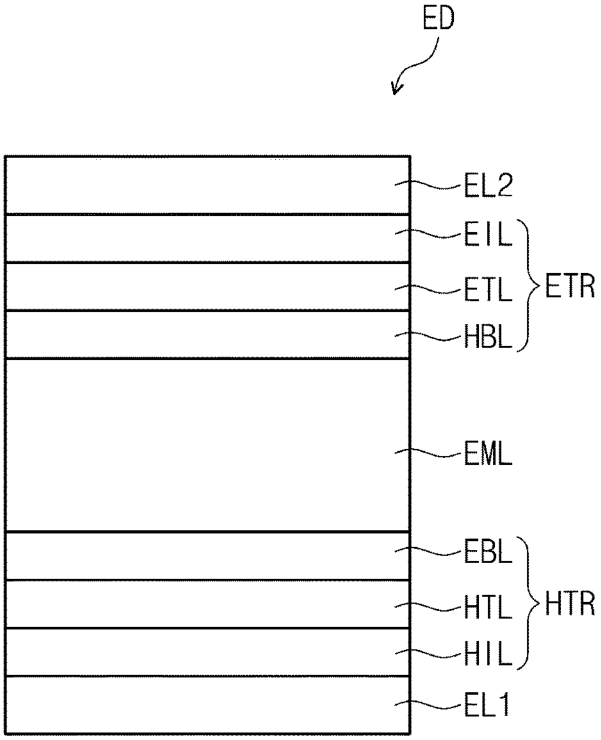
FIG. 5 is a cross-sectional view schematically showing an organic electroluminescence device according to an embodiment of the present disclosure.
Figure 6:
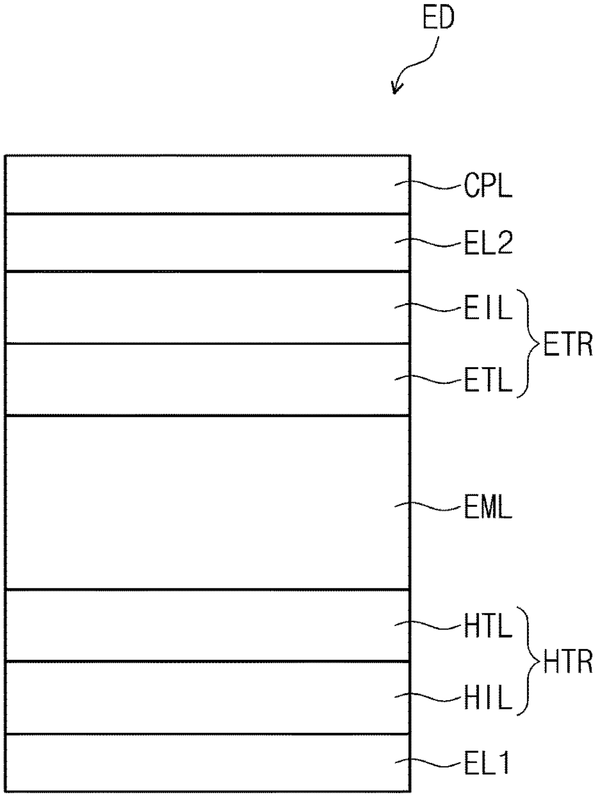
FIG. 6 is a cross-sectional view schematically showing an organic electroluminescence device according to an embodiment of the present disclosure.

When compared with FIG. 3, FIG. 4 shows the cross-sectional view of an organic electroluminescence device ED of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 3, FIG. 5 shows the cross-sectional view of an organic electroluminescence device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the cross-sectional view of an organic electroluminescence device ED of an embodiment, including a capping layer CPL on the second electrode EL2.

The first electrode EL1 has conductivity (e.g., electrical conductivity). The first electrode EL1 may be formed using a metal material, a metal alloy, and/or a conductive compound. The first electrode EL1 may be an anode or a cathode. However, an embodiment of the present disclosure is not limited thereto. In addition, the first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). Also, the first electrode EL1 may have a structure including multiple layers including a reflective layer or a transflective layer formed using the above materials, and a transmissive conductive layer formed using ITO, IZO, ZnO, and/or ITZO. For example, the first electrode EL1 may include a three-layer structure of ITO/Ag/ITO. However, an embodiment of the present disclosure is not limited thereto. In addition, the first electrode EL1 may include the aforementioned metal materials, combinations of two or more metal materials selected from the aforementioned metal materials, and/or oxides of the aforementioned metal materials, without limitation. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission auxiliary layer and/or an electron blocking layer EBL. The thickness of the hole transport region HTR may be from about 50 Å to about 15,000 Å.

The hole transport region HTR may have a single layer formed using a single material, a single layer formed using multiple different materials, or a multilayer structure including multiple layers formed using multiple different materials.

For example, the hole transport region HTR may have the structure of a single layer of a hole injection layer HIL or a hole transport layer HTL, and may have a structure of a single layer formed using a hole injection material and a hole transport material. In one or more embodiments, the hole transport region HTR may have a structure of a single layer formed using multiple different materials, or a structure stacked from the first electrode EL1 of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below.

Formula H-1

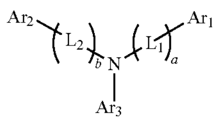

In Formula H-1, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms. a and b may be each independently an integer of 0 to 10. Meanwhile, if a or b is an integer of 2 or more, multiple $L_1$ and $L_2$ may be each independently a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ are each independently a substituted or unsubstituted aryl group of 6 to 30 ring-forming carbon atoms, or a substituted or unsubstituted heteroaryl group of 2 to 30 ring-forming carbon atoms. In addition, in Formula H-1, $Ar_3$ may be a substituted or unsubstituted aryl group of 6 to 30 ring-forming carbon atoms.

The compound represented by Formula H-1 may be a monoamine compound. Otherwise, the compound represented by Formula H-1 may be a diamine compound in which at least one selected from among $Ar_1$ to $Ar_3$ includes an amine group as a substituent. Further, the compound represented by Formula H-1 may be a carbazole-based compound in which a substituted or unsubstituted carbazole group is included in at least one selected from among $Ar_1$ and $Ar_2$, or a fluorene-based compound in which a substituted or unsubstituted fluorene group is included in at least one selected from among $Ar_1$ and $Ar_2$.

The compound represented by Formula H-1 may be represented by any one selected from among the compounds represented in Compound Group H below. However, the compounds illustrated in Compound Group H are embodiments, and the compound represented by Formula H-1 is not limited to those represented in Compound Group H below.

Compound Group H

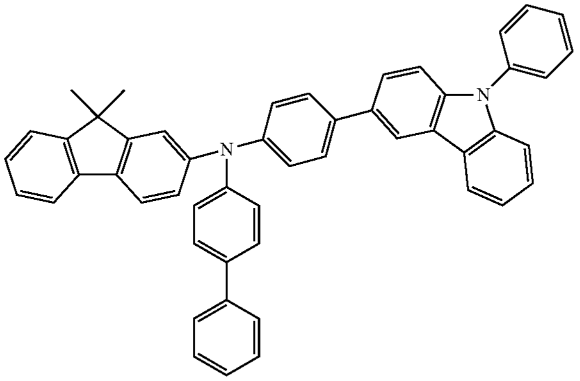

-continued
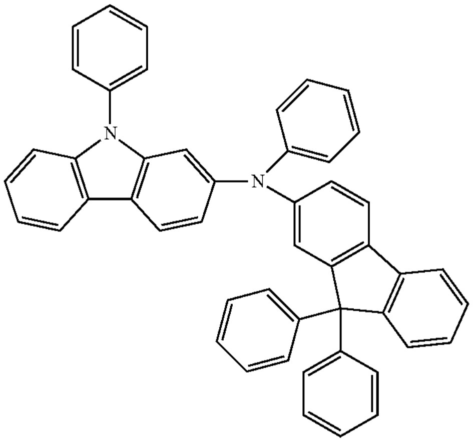
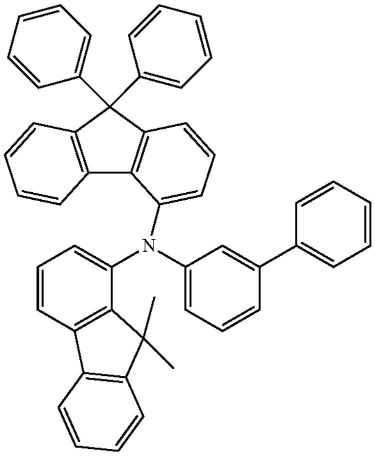
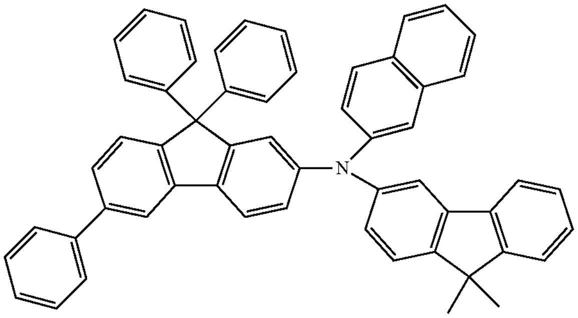
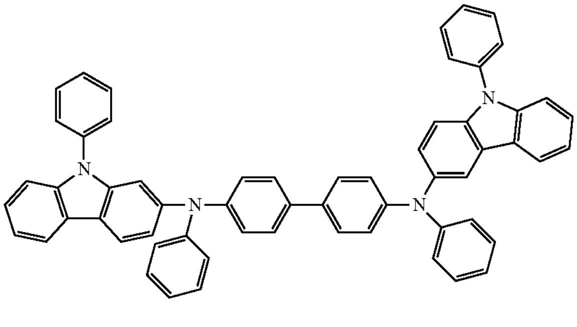
-continued
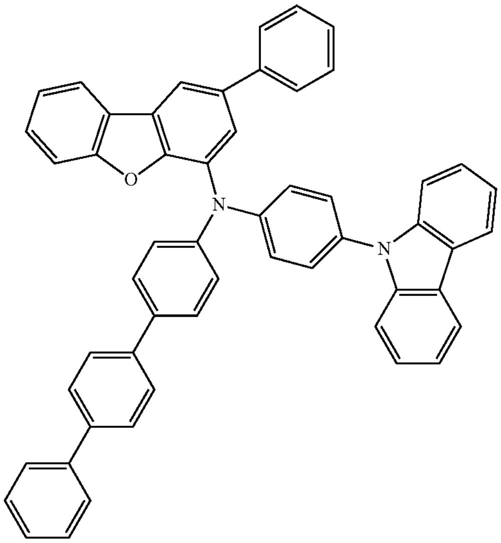
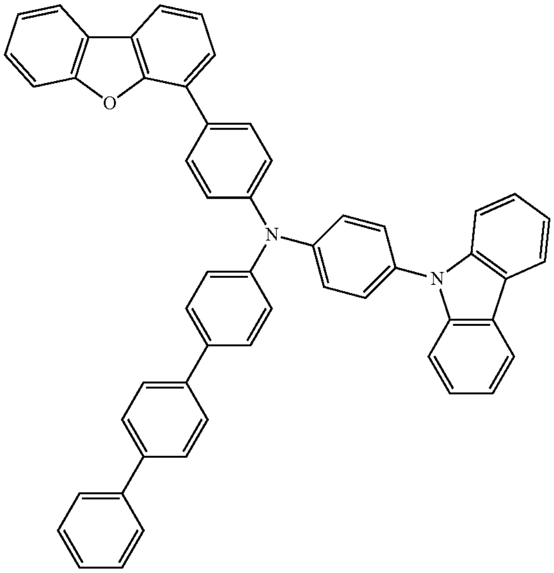
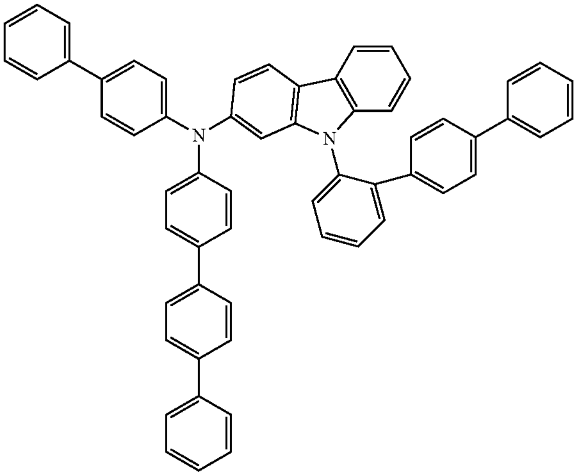

-continued
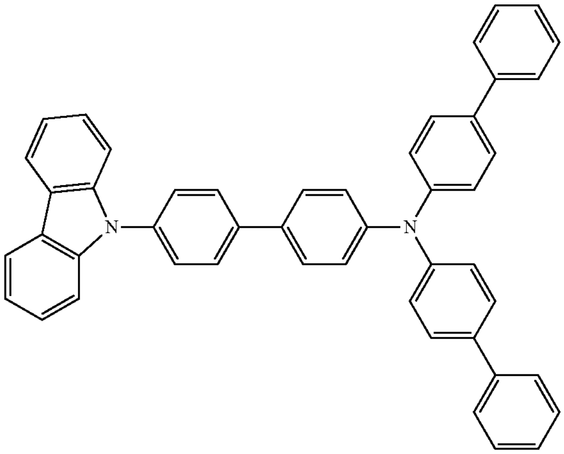
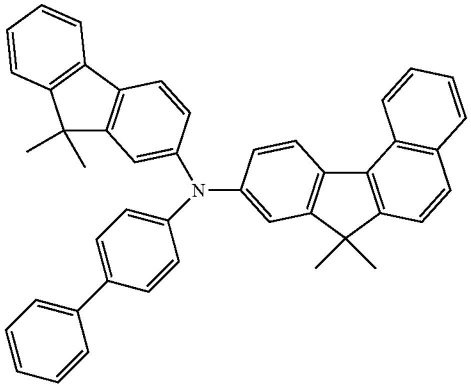
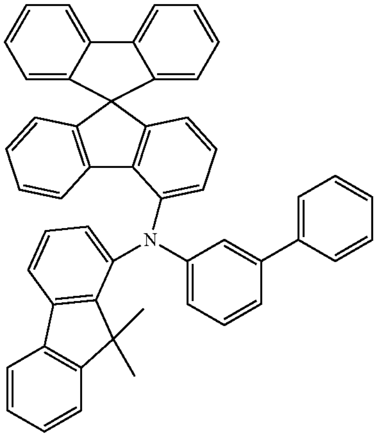
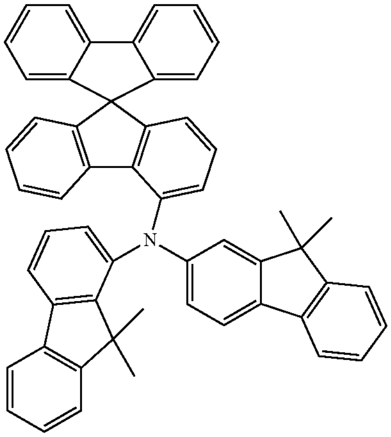
-continued
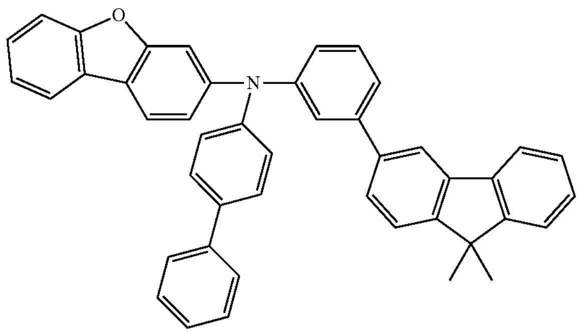
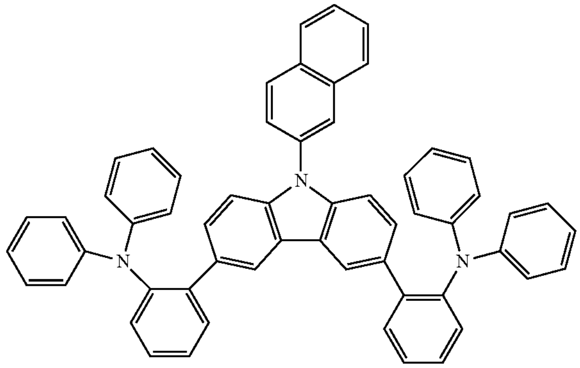
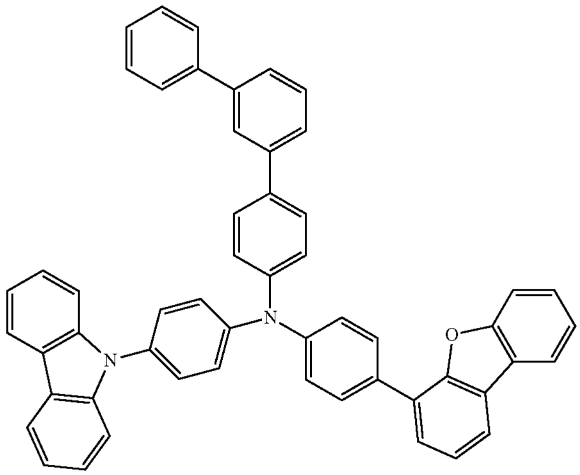

-continued

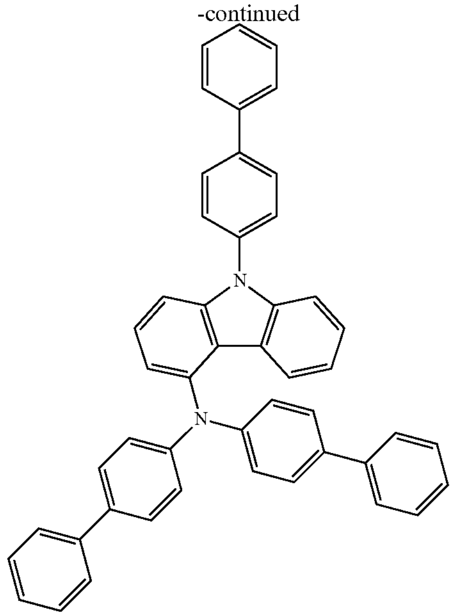

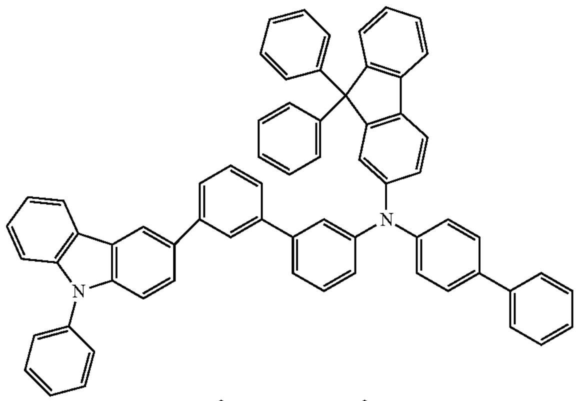

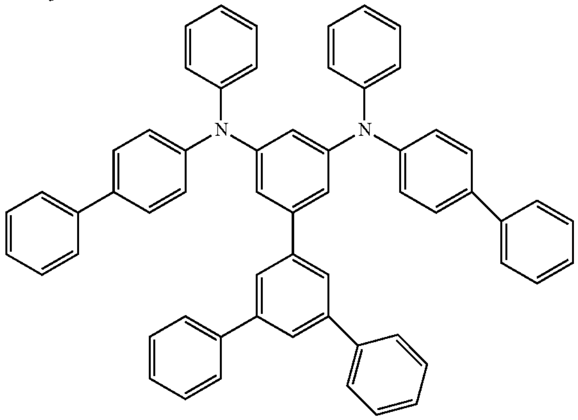

The hole transport region HTR may further include, for example, a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl) borate], and/or dipyrazino[2,3-f:2',3'-h] quinoxaline-2,3,6,7,10,11-hexacarbonitrile (HAT-CN).

The hole transport region HTR may further include carbazole derivatives such as N-phenyl carbazole and/or polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may include carbazole derivatives such as N-phenyl carbazole and/or polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, and/or an electron blocking layer EBL.

The thickness of the hole transport region HTR may be from about 100 Å to about 10,000 Å, for example, from about 100 Å to about 5,000 Å. In case where the hole transport region HTR includes a hole injection layer HIL, the thickness of the hole injection region HIL may be, for example, from about 30 Å to about 1,000 Å. In case where the hole transport region HTR includes a hole transport layer HTL, the thickness of the hole transport layer HTL may be from about 30 Å to about 1,000 Å. For example, in an embodiment where the hole transport region HTR includes an electron blocking layer EBL, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without substantial increase of a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may include at least one selected from among halogenated metal compounds, quinone derivatives, metal oxides, and cyano group-containing compounds, without limitation. For example, the p-dopant may include halogenated metal compounds such as CuI and/or RbI, quinone derivatives such as tetracyanoquinodimethane (TCNQ) and/or 2,3,5,6-tetrafluoro-7,7',8,8-tetracyanoquinodimethane (F4-TCNQ), metal oxides such as tungsten oxide, and/or molybdenum oxide, etc., without limitation.

As described above, the hole transport region HTR may further include at least one of a buffer layer or an electron blocking layer EBL in addition to the hole injection layer HIL and the hole transport layer HTL. The buffer layer may compensate an optical resonance distance according to the wavelength of light emitted from an emission layer EML and may increase light emission efficiency. Materials which may be included in a hole transport region HTR may be used as materials included in a buffer layer. The electron blocking layer EBL is a layer playing the role of preventing or reducing the injection of electrons from the electron transport region ETR to the hole transport region HTR.

The emission layer EML is provided on the hole transport region HTR. For example, the emission layer EML may have a thickness of about 100 Å to about 1,000 Å, or about 100 Å to about 300 Å. The emission layer EML may have a single layer formed using a single material, a single layer formed using multiple different materials, or a multilayer structure having multiple layers formed using multiple different materials.

The emission layer EML of the organic electroluminescence device ED of an embodiment includes different types or kinds of multiple emission materials according to an embodiment of the present disclosure. The organic electroluminescence device ED of an embodiment includes a first host compound and a second host compound, which are different from each other, and a dopant compound.

Meanwhile, in the present description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the disclosed substituents may be substituted or unsubstituted. For example, a biphenyl group may be interpreted as an aryl group or a phenyl group substituted with a phenyl group.

In the present description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles and/or polycycles. In addition, the ring formed via the combination with an adjacent group may be combined with another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the present description, the halogen atom may be a fluorine atom, a chlorine atom, a bromine atom, or an iodine atom.

In the present description, the alkyl may be a linear, branched or cyclic type (e.g., may be a linear alkyl group, a branched alkyl group, or a cyclic alkyl group). The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the term "hydrocarbon ring group" means an optional functional group or substituent derived from an aliphatic hydrocarbon ring. The hydrocarbon ring group may be a saturated hydrocarbon ring group of 5 to 20 ring-forming carbon atoms.

In the present description, the term "aryl group" means an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, the heterocyclic group means an optional functional group or substituent derived from a ring including one or more among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may be a monocycle or a polycycle.

In the present description, the heterocyclic group may include one or more selected from among B, O, N, P, Si and S as heteroatoms. If the heterocyclic group includes two or more heteroatoms, two or more heteroatoms may be the same or different. The heterocyclic group may be a monocyclic heterocyclic group or a polycyclic heterocyclic group, and has the concept including a heteroaryl group. The carbon number for forming rings of the heteroaryl group may be 2 to 30, 2 to 20, 2 to 12, or 2 to 10.

In the present description, the aliphatic heterocyclic group may include one or more selected from among B, O, N, P, Si and S as heteroatoms. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the present description, the heteroaryl group may include one or more selected from among B, O, N, P, Si and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the present description, the explanation on the aryl group may be applied to the arylene group except that the arylene group is a divalent group. The explanation on the heteroaryl group may be applied to the heteroarylene group except that the heteroarylene group is a divalent group.

In the present description, the silyl group includes an alkyl silyl group and an aryl silyl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the present description, the direct linkage may mean a single bond (e.g., a single covalent bond).

In the description, ——* mean a position to be connected to another atom.

The emission layer EML of the organic electroluminescence device ED of an embodiment may include a first host compound and a second host compound, which are different from each other, and a dopant compound including an organometallic complex including Pt (platinum), Au, or Cu (copper) as a central metal atom.

The first host compound according to an embodiment of the present disclosure is represented by Formula 1 below.

Formula 1

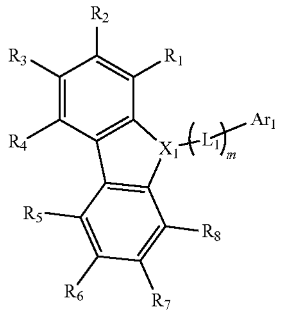

In Formula 1, $X_1$ is N or $CR_9$, $R_1$ to $R_9$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 1, $L_1$ is a substituted or unsubstituted arylene group of 6 to 30 ring-forming carbon atoms, or a substituted or unsubstituted heteroarylene group of 2 to 30 ring-forming carbon atoms, or combined with an adjacent group to form a ring.

In Formula 1, $Ar_1$ is a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. However, at least one selected from among $R_1$ to $R_8$ and $Ar_1$ includes a substituted or unsubstituted silyl group, or a substituted or unsubstituted aryl group of 6 to 30 ring-forming carbon atoms, which is substituted with a substituted or unsubstituted silyl group.

In Formula 1, m is 1 or 2. In one or more embodiments, if m is 2, multiple $L_1$ groups are the same or different.

In an embodiment, at least one selected from among $R_1$ to $R_8$ and $Ar_1$ may include a substituted or unsubstituted silyl group.

In an embodiment, the second host compound is represented by Formula 2 below.

Formula 2

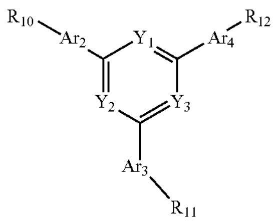

In Formula 2, $Y_1$ to $Y_3$ are each independently N or $CR_{13}$, where at least one selected from among $Y_1$ to $Y_3$ is N.

In Formula 2, $Ar_2$ to $Ar_4$ are each independently a direct linkage, a substituted or unsubstituted arylene group of 6 to 30 ring-forming carbon atoms, or a substituted or unsubstituted heteroarylene group of 2 to 30 ring-forming carbon atoms.

In Formula 2, $R_{10}$ to $R_{12}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. However, at least one selected from among $R_{10}$ to $R_{12}$ includes a substituted or unsubstituted silyl group.

In Formula 2, $R_{13}$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In an embodiment, at least one selected from among $R_{10}$ to $R_{12}$ of Formula 2 may include a substituted or unsubstituted silyl group.

In an embodiment, all $Y_1$ to $Y_3$ of Formula 2 may be represented by N. For example, the second host compound represented by Formula 2 may include a triazine moiety.

In an embodiment, the dopant compound is represented by Formula 3 below.

Formula 3

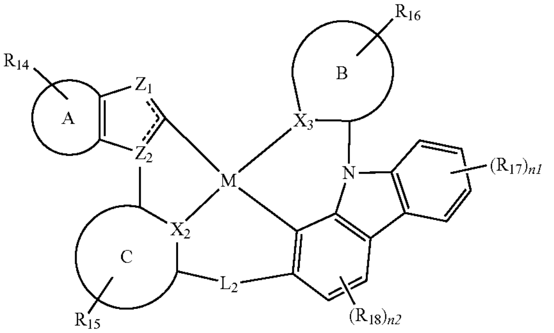

In Formula 3, M is Pt, Au, or Cu, $Z_1$ is $NR_{19}$ or $CR_2OR_{21}$, $X_2$, $X_3$, and $Z_2$ are each independently N or C, and $L_2$ is O or S.

In Formula 3, $R_{14}$ to $R_{18}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and, optionally, may be combined with an adjacent group to form a ring.

In Formula 3, $R_{19}$ to $R_{21}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 3, ring A to ring C are each independently a substituted or unsubstituted monocyclic or polycyclic hydrocarbon ring group of 6 to 30 ring-forming carbon atoms, or a substituted or unsubstituted monocyclic or polycyclic heterocyclic group of 2 to 30 ring-forming carbon atoms.

In Formula 3, n1 is an integer of 0 to 4. In one or more embodiments, if n1 is 2 or more, multiple $R_{17}$ groups are the same or different.

In Formula 3, n2 is an integer of 0 to 2. In one or more embodiments, if n2 is 2, multiple $R_{18}$ groups are the same or different.

In an embodiment, one selected from among $R_{14}$ to $R_{18}$ of Formula 3 may include a substituted or unsubstituted silyl group.

In an embodiment, Formula 1 may be represented by any one selected from among Formula 4-1 to Formula 4-3 below.

Formula 4-1

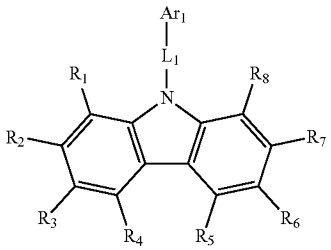

-continued

Formula 4-2

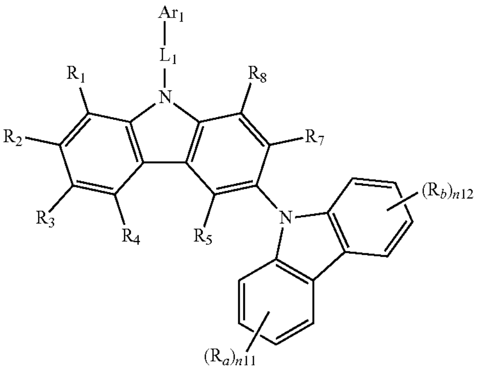

Formula 4-3

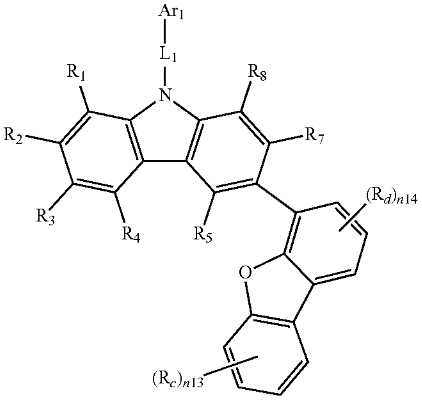

In Formula 4-1 to Formula 4-3, $R_a$ to $R_d$ may be each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 4-2, n11 is an integer of 0 to 4. In one or more embodiments, if n11 is 2 or more, multiple $R_a$ groups are the same or different.

In Formula 4-2, n12 is an integer of 0 to 4. In one or more embodiments, if n12 is 2 or more, multiple $R_b$ groups are the same or different.

In Formula 4-3, n13 is an integer of 0 to 4. In one or more embodiments, if n13 is 2 or more, multiple $R_c$ groups are the same or different.

In Formula 4-3, n14 is an integer of 0 to 3. In one or more embodiments, if n13 is 2 or more, multiple $R_d$ groups are the same or different.

In Formula 4-1 to Formula 4-3, $R_1$ to $R_8$, $L_1$, and $Ar_1$ are the same as defined with respect to Formula 1.

In an embodiment, $L_1$ of Formula 1 may be represented by Formula 5-1 or Formula 5-2 below.

Formula 5-1

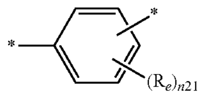

-continued

Formula 5-2

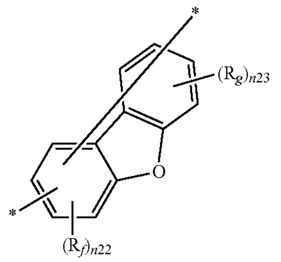

In Formula 5-1 and Formula 5-2, $R_e$ to $R_g$ may be each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 5-1, n21 is an integer of 0 to 4. In one or more embodiments, if n21 is 2 or more, multiple $R_e$ groups are the same or different.

In Formula 5-2, n22 is an integer of 0 to 3. In one or more embodiments, if n22 is 2 or more, multiple $R_f$ groups are the same or different.

In Formula 5-2, n23 is an integer of 0 to 4. In one or more embodiments, if n23 is 2 or more, multiple $R_g$ groups are the same or different.

Here, the sum of n22 and n23 is 6 or less.

In an embodiment, $Ar_2$ to $Ar_4$ of Formula 2 may be each independently a direct linkage or represented by Formula 6-1 or Formula 6-2 below.

Formula 6-1

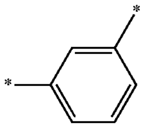

Formula 6-2

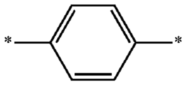

In an embodiment, Formula 2 may be represented by any one selected from among Formula 7-1 to Formula 7-4 below.

Formula 7-1

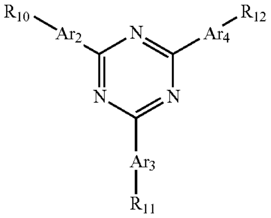

-continued

Formula 7-2

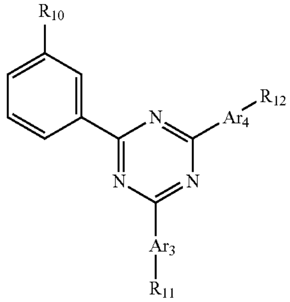

Formula 7-3

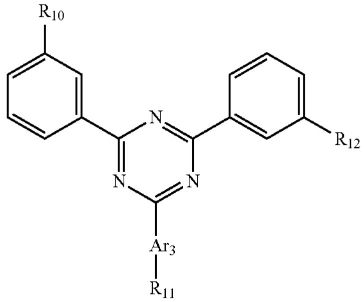

Formula 7-4

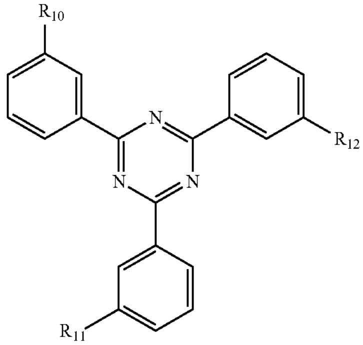

In Formula 7-1 to Formula 7-4, $Ar_2$ to $Ar_4$, and $R_{10}$ to $R_{12}$ are the same as defined with respect to Formula 2.

In an embodiment, in any one formula selected from among Formula 2 and Formula 71- to Formula 7-3, at least one selected from among $Ar_2$ to $Ar_4$ may be a direct linkage.

In an embodiment, Formula 3 may be represented by Formula 8 below.

Formula 8

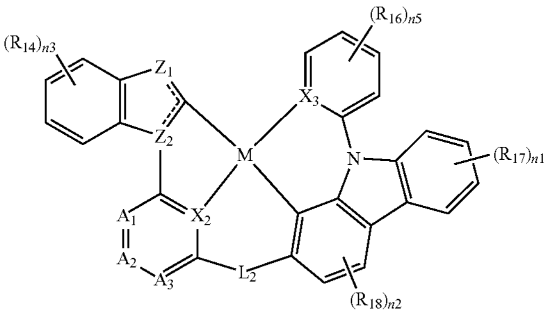

In Formula 8, $A_1$ to $A_3$ are each independently N, B, or $CR_{22}$, $R_{22}$ is a hydrogen atom, a deuterium atom, a halogen atom, a substituted or unsubstituted silyl group, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

In Formula 8, n3 is an integer of 0 to 4. In one or more embodiments, if n3 is 2 or more, multiple $R_{14}$ groups are the same or different.

In Formula 8, n5 is an integer of 0 to 4. In one or more embodiments, if n5 is 2 or more, multiple $R_{16}$ groups are the same or different.

In Formula 8, M, $L_2$, $X_2$, $X_3$, $Z_1$, $Z_2$, $R_{14}$, $R_{16}$ to $R_{18}$, n1, and n2 are the same as defined with respect to Formula 3.

In an embodiment, M of Formula 3 may be Pt.

In an embodiment, one selected from among $R_{14}$, $R_{16}$ to $R_{18}$, and $R_{22}$ of Formula 8 may include a substituted or unsubstituted silyl group.

In an embodiment, Formula 3 may be represented by Formula 9 below.

Formula 9

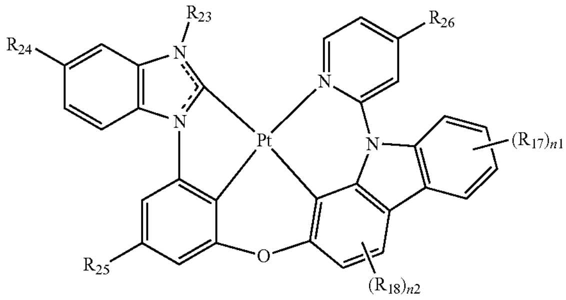

In Formula 9, $R_{23}$ may be a hydrogen atom, a deuterium atom, a halogen atom, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms.

In Formula 9, $R_{24}$ to $R_{26}$ are each independently a hydrogen atom, a deuterium atom, a substituted or unsubstituted silyl group, or a substituted or unsubstituted alkyl group of 1 to 30 carbon atoms.

In Formula 9, $R_{17}$, $R_{18}$, n1 and n2 are the same as defined with respect to Formula 3.

In an embodiment, one selected from among $R_{24}$ to $R_{26}$ of Formula 9 may include a substituted or unsubstituted silyl group.

In some embodiments, at least one from among the first host compound, the second host compound, and the dopant compound may include a deuterium atom. For example, at least one from among the first host compound, the second host compound, and the dopant compound may include at least one deuterium atom as a substituent.

In an embodiments, the first host compound may include a deuterium atom. For example, at least one of $R_1$ to $R_8$, $L_1$, or $Ar_1$ in Formula 1 may include a deuterium atom, or a substituent containing a deuterium atom.

In an embodiments, the second host compound may include a deuterium atom. For example, at least one of $R_{10}$ to $R_{13}$, or $Ar_2$ to $Ar_4$ in Formula 2 may include a deuterium atom, or a substituent containing a deuterium atom.

In an embodiments, the dopant compound may include a deuterium atom. For example, at least one of $R_{14}$ to $R_{21}$ in Formula 3 may include a deuterium atom, or a substituent containing a deuterium atom.

The first host compound represented by Formula 1 according to an embodiment may be any one selected from the compounds represented in Compound Group 1 below. However, an embodiment of the present disclosure is not limited thereto.

Compound Group 1

HT-01

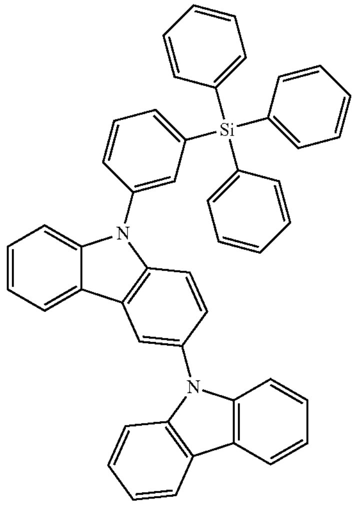

HT-02

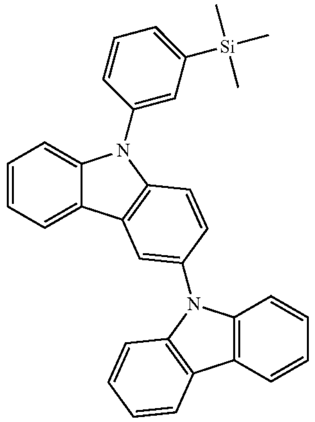

HT-03

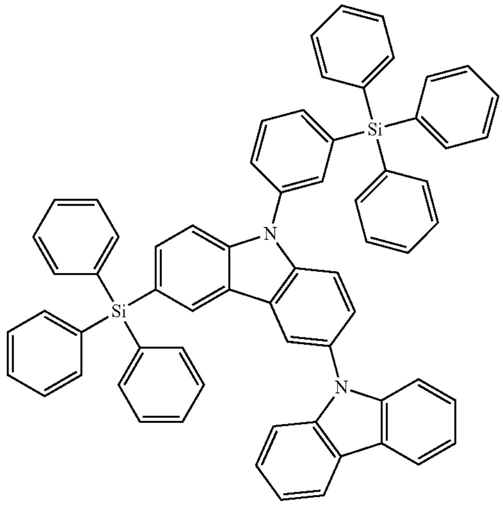

-continued
HT-04
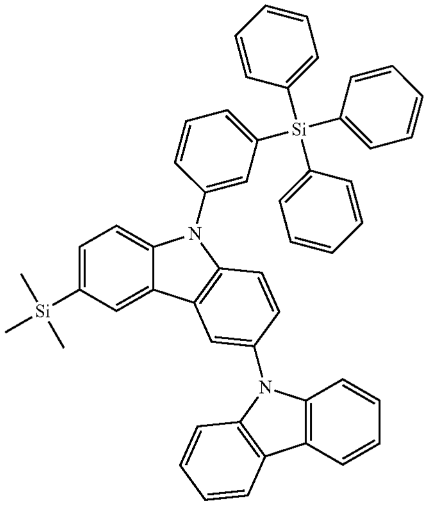
HT-05
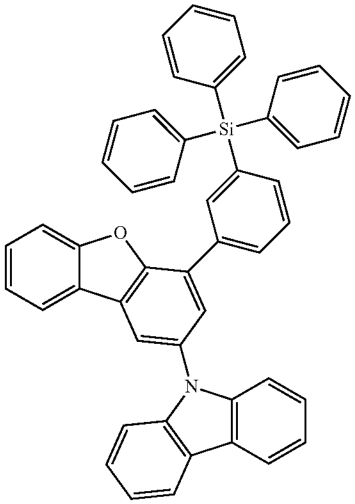
HT-06
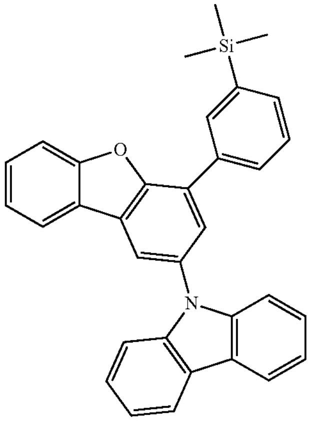
-continued
HT-07
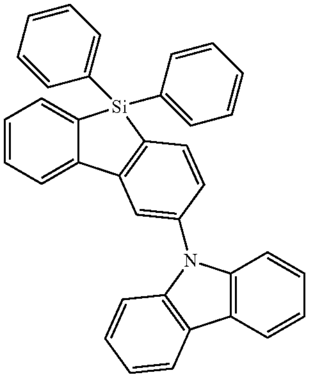
HT-08
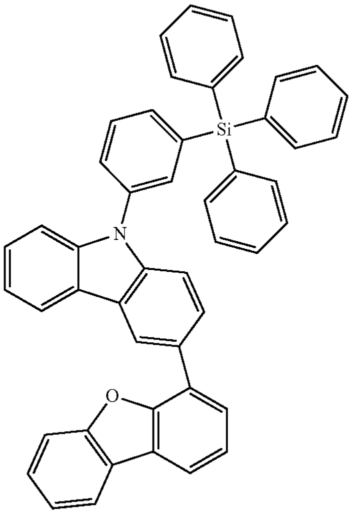
HT-09
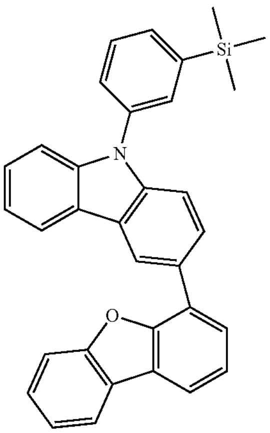

-continued
HT-10
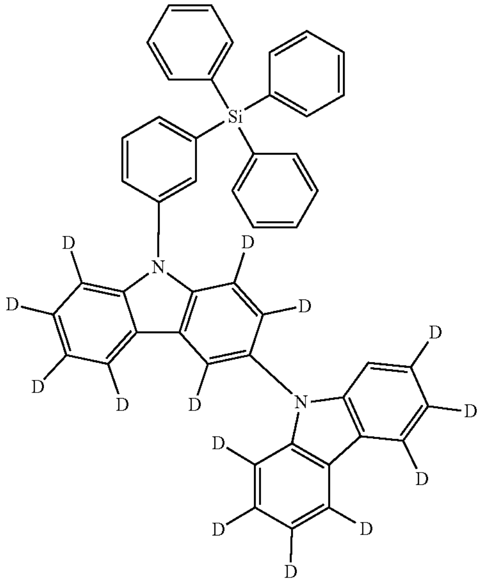
HT-11
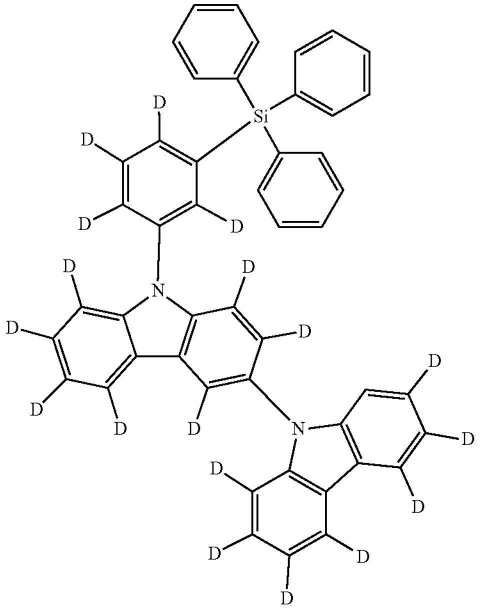
-continued
HT-12
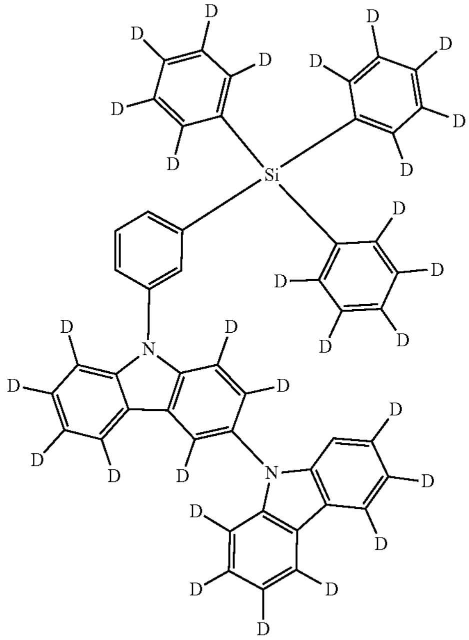
HT-13
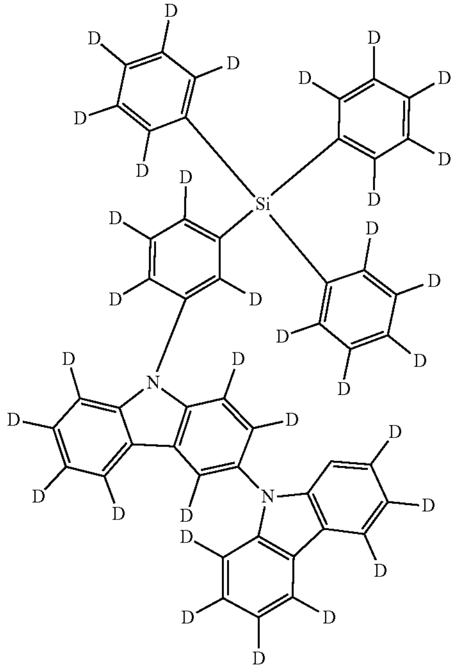

-continued
HT-14
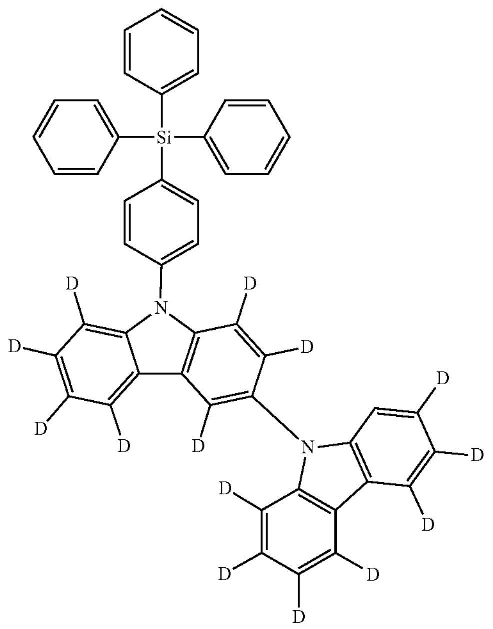
HT-15
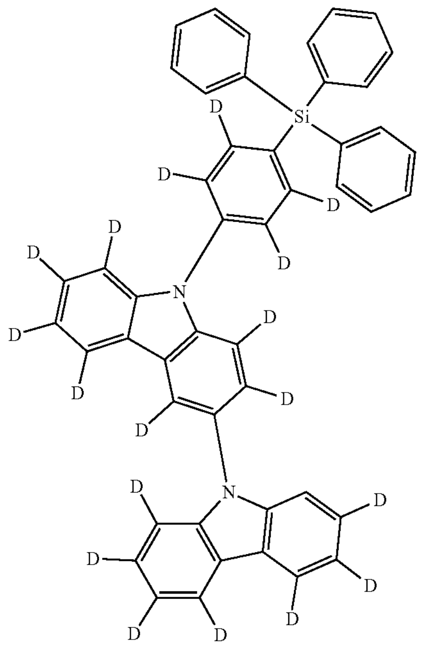
-continued
HT-16
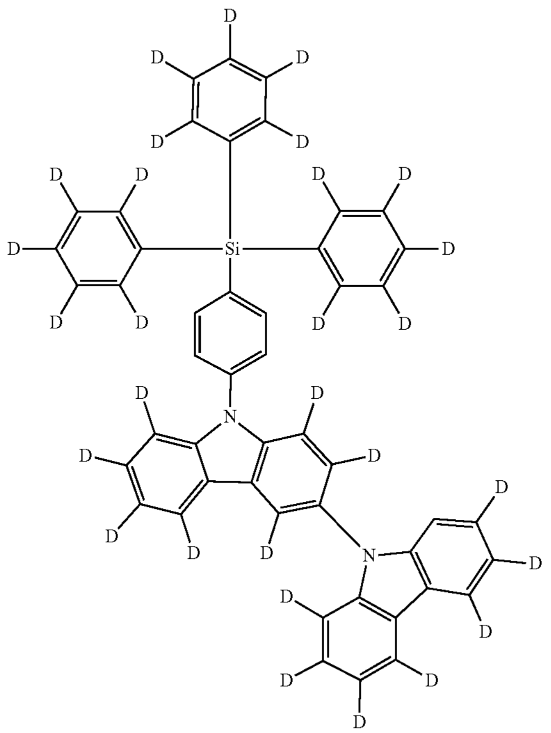
HT17
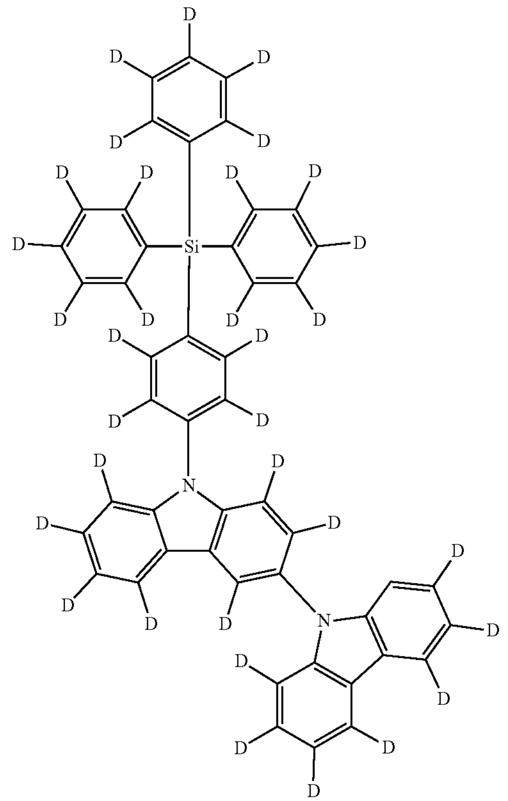

-continued
HT-18
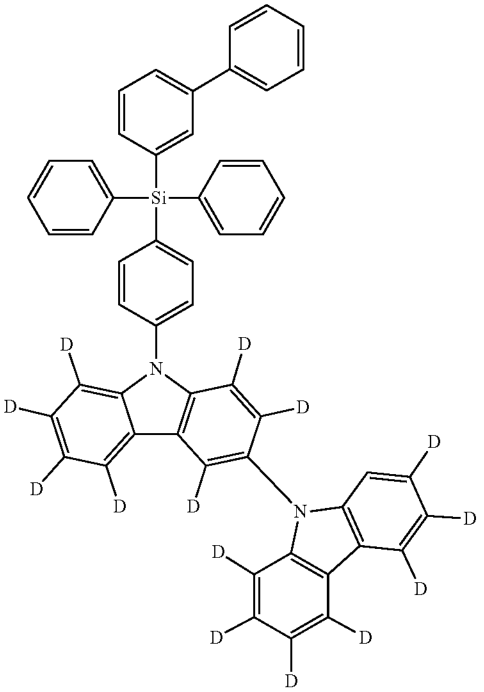
HT-19
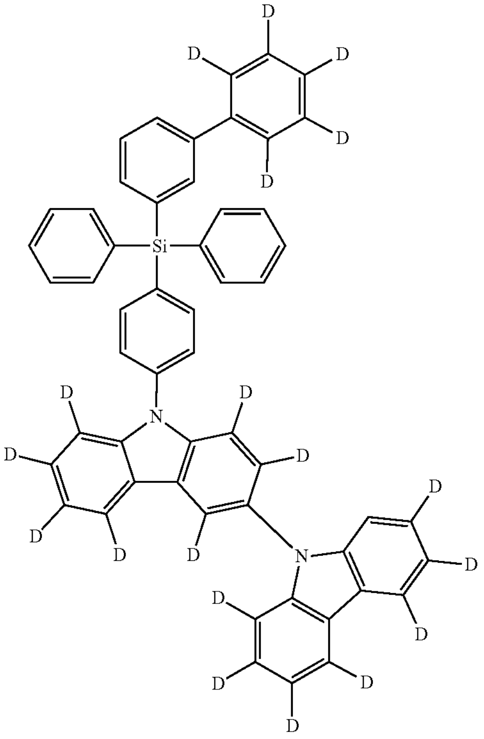
-continued
HT-20
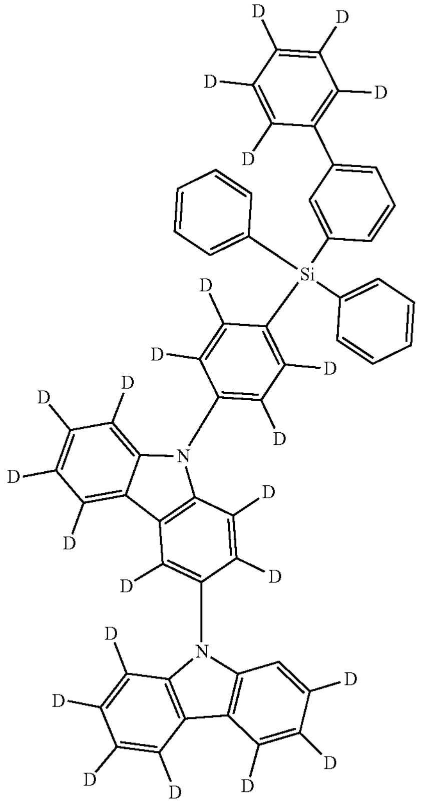
HT-21
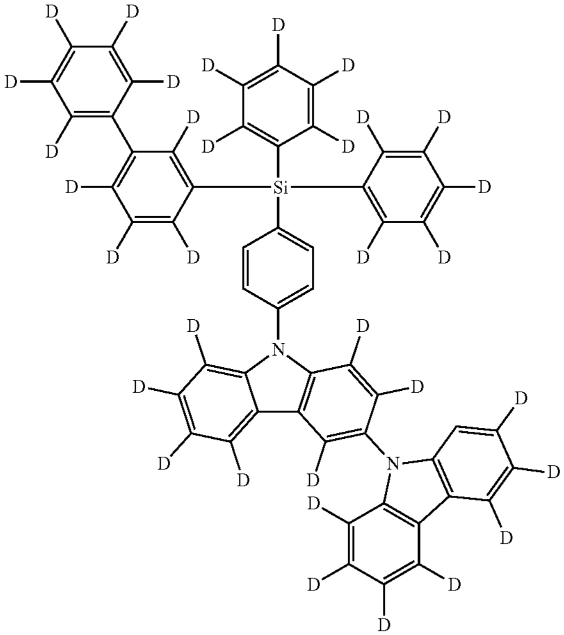

-continued
HT-22
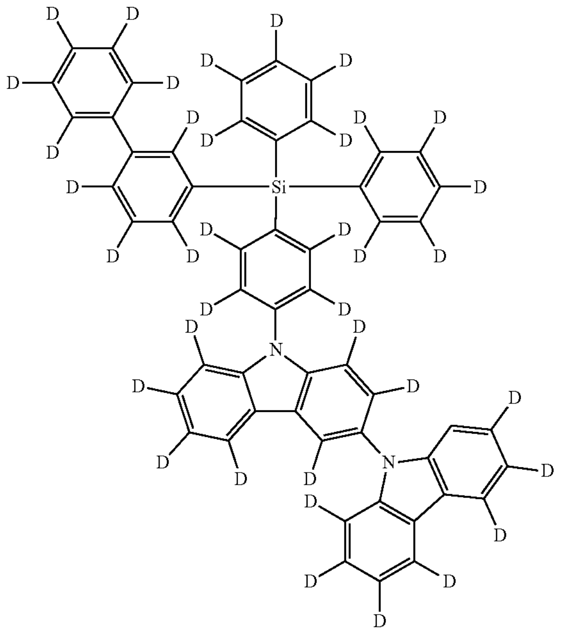
HT-23
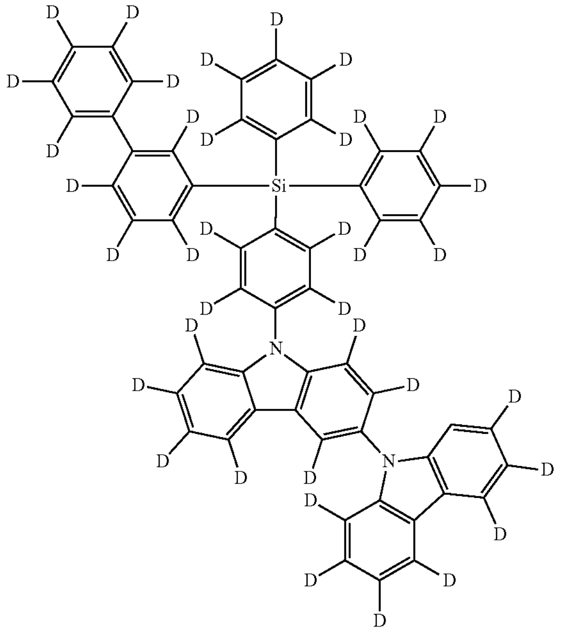
-continued
HT-24
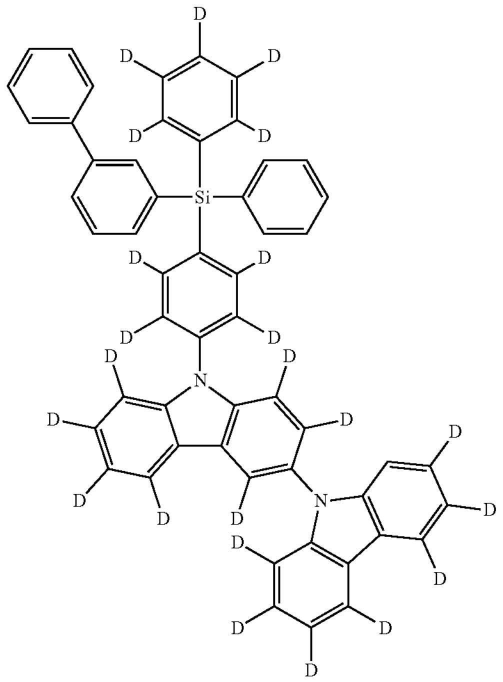
HT-25
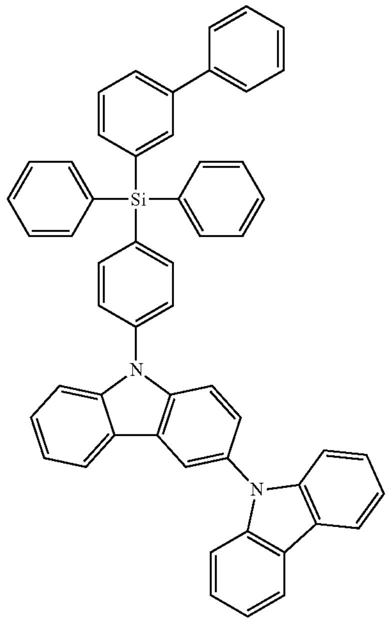

-continued
HT-26
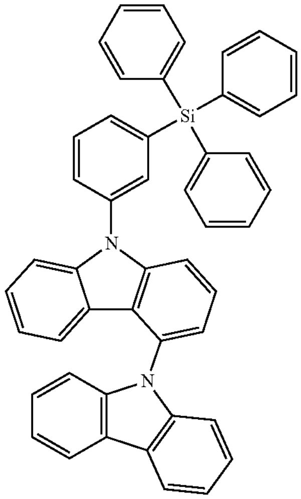
HT-27
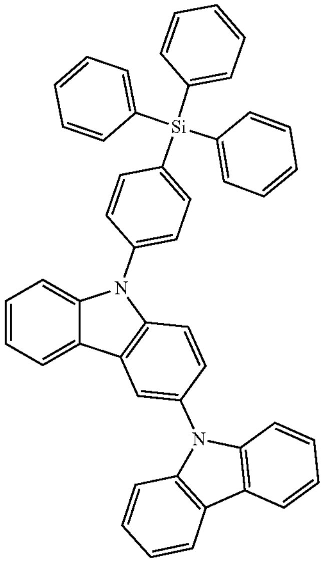
HT-28
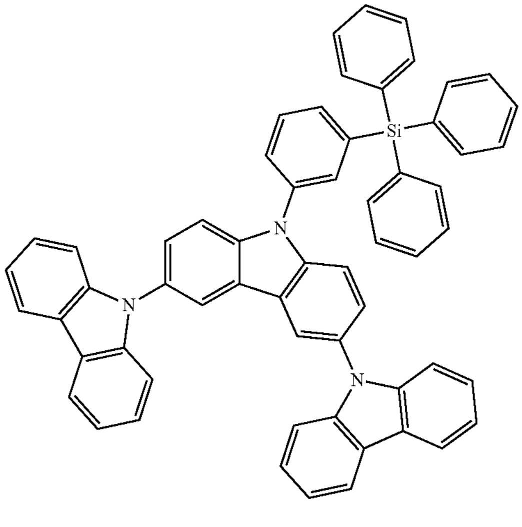
-continued
HT-29
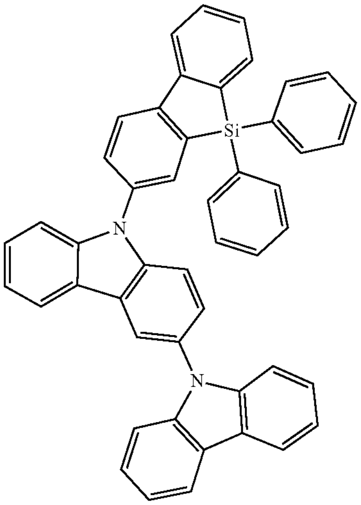
HT-30
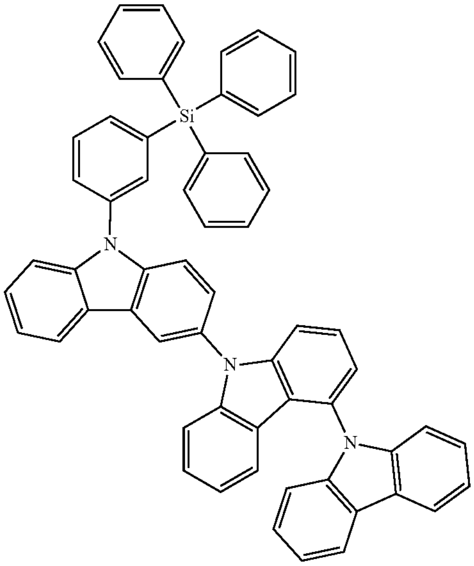
HT-31
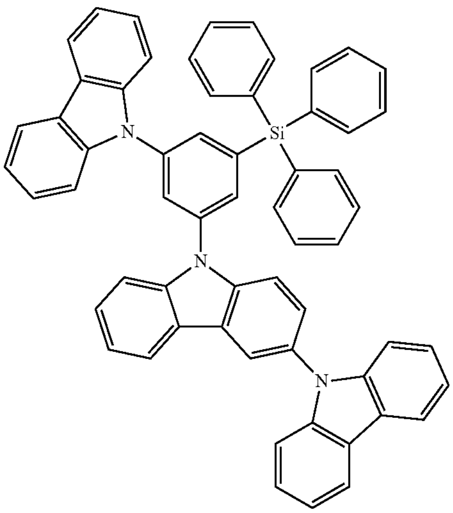

-continued
HT-32
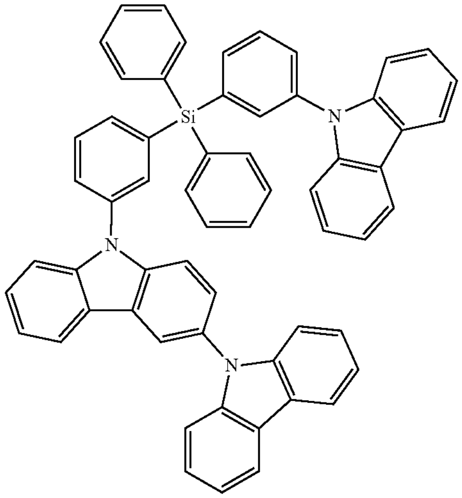
HT-33
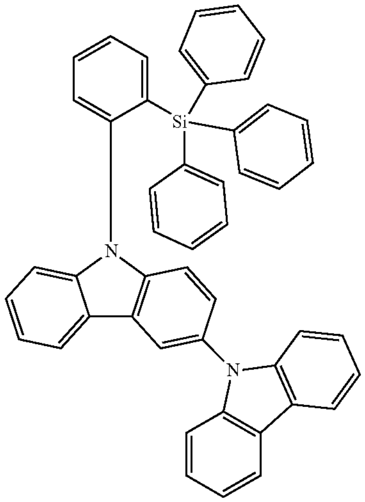
HT-34
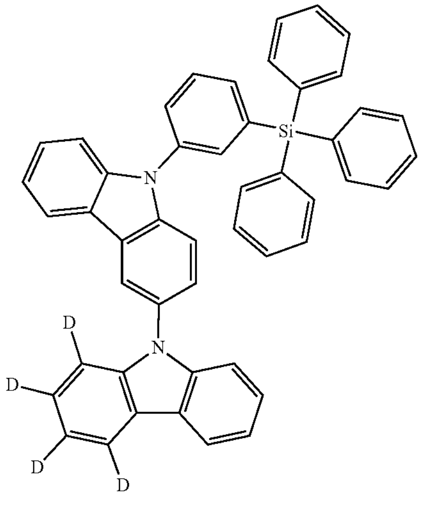
-continued
HT-35
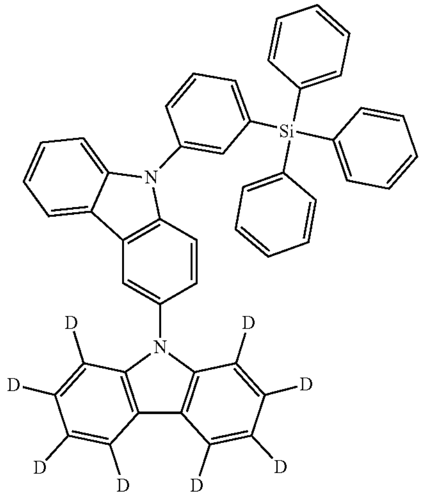
HT-36
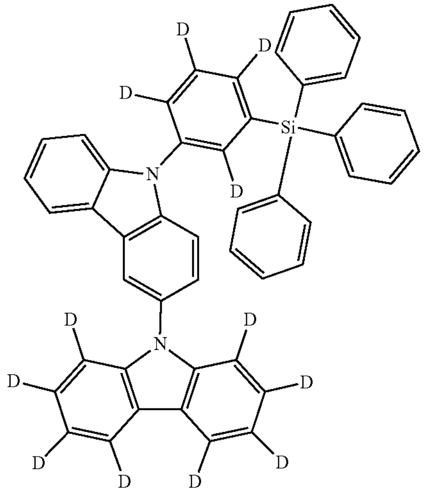
HT-37
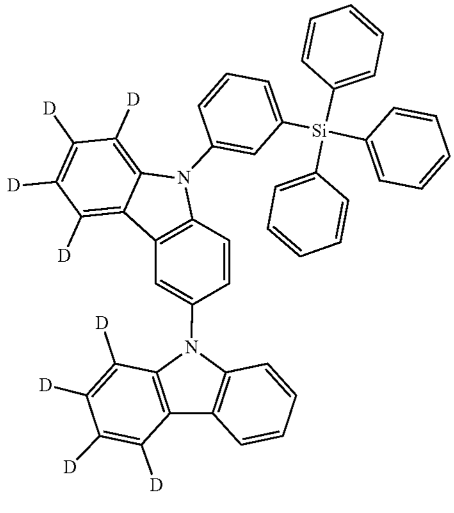

-continued
HT-38
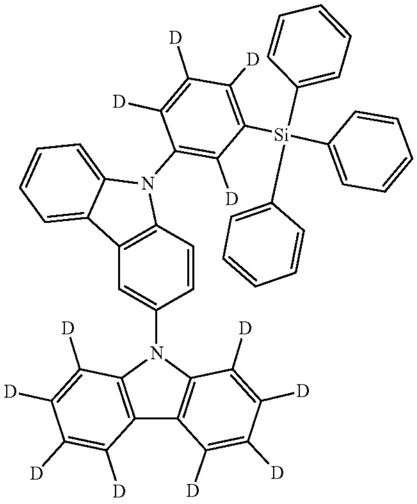
HT-39
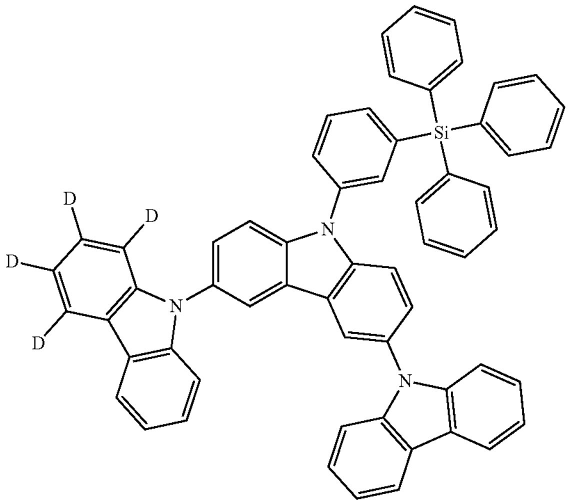
HT-40
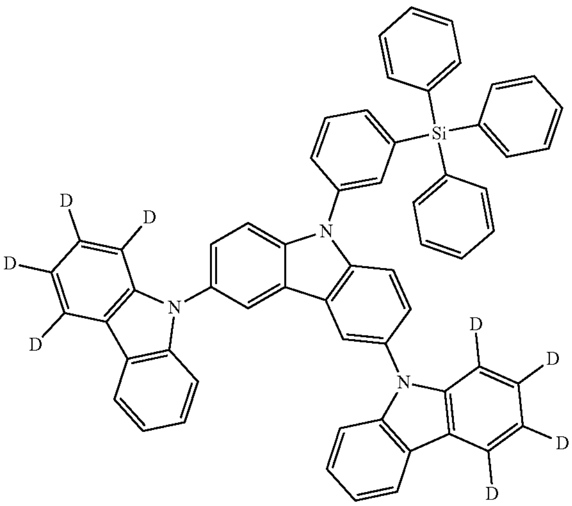
-continued
HT-41
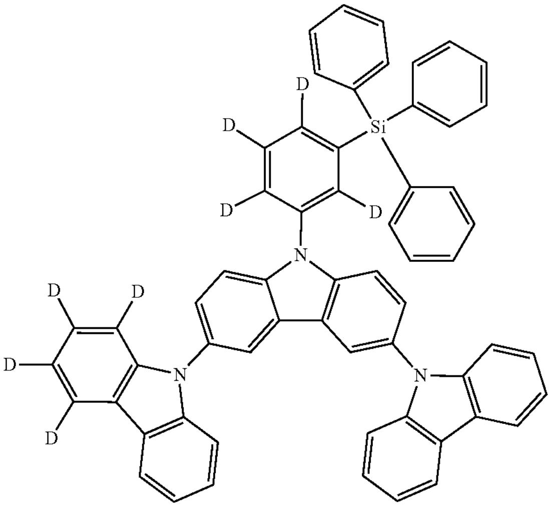
HT-42
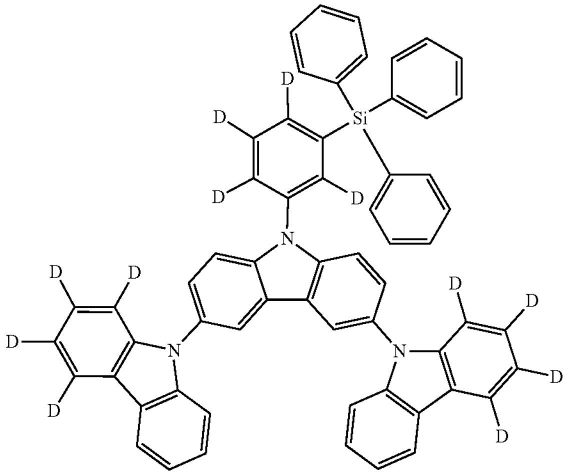
HT-43
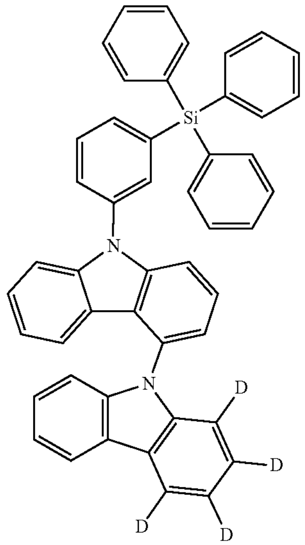

-continued
HT-44
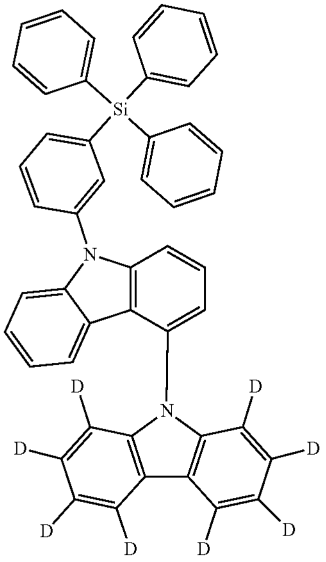
HT-45
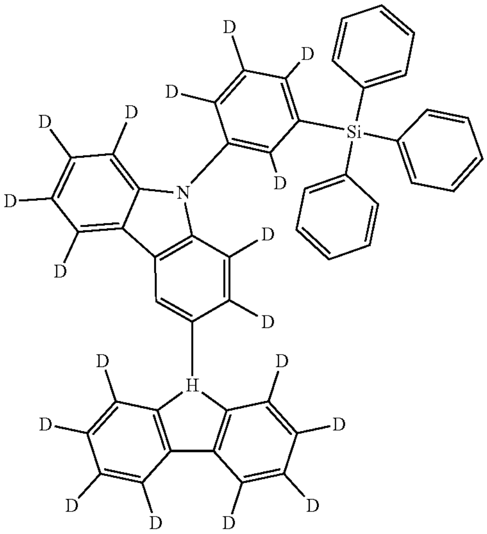
-continued
HT-46
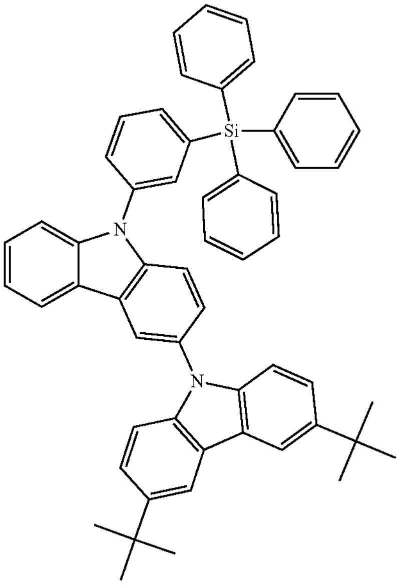
HT-47
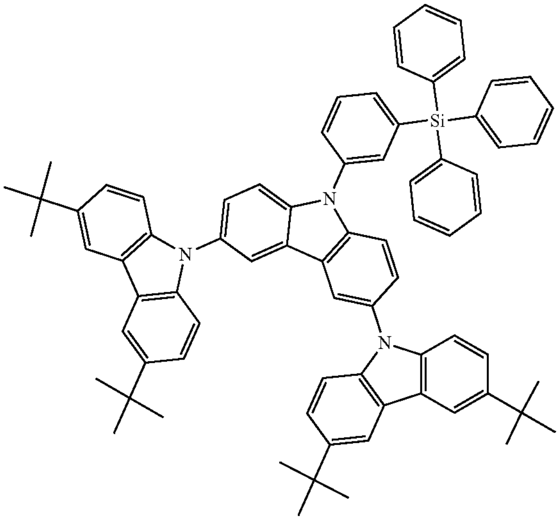
HT-48
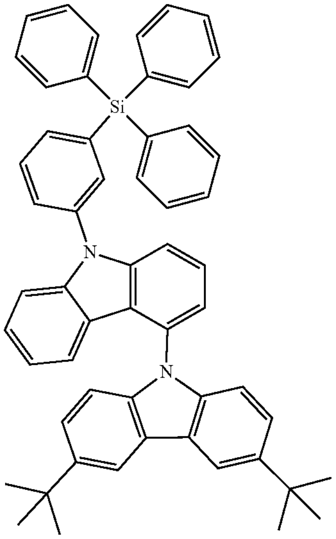

-continued
HT-49
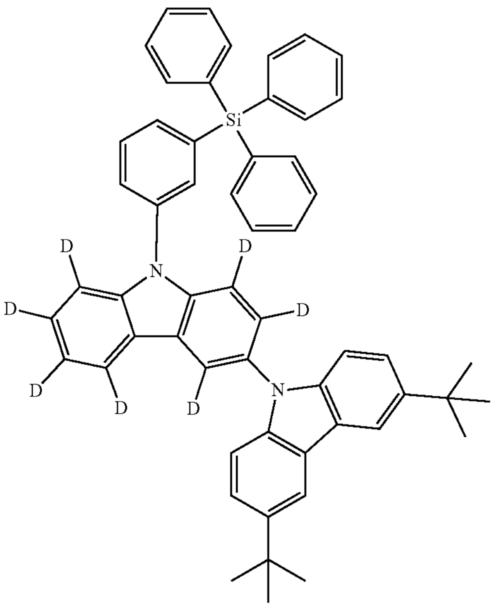
HT-50
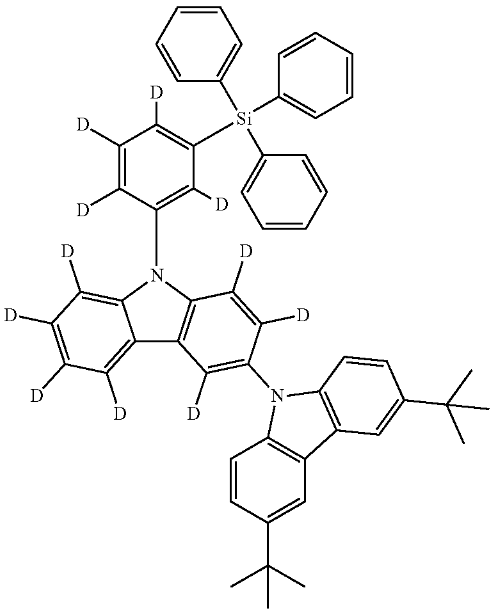
-continued
HT-51
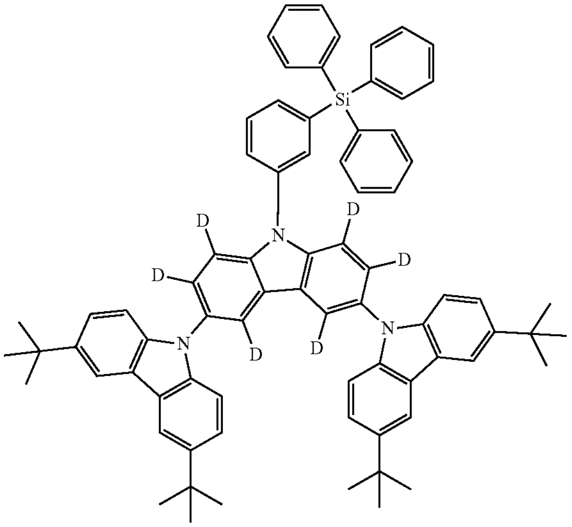
HT-52
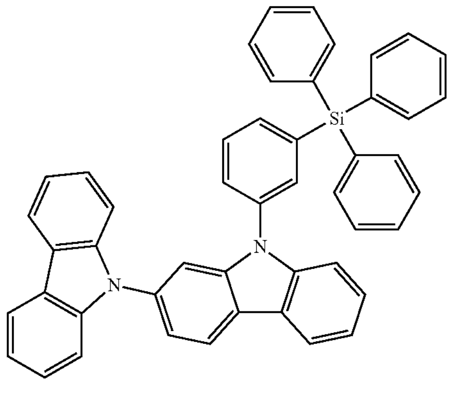
HT-53
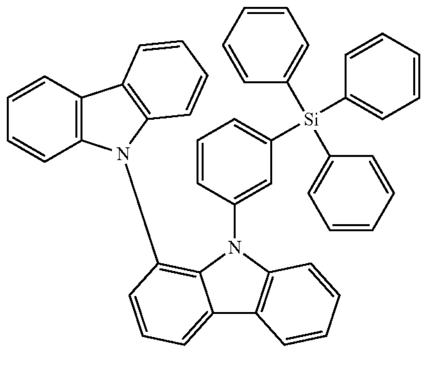

HT-54
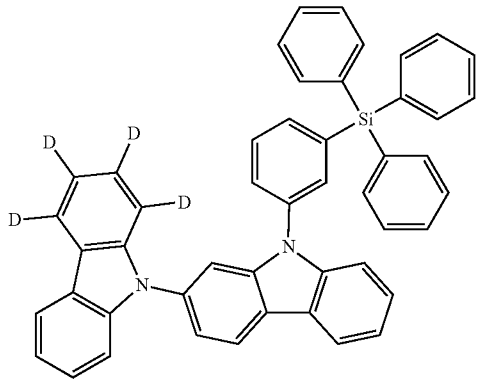
HT-55
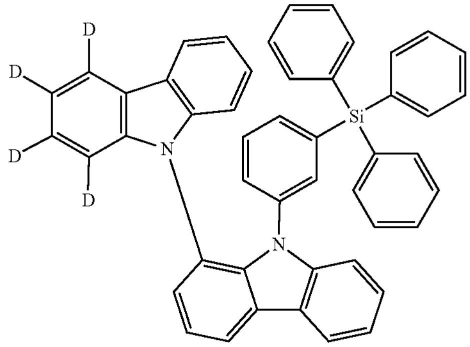
HT-56
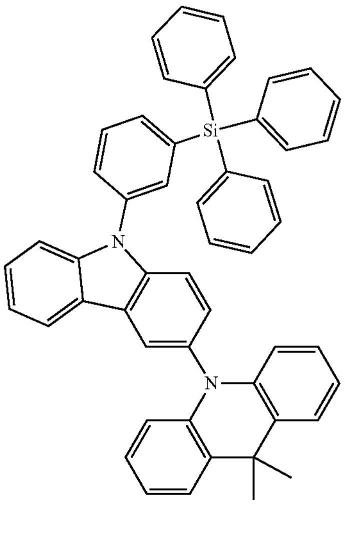
HT-57
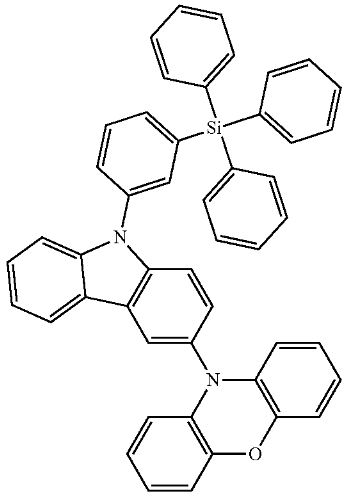
HT-58
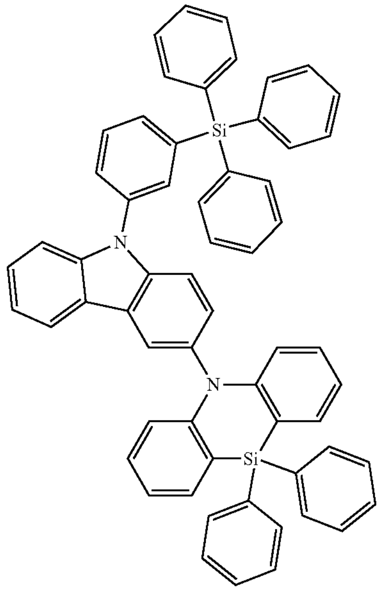
HT-59
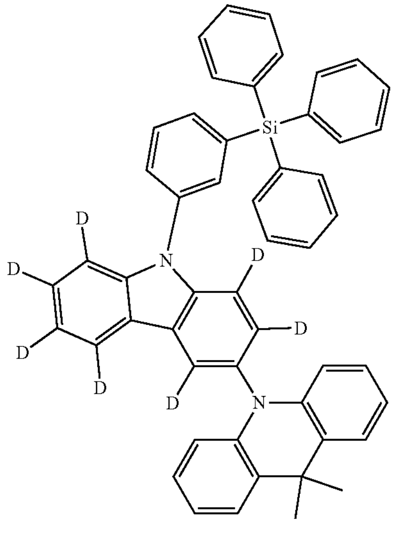

-continued
HT-60
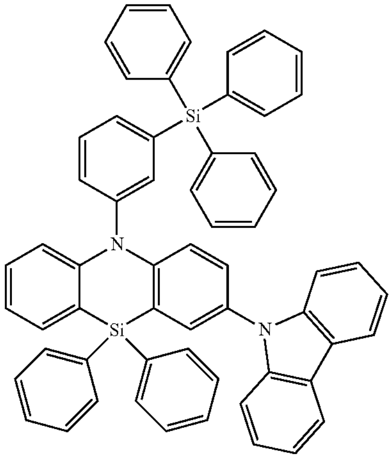
HT-61
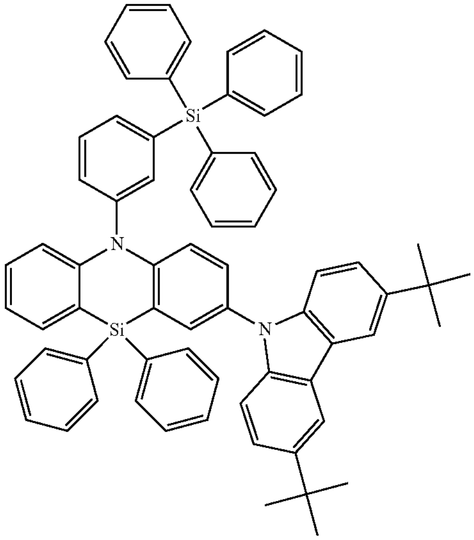
HT-62
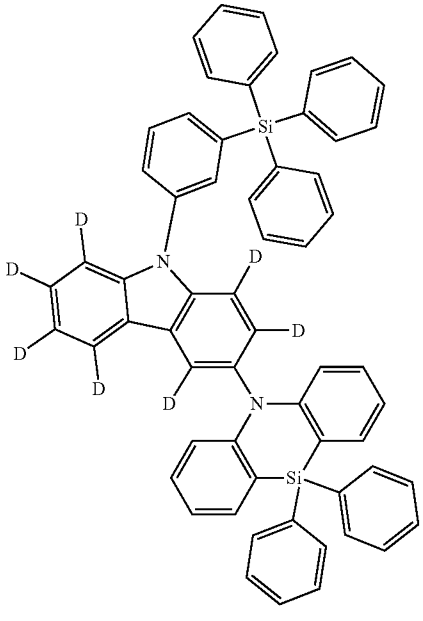
-continued
HT-63
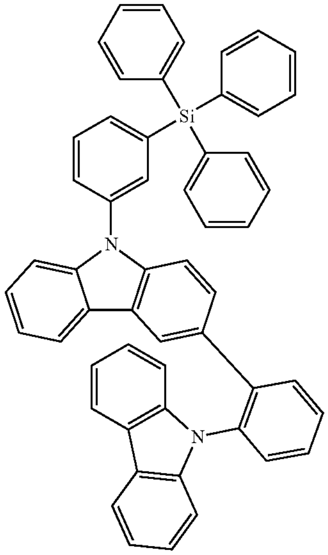
HT-64
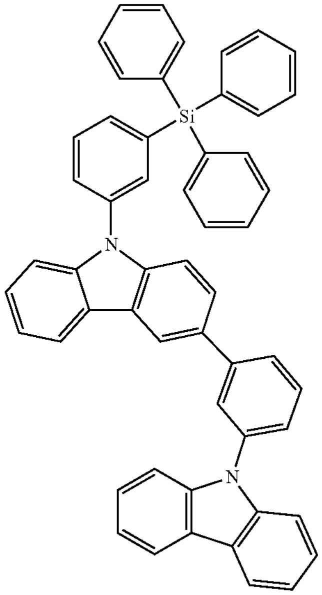

-continued
HT-65
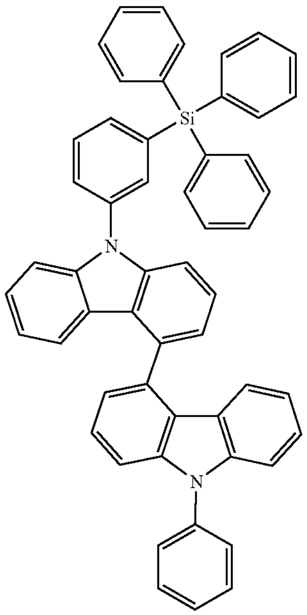
HT-66
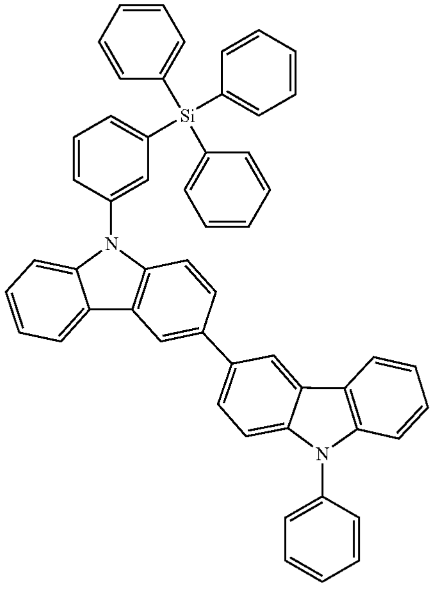
-continued
HT-67
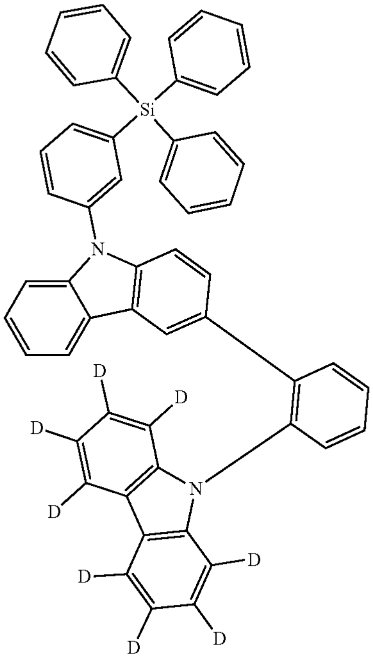
HT-68
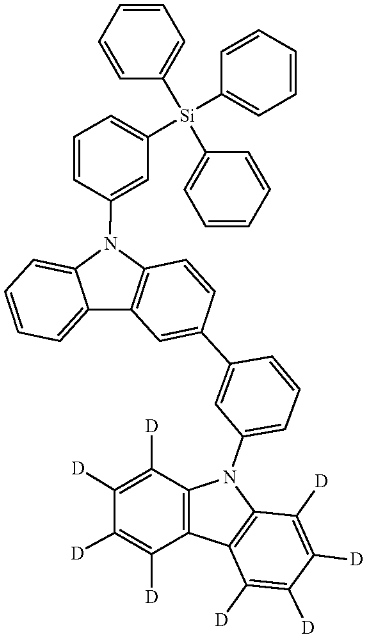

-continued
HT-69
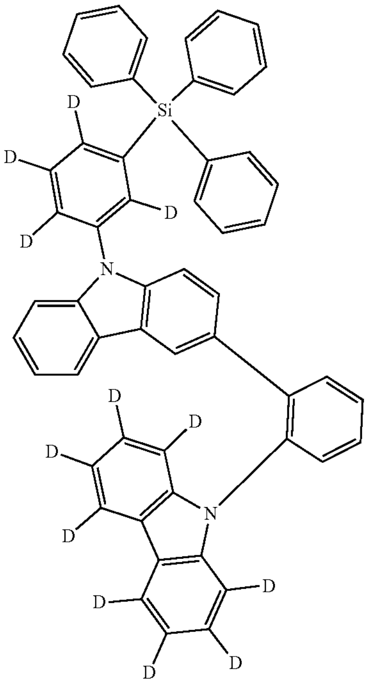
HT-70
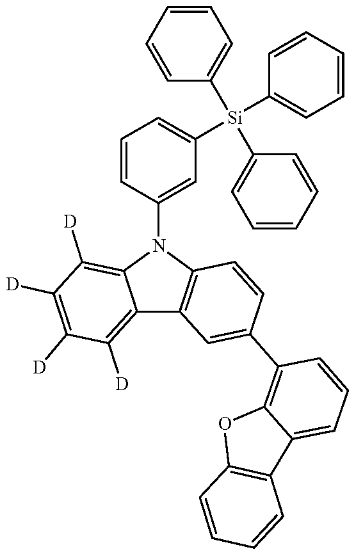
The second host compound represented by Formula 2 according to an embodiment may be any one selected from the compounds represented in Compound Group 2 below. However, an embodiment of the present disclosure is not limited thereto.
Compound Group 2
ET-01
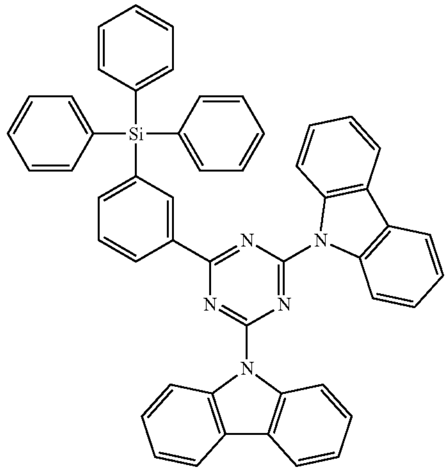
ET-02
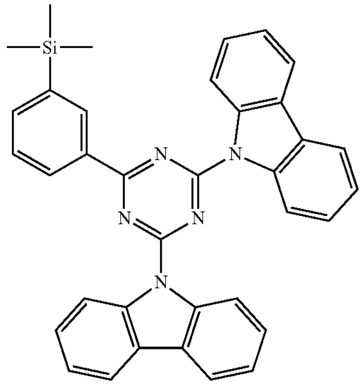
ET-03
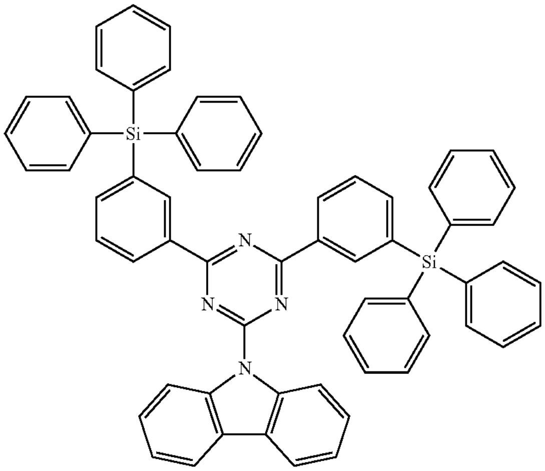

-continued
ET-04
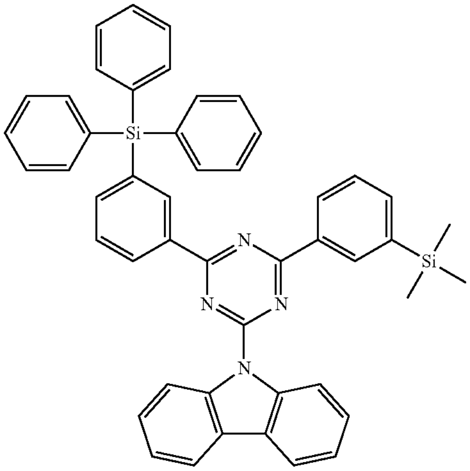
ET-05
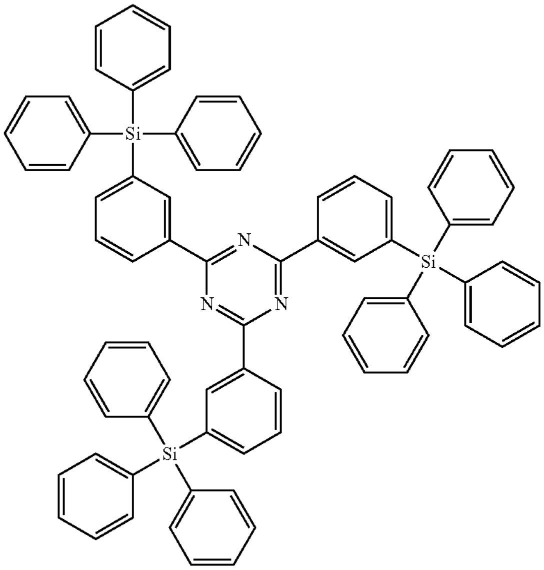
ET-06
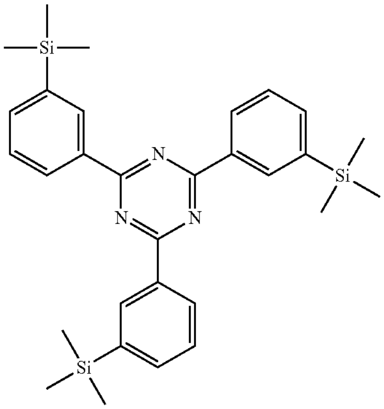
-continued
ET-07
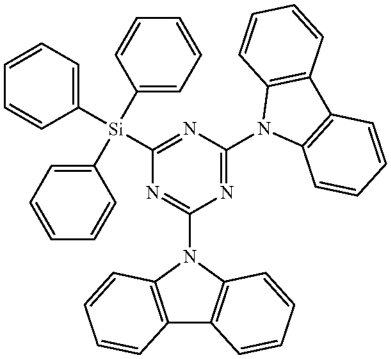
ET-08
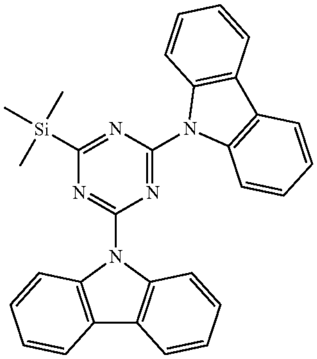
ET-09
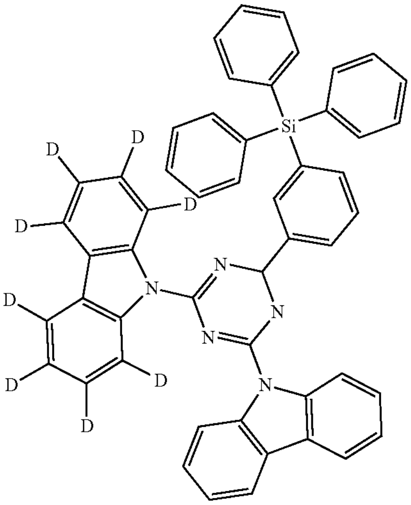

-continued
ET-10
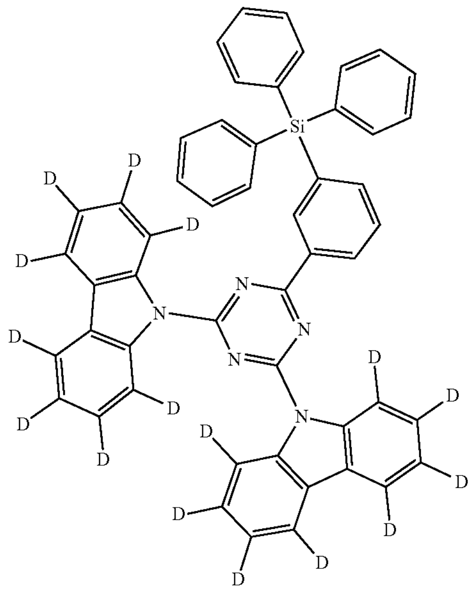
ET-11
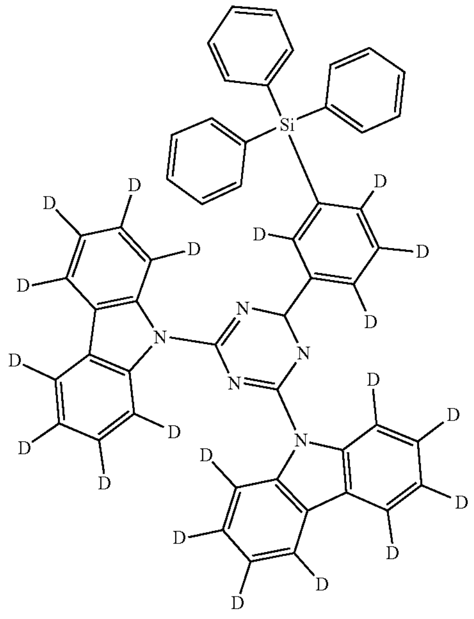
-continued
ET-12
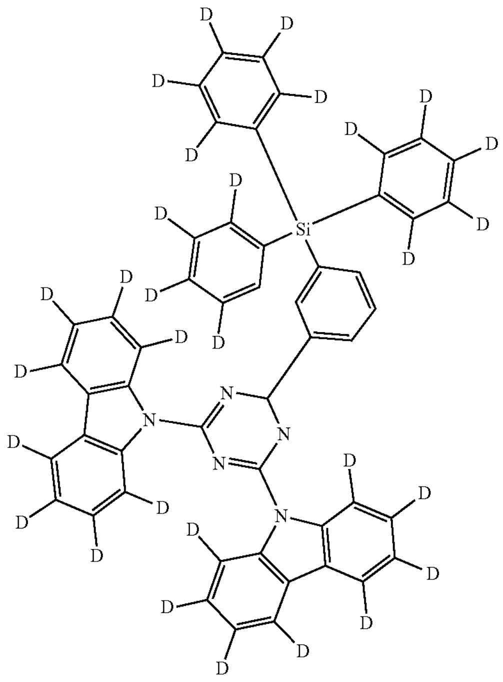
ET-13
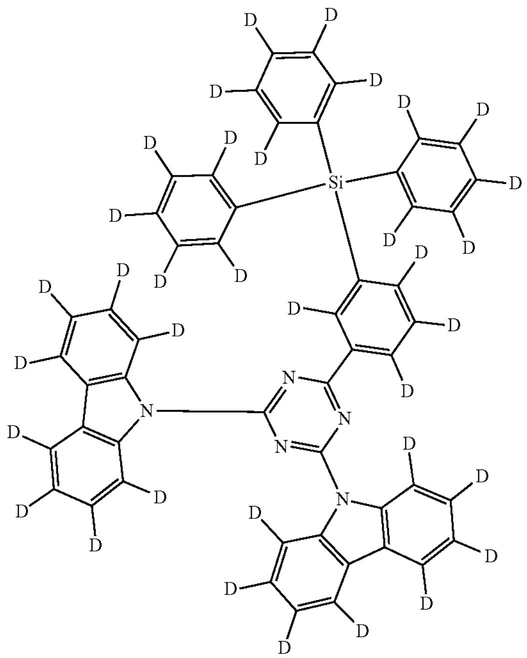

-continued
ET-14
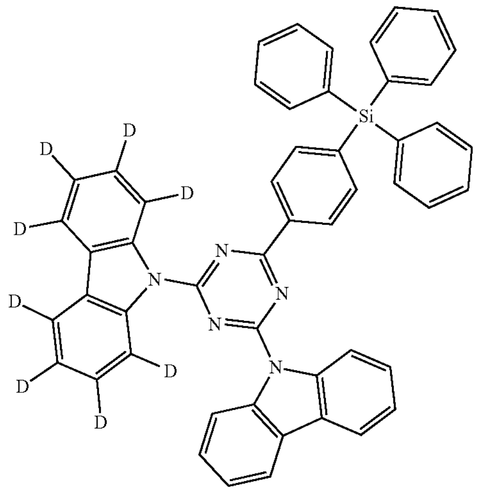
ET-15
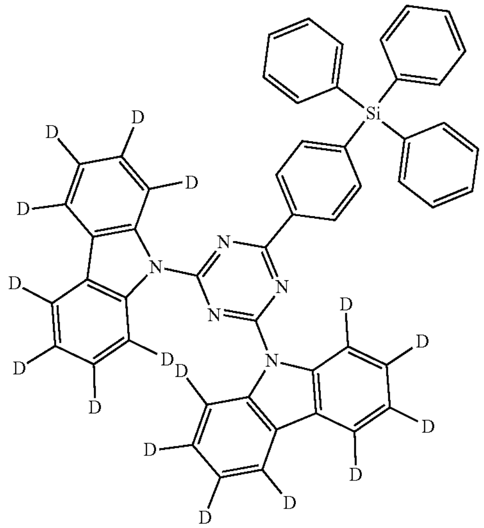
ET-16
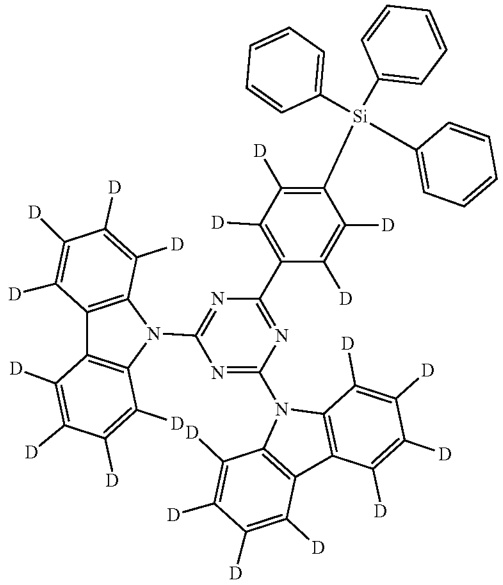
-continued
ET-17
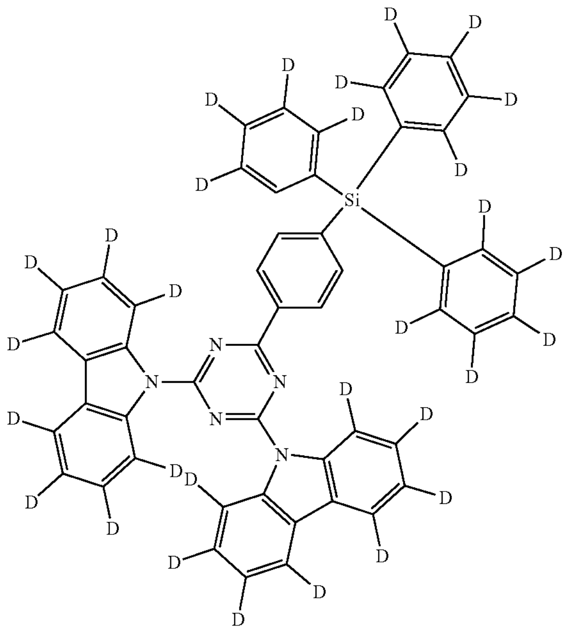
ET-18
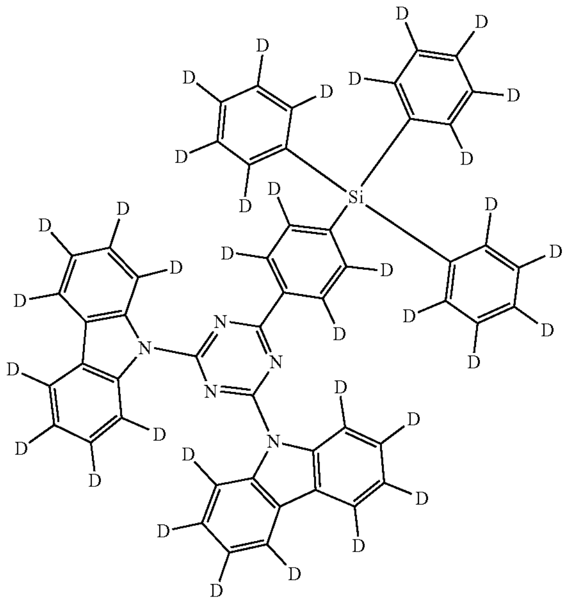

-continued
ET-19
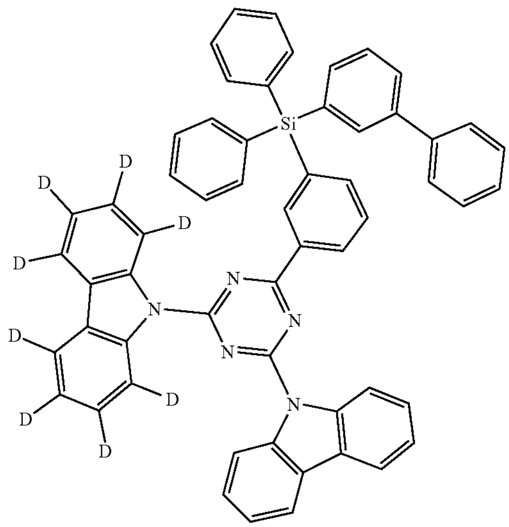
ET-20
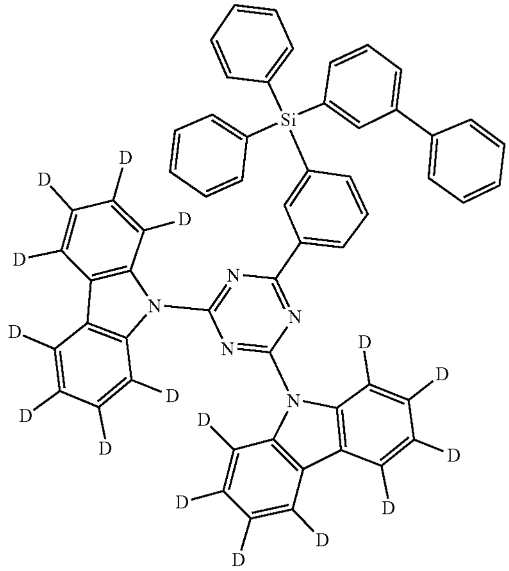
-continued
ET-21
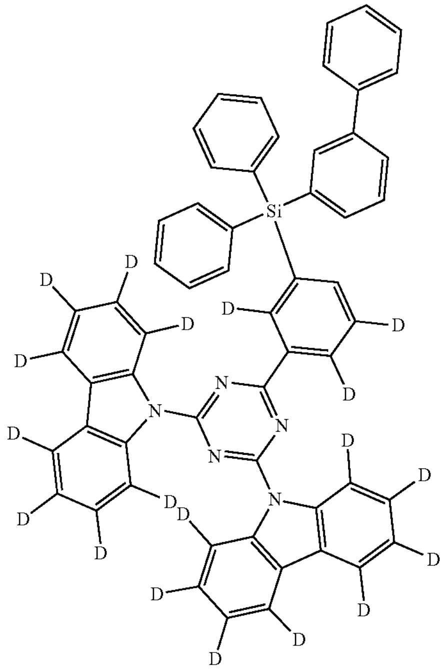
ET-22
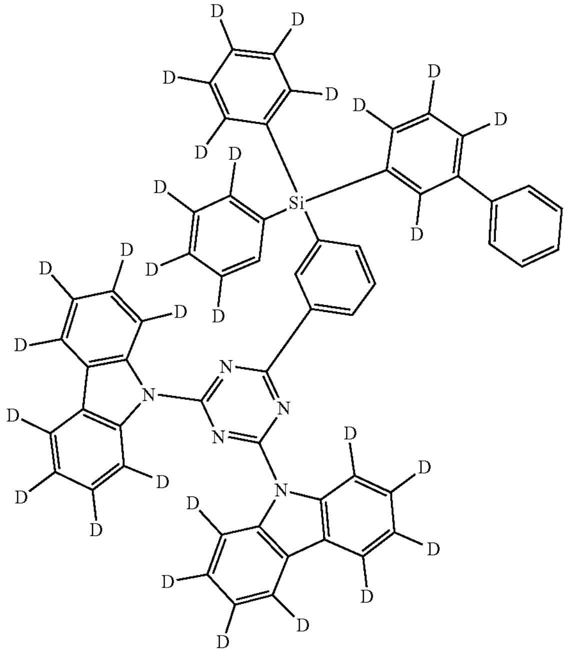

-continued
ET-23
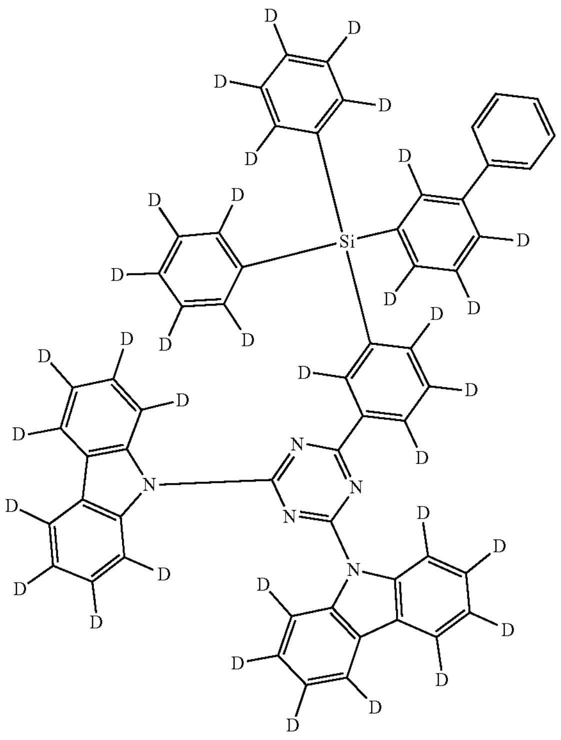
ET-24
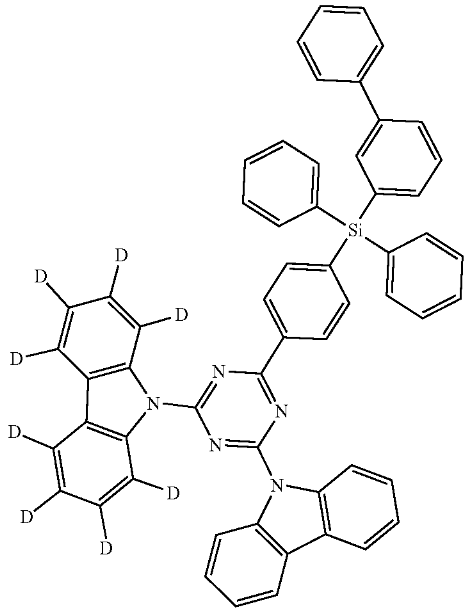
-continued
ET-25
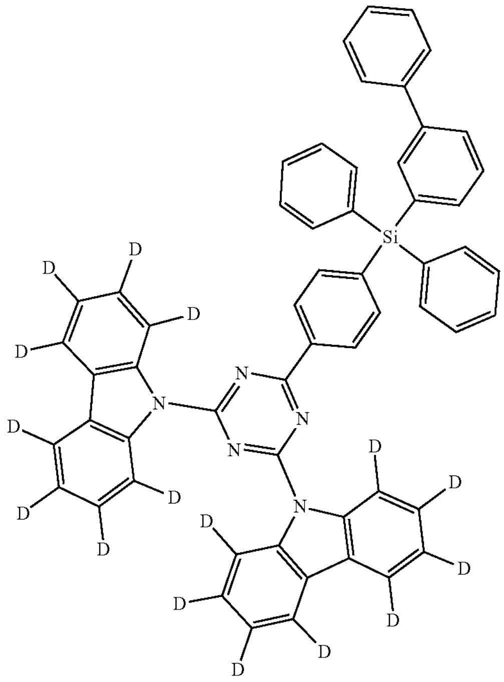
ET-26
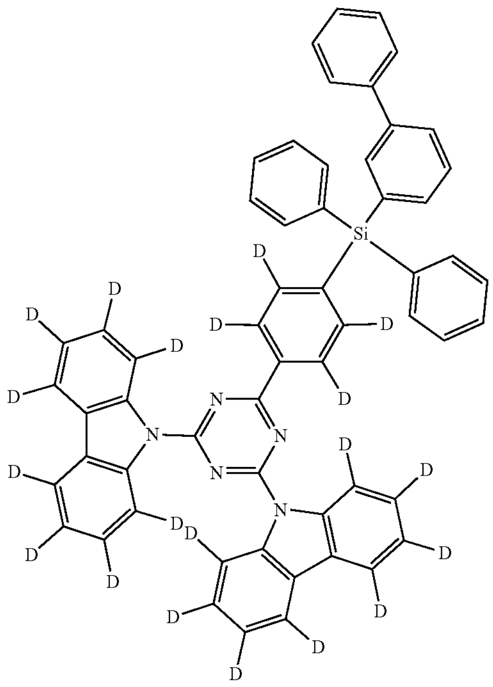

-continued
ET-27
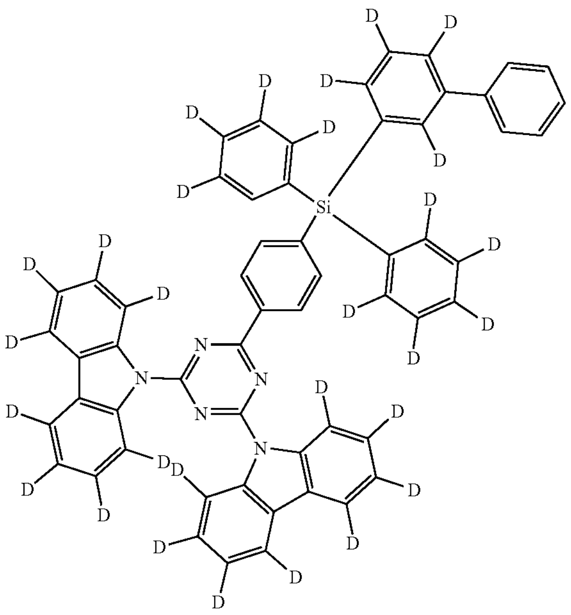
ET-28
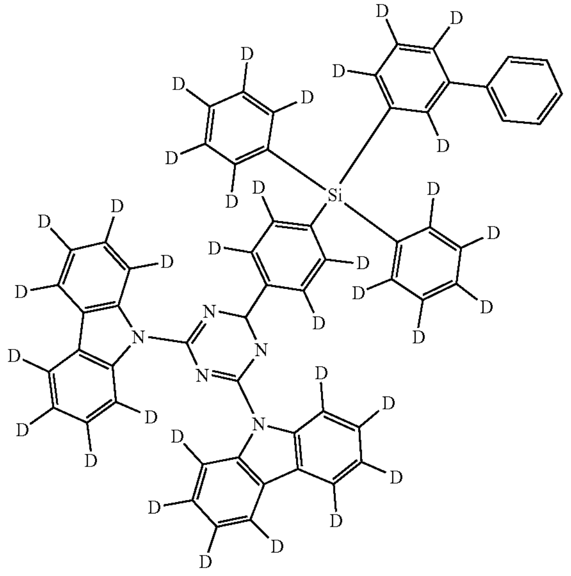
-continued
ET-29
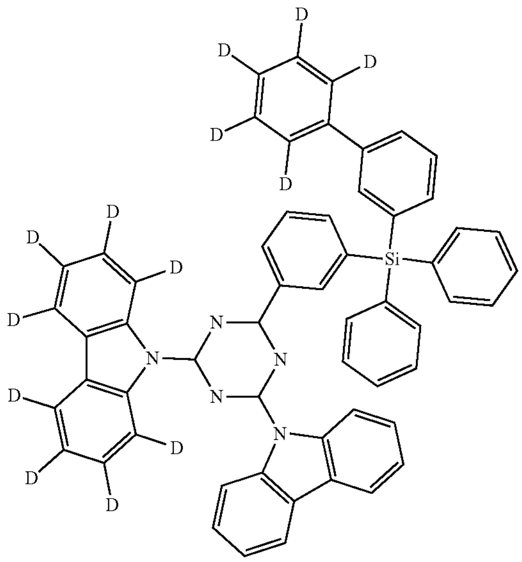
ET-30
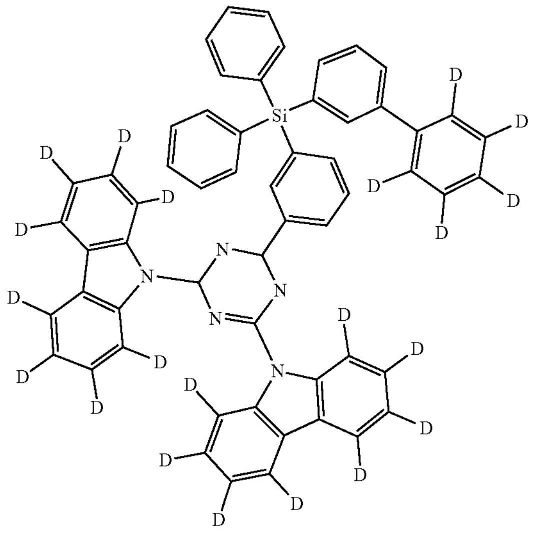

-continued
ET-31
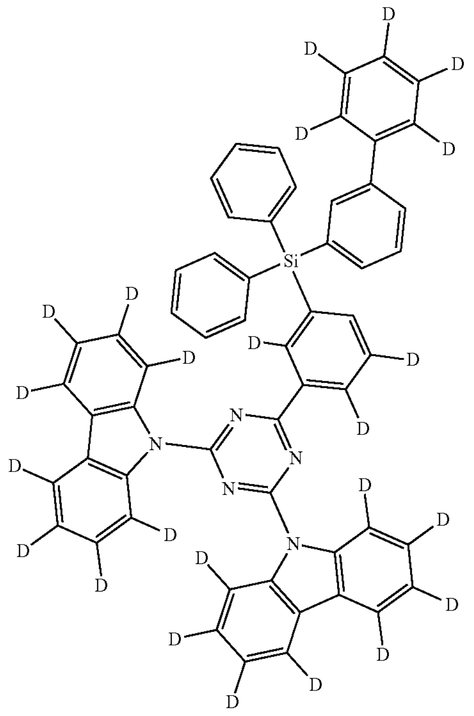
ET-32
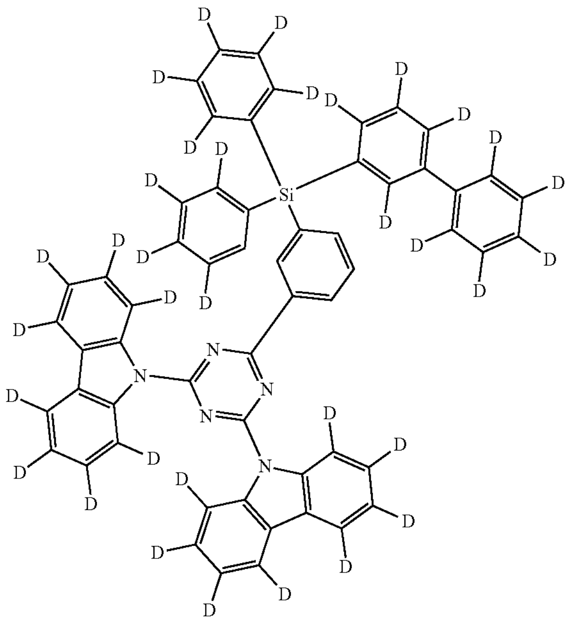
-continued
ET-33
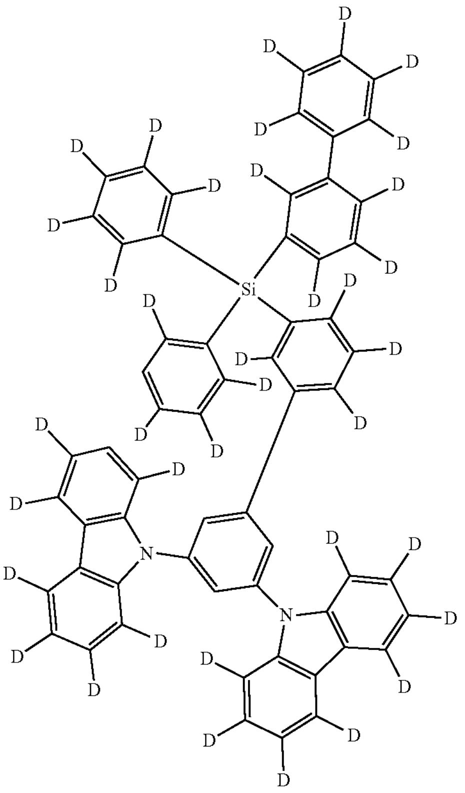
ET-34
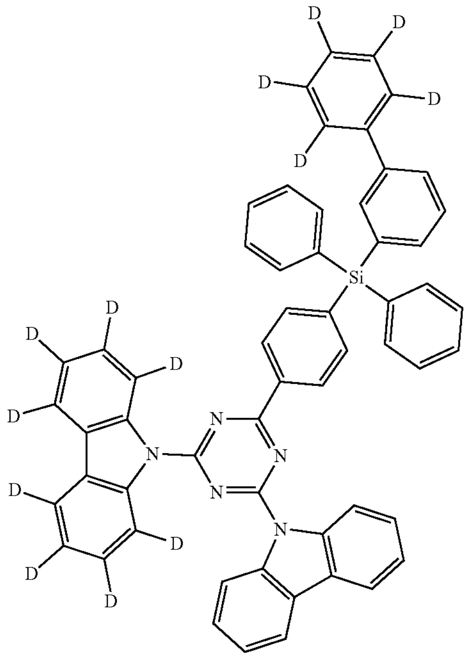

-continued
ET-35
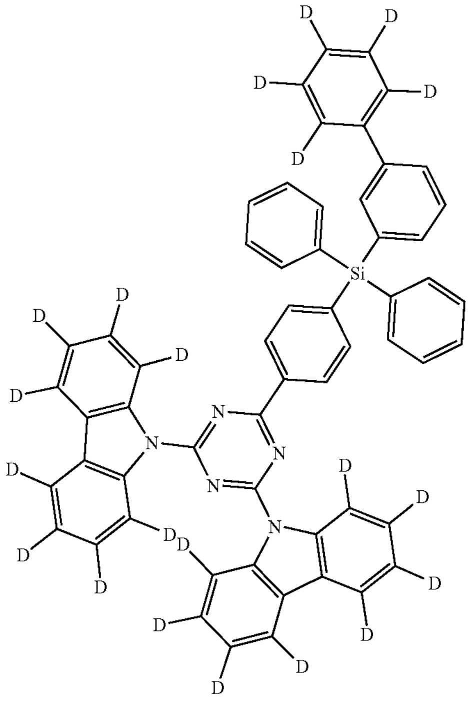
ET-36
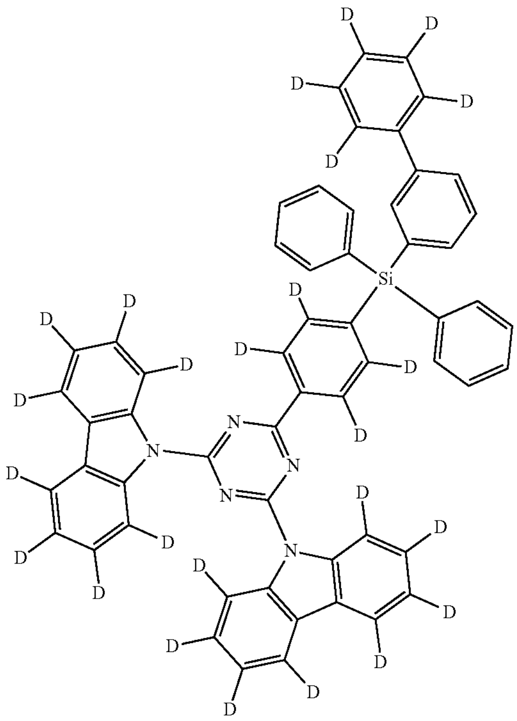
-continued
ET-37
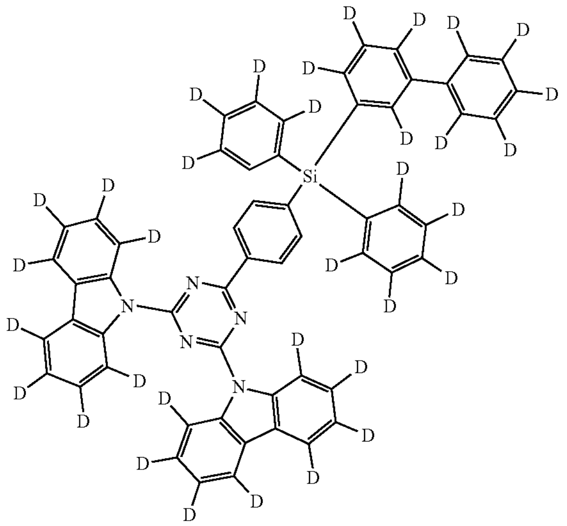
ET-38
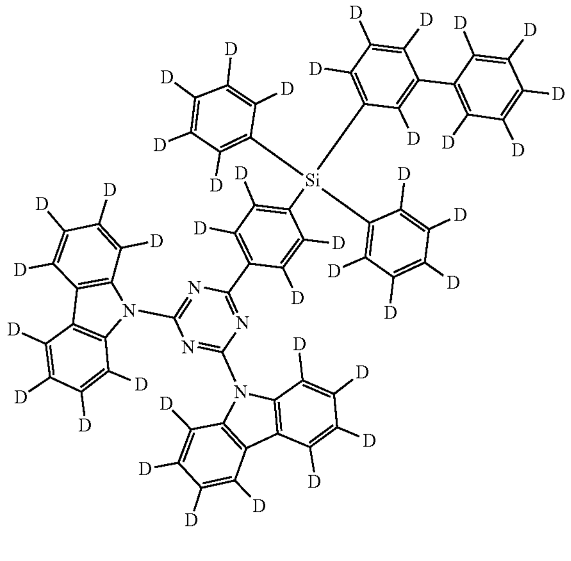
The dopant compound represented by Formula 3 according to an embodiment may be any one selected from the compounds represented in Compound Group 3 below. However, an embodiment of the present disclosure is not limited thereto.

-continued
Compound Group 3
PBD-01
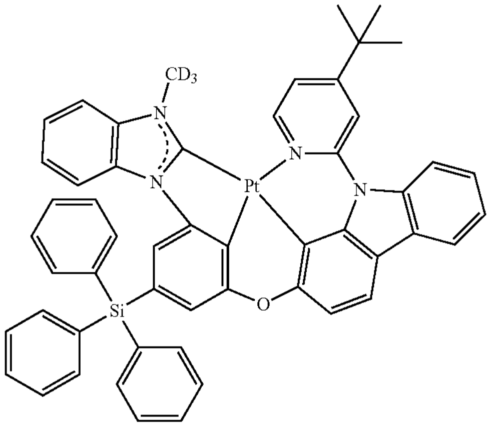
PBD-02
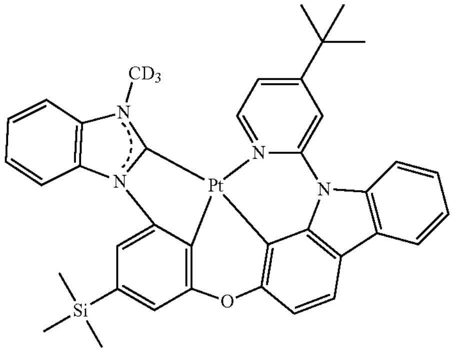
PBD-03
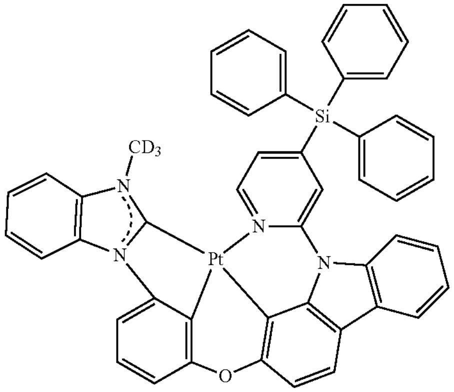
PBD-04
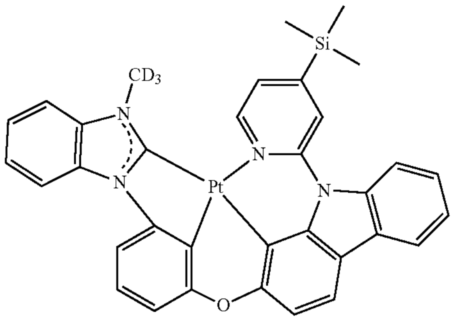
PBD-05
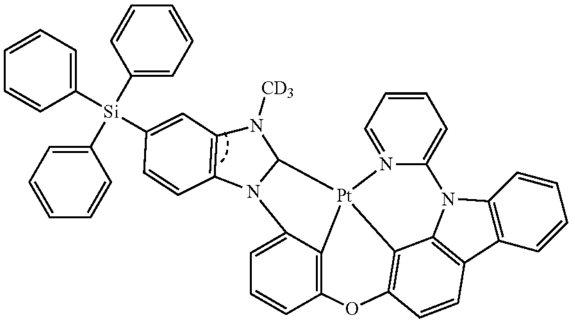
PBD-06
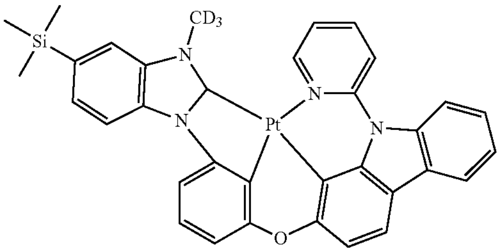
PBD-07
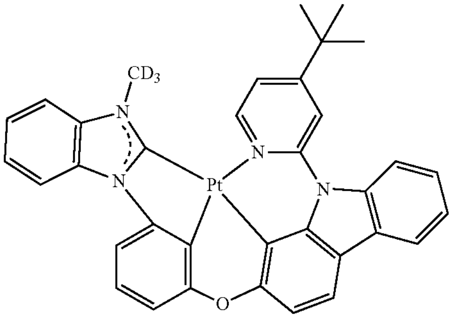
PBD-08
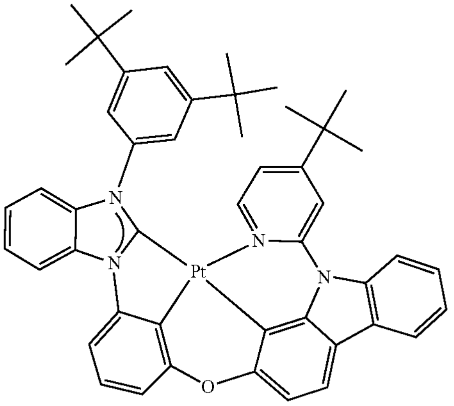

-continued
PBD-09
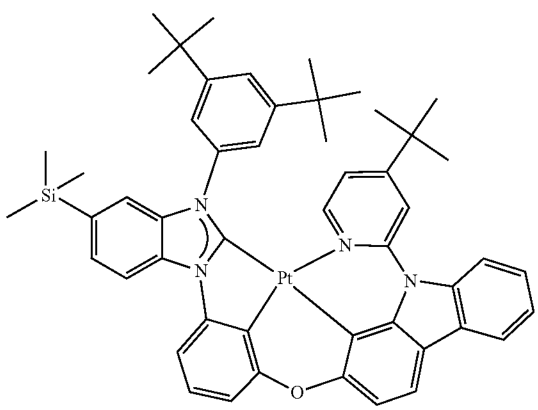
PBD-10
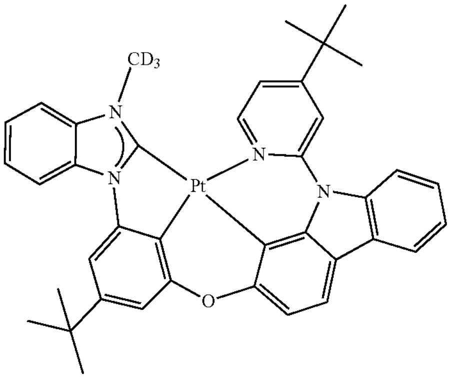
PBD-11
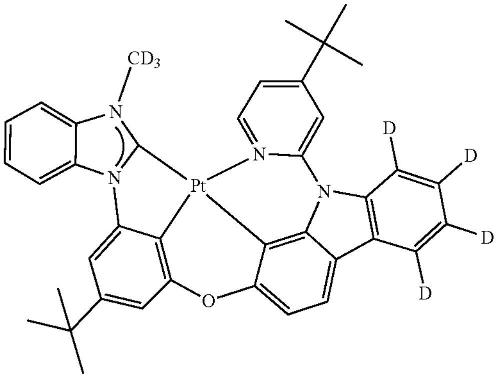
PBD-12
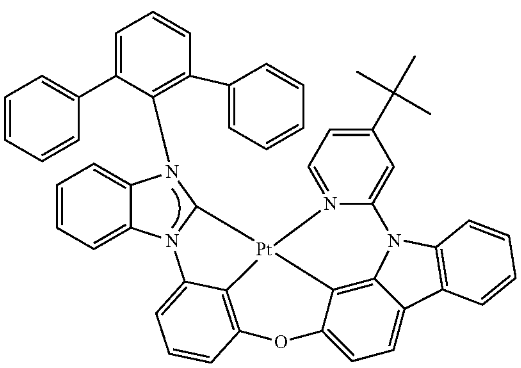
-continued
PBD-13
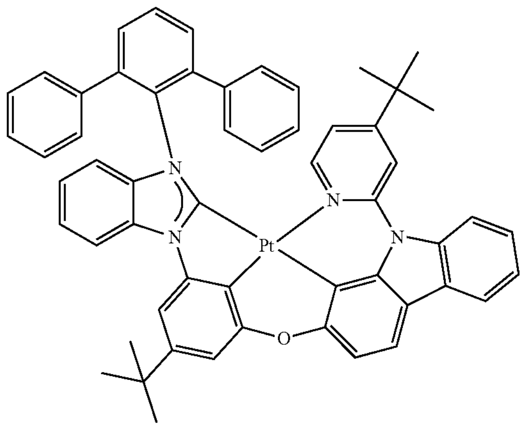
PBD-14
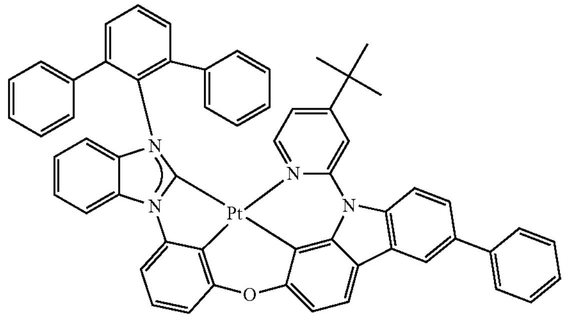
PBD-15
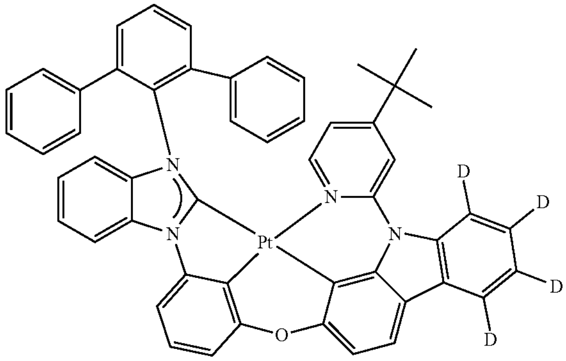
PBD-16
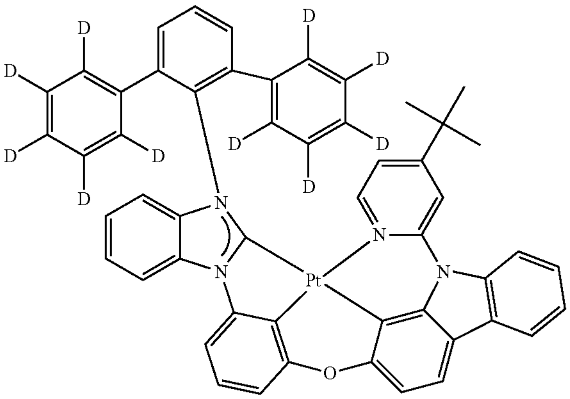

-continued

PBD-17

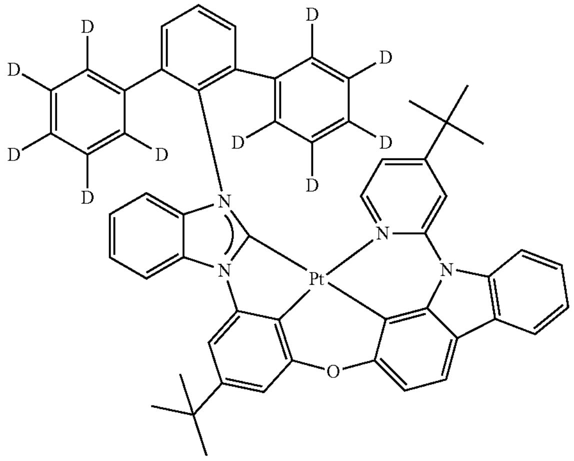

PBD-18

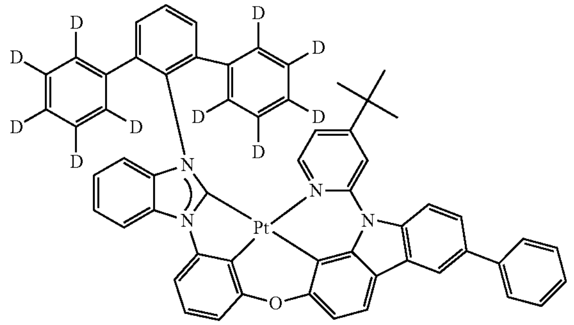

PBD-19

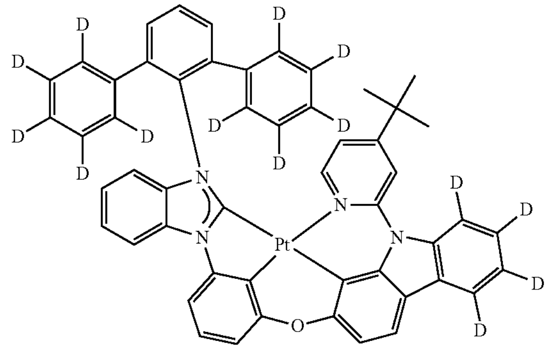

Referring to FIG. 3 to FIG. 6 again, the organic electroluminescence device ED according to an embodiment of the present disclosure will be further explained.

As described above, the emission layer EML includes the first host compound and the second host compound, different from each other, and the dopant compound according to an embodiment of the present disclosure. For example, the emission layer EML includes a first host compound represented by Formula 1, a second host compound represented by Formula 2, and a dopant compound including an organometallic complex containing Pt, Au or Cu as a central metal atom. In one or more embodiments, the emission layer EML includes a first host compound represented by Formula 1, a second host compound including a silyl group as a substituent and a heteroaryl group containing N, and a dopant compound represented by Formula 3.

In one or more embodiments, the organic electroluminescence device ED of an embodiment may include multiple emission layers. The multiple emission layers may be stacked one by one and provided. For example, the organic electroluminescence device ED including the multiple emission layers may emit white light. The organic electroluminescence device ED including the multiple emission layers may be an organic electroluminescence device of a tandem structure. If the organic electroluminescence device ED includes multiple emission layers, at least one emission layer EML may include all of the first host compound, the second host compound and the dopant compound.

In the organic electroluminescence device ED of an embodiment, the emission layer EML may further include anthracene derivatives, pyrene derivatives, fluoranthene derivatives, chrysene derivatives, dihydrobenzanthracene derivatives, or triphenylene derivatives. For example, the emission layer EML may further include anthracene derivatives or pyrene derivatives.

In the organic electroluminescence devices ED of embodiments, shown in FIG. 3 to FIG. 6, the emission layer EML may further include a host and a dopant, and the emission layer EML may further include a compound represented by Formula E-1 below. The compound represented by Formula E-1 below may be used as a fluorescence host material.

Formula E-1

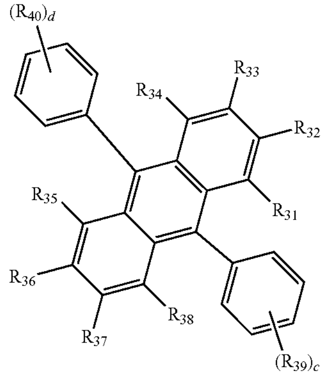

In Formula E-1, $R_{31}$ to $R_{40}$ may be each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. In one or more embodiments, $R_{31}$ to $R_{40}$ may be combined with an adjacent group to form a saturated hydrocarbon ring or an unsaturated hydrocarbon ring.

In Formula E-1, c and d may be each independently an integer of 0 to 5.

Formula E-1 may be represented by any one selected from among Formula E1 to Formula E18 below.

-continued
E1
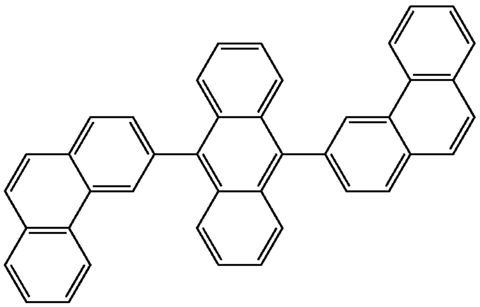
E2
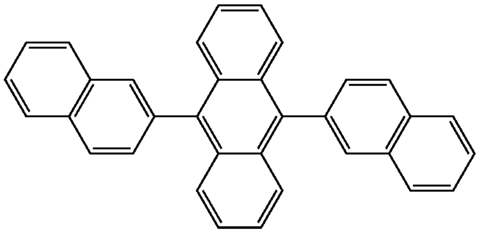
E3
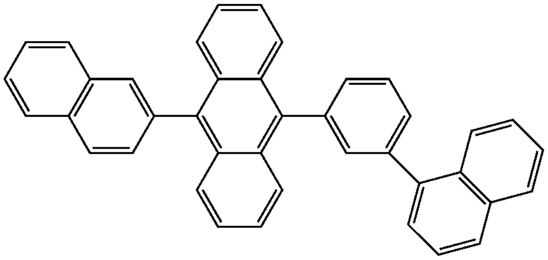
E4
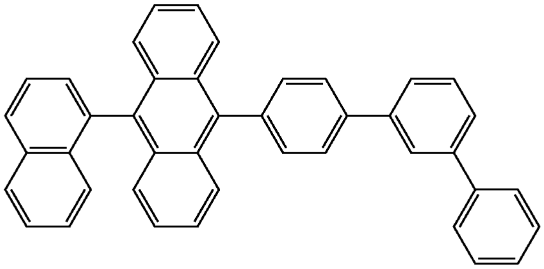
E5
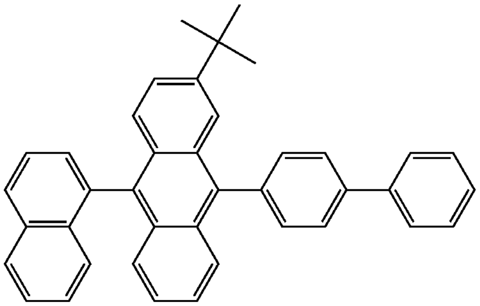
E6
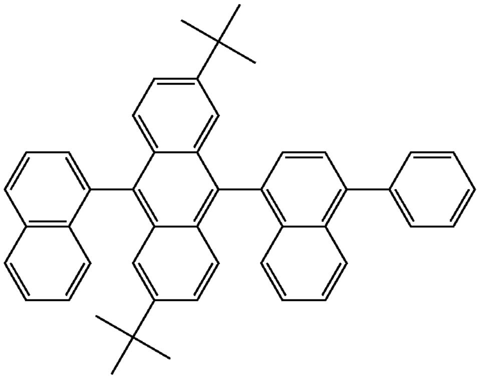
E7
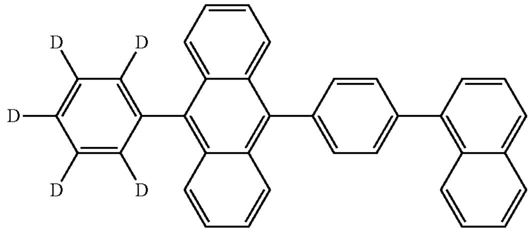
E8
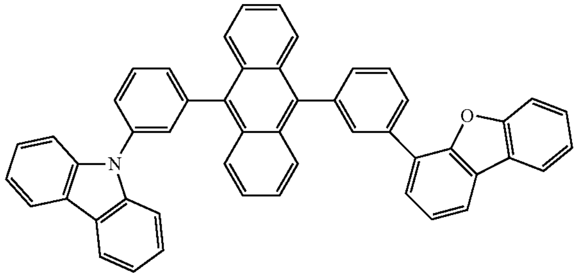
E9
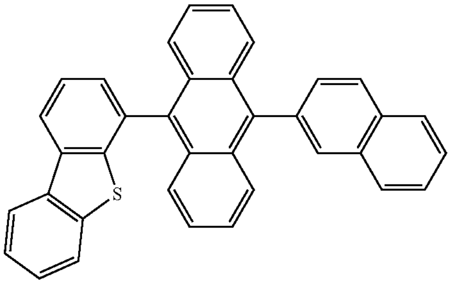
E10
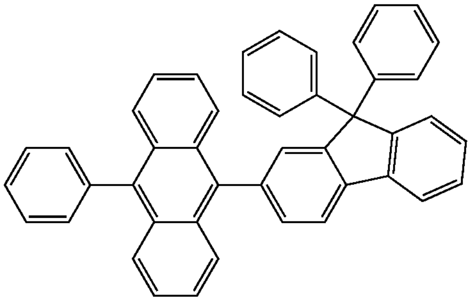

-continued
E11
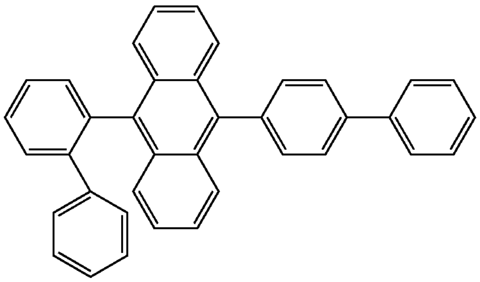
E12
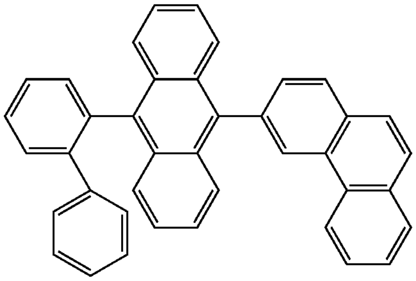
E13
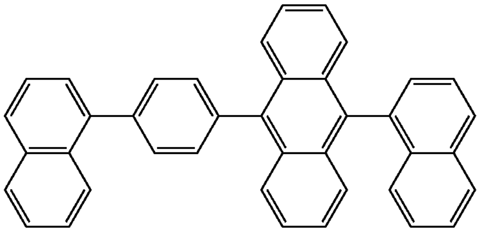
E14
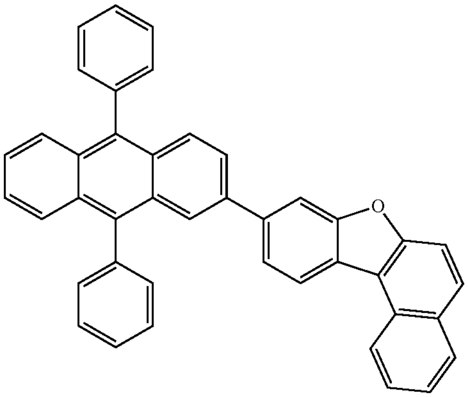
-continued
E15
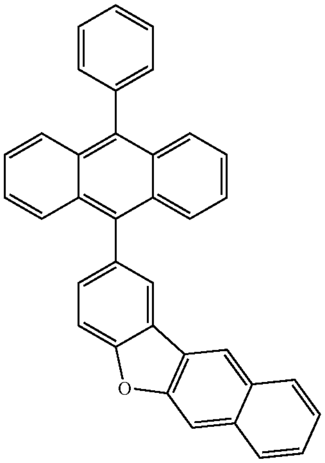
E16
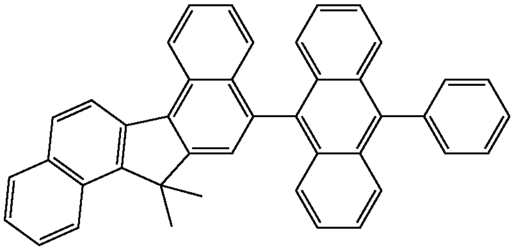
E17
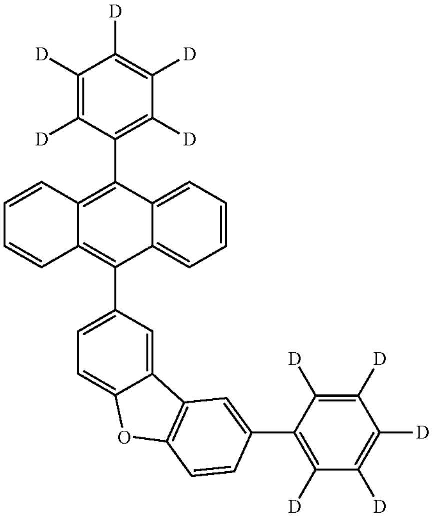

-continued

E18

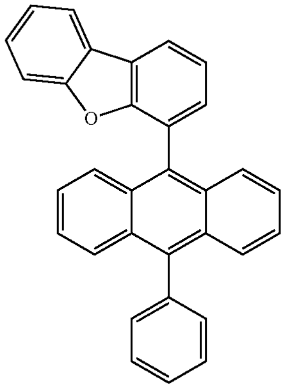

In an embodiment, the emission layer EML may further include a compound represented by Formula E-2a or Formula E-2b below. The compound represented by Formula E-2a or Formula E-2b may be used as a phosphorescence host material.

Formula E-2a

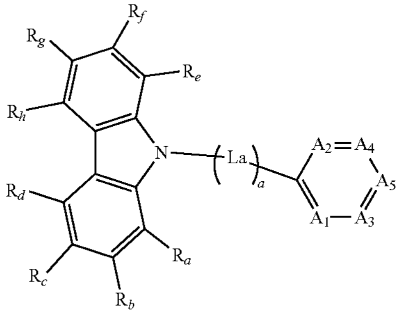

In Formula E-2b, a may be an integer of 0 to 10, La may be a direct linkage, a substituted or unsubstituted arylene group of 6 to 30 ring-forming carbon atoms, or a substituted or unsubstituted heteroarylene group of 2 to 30 ring-forming carbon atoms. In one or more embodiments, if a is an integer of 2 or more, multiple La may be each independently a substituted or unsubstituted arylene group of 6 to 30 ring-forming carbon atoms, or a substituted or unsubstituted heteroarylene group of 2 to 30 ring-forming carbon atoms.

In addition, in Formula E-2a, $A_1$ to $A_5$ may be each independently N or CRi. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to each other to form a ring. $R_a$ to $R_i$ may be combined with an adjacent group to form a hydrocarbon ring or a heterocycle including N, O, S, etc. as a ring-forming atom.

In one or more embodiments, in Formula E-2a, two or three selected from $A_1$ to $A_5$ may be N, and the remainder may be $CR_i$.

Formula E-2b $$(Cbz1)\!-\!(L_b)_b\!-\!(Cbz2)$$

In Formula E-2b, Cbz1 and Cbz2 may be each independently an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. b is an integer of 0 to 10, and if b is an integer of 2 or more, multiple $L_b$ may be each independently a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one selected from among the compounds in Compound Group E-2 below. However, the compounds shown in Compound Group E-2 below are only example illustrations, and the compound represented by Formula E-2a or Formula E-2b is not limited to the compounds represented in Compound Group E-2 below.

Compound Group E-2

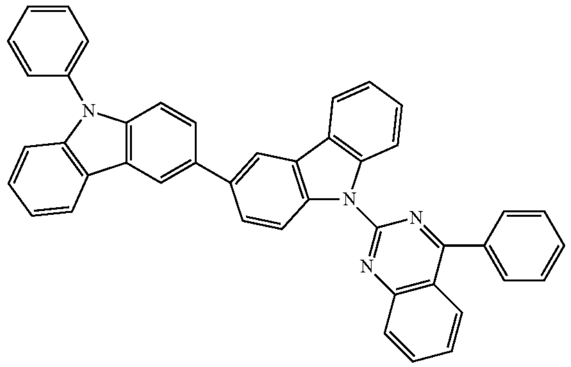

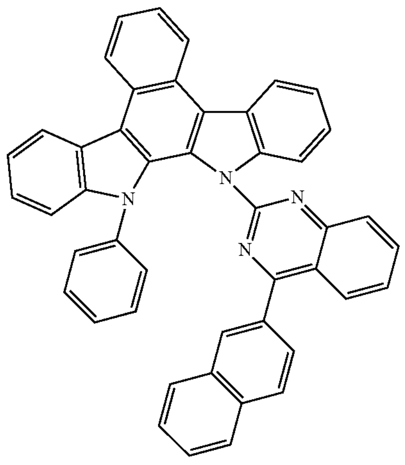

-continued
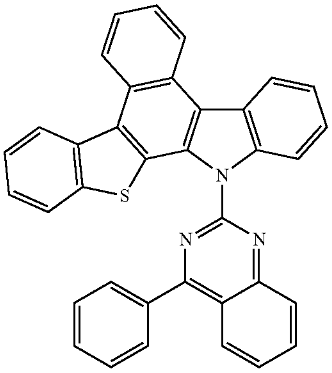
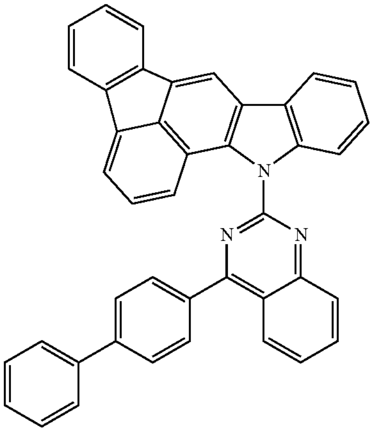
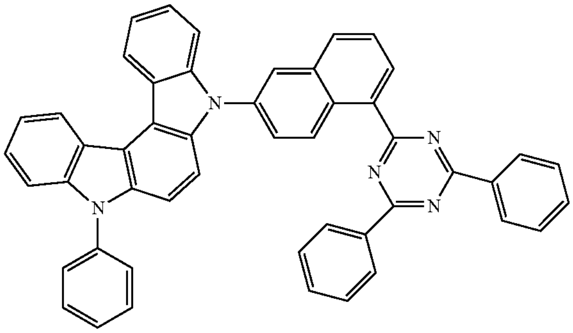
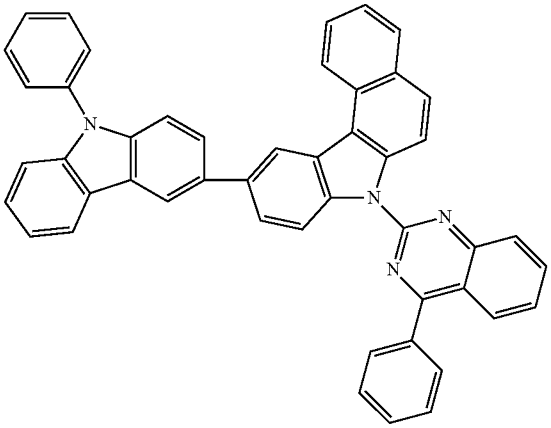
-continued
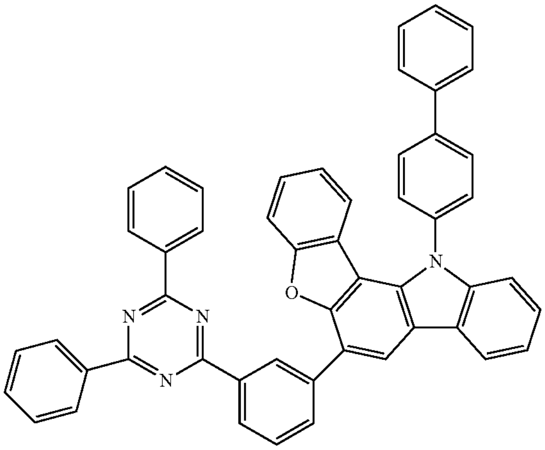
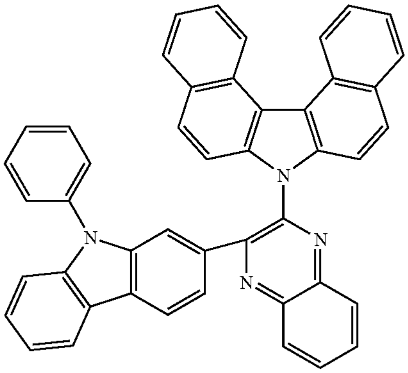
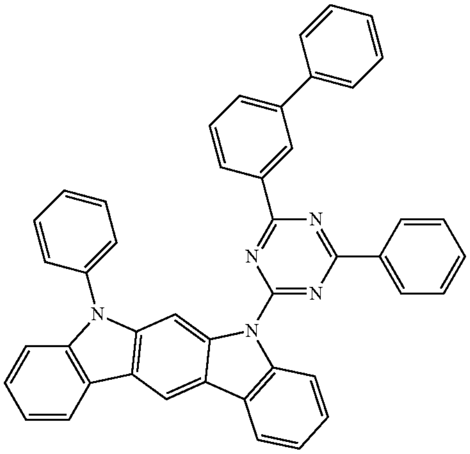
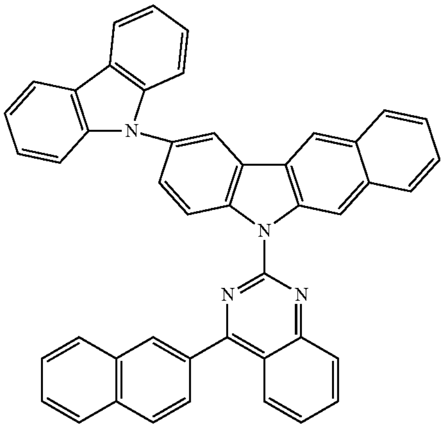

-continued
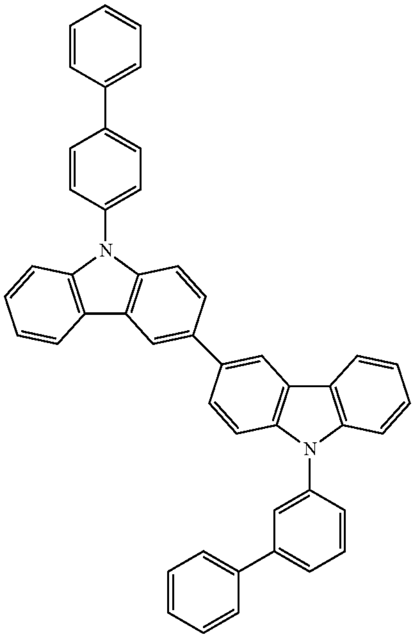
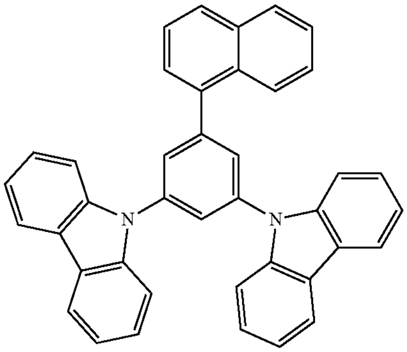
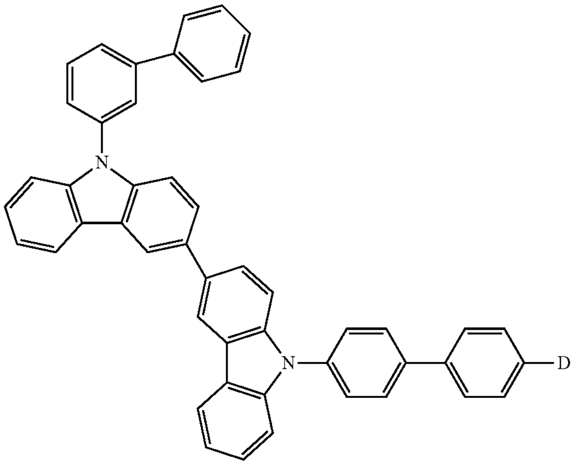
-continued
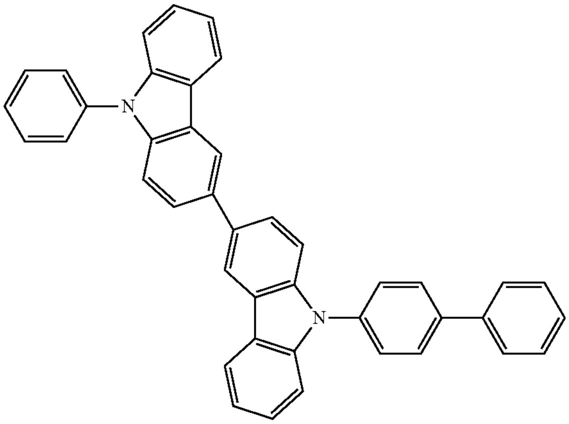
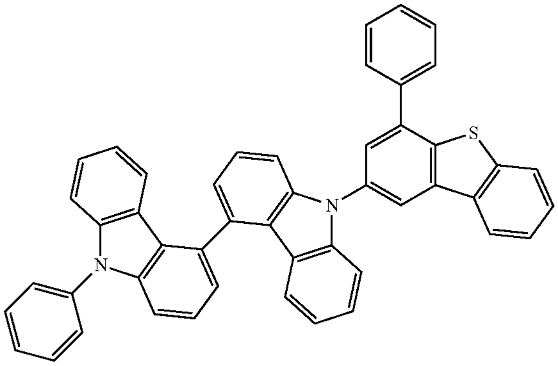
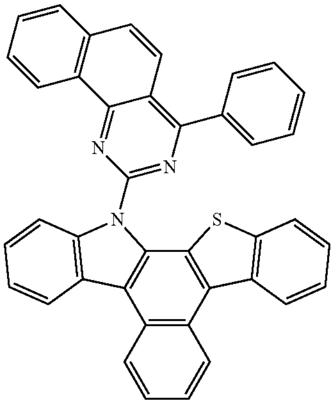
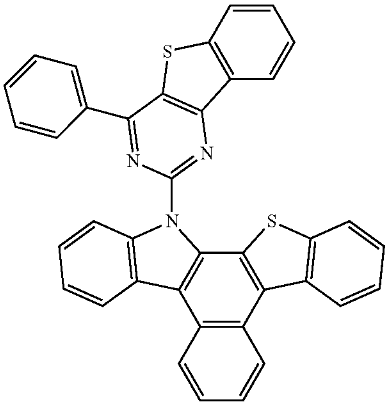

-continued

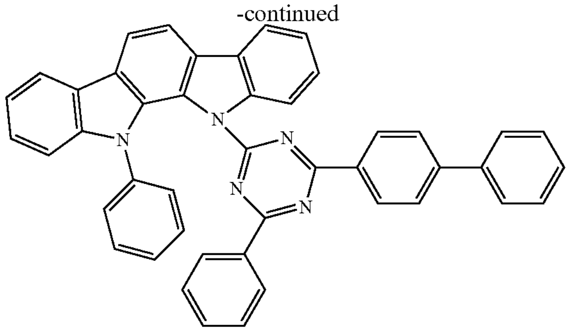

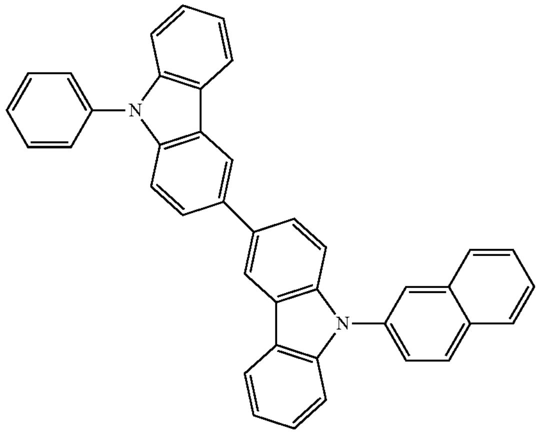

The emission layer EML may further include any suitable material generally used in the art as a host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and/or 1,3,5-tris(1-phenyl-1H-benzo[d]imidazole-2-yl)benzene (TPBi). However, an embodiment of the present disclosure is not limited thereto. For example, tris(8-hydroxyquinolino)aluminum ($Alq_3$), 4,4'-bis(N-carbazoyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenyamine (TCTA), 1,3,5-tris(1-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as the host material.

The emission layer EML may further include a compound represented by Formula M-a or Formula M-b below. The compound represented by Formula M-a or Formula M-b may be used as a phosphorescence dopant material.

[Formula M-a]

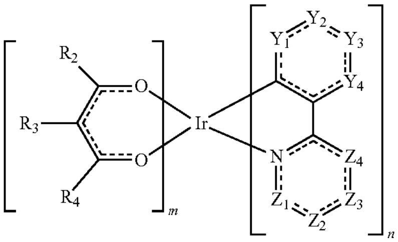

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m is 0 or 1, and n is 2 or 3. In Formula M-a, if m is 0, n is 3, and if m is 1, n is 2.

The compound represented by Formula M-a may be used as a red phosphorescence dopant or a green phosphorescence dopant.

The compound represented by Formula M-a may be represented by any one selected from among Compounds M-a1 to M-a5 below. However, Compounds M-a1 to M-a5 below are only example illustrations, and the compound represented by Formula M-a is not limited to the compounds represented by Compounds M-a1 to M-a5 below.

M-a1

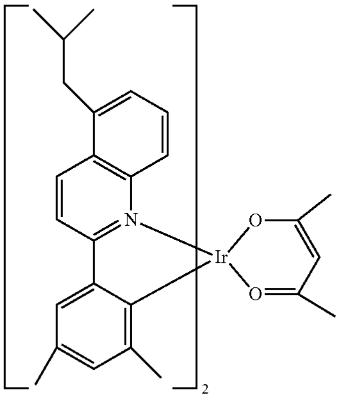

-continued

M-a2

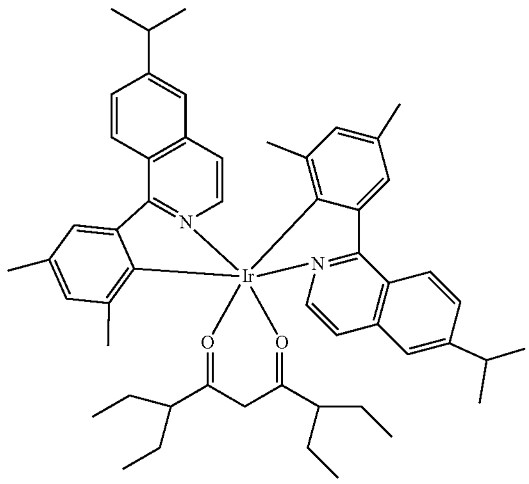

M-a3

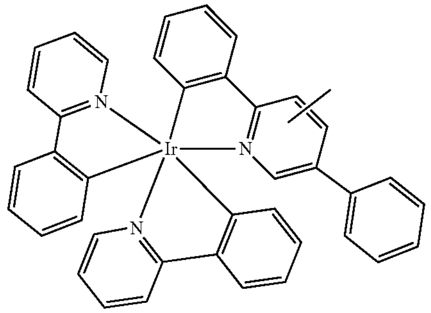

M-a4

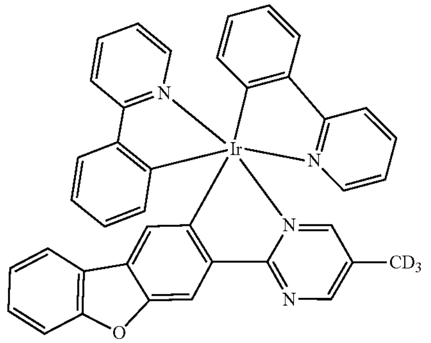

M-a5

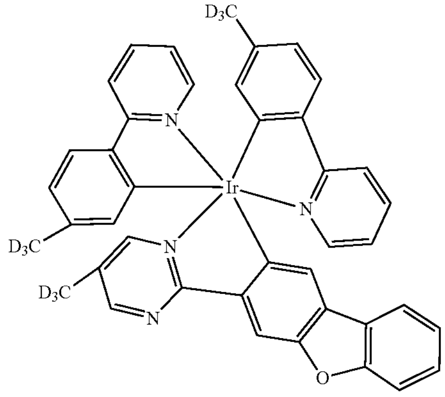

Compound M-a1 and Compound M-a2 may be used as red dopant materials, and Compound M-a3 to Compound M-a5 may be used as green dopant materials.

Formula M-b

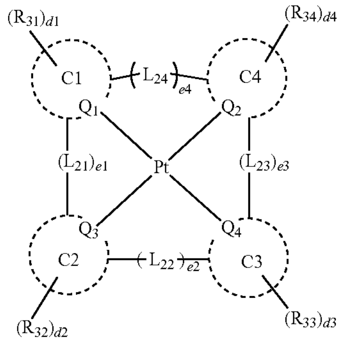

In Formula M-b, $Q_1$ to $Q_4$ are each independently C or N, C1 to C4 are each independently a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ are each independently a direct linkage,

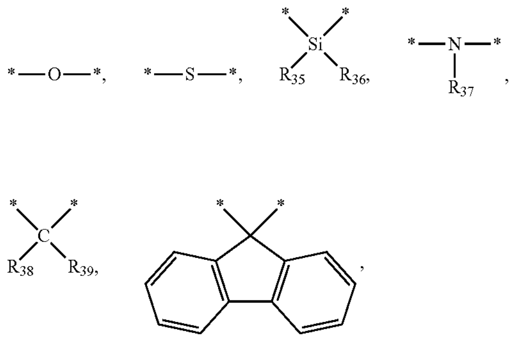

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and dl to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are only example illustrations, and the compound represented by Formula M-b is not limited to the compounds represented below.

-continued
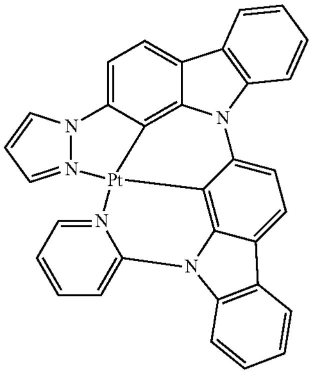
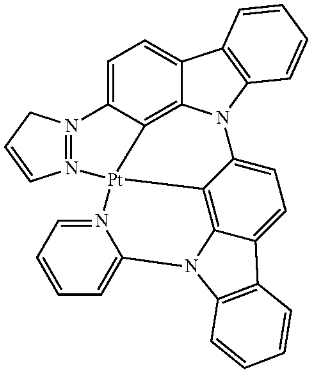
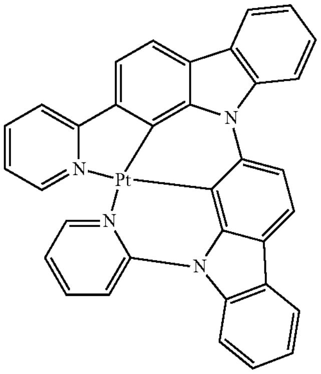
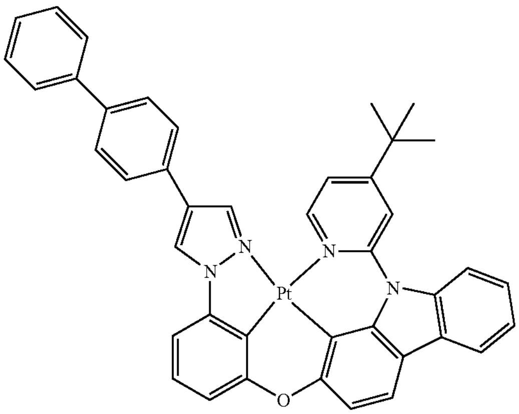
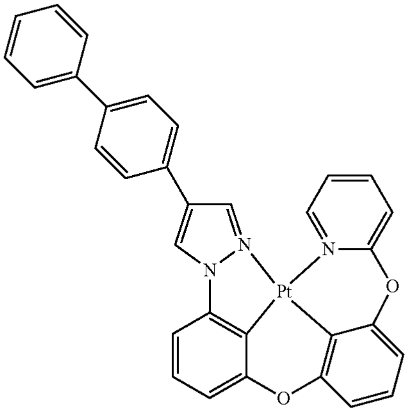
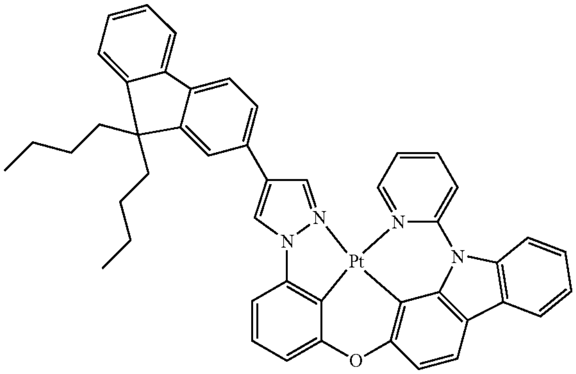
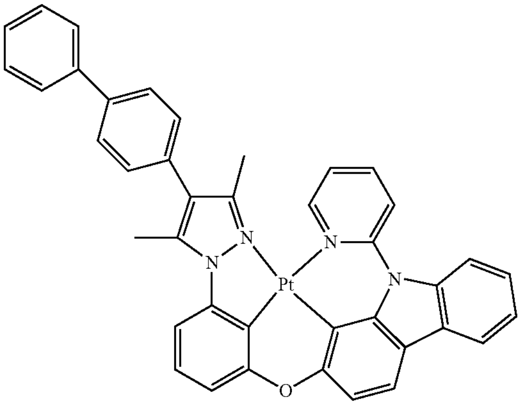
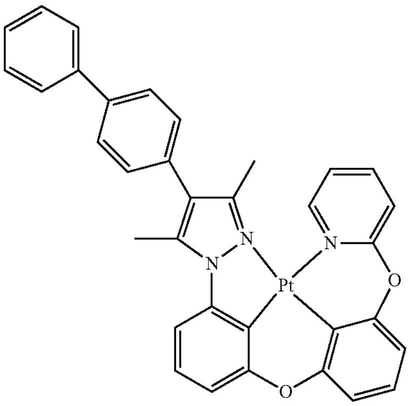

-continued

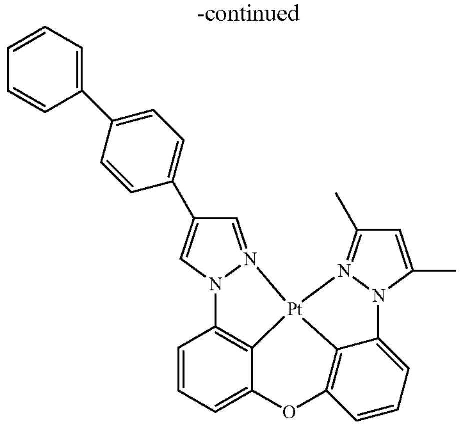

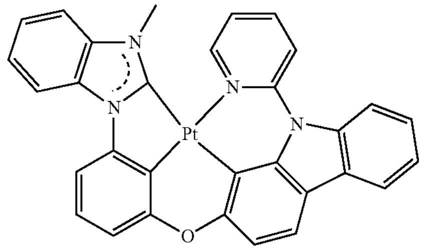

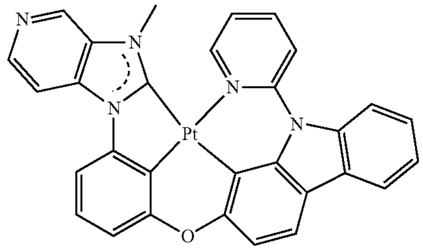

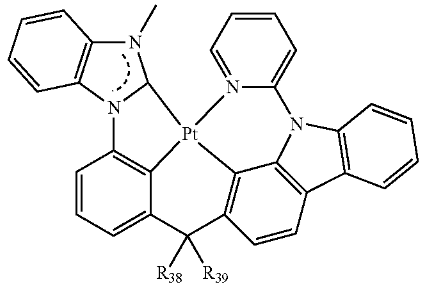

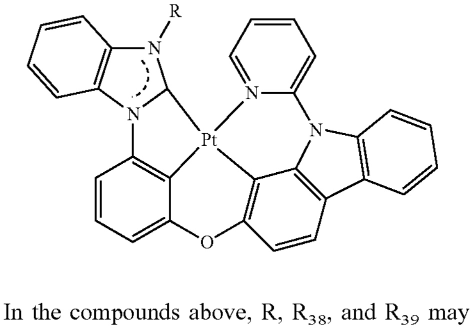

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may further include a compound represented by any one selected from among Formula F-a to Formula F-c below. The compounds represented by Formula F-a to Formula F-c below may be used as fluorescence dopant materials.

Formula F-a

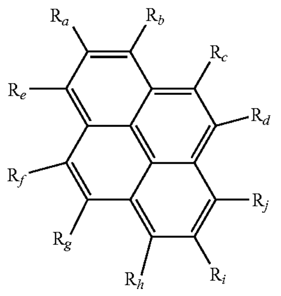

In Formula F-a, two selected from $R_a$ to $R_j$ may be each independently substituted with $*$—$NAr_1Ar_2$. The remainder not substituted with $*$—$NAr_1Ar_2$ among $R_a$ to $R_j$ may be each independently a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In $*$—$NAr_1Ar_2$, $Ar_1$ and $Ar_2$ may be each independently a substituted or unsubstituted aryl group of 6 to 30 ring-forming carbon atoms, or a substituted or unsubstituted heteroaryl group of 2 to 30 ring-forming carbon atoms. For example, at least one selected from among $Ar_1$ and $Ar_2$ may be a heteroaryl group including 0 or S as a ring-forming atom.

Formula F-b

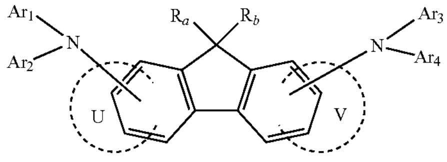

In Formula F-b, $R_a$ and $R_b$ may be each independently a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may be each independently a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may be each independently 0 or 1. For example, in Formula F-b, if the number of U or V is 1, one ring forms a fused ring at the designated part by U or V, and if the number of U or V is 0, a ring is not present at the designated part by U or V. In one or more embodiments, if the number of U is 0, and the number of V is 1, or if the number of U is 1, and the number of V is 0, a fused ring having the fluorene core of Formula F-b may be a ring compound with four rings. In addition, if the number of both U and V is 0, the fused ring of Formula F-b may be a ring compound with three rings. In addition, if the number of both U and V is 1, a fused ring having the fluorene core of Formula F-b may be a ring compound with five rings.

Formula F-c

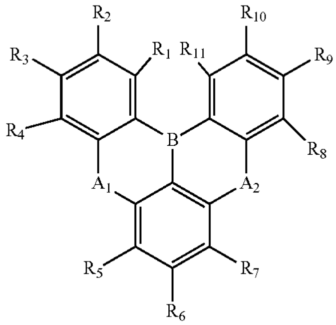

In Formula F-c, $A_1$ and $A_2$ may be each independently O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring.

In Formula F-c, $A_1$ and $A_2$ may be each independently combined with the substituents of an adjacent ring to form a fused ring. For example, if $A_1$ and $A_2$ are each independently $NR_m$, $A_1$ may be combined with $R_4$ or $R_5$ to form a ring. In addition, $A_2$ may be combined with $R_7$ or $R_8$ to form a ring.

In an embodiment, the emission layer EML may include as a suitable dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and/or 4,4'-bis[2-(4-(N,N-diphenylamino)phenyl)vinyl]biphenyl (DPAVBi)), perylene and/or derivatives thereof (for example, 2,5,8,11-tetra-t-butylperylene (TBP)), pyrene and/or derivatives thereof (for example, 1,1-dipyrene, 1,4-dipyrenylbenzene, and/or 1,4-bis(N,N-diphenylamino)pyrene), etc.

The emission layer EML may further include any suitable phosphorescence dopant material available in the art. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). In one or more embodiments, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), and/or platinum octaethyl porphyrin (PtOEP) may be used as the phosphorescence dopant. However, an embodiment of the present disclosure is not limited thereto.

In the organic electroluminescence devices ED of embodiments, shown in FIG. 3 to FIG. 6, the electron transport region ETR is provided on the emission layer EML. The electron transport region ETR may include at least one of an electron blocking layer HBL, an electron transport layer ETL or an electron injection layer EIL. However, an embodiment of the present disclosure is not limited thereto.

The electron transport region ETR may have a single layer formed using a single material, a single layer formed using multiple different materials, or a multilayer structure having multiple layers formed using multiple different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1 below.

Formula ET-1

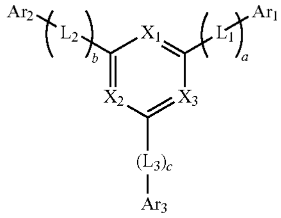

In Formula ET-1, at least one selected from among $X_1$ to $X_3$ is N, and the remainder are $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may be each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group of 6 to 30 ring-forming carbon atoms, or a substituted or unsubstituted heteroarylene group of 2 to 30 ring-forming carbon atoms. Meanwhile, in case where a to c are integers of 2 or more, $L_1$ to $L_3$ may be each independently a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound such as 2-(4-(N-phenylbenzoimidazol-1-yl)phenyl)-9,10-dinaphthylanthracene. However, an embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and/or mixtures thereof, without limitation.

In addition, the electron transport region ETR may include a metal halide such as LiF, NaCl, CsF, RbCl, RbI, CuI and/or KI, a metal in lanthanoides such as Yb, and/or a co-deposition material of the metal halide and the metal in lanthanoides. For example, the electron transport region ETR may include KI:Yb, RbI:Yb, etc., as the co-deposition material. In one or more embodiments, the electron transport region ETR may use a metal oxide such as $Li_2O$ and/or BaO, and/or 8-hydroxy-lithium quinolate (Liq). However, an embodiment of the present disclosure is not limited thereto. The electron transport region ETR may also be formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, and/or metal stearates.

The electron transport region ETR may include the above-described compounds of the electron transport region in at least one of an electron injection layer EIL, an electron transport layer ETL, and/or a hole blocking layer HBL.

If the electron transport region ETR includes an electron transport layer ETL, the thickness of the electron transport layer ETL may be from about 100 Å to about 1,000 Å, for example, from about 150 Å to about 500 Å. If the thickness of the electron transport layer ETL satisfies the above described range, suitable or satisfactory electron transport properties may be obtained without inducing substantial increase of a driving voltage. If the electron transport region ETR includes an electron injection layer EIL, the thickness of the electron injection layer EIL may be from about 1 Å to about 100 Å, from about 3 Å to about 90 Å. If the thickness of the electron injection layer EIL satisfies the above-described range, suitable or satisfactory electron injection properties may be obtained without substantial increase of a driving voltage.

The second electrode EL2 is provided on the electron transport region ETR. The second electrode EL2 may be a common electrode. The second electrode EL2 may be a cathode or an anode, but an embodiment of the present disclosure is not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds and/or mixtures thereof (for example, AgMg, AgYb, and/or MgAg). The second electrode EL2 may have a multilayered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, and/or oxides of the aforementioned metal materials.

In one or more embodiments, the second electrode EL2 may be coupled with an auxiliary electrode. If the second electrode EL2 is coupled with the auxiliary electrode, the resistance of the second electrode EL2 may decrease.

In one or more embodiments, on the second electrode EL2 of the light emitting element ED of an embodiment, a capping layer CPL may be further included. The capping layer CPL may include a multilayer or a single layer.

In an embodiment, the capping layer CPL may be an organic layer and/or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., and/or include an epoxy resin, and/or acrylate such as methacrylate. The capping layer CPL may include at least one of Compounds P1 to P5 below, but an embodiment of the present disclosure is not limited thereto.

P1

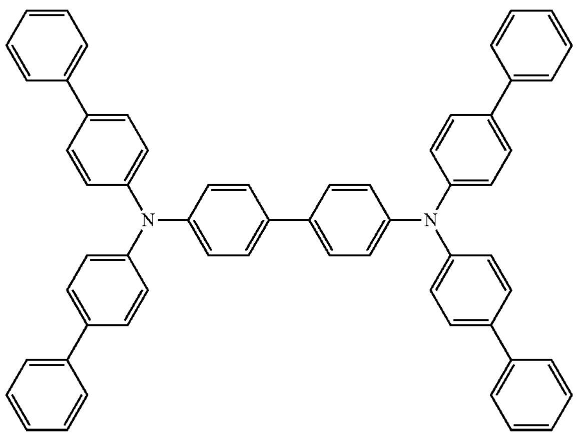

-continued

P2

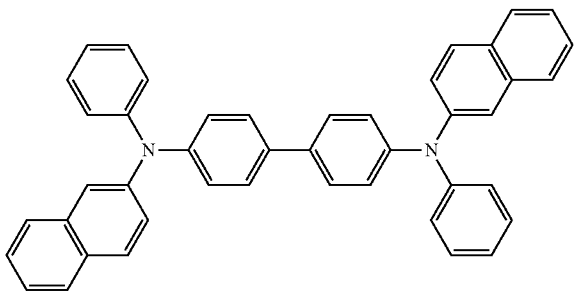

P3

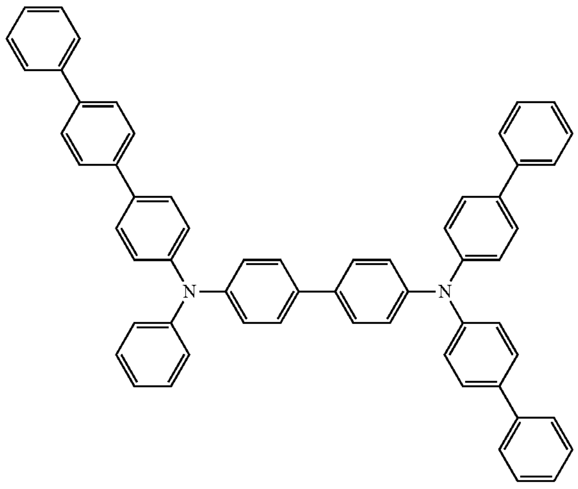

P4

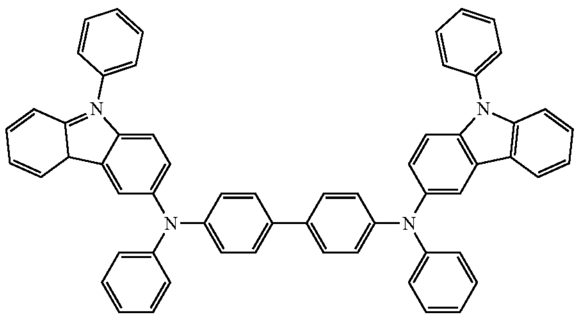

-continued

P5

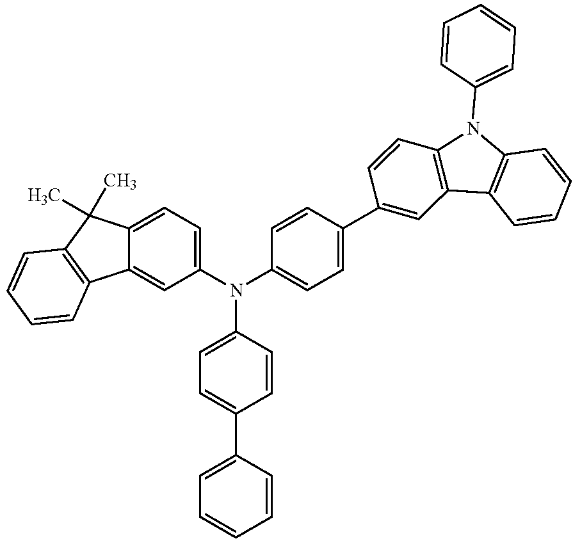

In one or more embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
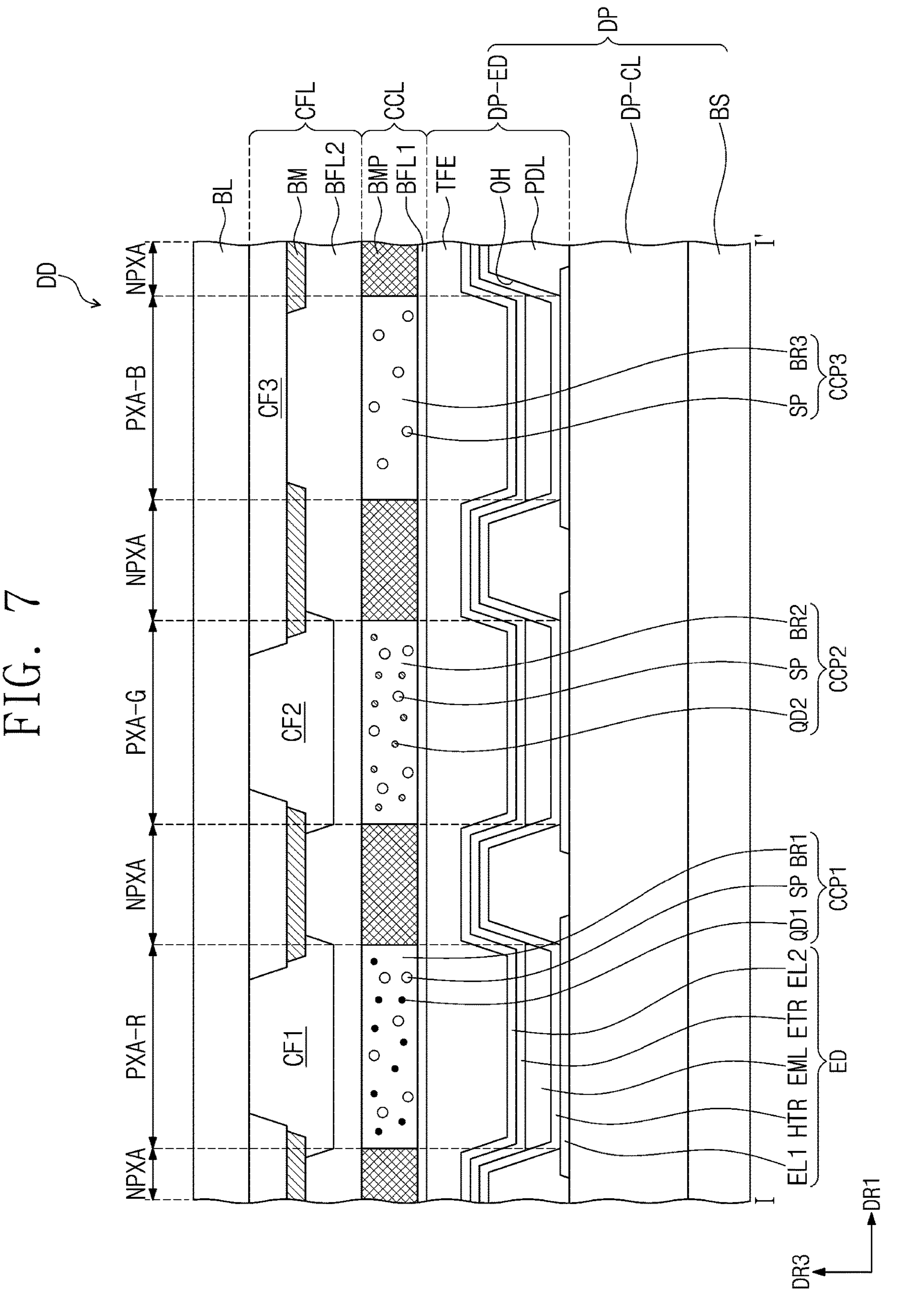
FIG. 7 is a cross-sectional view showing a display apparatus according to an embodiment of the present disclosure.
Figure 8:
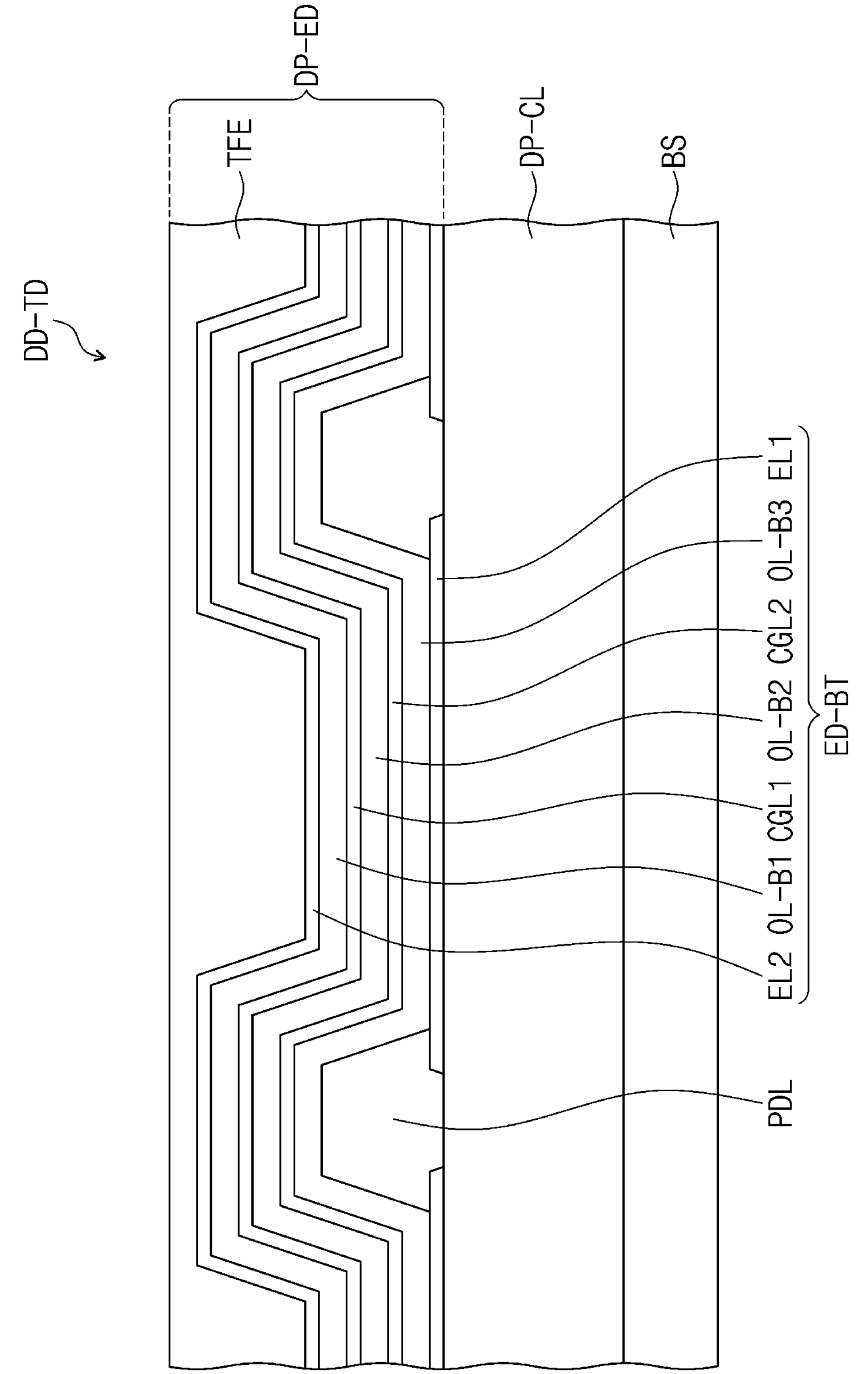
FIG. 8 is a cross-sectional view showing a display apparatus according to an embodiment of the present disclosure.

FIG. 7 and FIG. 8 are cross-sectional views of display apparatuses according to example embodiments. In the following description of the display apparatuses of embodiments referring to FIG. 7 and FIG. 8, the overlapping parts with the explanation on FIG. 1 to FIG. 6 will not be described again, and the different features will be explained chiefly.

Referring to FIG. 7, the display apparatus DD according to an embodiment may include a display panel DP including a display device layer DP-ED, a light controlling layer CCL on the display panel DP and a color filter layer CFL.

In an embodiment shown in FIG. 7, the display panel DP includes a base layer BS, a circuit layer DP-CL provided on the base layer BS and a display device layer DP-ED, and the display device layer DP-ED may include an organic electroluminescence device ED.

The organic electroluminescence device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In one or more embodiments, the same structures of the organic electroluminescence devices of FIG. 4 to FIG. 6 may be applied to the structure of the organic electroluminescence device ED shown in FIG. 7.

Referring to FIG. 7, the emission layer EML may be in an opening part OH defined in a pixel definition layer PDL. For example, the emission layer EML divided by the pixel definition layer PDL and correspondingly provided to each of luminous areas PXA-R, PXA-G and PXA-B may emit light in the same wavelength region. In the display apparatus DD of an embodiment, the emission layer EML may emit blue light. In one or more embodiments, different from the drawings, in an embodiment, the emission layer EML may be provided as a common layer for all luminous areas PXA-R, PXA-G and PXA-B.

The light controlling layer CCL may be on the display panel DP. The light controlling layer CCL may include a light converter. The light converter may be a quantum dot or a phosphor. The light converter may convert the wavelength of light provided and then emit. In one or more embodiments, the light controlling layer CCL may be a layer including a quantum dot and/or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be between the separated light controlling parts CCP1, CCP2 and CCP3, but an embodiment of the present disclosure is not limited thereto. In FIG. 7, the partition pattern BMP is shown not to be overlapped with the light controlling parts CCP1, CCP2 and CCP3, but at least a portion of the edge of the light controlling parts CCP1, CCP2 and CCP3 may be overlapped with the partition pattern BMP.

The light controlling layer CCL may include a first light controlling part CCP1 including a first quantum dot QD1 converting a first color light provided from the organic electroluminescence device ED into a second color light, a second light controlling part CCP2 including a second quantum dot QD2 converting the first color light into a third color light, and a third light controlling part CCP3 transmitting the first color light.

In an embodiment, the first light controlling part CCP1 provides red light which is the second color light, and the second light controlling part CCP2 may provide green light which is the third color light. The third color controlling part CCP3 may transmit and provide blue light which is the first color light provided from the organic electroluminescence device ED. For example, the first quantum dot QD1 may be a red quantum dot, and the second quantum dot QD2 may be a green quantum dot. The emission layer EML may include a quantum dot material. The core of the quantum dot may be selected from a II-VI group compound, a III-VI group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-V group compound may include a binary compound such as $In_2S_3$, and/or $In_2Se_3$, a ternary compound such as $InGaS_3$, and/or $InGaSe_3$, or optional combinations thereof.

The I-III-VI group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, and/or a quaternary compound such as $AgInGaS_2$, and/or $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. Meanwhile, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe; and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound or the quaternary compound may be present at uniform (e.g., substantially uniform) concentration in a particle or may be present at a partially different concentration distribution state in the same particle. In addition, a core/shell structure in which one quantum dot wraps another quantum dot may be possible. The interface of the core and the shell may have a concentration gradient in which the concentration of an element present in the shell is decreased along a direction toward the center of the core.

In some embodiments, the quantum dot may have the above-described core-shell structure including a core including a nanocrystal and a shell wrapping the core. The shell of the quantum dot may play the role of a protection layer for preventing or reducing the chemical deformation of the core to maintain semiconductor properties and/or a charging layer for imparting the quantum dot with electrophoretic properties. The shell may have a single layer or a multilayer. The interface of the core and the shell may have a concentration gradient in which the concentration of an element present in the shell is decreased along a direction toward the center of the core. Examples of the shell of the quantum dot may include a metal and/or non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, and/or a ternary compound such as $MgAl_2O_4$, $CoFe_2O_4$, $NiFe_2O_4$ and/or $CoMn_2O_4$, but an embodiment of the present disclosure is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The quantum dot may have a full width of half maximum (FWHM) of emission wavelength spectrum of about 45 nm or less, for example, about 40 nm or less, for example, about 30 nm or less. Within this range, color purity or color reproducibility may be improved. In addition, light emitted via such quantum dot is emitted in all directions, and light view angle properties may be improved.

In addition, the shape of the quantum dot may be generally used shapes in the art, without specific limitation. For example, the shape of spherical, pyramidal, multi-arm, and/ or cubic nanoparticle, nanotube, nanowire, nanofiber, nanoplate particle, etc. may be used.

The quantum dot may control the color of light emitted according to the particle size, and accordingly, the quantum dot may have various suitable emission colors such as blue, red and green.

In addition, the light controlling layer CCL may further include a scatterer SP (e.g., a light scatterer SP). The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include at least one selected from among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

Each of the first light controlling part CCP1, the second light controlling part CCP2, and the third light controlling part CCP3 may include base resins BR1, BR2 and BR3, respectively, dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatter SP dispersed in the third base resin BR3. The base resins BR1, BR2 and BR3 are mediums in which the quantum dots QD1 and QD2 and the scatterer SP are dispersed, and may be composed of various suitable resin compositions which may be generally referred to as a binder. For example, the base resins BR1, BR2 and BR3 may be acrylic resins, urethane-based resins, silicone-based resins, epoxy-based resins, etc. The base resins BR1, BR2 and BR3 may be transparent resins. In an embodiment, the first base resin BR1, the second base resin BR2 and the third base resin BR3 may be the same or different from each other.

The light controlling layer CCL may include a barrier layer BFL1. The barrier layer BFL1 may play the role of blocking or reducing the penetration of moisture and/or oxygen (hereinafter, may be referred to as "humidity/oxygen"). The barrier layer BFL1 may be on the light controlling parts CCP1, CCP2 and CCP3 to block or reduce the exposure of the light controlling parts CCP1, CCP2 and CCP3 to humidity/oxygen. In one or more embodiments, the barrier layer BFL1 may cover the light controlling parts CCP1, CCP2 and CCP3. In addition, a barrier layer BFL2 may be provided between the light controlling parts CCP1, CCP2 and CCP3 and a color filter layer CFL.

Barrier layers BFL1 and BFL2 may include at least one inorganic layer. In one or more embodiments, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, and/or a metal thin film securing light transmittance. In one or more embodiments, the barrier layers BFL1 and BFL2 may further include an organic layer. The barrier layers BFL1 and BFL2 may be composed of a single layer or multiple layers.

In the display apparatus DD of an embodiment, the color filter layer CFL may be on the light controlling layer CCL. For example, the color filter layer CFL may be directly on the light controlling layer CCL. In this case, the barrier layer BFL2 may be omitted.

The color filter layer CFL may include a light blocking part BM and filters CF-B, CF-G and CF-R. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment and/or dye. The first filter CF1 may include a red pigment and/or dye, the second filter CF2 may include a green pigment and/or dye, and the third filter CF3 may include a blue pigment and/or dye. In one or more embodiments, an embodiment of the present disclosure is not limited thereto, but the third filter CF3 may not include a pigment and/or dye. The third filter CF3 may include a polymer photosensitive resin and not include a pigment and/or dye. The third filter CF3 may be transparent. The third filter CF3 may be formed using a transparent photosensitive resin.

In addition, in an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent or reduce light leakage phenomenon and divide the boundaries among adjacent filters CF1, CF2 and CF3. In addition, in an embodiment, the light blocking part BM may be formed as a blue filter.

The first to third filters CF1, CF2 and CF3 may correspond to the red luminous area PXA-R, the green luminous area PXA-G, and the blue luminous area PXA-B, respectively.

A base substrate BL may be on the color filter layer CFL. The base substrate BL may be a member which provides a base surface in which the color filter layer CFL, the light controlling layer CCL, and/or the like are included. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In addition, in an embodiment, the base substrate BL may be omitted.

FIG. 8 is a cross-sectional view illustrating a part of a display apparatus according to an embodiment. FIG. 8 illustrates a cross-sectional view of a part corresponding to the display panel DP of FIG. 7. In the display apparatus DD-TD of an embodiment, the organic electroluminescence device ED-BT may include a plurality of luminous structures OL-B1, OL-B2, and OL-B3. The organic electroluminescence device ED-BT may include a first electrode EL1 and a second electrode EL2 which face each other, and the plurality of luminous structures OL-B1, OL-B2, and OL-B3 sequentially stacked in the thickness direction between the first electrode EL1 and the second electrode EL2. The luminous structures OL-B1, OL-B2, and OL-B3 each may include an emission layer EML (FIG. 7) and a hole transport region HTR and an electron transport region ETR with the emission layer EML (FIG. 7) therebetween.

In one or more embodiments, the organic electroluminescence device ED-BT included in the display apparatus DD-TD of an embodiment may be an organic electroluminescence device having a tandem structure and including a plurality of emission layers.

In an embodiment illustrated in FIG. 8, each light emitted from each of the luminous structures OL-B1, OL-B2, and OL-B3 may be blue light. However, the embodiment of the present disclosure is not limited thereto, and the wavelength regions of light emitted from the luminous structures OL-B1, OL-B2 and OL-B3 may be different one another. For example, the organic electroluminescence device ED-BT including the multiple luminous structures OL-B1, OL-B2 and OL-B3 emitting light in different wavelength regions may emit white light.

Between neighboring luminous structures OL-B1, OL-B2 and OL-B3, a charge generating layer CGL may be included. The charge generating layer CGL may include a p-type charge generating layer and/or an n-type charge generating layer.

Figure 9:
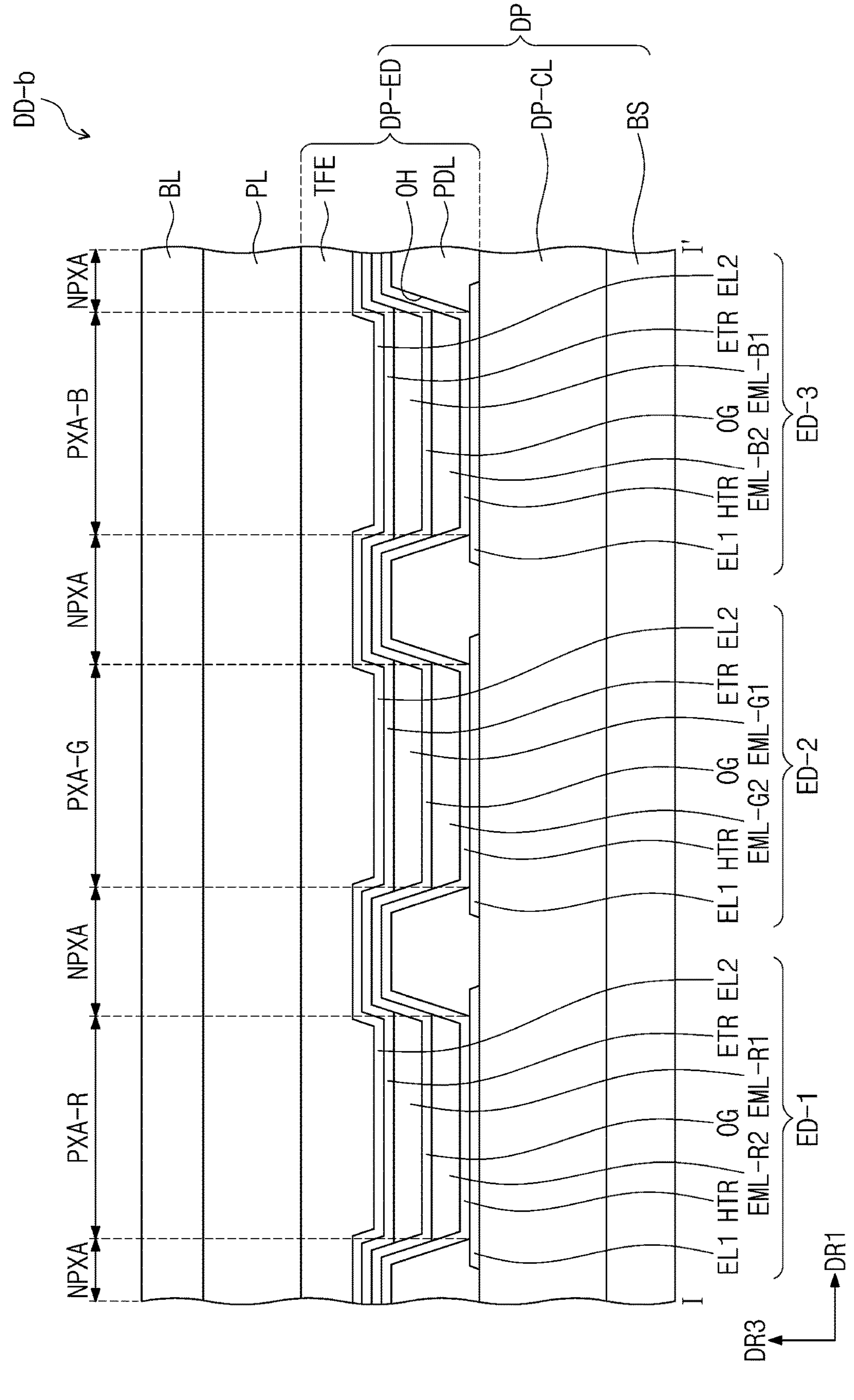
FIG. 9 is a cross-sectional view showing a display apparatus according to an embodiment of the present disclosure.
Figure 10:
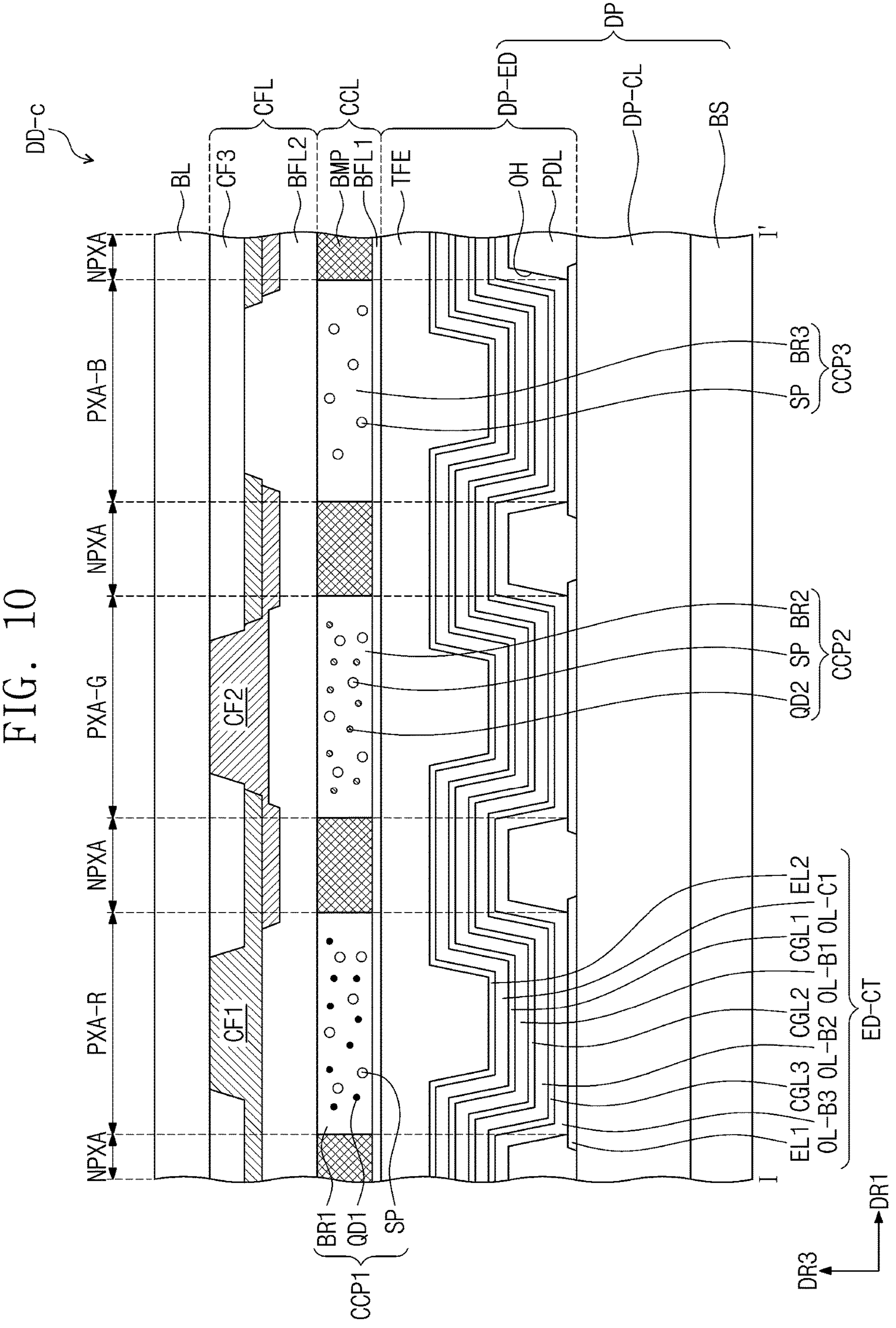
FIG. 10 is a cross-sectional view showing a display apparatus according to an embodiment of the present disclosure.

FIG. 9 is a cross-sectional view showing a display apparatus according to an embodiment of the present disclosure. FIG. 10 is a cross-sectional view showing a display apparatus according to an embodiment of the present disclosure.

Referring to FIG. 9, a display apparatus DD-b according to an embodiment may include light emitting devices ED-1, ED-2 and ED-3, formed by stacking two emission layers. Compared to the display apparatus DD of an embodiment, shown in FIG. 2, an embodiment shown in FIG. 9 is different in that the first to third light emitting devices ED-1, ED-2 and ED-3 include two emission layers stacked in a thickness direction, each. In the first to third light emitting devices ED-1, ED-2 and ED-3, two emission layers may emit light in substantially the same wavelength region.

The first light emitting device ED-1 may include a first red emission layer EML-R1 and a second red emission layer EML-R2. The second light emitting device ED-2 may include a first green emission layer EML-G1 and a second green emission layer EML-G2. In some embodiments, the third light emitting device ED-3 may include a first blue emission layer EML-B1 and a second blue emission layer EML-B2. Between the first red emission layer EML-R1 and the second red emission layer EML-$R_2$, between the first green emission layer EML-G1 and the second green emission layer EML-G2, and between the first blue emission layer EML-B1 and the second blue emission layer EML-B2, an emission auxiliary part OG may be disposed.

The emission auxiliary part OG may include a single layer or a multilayer. The emission auxiliary part OG may include a charge generating layer. For example, the emission auxiliary part OG may include an electron transport region, a charge generating layer, and a hole transport region stacked in order. The emission auxiliary part OG may be provided as a common layer in all of the first to third light emitting devices ED-1, ED-2 and ED-3. However, an embodiment of the present disclosure is not limited thereto, and the emission auxiliary part OG may be patterned and provided in an opening part OH defined in a pixel definition layer PDL.

The first red emission layer EML-R1, the first green emission layer EML-G1 and the first blue emission layer EML-B1 may be disposed between the electron transport region ETR and the emission auxiliary part OG. The second red emission layer EML-R2, the second green emission layer EML-G2 and the second blue emission layer EML-B2 may be disposed between the emission auxiliary part OG and the hole transport region HTR.

For example, the first light emitting device ED-1 may include a first electrode EL1, a hole transport region HTR, a second red emission layer EML-R2, an emission auxiliary part OG, a first red emission layer EML-R1, an electron transport region ETR, and a second electrode EL2, stacked in order (in the stated order). The second light emitting device ED-2 may include a first electrode EL1, a hole transport region HTR, a second green emission layer EML-G2, an emission auxiliary part OG, a first green emission layer EML-G1, an electron transport region ETR, and a second electrode EL2, stacked in order (in the stated order). The third light emitting device ED-3 may include a first electrode EL1, a hole transport region HTR, a second blue emission layer EML-B2, an emission auxiliary part OG, a first blue emission layer EML-B1, an electron transport region ETR, and a second electrode EL2, stacked in order (in the stated order).

In some embodiments, an optical auxiliary layer PL may be on a display device layer DP-ED. The optical auxiliary layer PL may include a polarization layer. The optical auxiliary layer PL may be on a display panel DP and may control reflected light at the display panel DP by external light. The optical auxiliary layer PL may not be provided with or in the display apparatus according to an embodiment.

At least one emission layer included in the display apparatus DD-b of an embodiment, shown in FIG. 9, may include the first host compound, the second host compound and the dopant compound according to an embodiment.

Different from FIG. 8 and FIG. 9, a display apparatus DD-c in FIG. 10 is shown to include four light emitting structures OL-B1, OL-B2, OL-B3 and OL-C1. A light emitting device ED-CT may include oppositely disposed first electrode EL1 and second electrode EL2, and first to fourth light emitting structures OL-B1, OL-B2, OL-B3 and OL-C1 stacked in order (in the stated order) in a thickness direction between the first electrode EL1 and the second electrode EL2. Between the first to fourth light emitting structures OL-B1, OL-B2, OL-B3 and OL-C1, charge generating layers CGL1, CGL2 and CGL3 may be disposed. Among the four light emitting structures, the first to third light emitting structures OL-B1, OL-B2 and OL-B3 emit blue light, and the fourth light emitting structure OL-C1 may emit green light. However, an embodiment of the present disclosure is not limited thereto, and the first to fourth light emitting structures OL-B1, OL-B2, OL-B3 and OL-C1 may emit different wavelengths of light.

Charge generating layers CGL1, CGL2 and CGL3 disposed among neighboring light emitting structures OL-B1, OL-B2, OL-B3 and OL-C1, respectively, may include a p-type or kind charge generating layer and/or an n-type or kind charge generating layer.

In at least one selected from among the light emitting structures OL-B1, OL-B2, OL-B3 and OL-C1, included in the display apparatus DD-c of an embodiment, the first host compound, the second host compound and the dopant compound according to an embodiment may be included. For example, at least one selected from among the first to third light emitting structures OL-B1, OL-B2, and OL-B3 may include the first host compound, the second host compound and the dopant compound according to an embodiment.

Figure 11:
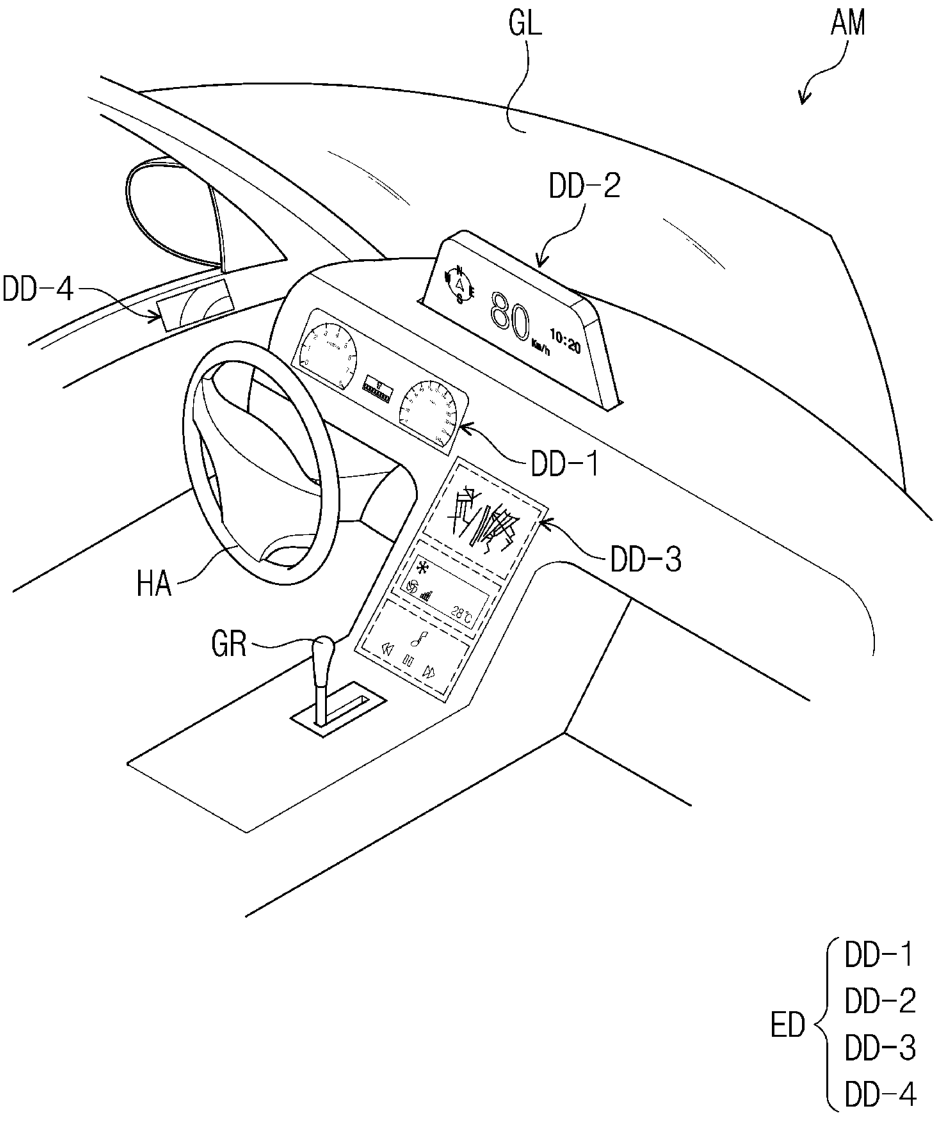
FIG. 11 is a perspective view schematically illustrating an electronic apparatus including a display apparatus according to an embodiment of the present disclosure.

FIG. 11 is a perspective view schematically illustrating an electronic apparatus including a display apparatus according to an embodiment of the present disclosure. FIG. 11 exemplarily illustrates an electronic apparatus including display apparatuses for a vehicle.

Referring to FIG. 11, the electronic apparatus ED of an embodiment may include display apparatuses DD-1, DD-2, DD-3, and DD-4 for a vehicle AM. FIG. 11 illustrates the first to fourth display apparatuses DD-1, DD-2, DD-3, and DD-4 as display apparatuses for a vehicle AM disposed inside the vehicle AM. FIG. 11 illustrates a vehicle, but this is an example, and the first to fourth display apparatuses DD-1, DD-2, DD-3, and DD-4 may be disposed in various transportation means such as bicycles, motorcycles, trains, ships, and airplanes. At least one among the first to fourth display apparatuses DD-1, DD-2, DD-3, and DD-4 may include the same configuration as the display apparatuses DD, DD-a, DD-b, and DD-c as described with reference to FIG. 1, FIG. 2, and FIGS. 7 to 10.

In an embodiment, at least one among the first to fourth display apparatuses DD-1, DD-2, DD-3, and DD-4 may include the light emitting device ED as described with reference to FIGS. 3 to 6. The first to fourth display apparatuses DD-1, DD-2, DD-3, and DD-4 may each independently include a plurality of light emitting devices ED, and each of the light emitting devices ED may include a first electrode EL1, a hole transport region HTR disposed on the upper portion of the first electrode EL1, an emission layer EML disposed on the upper portion of the hole transport region HTR, an electron transport region ETR disposed on the upper portion of the emission layer EML, and a second electrode disposed on the upper portion of the electron transport region ETR. Also, the emission layer EML may include the above-described polycyclic compound represented by Formula 1 of an embodiment. Accordingly, the electronic apparatus ED of an embodiment may exhibit improved image quality.

Referring to FIG. 11, the vehicle AM may include a steering wheel HA and a gear GR for driving the vehicle AM, and a front window GL may be disposed so as to face the driver.

The first display apparatus DD-1 may be disposed in a first region overlapping the steering wheel HA. For example, the first display apparatus DD-1 may be a digital cluster for displaying first information of the vehicle AM. The first information may include a scale for indicating a driving speed of the vehicle AM, a scale for indicating an engine speed (that is, revolutions per minute (RPM)), an image for indicating a fuel state, etc. A first scale and a second scale may be indicated as a digital image.

The second display apparatus DD-2 may be disposed in a second region facing the driver's seat and overlapping the front window WD. The driver's seat may be a seat in which the steering wheel HA is disposed. For example, the second display apparatus DD-2 may be a head up display (HUD) for displaying second information of the vehicle AM. The second display apparatus DD-2 may be optically transparent. The second information may include digital numbers DN for indicating a driving speed, and may further include information such as the current time.

The third display apparatus DD-3 may be disposed in a third region adjacent to the gear GR. For example, the third display apparatus DD-3 may be disposed between the driver's seat and the passenger seat and may be a center information display (CID) for a vehicle for displaying third information. The passenger seat may be a seat spaced apart from the driver's seat with the gear GR disposed therebetween. The third information may include information about traffic (e.g., navigation information), playing music or radio, playing video, temperatures inside the vehicle AM, etc.

The fourth display apparatus DD-4 may be spaced apart from the steering wheel HA and the gear GR, and may be disposed in a fourth region adjacent to the side of the vehicle AM. For example, the fourth display apparatus DD-4 may be a digital side-view mirror for displaying fourth information. The fourth display apparatus DD-4 may display an image outside the vehicle AM taken by a camera module CM disposed outside the vehicle AM. The fourth information may include an image outside the vehicle AM.

The above-described first to fourth information may be examples, and the first to fourth display apparatuses DD-1, DD-2, DD-3, and DD-4 may further display information about the inside and outside of the vehicle. The first to fourth information may include different information. However, the embodiment of the the present disclosure is not limited thereto, and a part of the first to fourth information may include the same information as one another.

Hereinafter, the subject matter of the present disclosure will be further explained referring to embodiments and comparative embodiments. The following embodiments are only example illustrations to assist the understanding of the subject matter of the present disclosure, and the scope of the present disclosure is not limited thereto.

SYNTHETIC EXAMPLES

The first host compound, the second host compound and the dopant compound according to an embodiment of the present disclosure may be synthesized, for example, as follows. However, the synthetic method of the compound according to an embodiment of the present disclosure is not limited thereto.

1. Synthesis of Compound HT-01

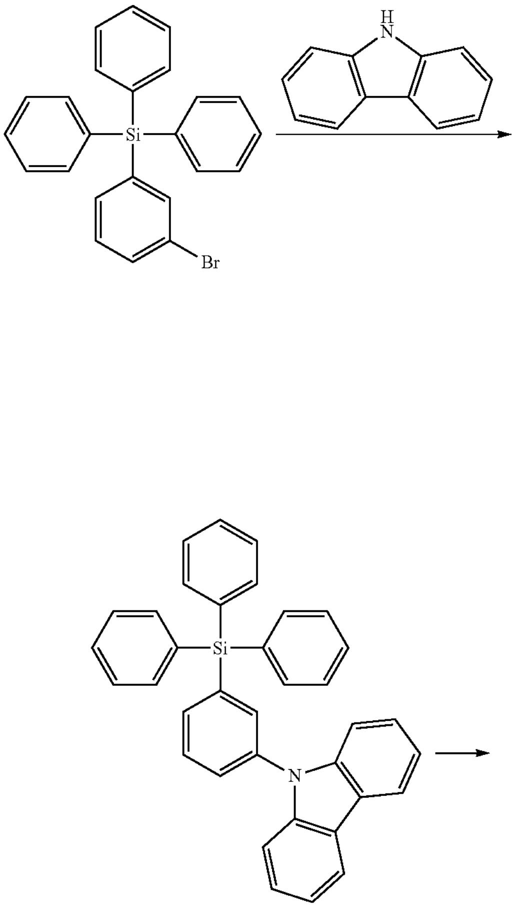

A-1

-continued

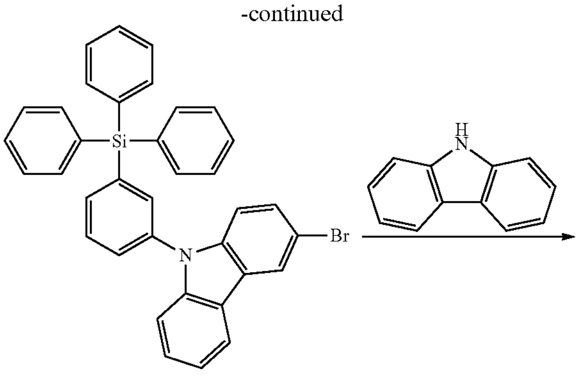

A-2

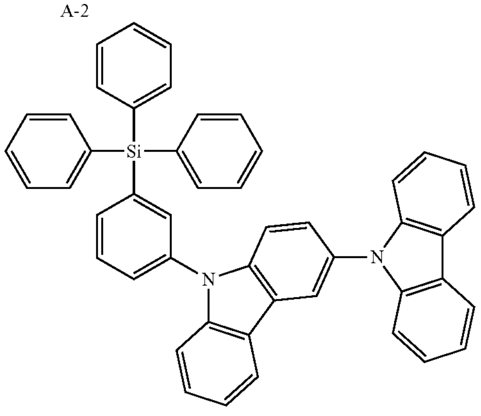

HT-01

Synthesis of Intermediate A-1

To a round-bottom flask, (3-bromophenyl)triphenylsilane (10 g, 1 eq), 9H-carbazole (4.4 g, 1 eq), sodium tert-butoxide (3.5 g, 1.5 eq), tris(dibenzylideneacetone)dipalladium(0) (0.88 g, 0.04 eq), tri-tert-butylphosphine (0.8 ml, 0.08 eq), and toluene (120 ml) were added and refluxed (about 130° C.) overnight while stirring. After finishing the reaction, silica filtration was performed with methylene chloride, and solvents were removed therefrom. The crude product thus obtained was separated by column chromatography using hexane:methylene chloride (4:1), solidified using methanol, filtered and dried to synthesize Intermediate A-1 (yield 91%).

$C_{36}H_{27}NSi$ [M]+: calcd: 502.19, measured: 501

Synthesis of Intermediate A-2

In a round-bottom flask, A-1 (11 g, 1 eq) was dissolved in DMF (200 ml) and then stirred at about 0° C. for about 30 minutes. NBS (3.8 g, 0.95 eq) dissolved in DMF (20 ml) was slowly added thereto dropwisely, and stirred at room temperature overnight. After finishing the reaction, $H_2O$ was added thereto, and stirred. The solid thus produced was filtered. The dried solid was dissolved in methylene chloride, and the resultant solution was treated with $MgSO_4$, and then, solvents were removed therefrom. Silica filtration was performed with methylene chloride, and the solvent was removed therefrom. The product thus obtained was solidified with methanol and dried to obtain Intermediate A-2 (yield 78%).

$C_{36}H_{26}BrNSi$ [M]+: calcd: 580.60, measured: 579

Synthesis of Compound HT-01

To a round-bottom flask, A-2 (10 g, 1 eq), 9H-carbazole (4.4 g, 1 eq), sodium tert-butoxide (3.5 g, 1.5 eq), tris (dibenzylideneacetone)dipalladium(0) (0.88 g, 0.04 eq), tri-tert-butylphosphine (0.8 ml, 0.08 eq), and toluene (120 ml) were added and refluxed (about 130° C.) overnight while stirring. After finishing the reaction, silica filtration was performed with methylene chloride, and solvents were removed therefrom. The crude product thus obtained was separated by column chromatography using hexane:methylene chloride (4:1), solidified using methanol, filtered and dried to synthesize Compound HT-01 (yield 91%).

$C_{48}H_{34}N_2Si$ [M]+: calcd: 667.20, measured: 666

Elemental Analysis for calcd: C, 86.45; H, 5.14; N, 4.20; Si, 4.21

2. Synthesis of Compound HT-03

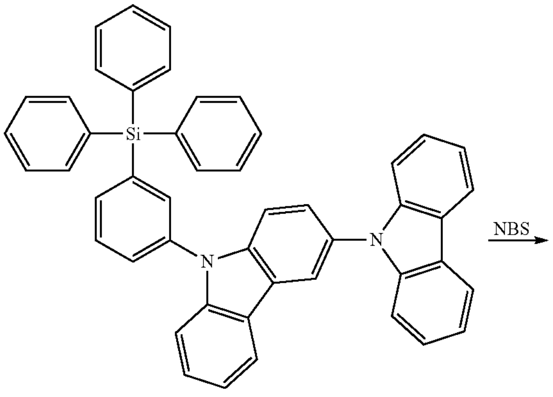

A-3

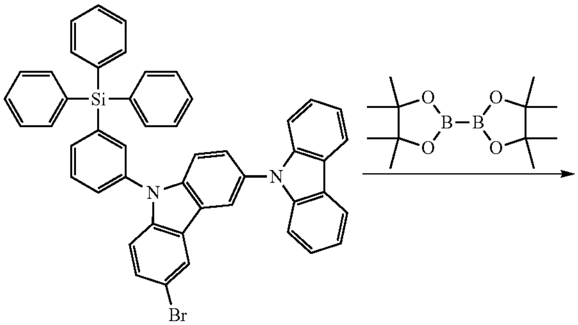

A-4

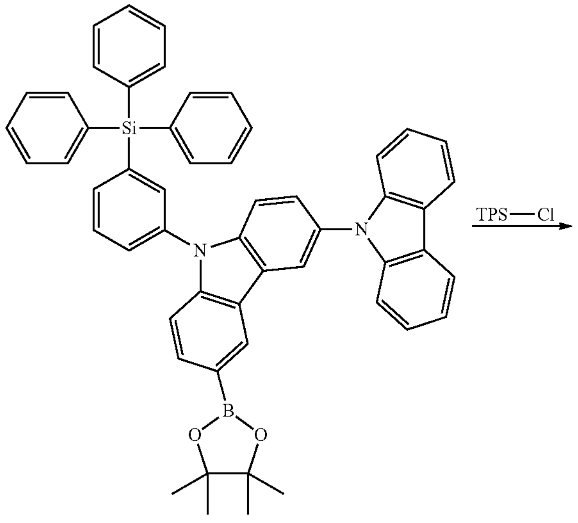

A-5

-continued

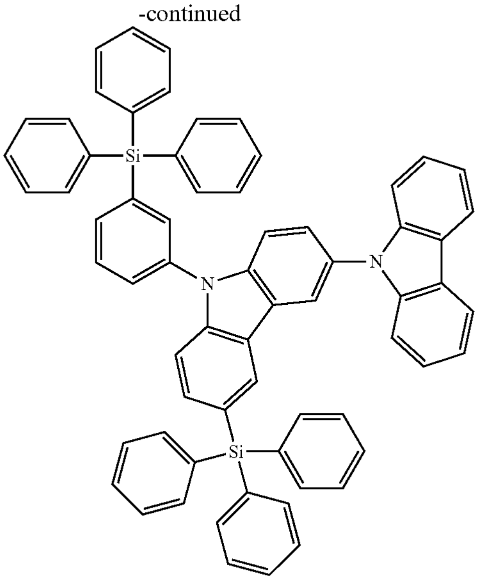

HT-03

Synthesis of Intermediate A-4

In a round-bottom flask, A-3 (10 g, 1 eq) and THF (120 ml) were added, and 1.2 eq of NBS was added in dark room conditions, followed by stirring overnight. After finishing the reaction, silica filtration was performed with methylene chloride, and the solvents were removed therefrom. The product thus obtained was separated by column chromatography using hexane:methylene chloride (3:1), solidified with methanol, filtered and dried to obtain Intermediate A-4 (yield 70%).

$C_{48}H_{33}BrN_2Si$ [M]+: calcd: 745.16, measured: 744

Synthesis of Intermediate A-5

To a round-bottom flask, A-4 (25 g, 1 eq), 4,4,4',4',5,5,5',5'-octamethyl-2,2'-bi(1,3,2-dioxaborolane) (1.2 eq), potassium acetate (2.5 eq), bis(triphenylphosphine)-palladium(II) dichloride (0.05 eq), and toluene (550 ml) were added and refluxed (about 130° C.) overnight while stirring. After finishing the reaction, silica filtration was performed with methylene chloride, and solvents were removed therefrom. The crude product thus obtained was separated by column chromatography using hexane, solidified using methanol and dried to synthesize Intermediate A-5 (yield 77%).

$C_{54}H_{45}BN_2O_2Si$ [M]+: calcd: 793.40, measured: 792

Synthesis of Compound HT-03

To a round-bottom flask, A-5 (1 eq), triphenylsilyl chloride (1.1 eq), $Pd(PPh_3)_4$ (0.05 eq), $K_2CO_3$ (2.5 eq), THF (400 ml), and $H_2O$ (100 ml) were added and refluxed (about 100° C.) overnight while stirring. After finishing the reaction, ethyl acetate/$H_2O$ were added thereto, stirring was performed for about 30 minutes, and only an organic layer was separated therefrom using a separating funnel. The organic layer was dried with $MgSO_4$, silica filtration using methylene chloride was performed, and the solid thus produced was filtered using methanol and then dried. The dried solid was dissolved in toluene (100 ml) by boiling, and ether: hexane=1:1 (100 ml) was added thereto dropwisely for solidification. The resultant solid was dissolved again in methylene chloride (400 ml), and then, hexane (400 ml) was added slowly for recrystallization to synthesize Compound HT-03 (yield 84.1%).

$C_{66}H_{48}N_2Si_2$ [M]+: calcd: 925.05, measured: 924

Elemental Analysis for calcd: C, 85.67; H, 5.23; N, 3.03; Si, 6.07

3. Synthesis of Compound HT-04

Compound HT-04 was obtained in a yield of 79% by performing substantially the same method as in the synthetic process of Compound HT-03 except for using trimethylsilyl chloride instead of triphenylsilyl chloride.

$C_{51}H_{42}N_2Si_2$ [M]+: calcd: 739.43, measured: 738

Elemental Analysis for calcd: C, 82.88; H, 5.73; N, 3.79; Si, 7.60

4. Synthesis of Compound ET-01

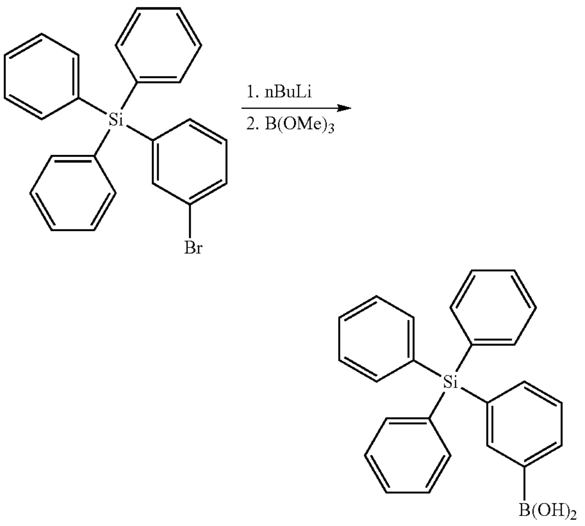

A-7

Synthesis of Intermediate A-7

To a round-bottom flask, (3-bromophenyl)triphenylsilane (1 eq) was added, and THF (150 ml) was added. At about −78° C., n-BuLi (2 M in hexane, 17 ml, 1.2 eq) was slowly added thereto dropwisely. After about 40 minutes, trimethyl borate (5.75 ml, 1.5 eq) was slowly added thereto dropwisely, and then, the temperature was slowly elevated and stirred overnight. The reaction was quenched using water and a $NH_4Cl$ solution, and the resultant product was washed with ethyl acetate/$H_2O$, dried with $MgSO_4$, and then separated by column chromatography using methylene chloride: ethyl acetate to obtain Intermediate A-7 (yield 77%).

$C_{24}H_{21}BO_2Si$ [M]+: calcd: 380.33, measured: 379

Synthesis of Intermediate A-8

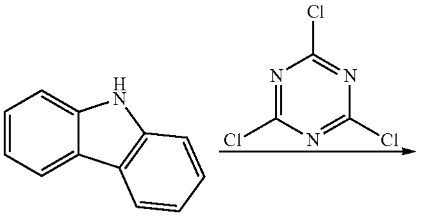

-continued

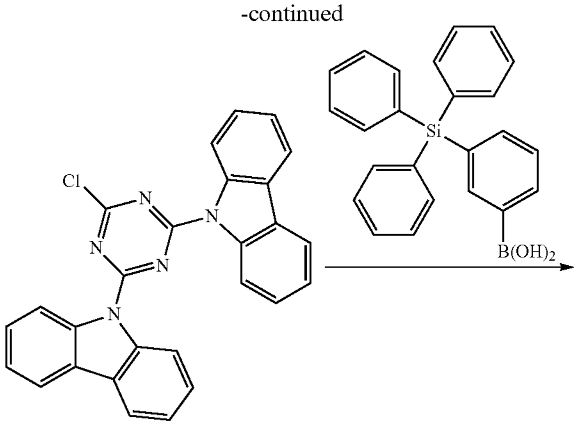

A-8

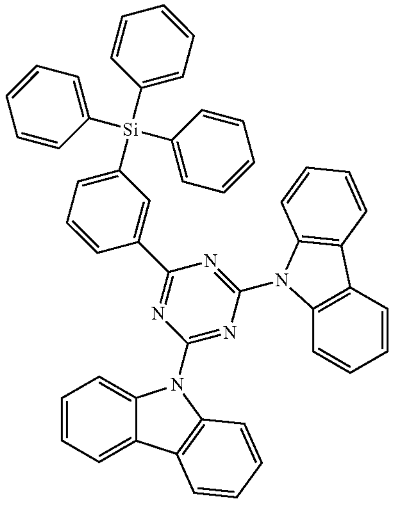

ET-01

To a round-bottom flask, carbazole (2 eq) was added, and THF was added. At room temperature, n-BuLi (2 M in hexane, 1.9 eq) was slowly added thereto dropwisely and stirred for about 30 minutes. To a round-bottom flask, 2,4,6-trichlorotriazine (1 eq) was added, and THF was added. A prepared Li-carbazole solution was slowly added thereto dropwisely over about 30 minutes using a dropping funnel. The resultant reaction solution was refluxed for about 2 hours. After cooling the reaction solution to room temperature, water was added for quenching and stirred for about 30 minutes. The solid thus produced was filtered, and the solid was washed with distilled water, methanol and hexane to obtain Intermediate A-8 (yield 84%).

$C_{27}H_{16}ClN_5$ [M]+: calcd: 445.91, measured: 444

Synthesis of Compound ET-01

To a round-bottom flask, A-8 (1 eq), A-7 (1.1 eq), $Pd(PPh_3)_4$ (0.05 eq), $K_2CO_3$ (2.5 eq), THF (400 ml), and $H_2O$ (100 ml) were added and refluxed (about 100° C.) overnight while stirring. After finishing the reaction, ethyl acetate/$H_2O$ were added thereto, stirring was performed for about 30 minutes, and only an organic layer was separated therefrom using a separating funnel. The organic layer was dried with $MgSO_4$, silica filtration using methylene chloride was performed, and the solid thus produced was filtered using methanol and then dried. The dried solid was dissolved in toluene (100 ml) by boiling, and ether:hexane=1:1 (100 ml) was added thereto dropwisely for solidification. The solid was dissolved again in methylene chloride (400 ml), and then hexane (400 ml) was added to slowly recrystallize to synthesize Intermediate A-9 (yield 84.1%).

$C_{51}H_{35}N_5Si$ [M]+: calcd: 745.96, measured: 744

Elemental Analysis for calcd: C, 82.12; H, 4.73; N, 9.39; Si, 3.76

5. Synthesis of Compound ET-03

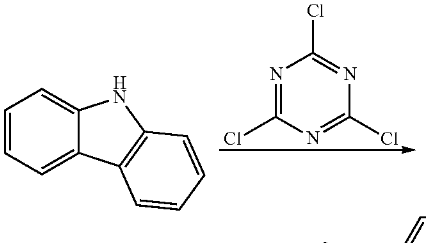

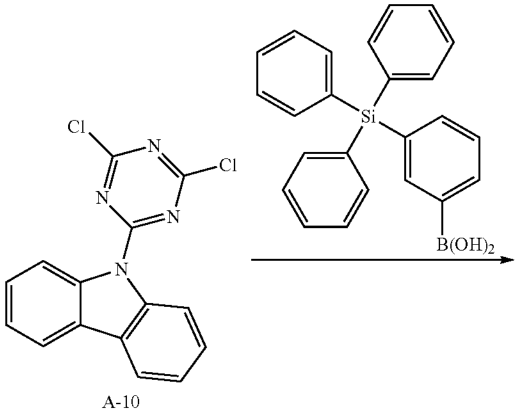

A-10

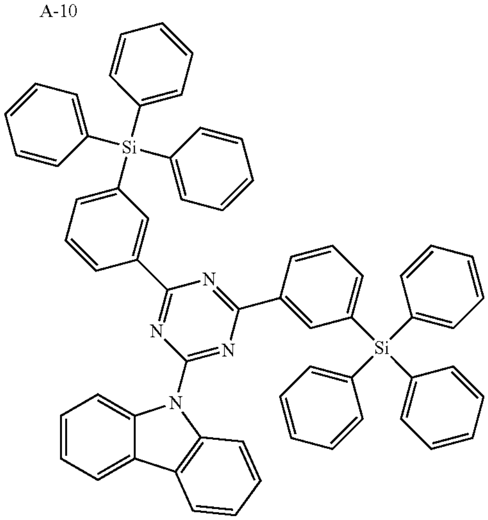

ET-03

Synthesis of Intermediate A-10

Substantially the same synthetic method of A-8 was performed except for adding 1 eq of carbazole instead of 2 eq to a round-bottom flask to obtain Intermediate A-10 in a yield of 71%.

$C_{15}H_8Cl_2N_4$ [M]+: calcd: 315.16, measured: 314

Synthesis of Compound ET-03

Substantially the same synthetic method of A-9 was performed except for using Intermediate A-10 and using 1.1 eq of A-7 instead of 2.2 eq to obtain Compound ET-03 in a yield of 79%.

$C_{63}H_{46}N_4Si_2$ [M]+: calcd: 915.26, measured: 914

Elemental Analysis for calcd: C, 82.68; H, 5.07; N, 6.12; Si, 6.14

6. Synthesis of Compound ET-08

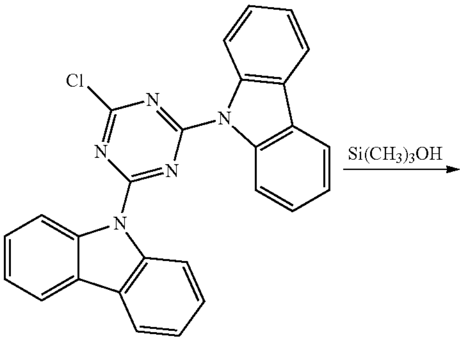

A-8

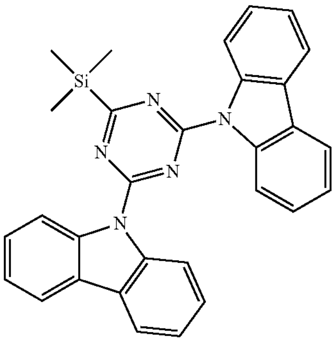

ET-08

To a round-bottom flask, A-8 (2 eq) was added, and THF was added. At room temperature, triethylammonium (1.2 eq) and trimethylsilanol (1.2 eq) were added and refluxed for about 3 hours. After cooling the resultant reaction solution to room temperature, water was added dropwisely thereto for quenching and stirred for about 30 minutes. The solid thus produced was filtered, washed with distilled water, methanol and hexane, and separated by column chromatography using methylene chloride:hexane to obtain Compound ET-08 in a yield of 62%.

$C_{63}H_{46}N_4Si_2$ [M]+: calcd: 484.19, measured: 483

Elemental Analysis for calcd: C, 74.50; H, 5.21; N, 14.48; Si, 5.81

7. Synthesis of Compound PBD-01

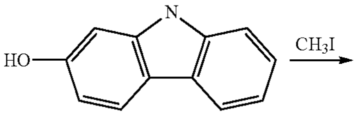

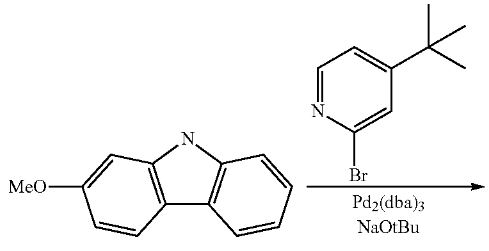

1

-continued

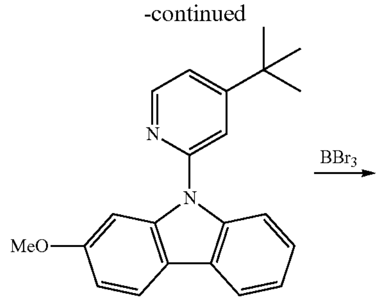

2

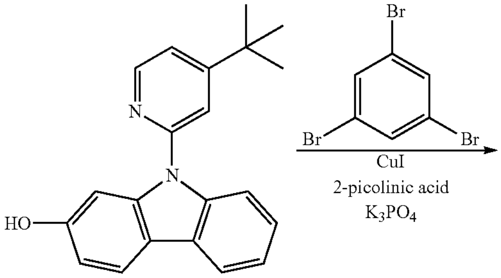

3

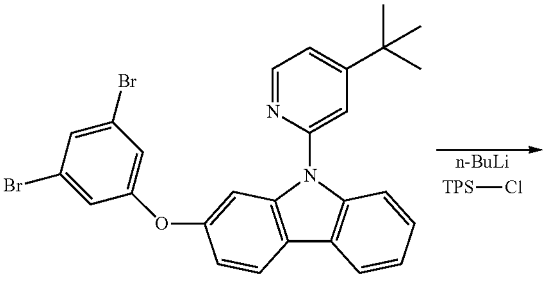

4

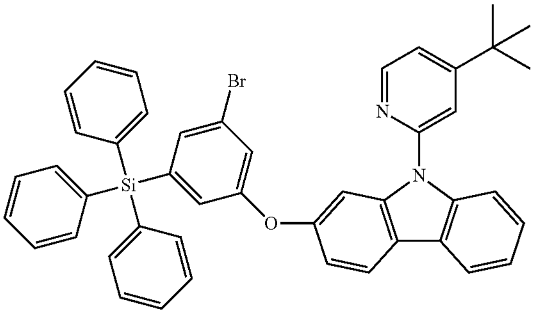

5

Synthesis of Intermediate 1

To a round-bottom flask, 9-carbazole-2-ol (20 g, 1 eq), methyl iodide (3.0 eq), and DMF (120 ml) were added and stirred at about 100° C. overnight. After finishing the reaction, silica filtration with methylene chloride was performed, and solvents were removed therefrom. The crude product thus obtained was recrystallized with methanol, filtered and dried to synthesize Intermediate 1 (yield 90%).

Synthesis of Intermediate 2

To a round-bottom flask, Intermediate 1 (15 g, 1 eq), 2-bromo-4-(tert-butyl)pyridine (1.2 eq), $Pd_2(dba)_3$ (0.02 eq), and NaOtBu (1.6 eq) were added and stirred at about 120° C. for about 12 hours in toluene (110 ml). After finishing the reaction, silica filtration with methylene chloride was performed, and solvents were removed therefrom. The crude product thus obtained was separated by column chromatography using methylene chloride:hexane (1:3) and dried to synthesize Intermediate 2 (yield 70%).

$C_{22}H_{22}N_2O$ [M]+: calcd: 331.17, measured: 330

Synthesis of Intermediate 3

To a round-bottom flask, Intermediate 2 (15 g) and methylene chloride (100 ml) were added and stirred. In a state of about −78° C., a $BBr_3$ (2.0 eq in 1.0 M methylene chloride) solution was prepared and slowly added thereto dropwisely using a dropping funnel. After stirring for about 1 hour, the temperature was slowly elevated, and stirring was performed at room temperature for about 2 hours. After finishing the reaction, ethyl acetate/$H_2O$ were added, stirring was performed for about 30 minutes, and only an organic layer was separated therefrom using a separating funnel. The organic layer was dried with $MgSO_4$, silica filtration using methylene chloride was performed, and the solid thus obtained was filtered using methanol and then dried. The crude product thus obtained was dissolved in methylene chloride (300 ml), and hexane (300 ml) was added for slow recrystallization to synthesize Intermediate 3 (yield 77%).

$C_{22}H_{22}N_2O$ [M]+: calcd: 316.16, measured: 315

Synthesis of Intermediate 4

To a round-bottom flask, Intermediate 3 (14 g), 1,3,5-tribromobenzene (1.2 eq), 2-picollinic acid (1.1 eq), $K_3PO_4$ (1.5 eq), and THF (400 ml) were added and refluxed (about 100° C.) overnight while stirring. After finishing the reaction, ethyl acetate/$H_2O$ were added thereto, stirring was performed for about 30 minutes, and only an organic layer was separated therefrom using a separating funnel. The organic layer was dried with $MgSO_4$, silica filtration using methylene chloride was performed, and the solid thus produced was filtered using methanol and then dried. The dried solid was dissolved in toluene (100 ml) by boiling, and ether:hexane=1:1 (100 ml) was added thereto dropwisely for solidification. The resultant solid was dissolved again in methylene chloride (400 ml), and then hexane (400 ml) was added for slowly recrystallization to synthesize Intermediate 4 (yield 84%).

$C_{27}H_{22}Br_2N_2O$ [M]+: calcd: 549.01, measured: 548

Synthesis of Intermediate 5

To a round-bottom flask, Intermediate 4 (12 g) was added, and THF was added. At about −78° C., n-BuLi (2 M in hexane, 1.1 eq) was slowly added thereto dropwisely and stirred for about 30 minutes. To a round-bottom flask, triphenylsilyl chloride (2 eq) was added, and THF was added thereto. This solution was slowly added dropwisely over about 30 minutes using a dropping funnel. The resultant reaction solution was refluxed for about 2 hours. After cooling the reaction solution to room temperature, water was added for quenching and stirred for about 30 minutes. The solid thus produced was filtered, and the solid was washed with distilled water, methanol and hexane to obtain Intermediate 5 (yield 65%).

$C_{45}H_{37}BrN_2OSi$ [M]+: calcd: 729.19, measured: 728

5

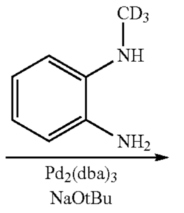

-continued

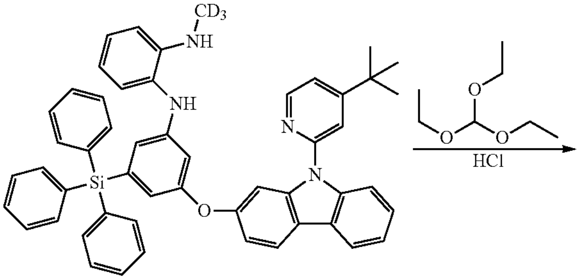

6

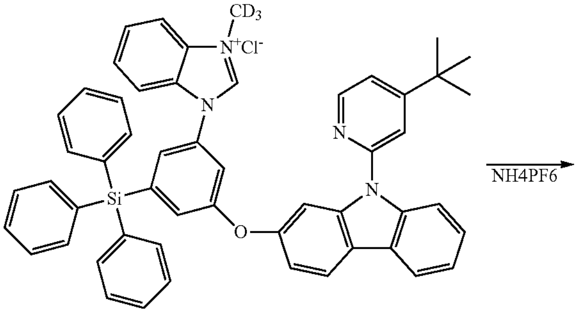

7

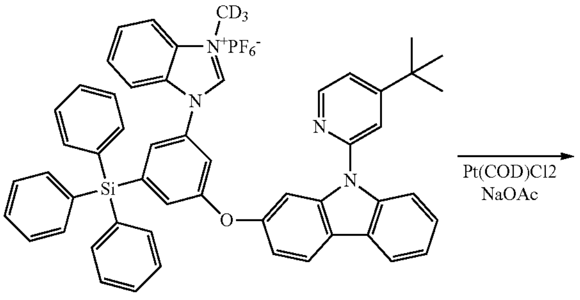

8

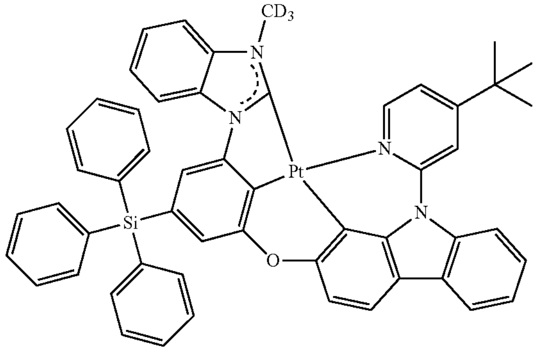

PBD-01

Synthesis of Intermediate 6

To a round-bottom flask, Intermediate 5 (8 g), N-(methyl-d3)benzene-1,2-diamine (1.0 eq), tris(dibenzylideneacetone)dipalladium(0) (0.02 eq), NaOtBu (1.6 eq), and toluene (100 ml) were added and refluxed (about 120° C.). After stirring for about 4 hours, silica filtration of the resultant reaction product with methylene chloride was performed, and solvents were removed. The crude product thus obtained was separated by column chromatography using hexane: methylene chloride (4:1), solidified with methanol, filtered and dried to synthesize Intermediate 6 (yield 80%).

$C_{52}H_{43}D_3N_4OSi$ [M]+: calcd: 774.36, measured: 773

Synthesis of Intermediate 7

To a round-bottom flask, Intermediate 6 (7 g), and triethoxymethane (50 eq) were dissolved in THF. 1.2 eq of HCl (1 M solution) was added thereto and refluxed (about 80° C.) for about 12 hours while stirring. After finishing the reaction, ethyl acetate/$H_2O$ were added thereto, stirring was performed for about 30 minutes, and only an organic layer was separated therefrom using a separating funnel. The organic layer was dried with $MgSO_4$, silica filtration using methylene chloride was performed, and the solid thus produced was filtered using methanol and then dried. The dried solid was dissolved in toluene (100 ml) by boiling, and ether:hexane=1:2 (100 ml) was added thereto dropwisely for solidification. The resultant solid was dissolved again in methylene chloride (400 ml), and then hexane (400 ml) was added for slow recrystallization to synthesize Intermediate 7 (yield 90%).

$C_{53}H_{42}D_3ClN_4OSi$ [M]+: calcd: 820.32, measured: 819

Synthesis of Intermediate 8

In a round-bottom flask, Intermediate 7 (5 g) was dissolved in methanol/$H_2O$ (2:1, 100 ml), and 3 eq of ammonium hexafluorophosphate was added thereto. After stirring at room temperature for about 4 hours, $H_2O$ was added and stirred, and the solid thus produced was filtered. Then, the solid dried was dissolved in methylene chloride, the solution was treated with $MgSO_4$, and the solvents were removed therefrom. Silica filtration with methylene chloride was performed, the solvent was removed therefrom, and the crude product thus obtained was solidified with methanol and dried to synthesize Intermediate 8 (Yield 95%).

$C_{53}H_{42}D_3F_6N_4OPSi$ [M]+: calcd: 930.32, measured: 929

Synthesis of Compound PBD-01

In a round-bottom flask, Intermediate 8 (4 g), $Pt(COD)Cl_2$ (1.1 eq), and NaOAc (3.0 eq) were dissolved in 1,4-dioxane (50 ml) and refluxed (about 120° C.) for about 96 hours. $H_2O$ was added thereto and stirred, and the solid thus produced was filtered. The resultant solid was washed with $H_2O$ three times, and the solid thus dried was separated by column chromatography using methylene chloride:hexane (1:1) to synthesize Compound PBD-01 (yield 30%).

$C_{53}H_{42}D_3F_6N_4OPSi$ [M]+: calcd: 930.32, measured: 929

Elemental Analysis for calcd: C, 65.08; H, 4.74; N, 5.73; 0, 1.64; Pt, 19.94; Si, 2.87

8. Synthesis of Compound PBD-02

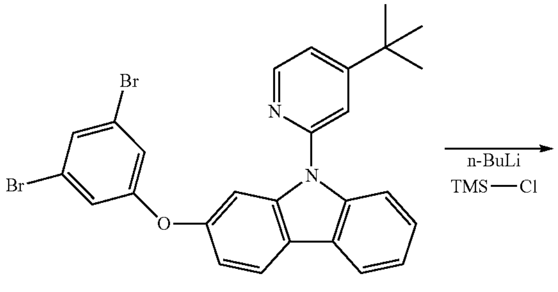

4

-continued

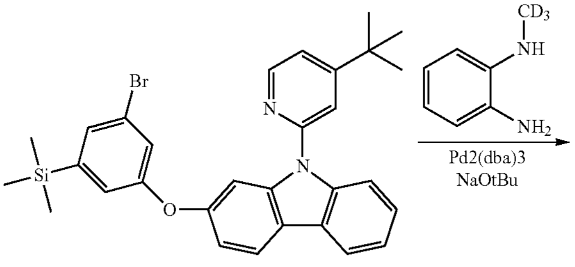

10

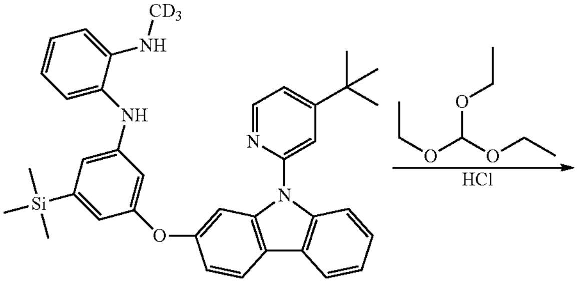

11

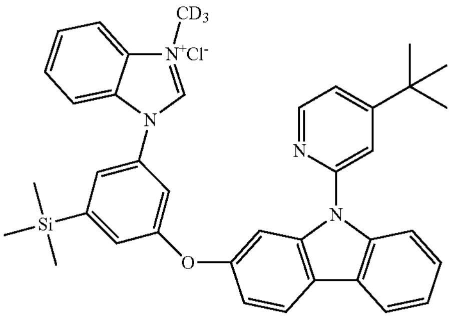

12

Synthesis of Intermediate 10

Substantially the same synthetic method of Intermediate 5 was performed except for using trimethylsilyl chloride instead of triphenylsilyl chloride to synthesize Intermediate 10 (yield 89%).

$C_{30}H_{31}BrN_2OSi$ [M]+: calcd: 543.14, measured:542

Synthesis of Intermediate 11

Substantially the same synthetic method of Intermediate 6 was performed using Intermediate 10 instead of Intermediate 5 to synthesize Intermediate 11 (yield 82%).

$C_{37}H_{37}D_3N_4OSi$ [M]+: calcd: 588.32, measured: 587

Synthesis of Intermediate 12

Substantially the same synthetic method of Intermediate 7 was performed using Intermediate 11 instead of Intermediate 6 to synthesize Intermediate 12 (yield 87%).

$C_{38}H_{36}D_3ClN_4OSi$ [M]+: calcd: 634.28, measured: 633

12

NH4PF6

-continued

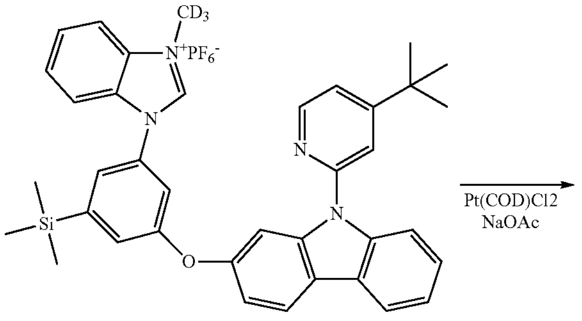

13

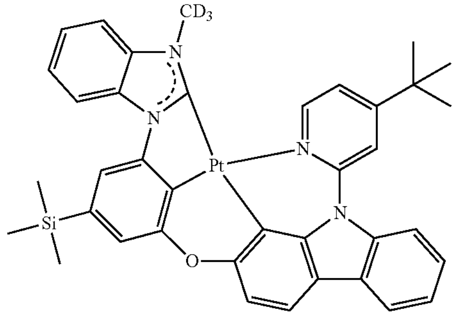

PBD-02

Synthesis of Intermediate 13

Substantially the same synthetic method of Intermediate 8 was performed using Intermediate 12 instead of Intermediate 7 to synthesize Intermediate 13 (yield 89%).

$C_{38}H_{36}D_3F_6N_4OPSi$ [M]+: calcd: 744.27, measured: 743

Synthesis of Compound PBD-02

Substantially the same synthetic method of Compound PBD-01 was performed using Intermediate 13 instead of Intermediate 8 to synthesize Compound PBD-02 (yield 37%).

$C_{38}H_{34}D_3N_4OPtSi$ [M]+: calcd: 792.26, measured: 791

Elemental Analysis for calcd: C, 57.63; H, 5.09; N, 7.07; 0, 2.02; Pt, 24.63; Si, 3.55

9. Synthesis of Compound PBD-03

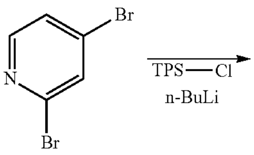

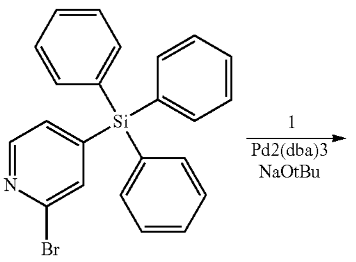

15

-continued

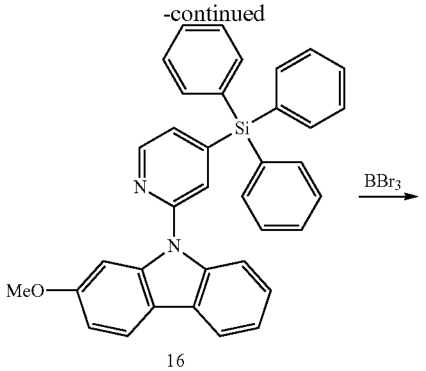

16

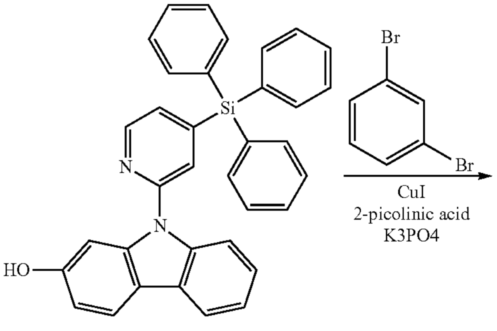

17

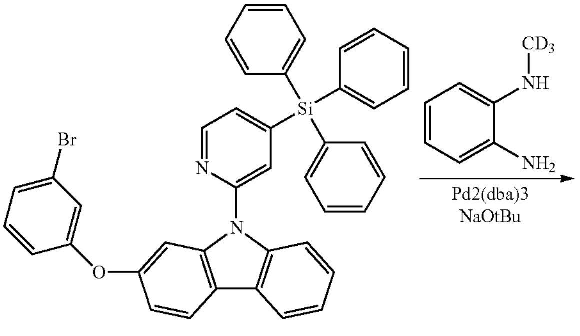

18

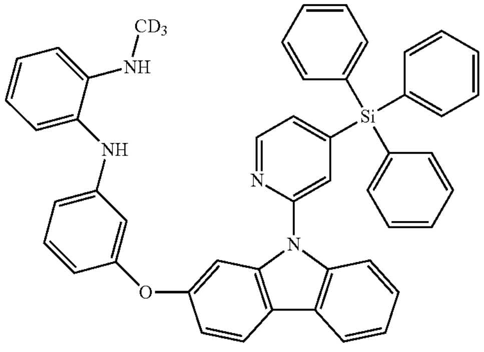

19

Synthesis of Intermediate 15

To a round-bottom flask, 2,4-dibromopyridine (20 g) was added, and 200 ml of THF was added. At about −78° C., n-BuLi (2 M in hexane, 1.1 eq) was slowly added thereto dropwisely and stirred for about 30 minutes. To a round-bottom flask, triphenylsilyl chloride (2 eq) was added, and THF was added thereto. This solution was slowly added dropwisely over about 30 minutes using a dropping funnel. The resultant reaction solution was refluxed for about 2 hours. After cooling the reaction solution to room temperature, water was added for quenching and stirred for about 30 minutes. The solid thus produced was filtered, and the solid was dissolved in methylene chloride and separated by column chromatography with methylene chloride:hexane (1:2) to synthesize Intermediate 15 (yield 80%).

$C_{23}H_{18}BrNSi$ [M]+: calcd: 416.04, measured: 415

Synthesis of Intermediate 16

To a round-bottom flask, Intermediate 15 (18 g), Intermediate 1 (1.2 eq), $Pd_2(dba)_3$ (0.02 eq), and NaOtBu (1.6 eq) were added and stirred at about 120° C. for about 12 hours in toluene (150 ml). After finishing the reaction, silica filtration with methylene chloride was performed, and solvents were removed therefrom. The crude product thus obtained was separated by column chromatography using methylene chloride:hexane (1:3) and dried to synthesize Intermediate 16 (yield 76%).

$C_{36}H_{28}N_2OSi$ [M]+: calcd: 533.20, measured: 532

Synthesis of Intermediate 17

To a round-bottom flask, Intermediate 15 (15 g) and methylene chloride (150 ml) were added and stirred. In a state of about −78° C., a $BBr_3$ (2.0 eq in 1.0 M methylene chloride) solution was prepared and slowly added thereto dropwisely using a dropping funnel. After stirring for about 1 hour, the temperature was slowly elevated, and stirring was performed at room temperature for about 2 hours. After finishing the reaction, ethyl acetate/$H_2O$ were added, stirring was performed for about 30 minutes, and only an organic layer was separated therefrom using a separating funnel. The organic layer was dried with $MgSO_4$, silica filtration using methylene chloride was performed, and the solid thus obtained was filtered using methanol and then dried. The crude product thus obtained was dissolved in methylene chloride (300 ml), and hexane (300 ml) was added for slow recrystallization to synthesize Intermediate 17 (yield 77%).

$C_{35}H_{26}N_2OSi$ [M]+: calcd: 519.28, measured: 518

Synthesis of Intermediate 18

To a round-bottom flask, Intermediate 17 (12 g), 1,3-dibromobenzene (1.2 eq), 2-picollinic acid (1.1 eq), $K_3PO_4$ (1.5 eq), and THF (400 ml) were added and refluxed (about 100° C.) overnight while stirring. After finishing the reaction, ethyl acetate/$H_2O$ were added thereto, stirring was performed for about 30 minutes, and only an organic layer was separated therefrom using a separating funnel. The organic layer was dried with $MgSO_4$, silica filtration using methylene chloride was performed, and the solid thus produced was filtered using methanol and then dried. The dried solid was dissolved in toluene (100 ml) by boiling, and ether:hexane=1:1 (100 ml) was added thereto dropwisely for solidification. The solid was dissolved again in methylene chloride (400 ml), and then hexane (400 ml) was added for slow recrystallization to synthesize Intermediate 18 (yield 88%).

$C_{41}H_{29}BrN_2OSi$ [M]+: calcd: 673.12, measured: 672

Synthesis of Intermediate 19

To a round-bottom flask, Intermediate 18 (12 g), N-(methyl-d3)benzene-1,2-diamine (1.0 eq), tris(dibenzylideneacetone)dipalladium(0) (0.02 eq), NaOtBu (1.6 eq), and toluene (100 ml) were added and refluxed (about 120° C.). After stirring for about 4 hours, silica filtration of the resultant reaction product with methylene chloride was performed, and the solvents were removed therefrom. The crude product thus obtained was separated by column chromatography using hexane:methylene chloride (4:1), solidified with methanol, filtered and dried to synthesize Intermediate 19 (yield 80%).

$C_{48}H_{35}D_3N_4OSi$ [M]+: calcd: 718.30, measured: 717

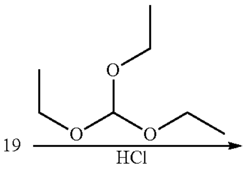

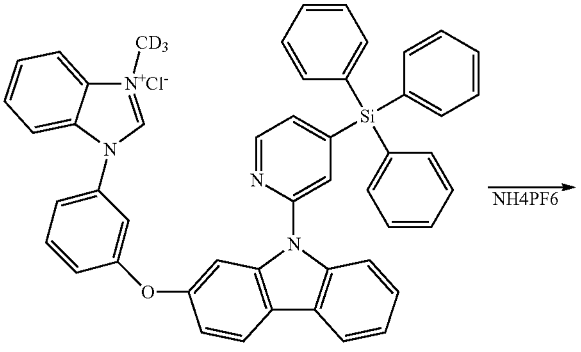

20

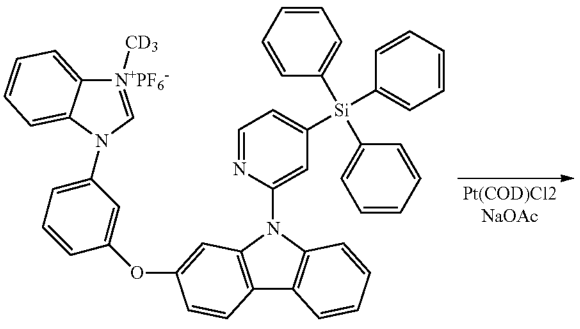

21

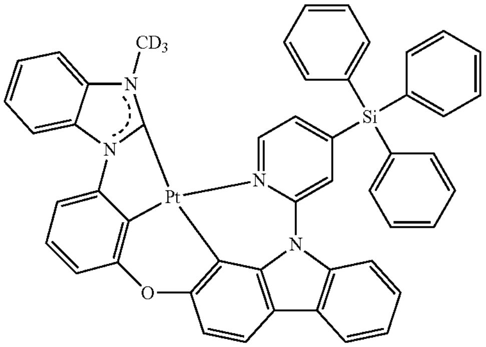

PBD-03

Synthesis of Intermediate 20

Substantially the same synthetic method of Intermediate 11 was performed except for using Intermediate 19 instead of Intermediate 10 to synthesize Intermediate 20 (yield 85%).

$C_{49}H_{34}D_3ClN_4OSi$ [M]+: calcd: 764.26, measured: 763

Synthesis of Intermediate 21

Substantially the same synthetic method of Intermediate 12 was performed except for using Intermediate 20 instead of Intermediate 11 to synthesize Intermediate 21 (yield 89%).

$C_{49}H_{34}D_3F_6N_4OPSi$ [M]+: calcd: 874.26, measured: 873

Synthesis of Compound PBD-03

Substantially the same synthetic method of Compound PBD-02 was performed except for using Intermediate 21 instead of Intermediate 13 to synthesize Compound PBD-03 (yield 30%).

$C_{49}H_{32}D_3N_4OPtSi$ [M]+: calcd: 922.24, measured: 921

Elemental Analysis for calcd: C, 63.83; H, 4.15; N, 6.08; 0, 1.74; Pt, 21.16; Si, 3.05

10. Synthesis of Compound PBD-07

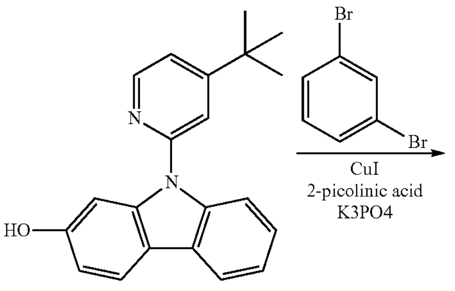

3

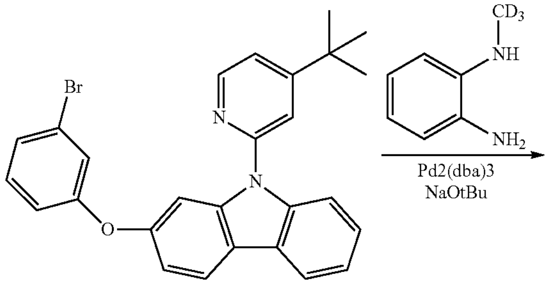

22

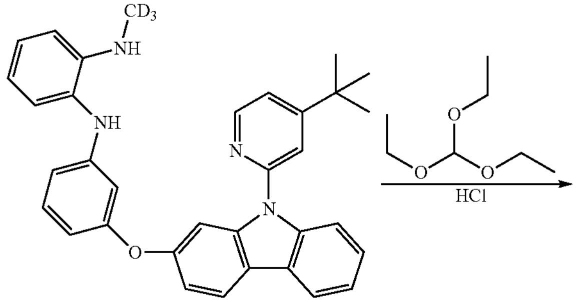

23

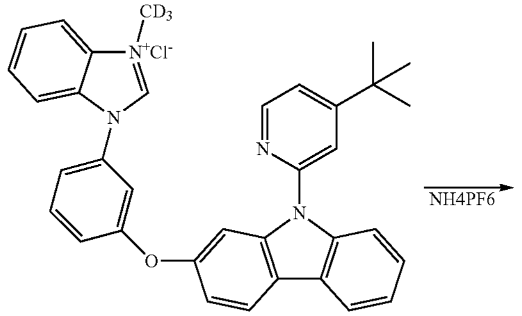

24

-continued

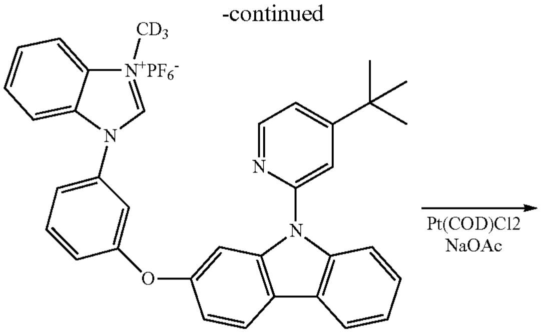

25

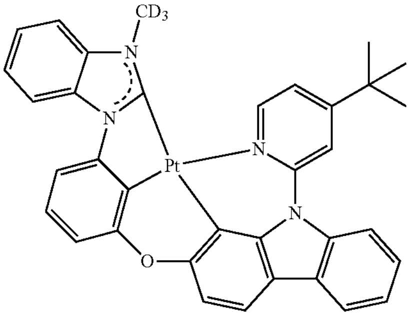

PBD-07

Synthesis of Intermediate 22

Substantially the same synthetic method of Intermediate 18 was performed except for using Intermediate 3 instead of Intermediate 17 to synthesize Intermediate 22 (yield 85%).

$C_{27}H_{23}BrN_2O$ [M]+: calcd: 470.10, measured: 469

Synthesis of Intermediate 23

Substantially the same synthetic method of Intermediate 19 was performed except for using Intermediate 22 instead of Intermediate 18 to synthesize Intermediate 23 (yield 82%).

$C_{34}H_{29}D_3N_4O$ [M]+: calcd: 515.28, measured: 514

Synthesis of Intermediate 24

Substantially the same synthetic method of Intermediate 20 was performed except for using Intermediate 23 instead of Intermediate 19 to synthesize Intermediate 24 (yield 79%).

$C_{35}H_{28}D_3ClN_4O$ [M]+: calcd: 561.24, measured: 560

Synthesis of Intermediate 25

Substantially the same synthetic method of Intermediate 21 was performed except for using Intermediate 24 instead of Intermediate 20 to synthesize Intermediate 25 (yield 90%).

$C_{35}H_{28}D_3F_6N_4OP$ [M]+: calcd: 671.23, measured: 670

Synthesis of Compound PBD-07

Substantially the same synthetic method of Compound PBD-03 was performed except for using Intermediate 25 instead of Intermediate 21 to synthesize Compound PBD-07 (yield 25%).

$C_{35}H_{26}D_3N_4OPt$ [M]+: calcd: 719.22, measured: 718

Elemental Analysis for calcd: C, 58.41; H, 4.48; N, 7.78; O, 2.22; Pt, 27.10

First host compound
HT-01
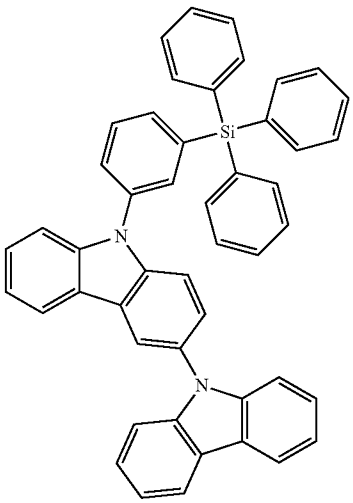
HT-03
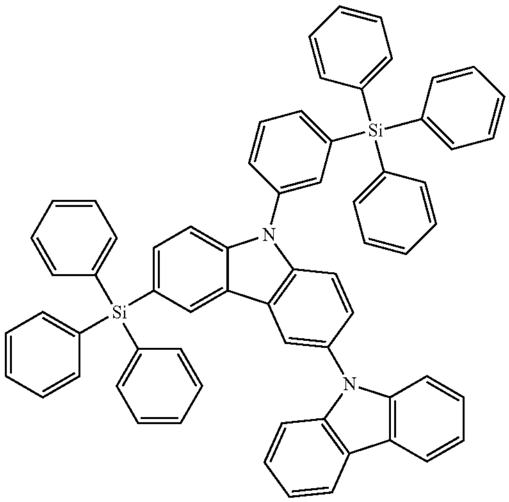
HT-04
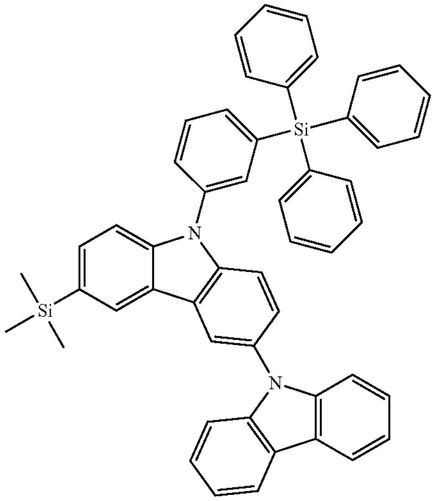
-continued
HT-12
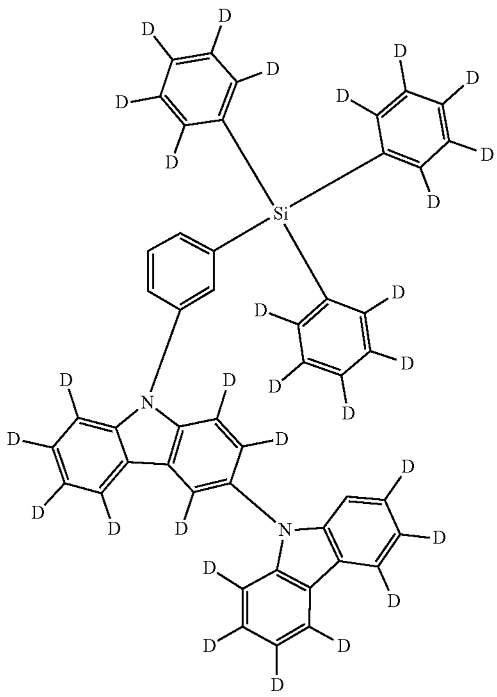
HT-13
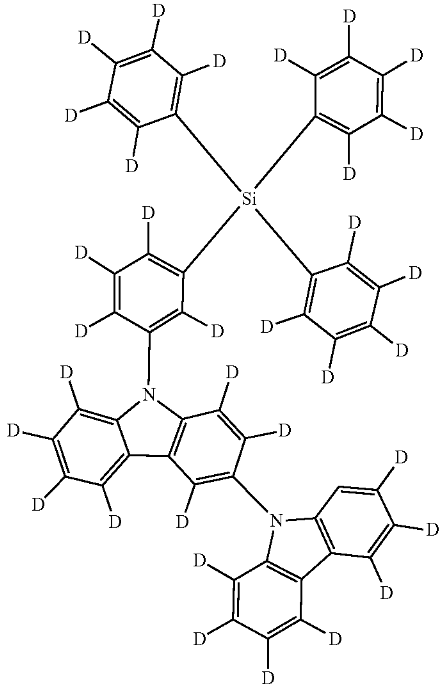

-continued
HT-16
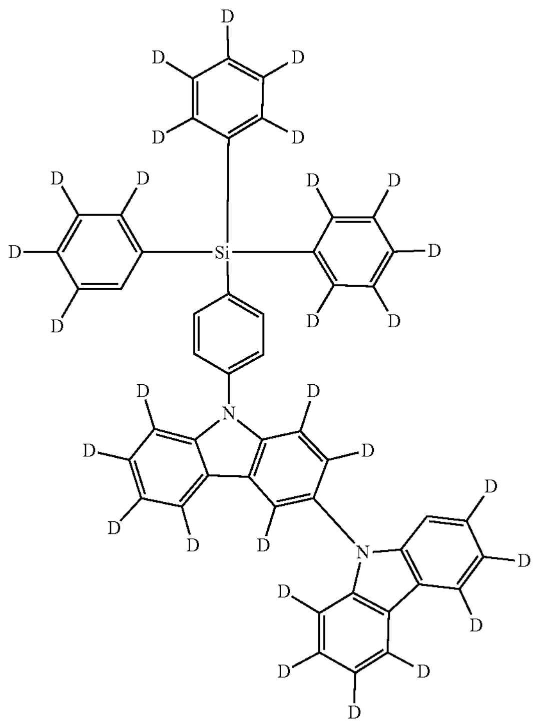
HT-17
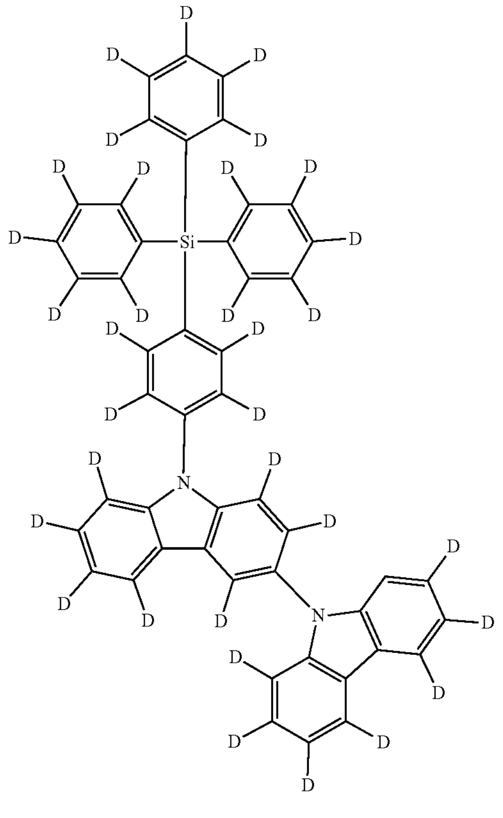
-continued
HT-18
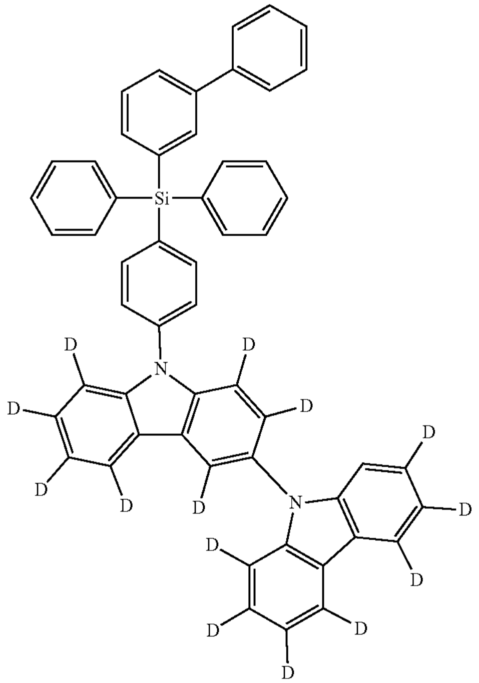
HT-23
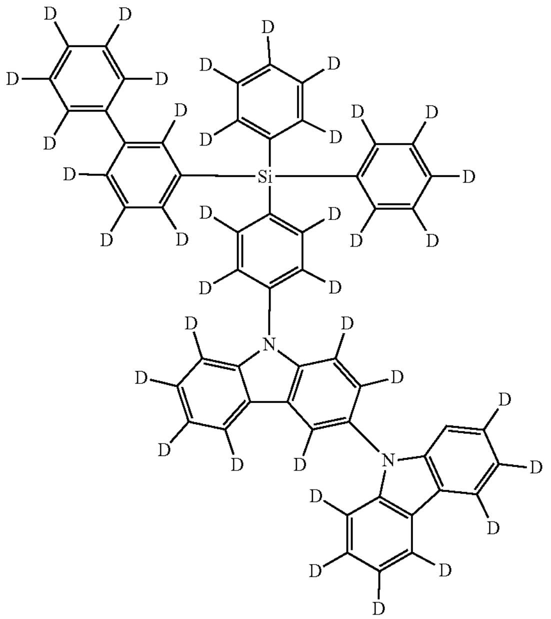

-continued
HT-C1
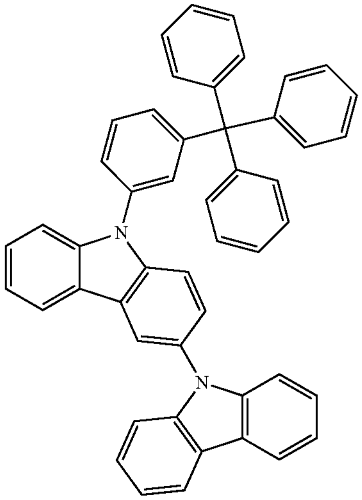
Second host compound
ET-01
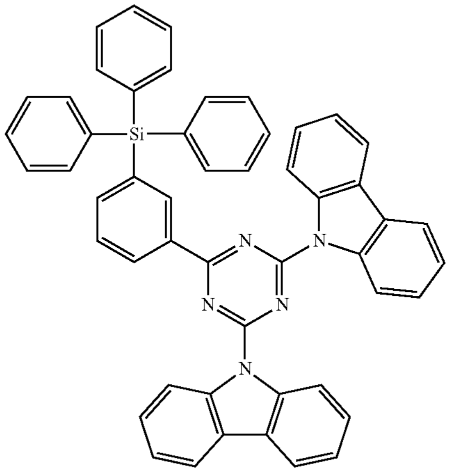
ET-03
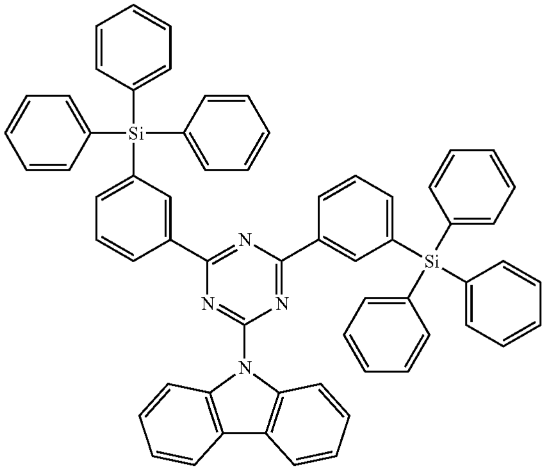
-continued
ET-08
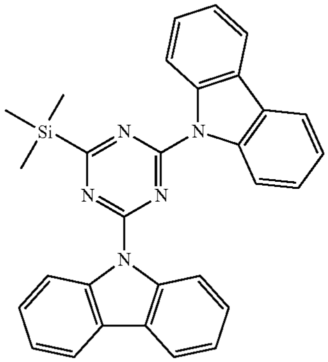
ET-12
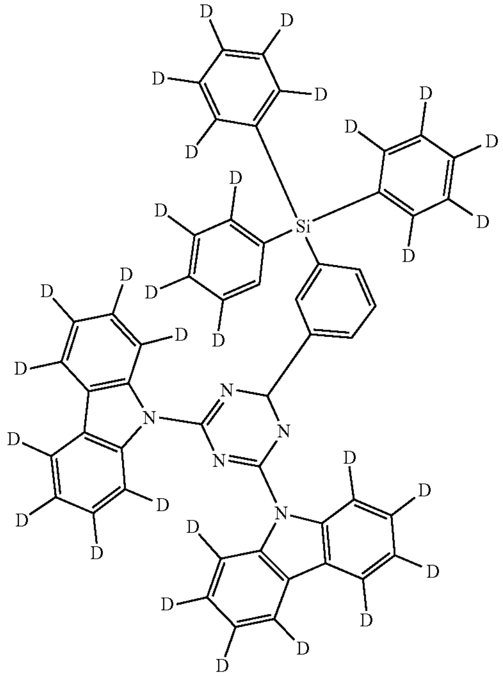

-continued
ET-13
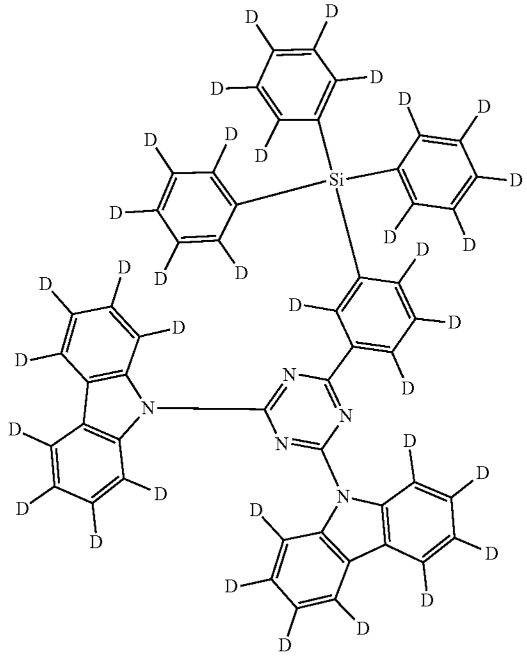
-continued
ET-33
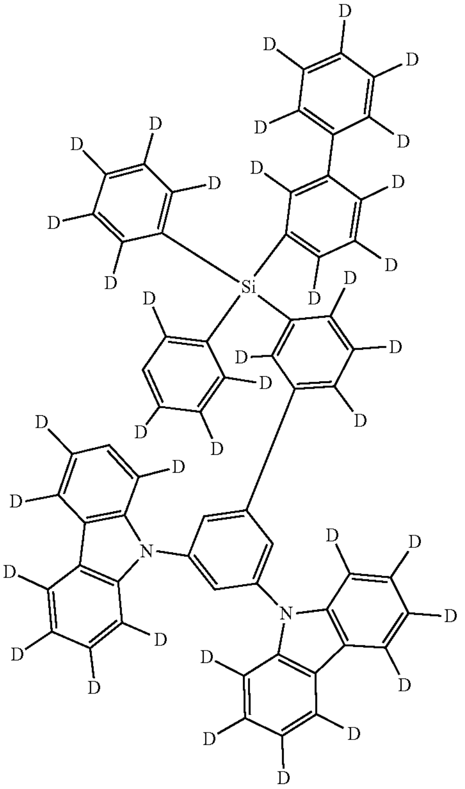
ET-18
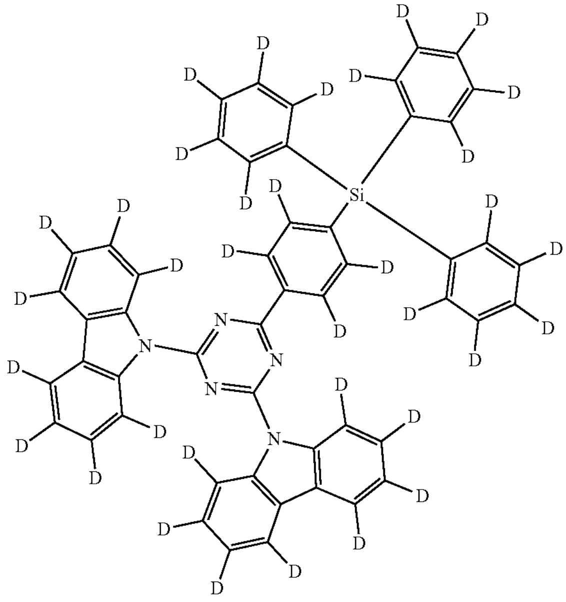
ET-C1
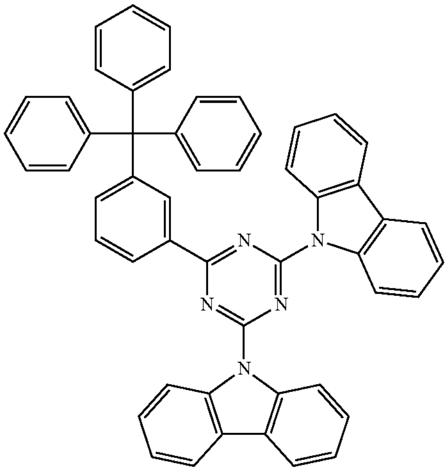

-continued

Dopant compound

PBD-01

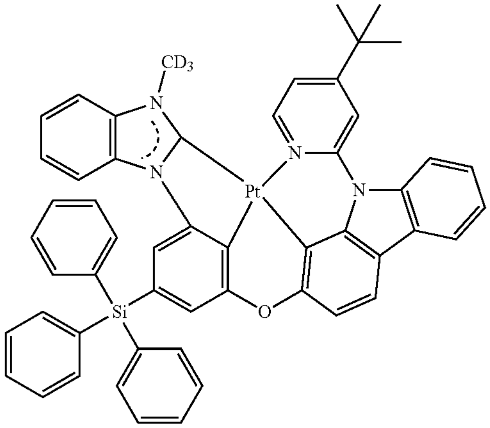

PBD-02

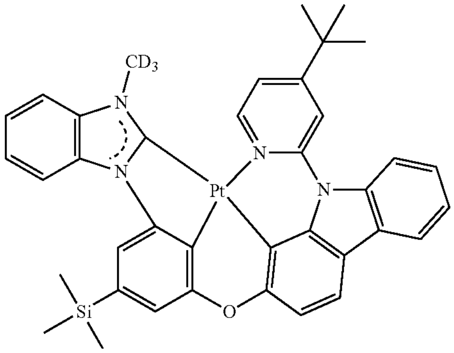

PBD-03

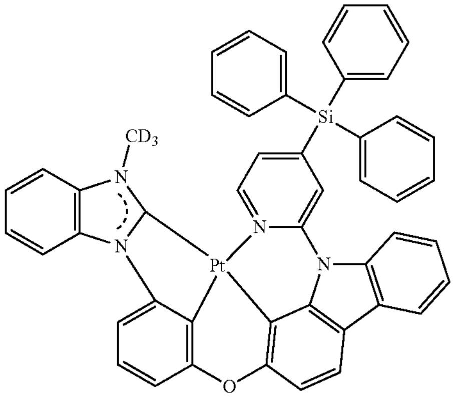

PBD-07

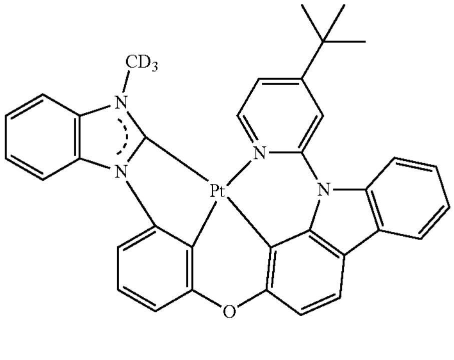

-continued

PBD-08

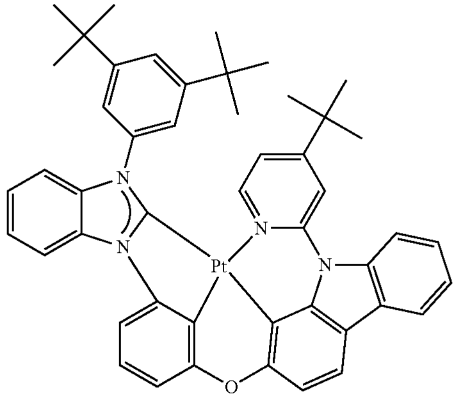

PBD-17

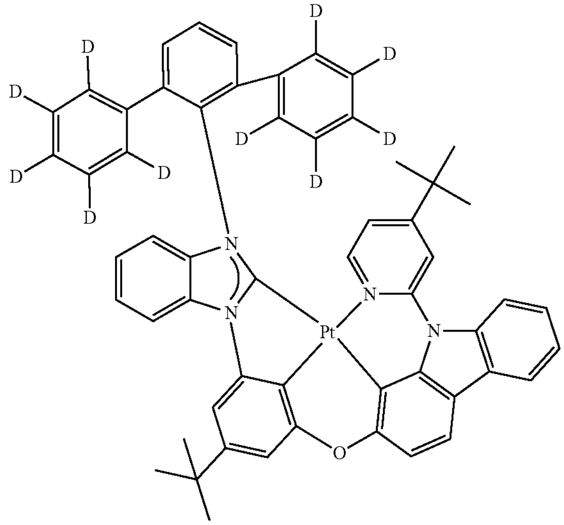

The organic electroluminescence devices of the Examples and Comparative

Examples were manufactured by a method described below. An ITO glass substrate was cut into a size of 50 mm×50 mm×0.5 mm, and cleaned with ultrasonic waves using isopropyl alcohol and distilled water for about 10 minutes, respectively, cleaned by irradiating ultraviolet rays for about 10 minutes and exposing to ozone, and then, was installed in a vacuum deposition apparatus. After that, a hole injection layer HIL with thickness of about 40 Å was formed using m-MTDATA, and a hole transport layer HTL with thickness of about 10 Å was formed using NPB. Then, the first host compound, the second host compound and the dopant compound according to an embodiment were co-deposited to form an emission layer EML with a thickness of about 400 Å, and an electron transport layer ETL with a thickness of about 300 Å was formed using Compound ZADN. Then, a second electrode EL2 with a thickness of about 120 nm was formed using Al. All layers were formed by a vacuum deposition method.

In order to evaluate the properties of the organic electroluminescence devices of the Examples and Comparative Examples, emission efficiency (cd/A) at a luminance of about 1000 cd/m$^2$ and life ($T_{90}$) were measured.

TABLE 1

| | First host | Second host | First host: second host | Dopant | Efficiency (cd/A) | Life ($T_{90}$) |
|---|---|---|---|---|---|---|
| Example 1 | HT-01 | ET-01 | 7:3 | PBD-02 | 20.8 | 40 |
| Example 2 | HT-01 | ET-03 | 7:3 | PBD-02 | 20.8 | 35 |
| Example 3 | HT-01 | ET-08 | 7:3 | PBD-02 | 21.5 | 33 |
| Example 4 | HT-03 | ET-01 | 7:3 | PBD-01 | 19.6 | 36 |
| Example 5 | HT-03 | ET-03 | 7:3 | PBD-01 | 19.2 | 30 |
| Example 6 | HT-03 | ET-08 | 7:3 | PBD-01 | 19.0 | 30 |
| Example 7 | HT-04 | ET-01 | 7:3 | PBD-03 | 20.6 | 32 |
| Example 8 | HT-04 | ET-03 | 7:3 | PBD-03 | 20.9 | 24 |
| Example 9 | HT-04 | ET-08 | 7:3 | PBD-03 | 19.8 | 23 |
| Example 10 | HT-01 | ET-03 | 7:3 | PBD-07 | 21.1 | 15 |
| Example 11 | HT-12 | ET-12 | 7:3 | PBD-08 | 19.8 | 131 |
| Example 12 | HT-12 | ET-13 | 7:3 | PBD-08 | 19.2 | 133 |
| Example 13 | HT-12 | ET-18 | 7:3 | PBD-08 | 19.3 | 125 |
| Example 14 | HT-12 | ET-33 | 7:3 | PBD-08 | 20.0 | 139 |
| Example 15 | HT-13 | ET-12 | 7:3 | PBD-08 | 19.9 | 135 |
| Example 16 | HT-13 | ET-13 | 7:3 | PBD-08 | 19.5 | 138 |
| Example 17 | HT-13 | ET-18 | 7:3 | PBD-08 | 20.1 | 130 |
| Example 18 | HT-13 | ET-33 | 7:3 | PBD-08 | 20.2 | 144 |
| Example 19 | HT-16 | ET-12 | 7:3 | PBD-08 | 19.9 | 129 |
| Example 20 | HT-16 | ET-13 | 7:3 | PBD-08 | 20.0 | 131 |
| Example 21 | HT-16 | ET-18 | 7:3 | PBD-08 | 19.7 | 125 |
| Example 22 | HT-16 | ET-33 | 7:3 | PBD-08 | 19.5 | 139 |
| Example 23 | HT-17 | ET-12 | 7:3 | PBD-08 | 19.8 | 133 |
| Example 24 | HT-17 | ET-13 | 7:3 | PBD-08 | 19.2 | 132 |
| Example 25 | HT-17 | ET-18 | 7:3 | PBD-08 | 19.5 | 130 |
| Example 26 | HT-17 | ET-33 | 7:3 | PBD-08 | 20.1 | 135 |
| Example 27 | HT-18 | ET-12 | 7:3 | PBD-08 | 19.9 | 149 |
| Example 28 | HT-18 | ET-13 | 7:3 | PBD-08 | 19.6 | 151 |
| Example 29 | HT-18 | ET-18 | 7:3 | PBD-08 | 20.2 | 140 |
| Example 30 | HT-18 | ET-33 | 7:3 | PBD-08 | 19.9 | 153 |
| Example 31 | HT-23 | ET-12 | 7:3 | PBD-08 | 20.1 | 149 |
| Example 32 | HT-23 | ET-13 | 7:3 | PBD-08 | 20.0 | 148 |
| Example 33 | HT-23 | ET-18 | 7:3 | PBD-08 | 19.8 | 148 |
| Example 34 | HT-23 | ET-33 | 7:3 | PBD-08 | 19.9 | 150 |
| Example 35 | HT-13 | ET-12 | 7:3 | PBD-17 | 22.2 | 184 |
| Example 36 | HT-13 | ET-13 | 7:3 | PBD-17 | 22.5 | 190 |
| Example 37 | HT-13 | ET-18 | 7:3 | PBD-17 | 21.9 | 180 |
| Example 38 | HT-13 | ET-33 | 7:3 | PBD-17 | 21.7 | 177 |
| Comparative Example 1 | HT-C1 | ET-01 | 7:3 | PBD-01 | 15.7 | 1 |
| Comparative Example 2 | HT-01 | ET-C1 | 7:3 | PBD-01 | 14.9 | 1 |

Referring to Table 1 above, it can be confirmed that Examples 1 to 38 showed improved device life when compared with Comparative Examples 1 and 2.

The first host compound, the second host compound and the dopant compound according to an embodiment of the present disclosure were used in an emission layer to contribute to the increase of the life of an organic electroluminescence device. Each of the first host compound and the second host compound according to an embodiment of the present disclosure includes a silyl group. Accordingly, the vacant d-orbital of a Si atom may stabilize electrons injected into the emission layer and improve the device life.

The first host compound, the second host compound and the dopant compound according to an embodiment of the present disclosure are used as the materials of an emission layer to contribute to the increase of the life of an organic electroluminescence device.

The organic electroluminescence device according to an embodiment of the present disclosure may show improved emission efficiency and device life characteristics.

The organic electroluminescence device according to an embodiment of the present disclosure includes two different host materials and a dopant material, and may show high efficiency and long life characteristics.

Although the example embodiments of the present disclosure have been described, it is understood that the present disclosure should not be limited to these example embodiments but various changes and modifications can be made by one ordinary skilled in the art within the spirit and scope of the present disclosure as defined by the appended claims, and equivalents thereof.

What is claimed is:

1. An organic electroluminescence device, comprising:

a first electrode;

a hole transport region on the first electrode;

an emission layer on the hole transport region;

an electron transport region on the emission layer; and a second electrode on the electron transport region, wherein the emission layer comprises:

a first host compound represented by Formula 1;

a second host compound comprising a silyl group as a substituent and a heteroaryl group containing N; and a dopant compound represented by Formula 3:

Formula 1

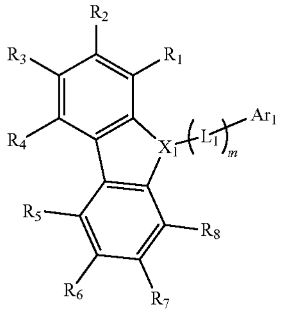

in Formula 1, $X_1$ is N or $CR_9$, $R_1$ to $R_9$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, $L_1$ is a substituted or unsubstituted arylene group of 6 to 30 ring-forming carbon atoms, or a substituted or unsubstituted heteroarylene group of 2 to 30 ring-forming carbon atoms, or combined with an adjacent group to form a ring, $Ar_1$ is a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and m is 1 or 2, wherein at least one selected from among $R_1$ to $R_8$ and $Ar_1$ is a substituted or unsubstituted silyl group, or an aryl group of 6 to 30 ring-forming carbon atoms, which is substituted with a substituted or unsubstituted silyl group:

Formula 3

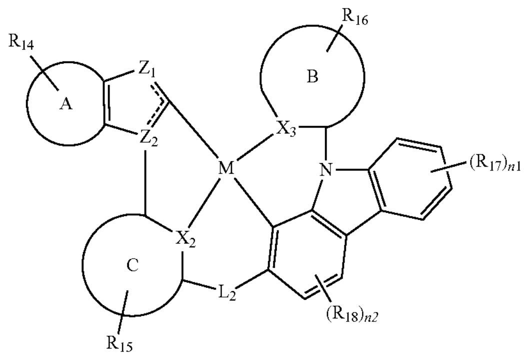

in Formula 3,

M is Pt, Au, or Cu, $Z_1$ is $NR_{19}$ or $CR_{20}R_{21}$, $X_2$, $X_3$, and $Z_2$ are each independently N or C, $L_2$ is O or S, $R_{14}$ to $R_{18}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, $R_{19}$ to $R_{21}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, ring A to ring C are each independently a substituted or unsubstituted monocyclic or polycyclic hydrocarbon ring group of 6 to 30 ring-forming carbon atoms, or a substituted or unsubstituted monocyclic or polycyclic heterocyclic group of 2 to 30 ring-forming carbon atoms, n1 is an integer of 0 to 4, and n2 is an integer of 0 to 2.

2. The organic electroluminescence device of claim 1, wherein the second host compound is represented by Formula 2:

Formula 2

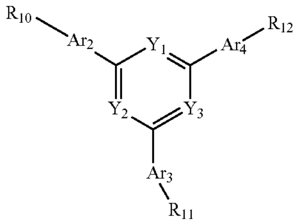

in Formula 2, $Y_1$ to $Y_3$ are each independently N or $CR_{13}$, wherein at least one selected from among $Y_1$ to $Y_3$ is N, $Ar_2$ to $Ar_4$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_{10}$ to $R_{12}$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and $R_{13}$ is a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, wherein at least one selected from among $R_{10}$ to $R_{12}$ comprises a substituted or unsubstituted silyl group.

3. The organic electroluminescence device of claim 1, wherein Formula 1 is represented by any one selected from among Formula 4-1 to Formula 4-3:

Formula 4-1

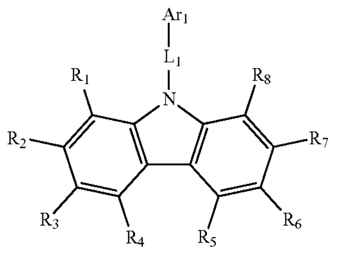

Formula 4-2

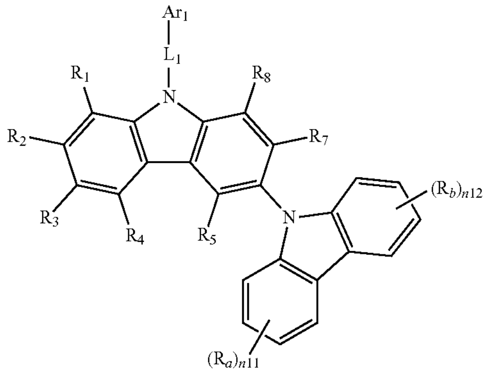

Formula 4-3

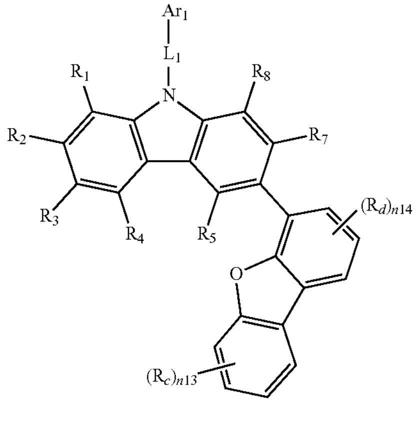

in Formula 4-1 to Formula 4-3, $R_a$ to $R_d$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n11 to n13 are each independently an integer of 0 to 4, n14 is an integer of 0 to 3, and $R_1$ to $R_8$, $L_1$, and $Ar_1$ are the same as defined with respect to Formula 1.

4. The organic electroluminescence device of claim 1, wherein $L_1$ of Formula 1 is represented by Formula 5-1 or Formula 5-2:

Formula 5-1

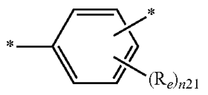

Formula 5-2

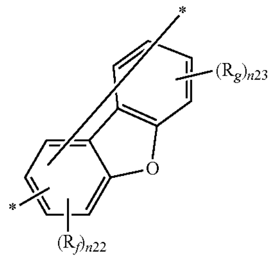

in Formula 5-1 and Formula 5-2, $R_e$ to $R_g$ are each independently a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n21 and n23 are each independently an integer of 0 to 4, and n22 is an integer of 0 to 3, wherein a sum of n22 and n23 is 6 or less.

5. The organic electroluminescence device of claim 1, wherein Formula 3 is represented by Formula 8:

Formula 8

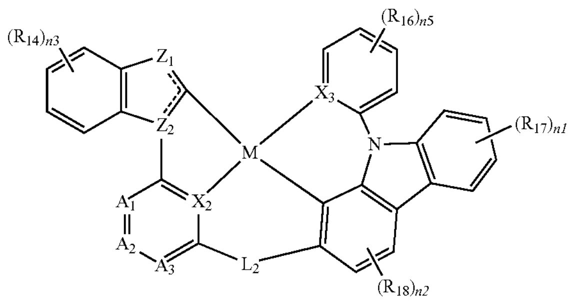

in Formula 8, $A_1$ to $A_3$ are each independently N, B, or $CR_{22}$, $R_{22}$ is a hydrogen atom, a deuterium atom, a halogen atom, a substituted or unsubstituted silyl group, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, n3 and n5 are each independently an integer of 0 to 4, and M, $L_2$, $X_2$, $X_3$, $Z_1$, $Z_2$, $R_{14}$, $R_{16}$ to $R_{18}$, n1, and n2 are the same as defined with respect to Formula 3.

6. The organic electroluminescence device of claim 1, wherein Formula 3 is represented by Formula 9:

Formula 9

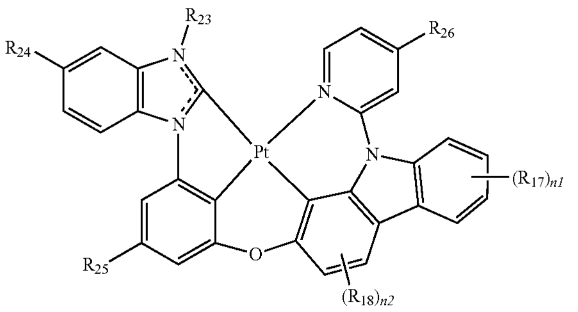

in Formula 9, $R_{23}$ is a hydrogen atom, a deuterium atom, a halogen atom, a substituted or unsubstituted alkyl group of 1 to 30 carbon atoms, a substituted or unsubstituted aryl group of 6 to 30 ring-forming carbon atoms, or a substituted or unsubstituted heteroaryl group of 2 to 30 ring-forming carbon atoms, $R_{24}$ to $R_{26}$ are each independently a hydrogen atom, a deuterium atom, a substituted or unsubstituted silyl group, or a substituted or unsubstituted alkyl group of 1 to 30 carbon atoms, $R_{17}$, $R_{18}$, n1 and n2 are the same as defined with respect to Formula 3.

7. The organic electroluminescence device of claim 2, wherein Formula 2 is represented by any one selected from among Formula 7-1 to Formula 7-4:

Formula 7-1

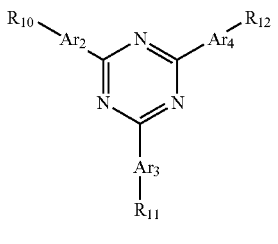

Formula 7-2

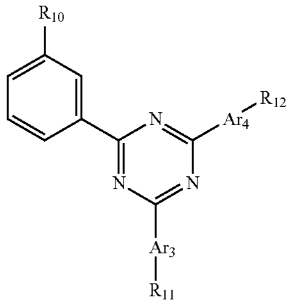

-continued
Formula 7-3
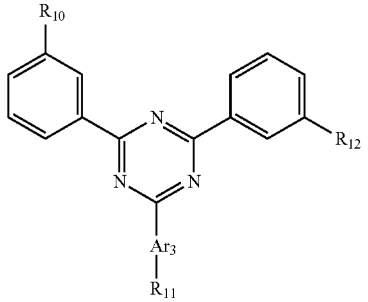
Formula 7-4
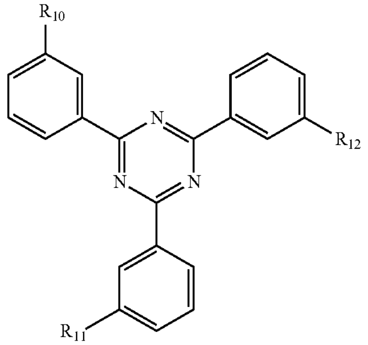
in Formula 7-1 to Formula 7-4,
$Ar_2$ to $Ar_4$, and $R_{10}$ to $R_{12}$ are the same as defined with respect to Formula 2.
8. The organic electroluminescence device of claim 1, wherein the first host compound represented by Formula 1 is any one selected from among compounds represented in Compound Group 1:
Compound Group 1
HT-01
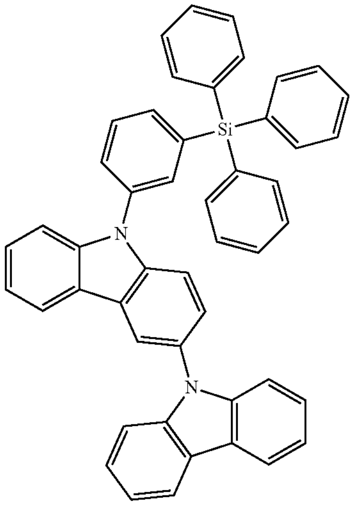
-continued
HT-02
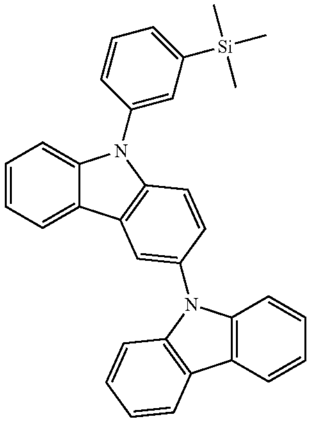
HT-03
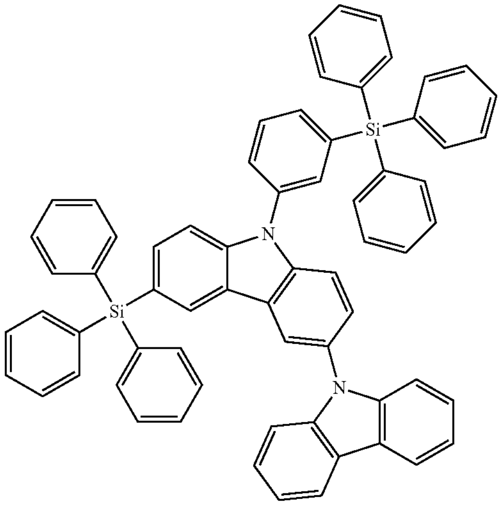
HT-04
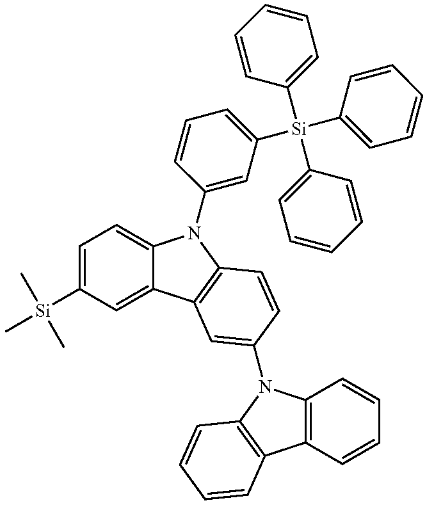

-continued
HT-05
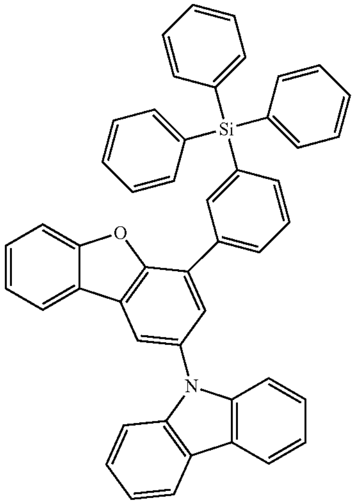
HT-06
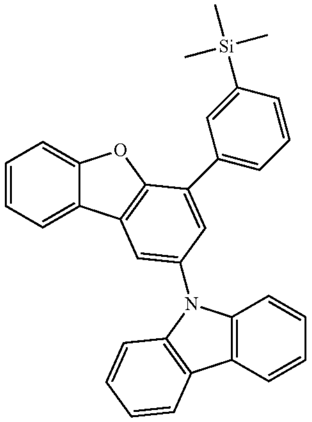
HT-07
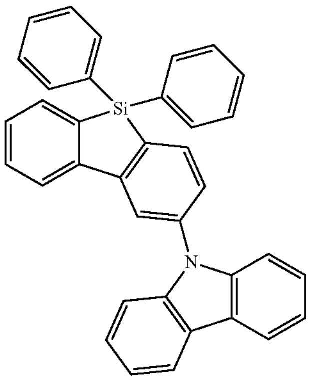
-continued
HT-08
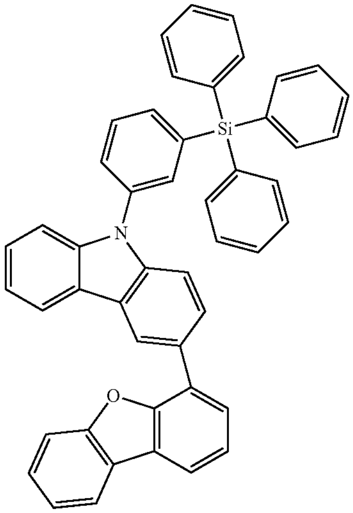
HT-09
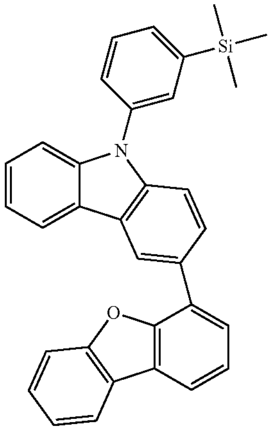
HT-10
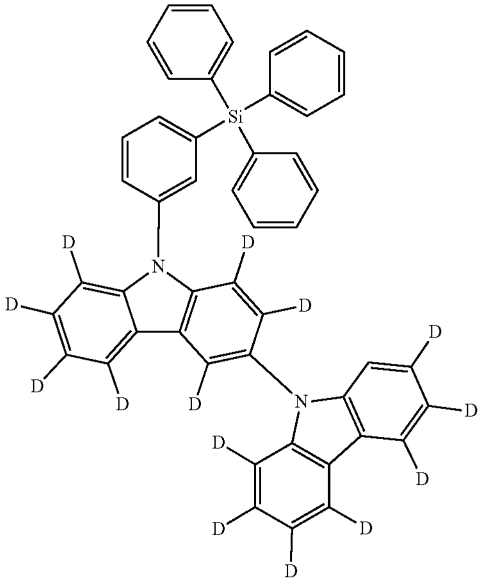

-continued
HT-11
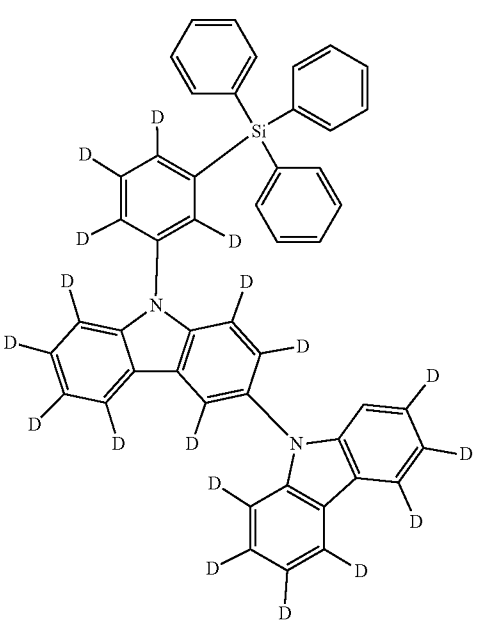
HT-12
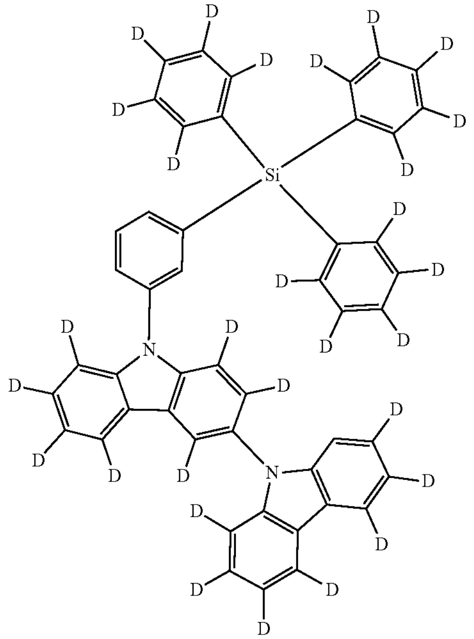
-continued
HT-13
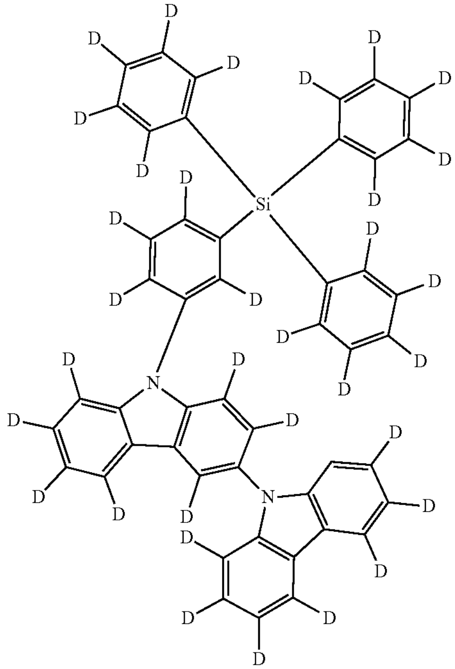
HT-14
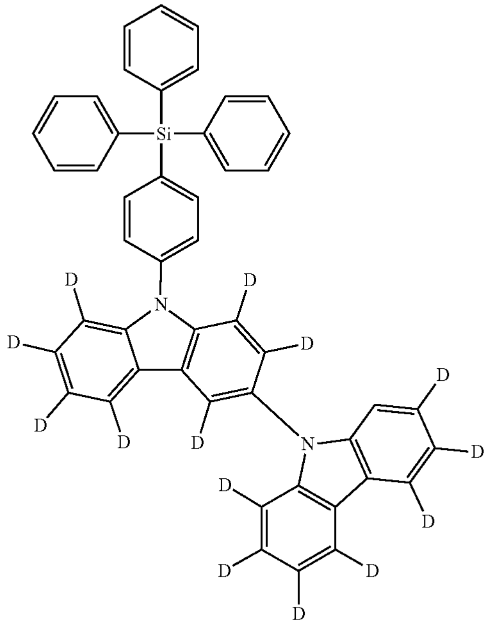

-continued
HT-15
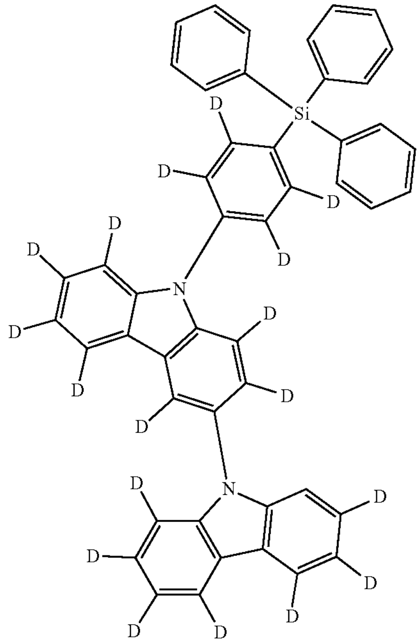
HT-16
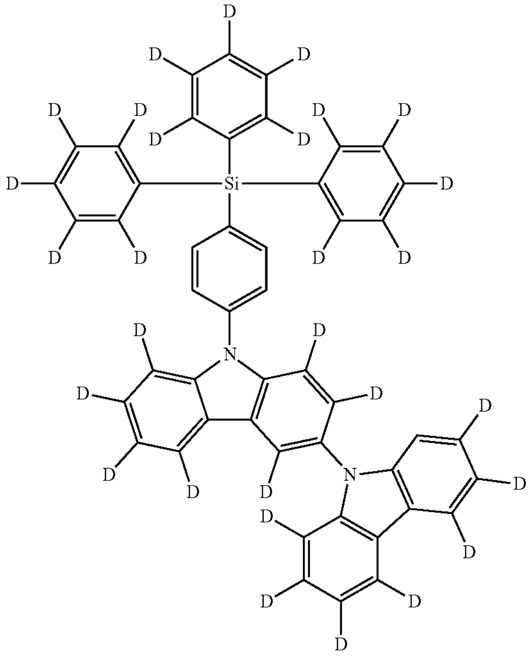
-continued
HT-17
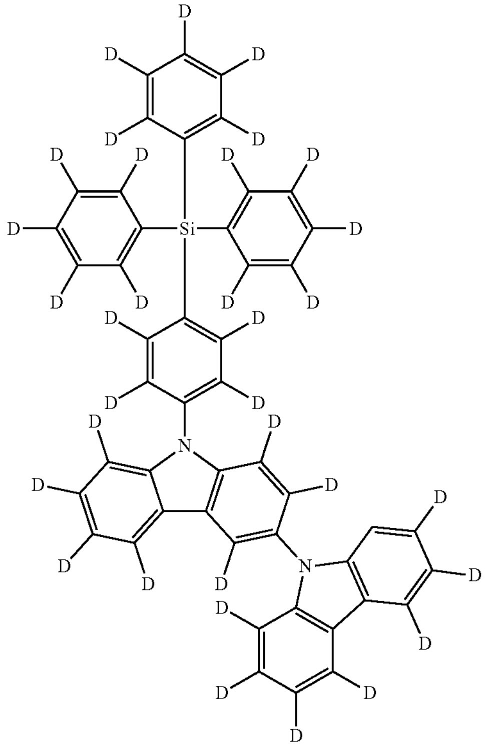
HT-18
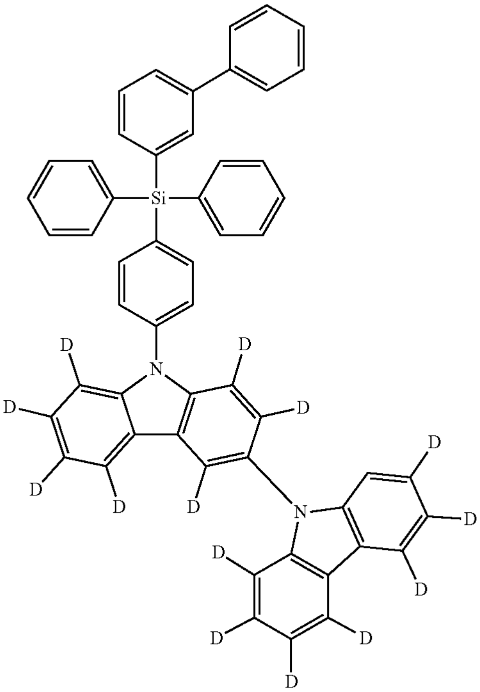

-continued
HT-19
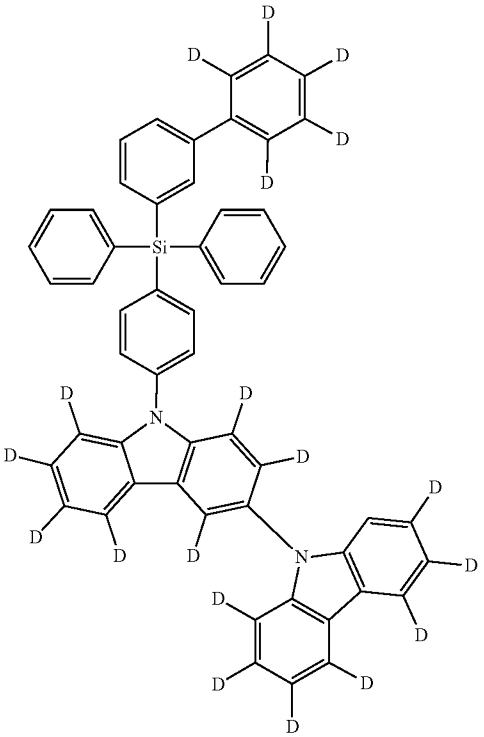
HT-20
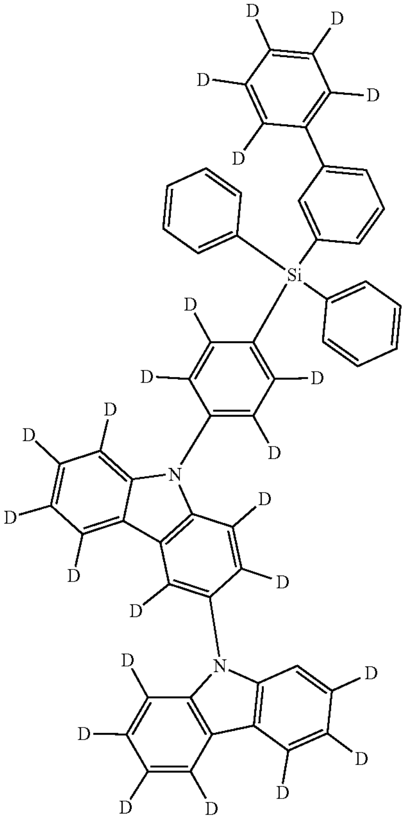
-continued
HT-21
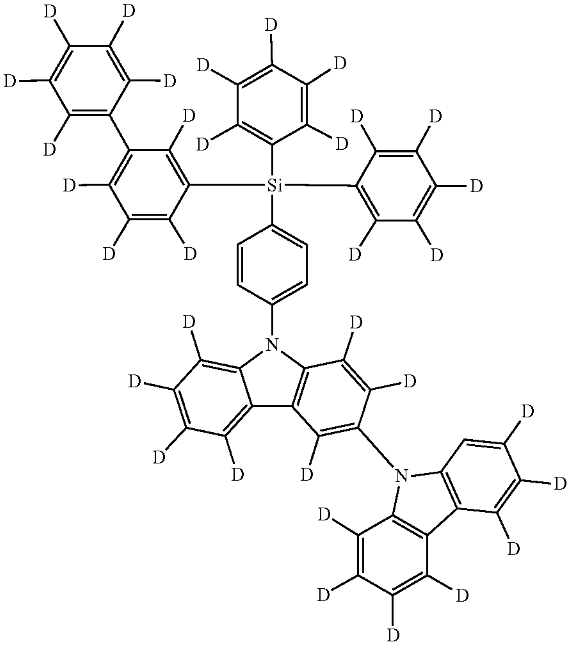
HT-22
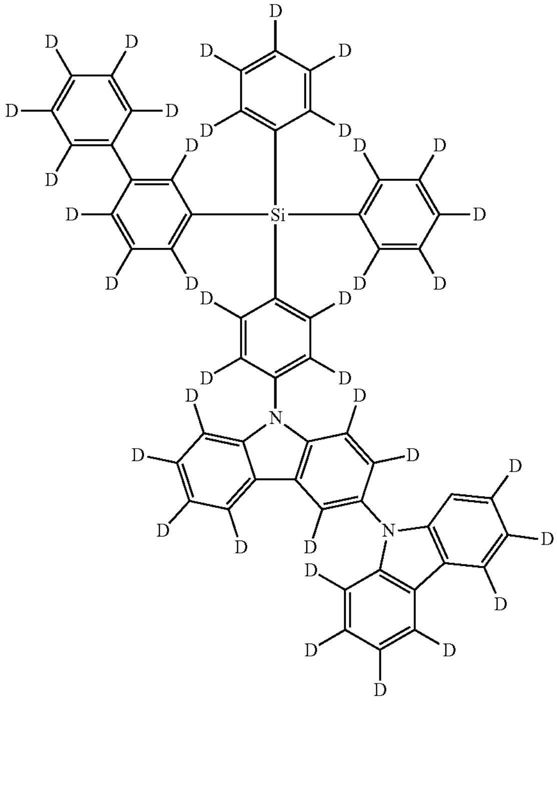

-continued
HT-23
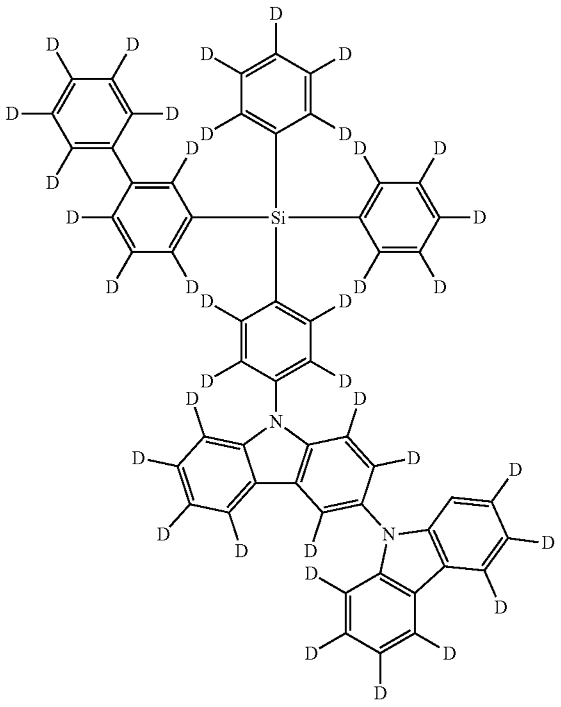
HT-24
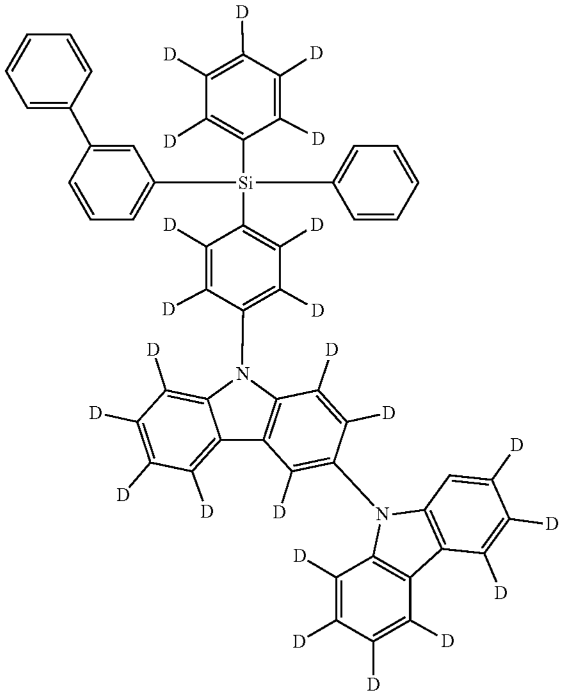
-continued
HT-25
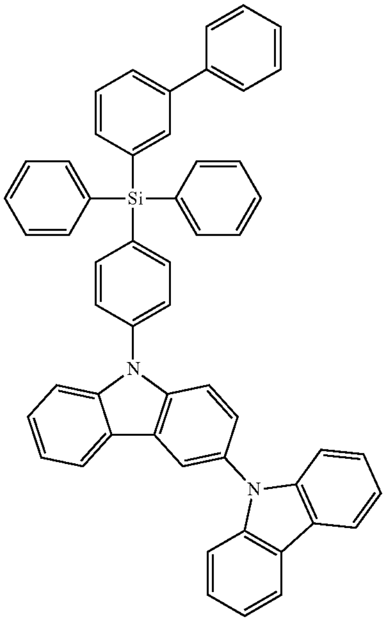
HT-26
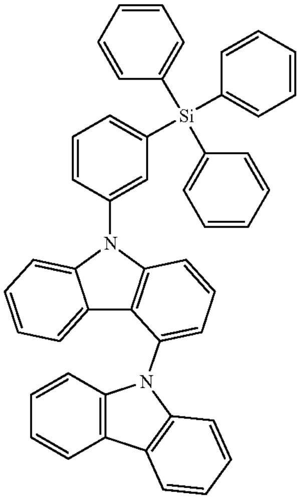

-continued
HT-27
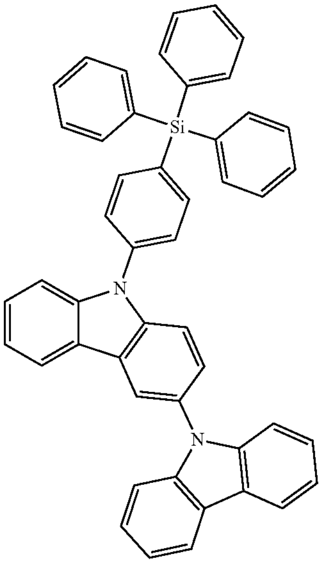
HT-28
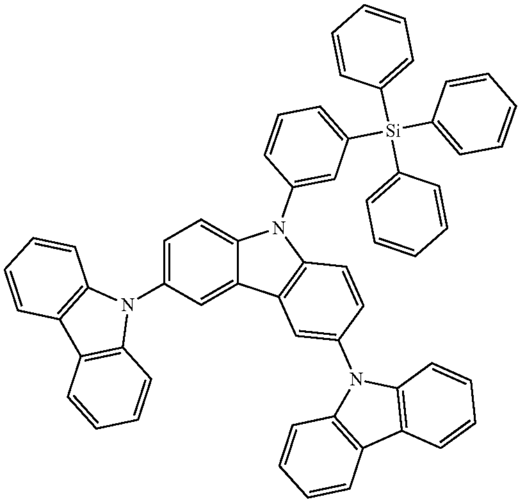
HT-29
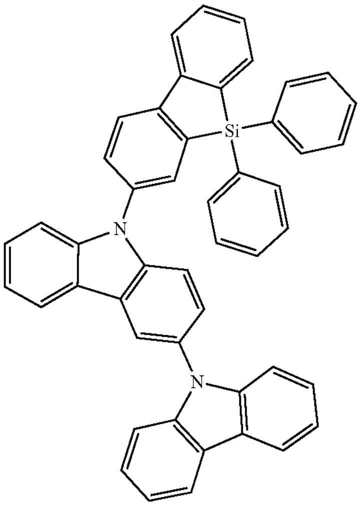
-continued
HT-30
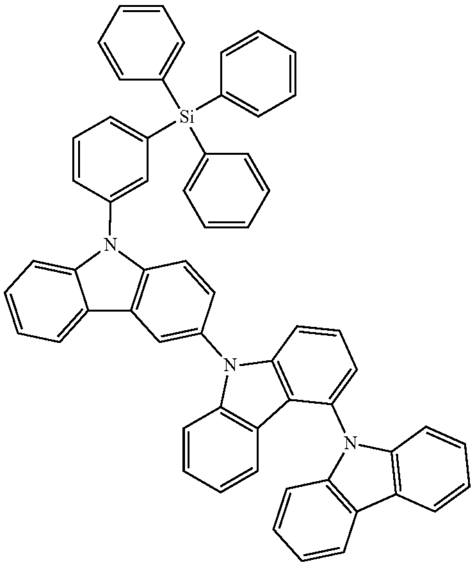
HT-31
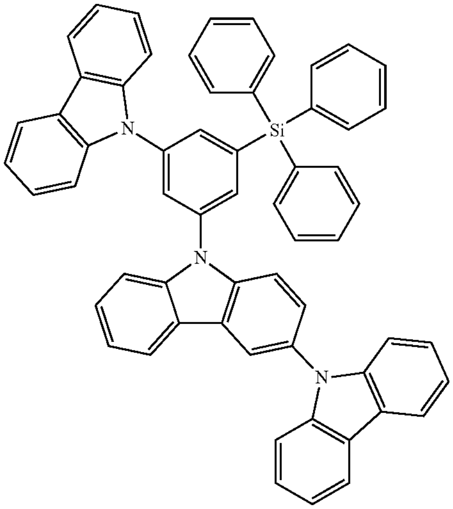
HT-32
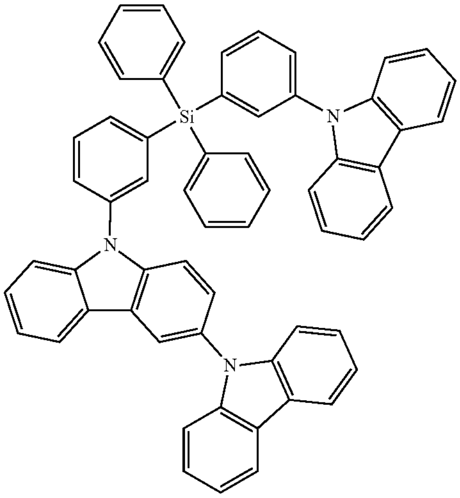

-continued
HT-33
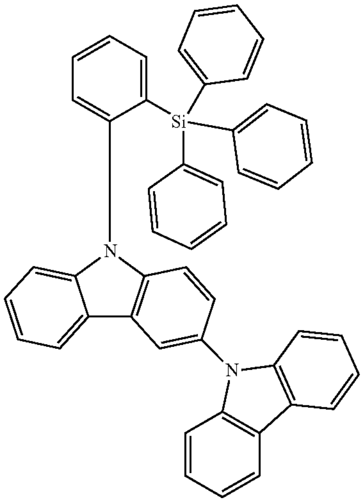
HT-34
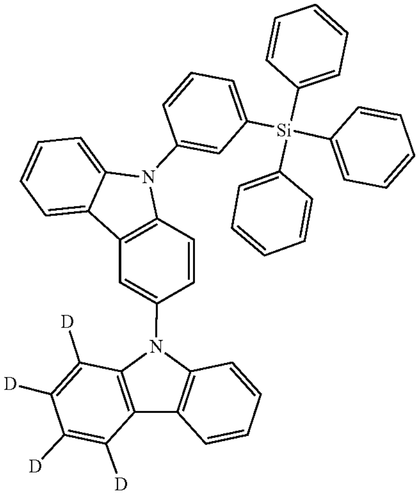
HT-35
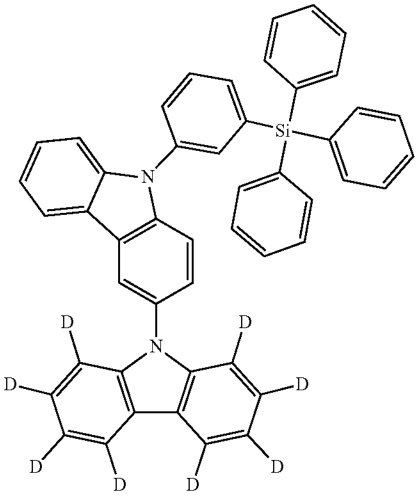
-continued
HT-36
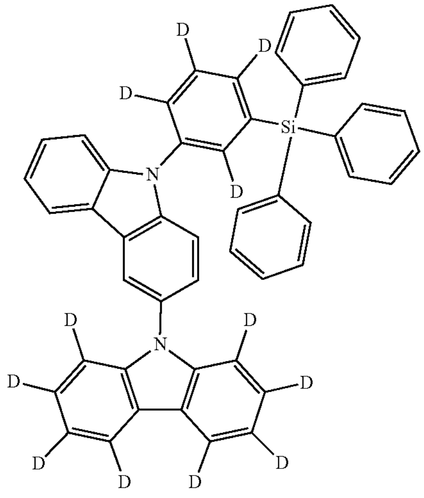
HT-37
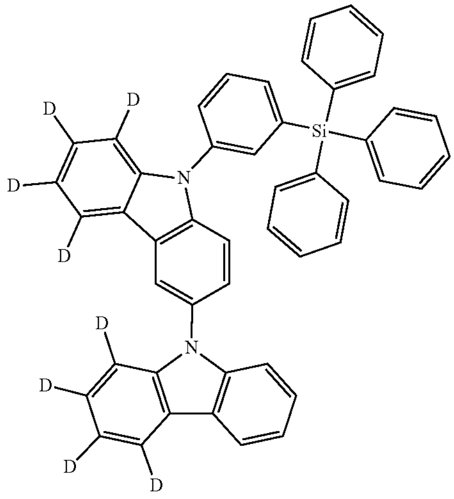
HT-38
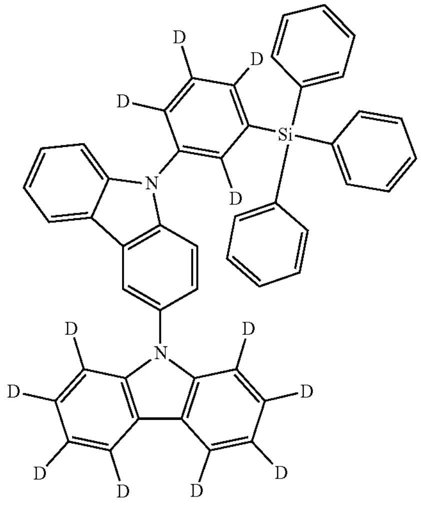

-continued
HT-39
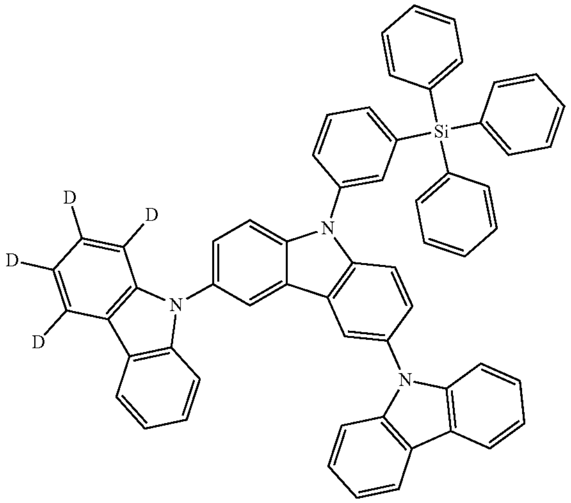
HT-40
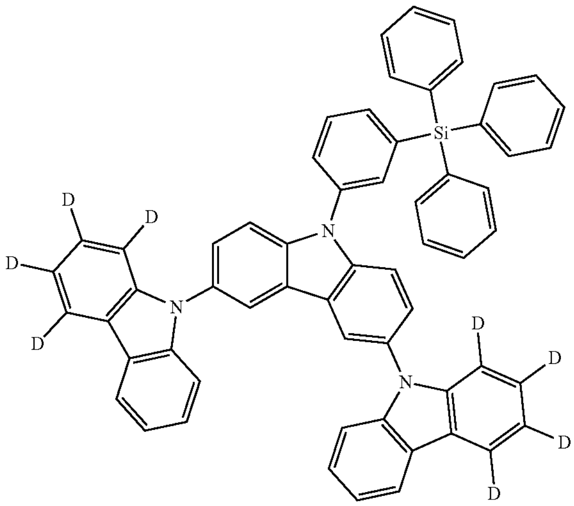
HT-41
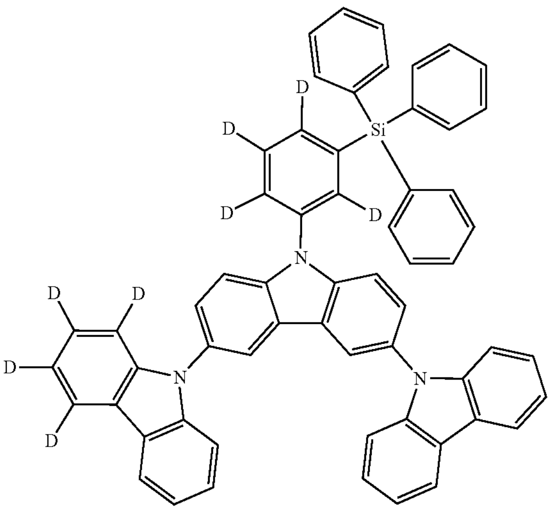
-continued
HT-42
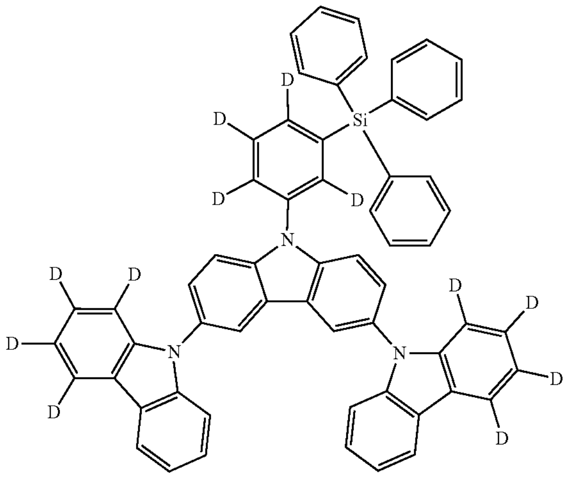
HT-43
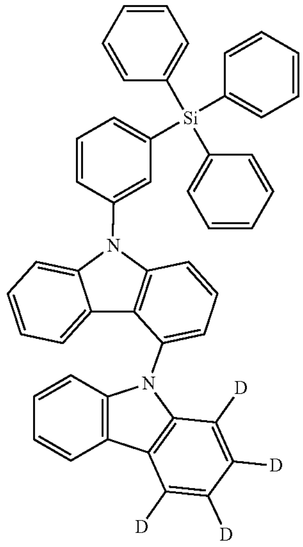
HT-44
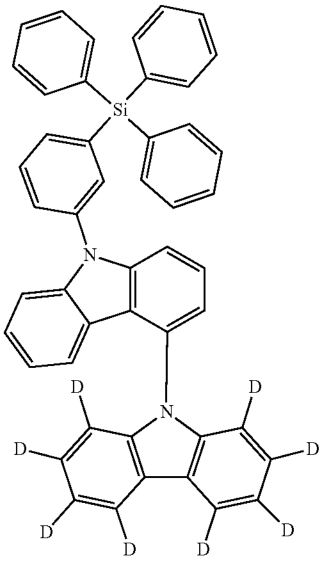

-continued
HT-45
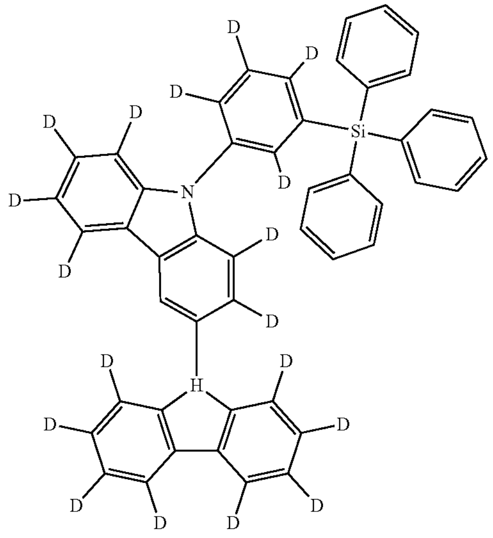
HT-46
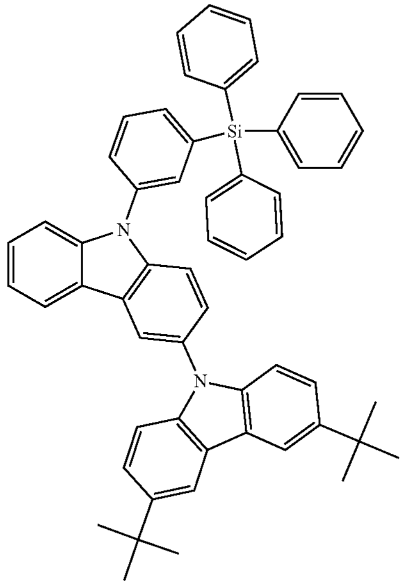
-continued
HT-47
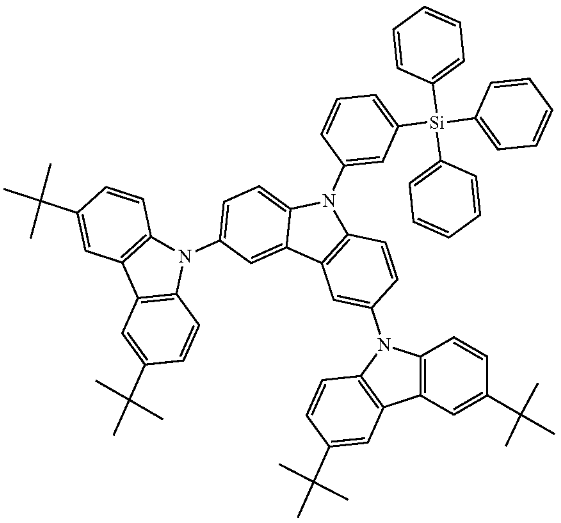
HT-48
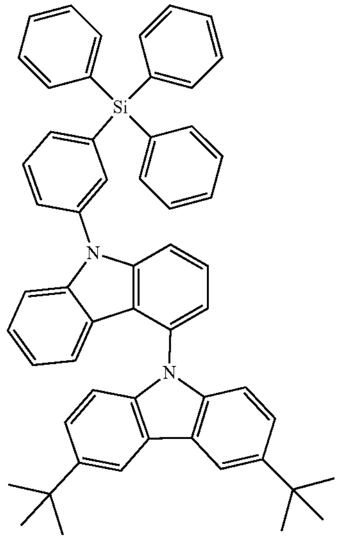

-continued
HT-49
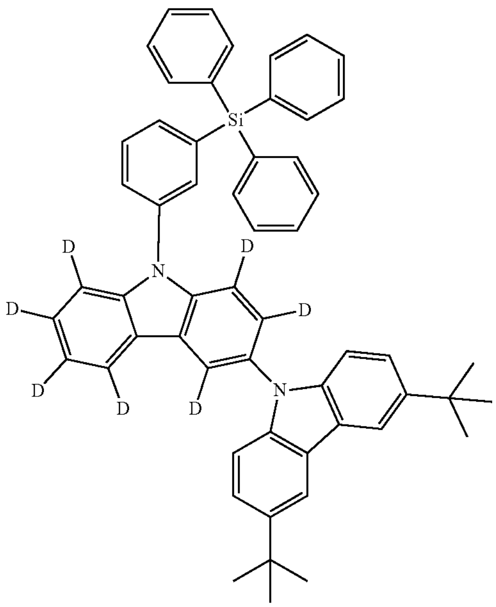
HT-50
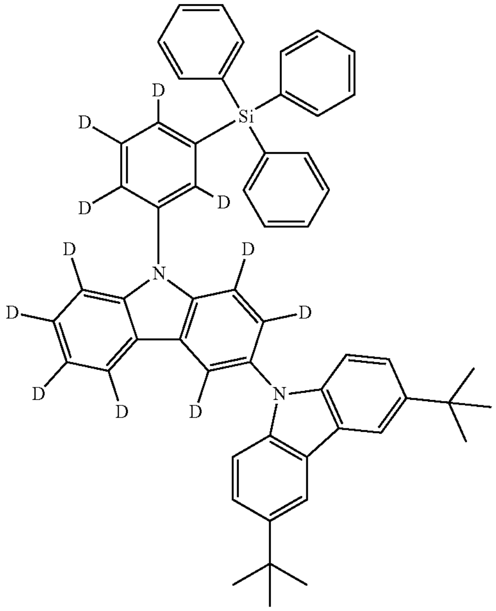
-continued
HT-51
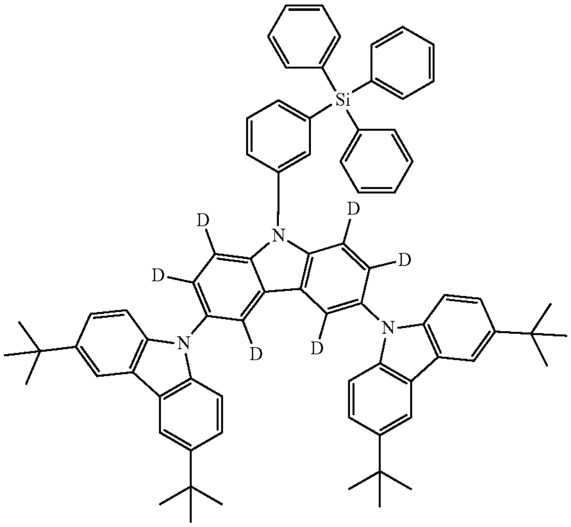
HT-52
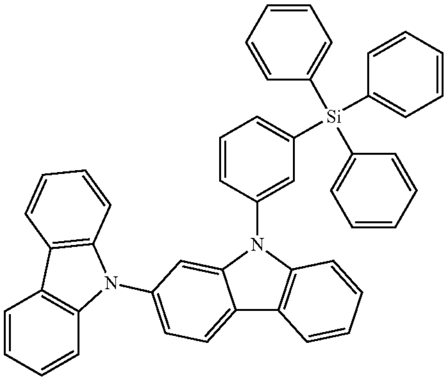
HT-53
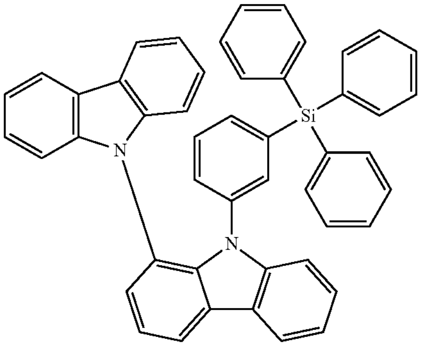

-continued
HT-54
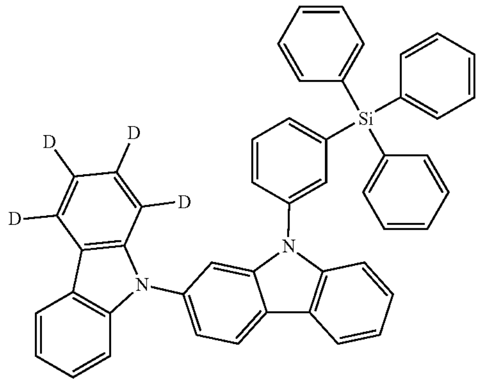
HT-55
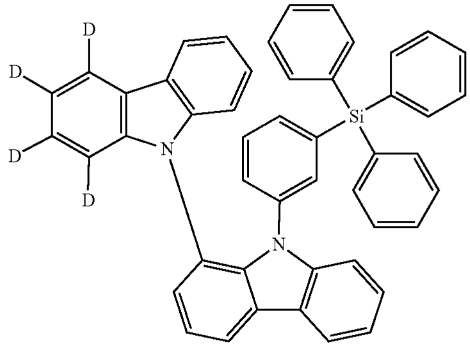
HT-56
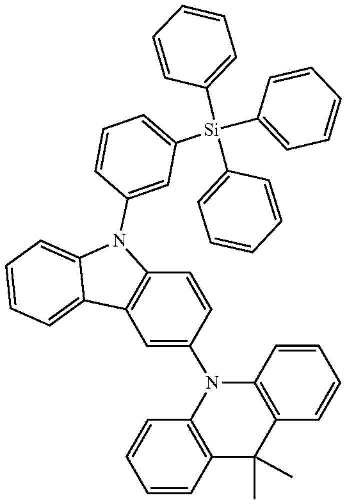
-continued
HT-57
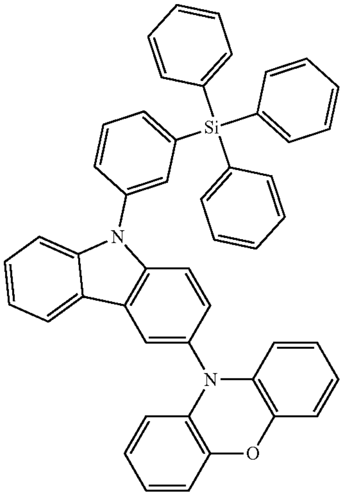
HT-58
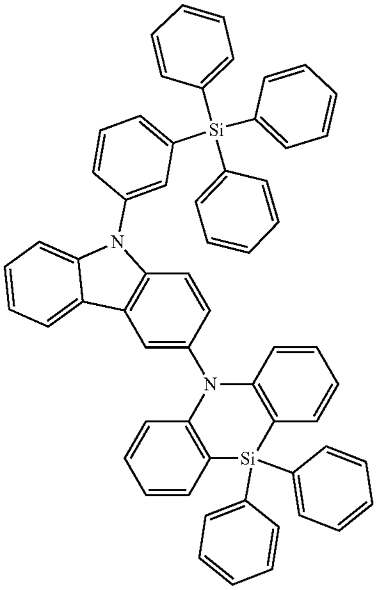
HT-59
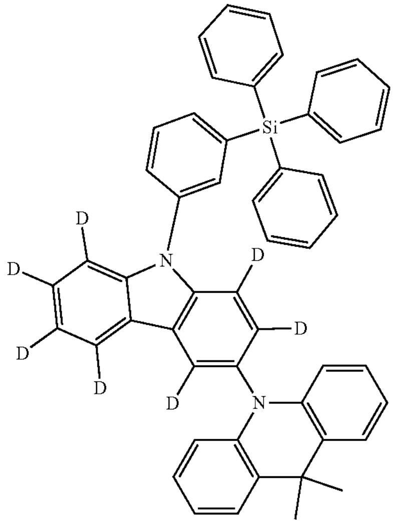

-continued
HT-60
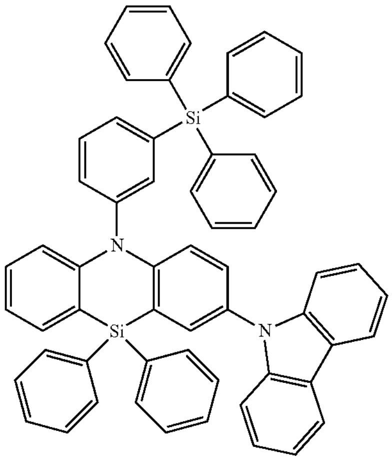
HT-61
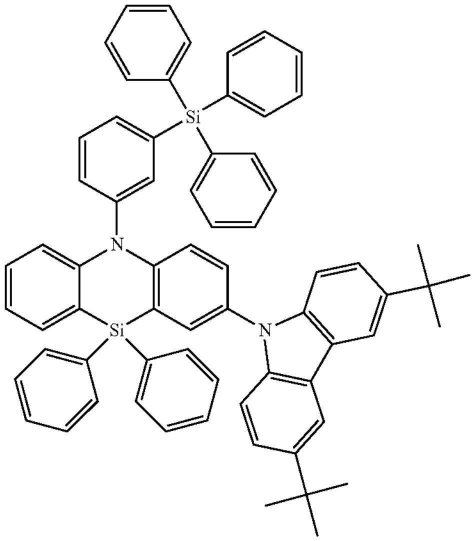
HT-62
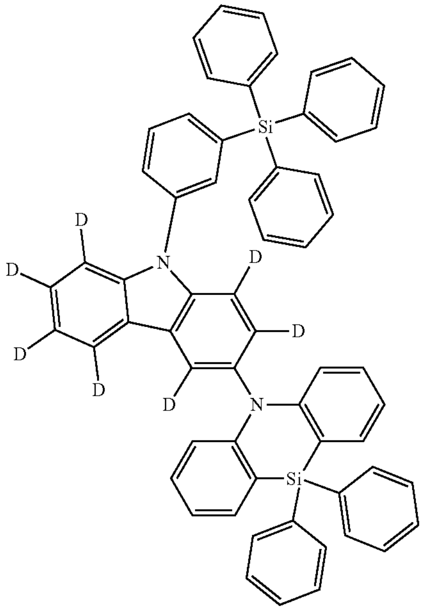
-continued
HT-63
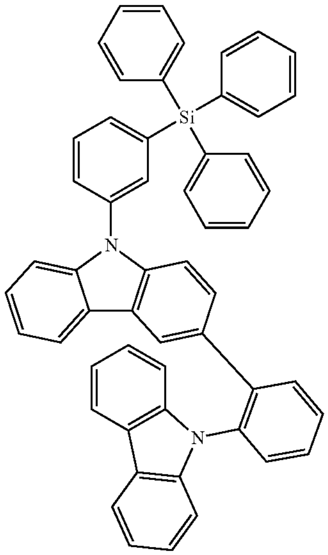
HT-64
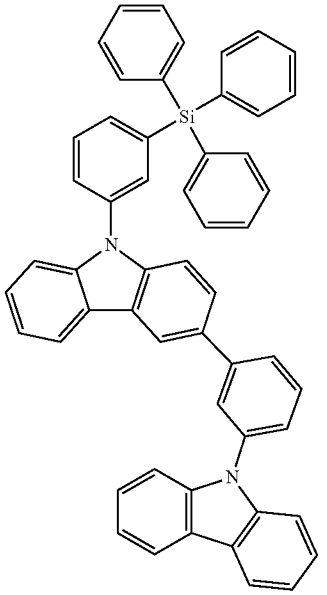

-continued
HT-65
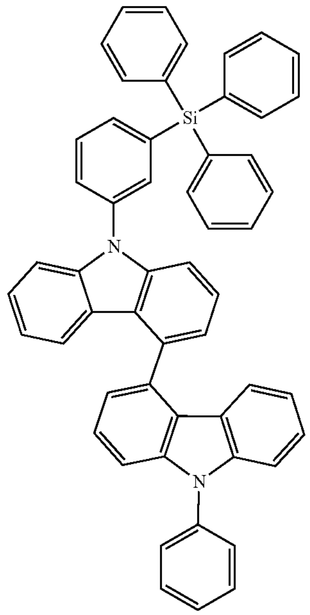
HT-66
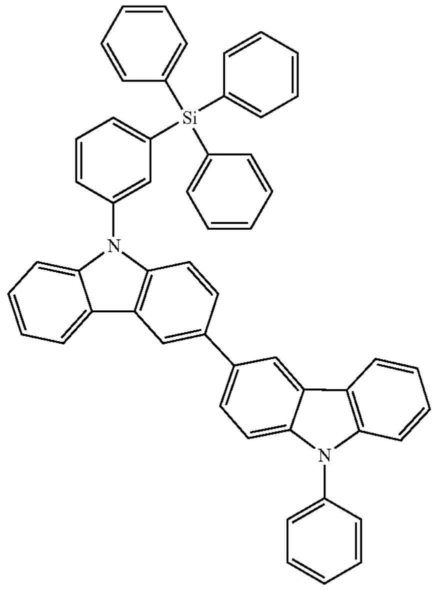
-continued
HT-67
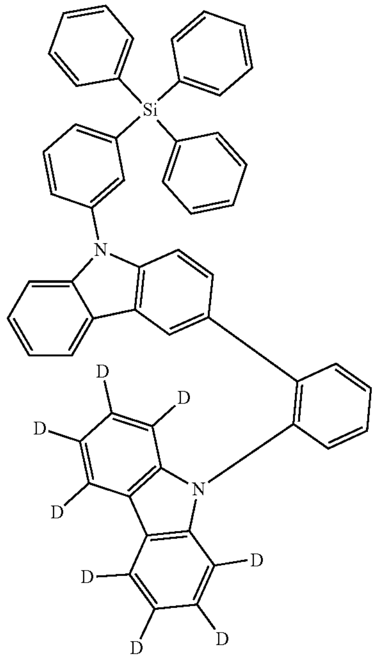
HT-68
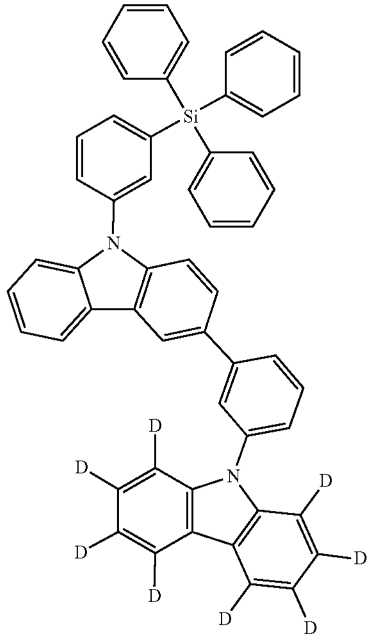

-continued
HT-69
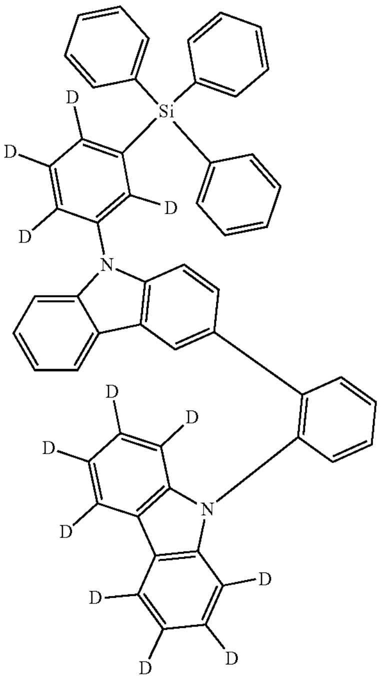
HT-70
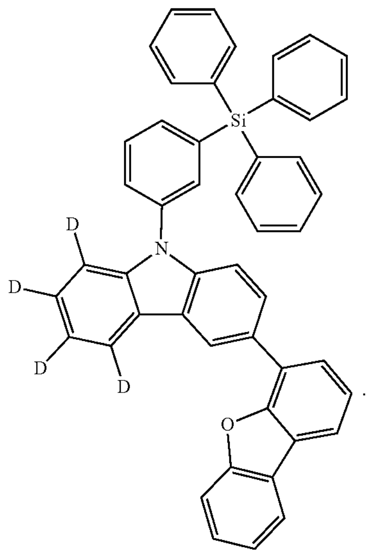
9. The organic electroluminescence device of claim 2, wherein the second host compound represented by Formula 2 is any one selected from among compounds represented in Compound Group 2:
Compound Group 2
ET-01
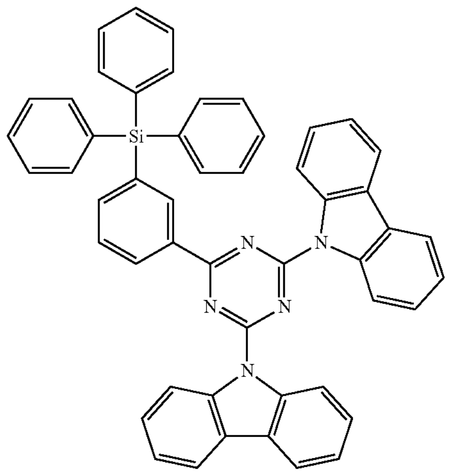
ET-02
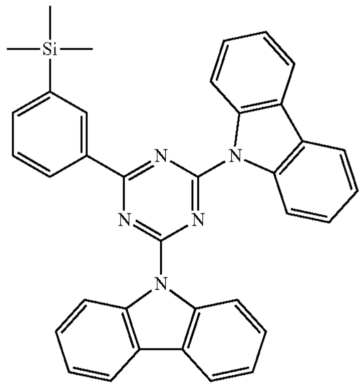
ET-03
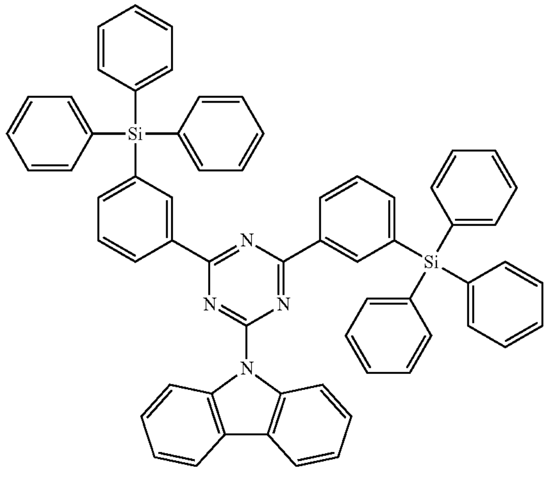

-continued
ET-04
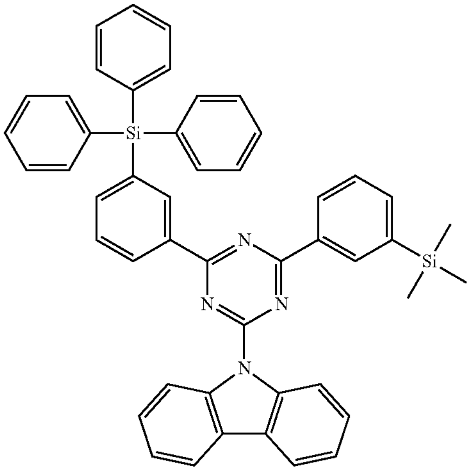
ET-05
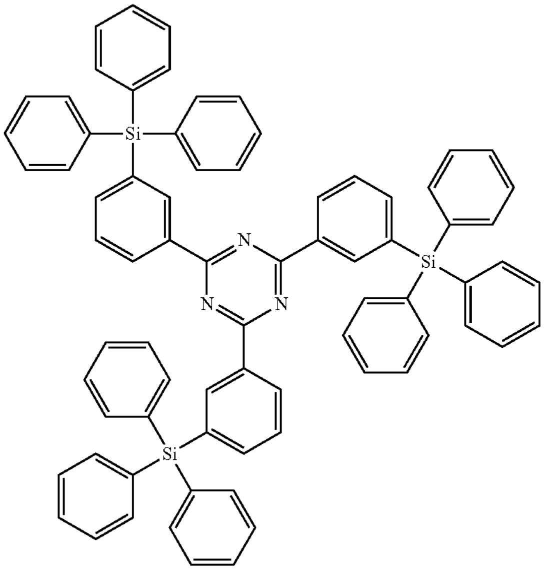
ET-06
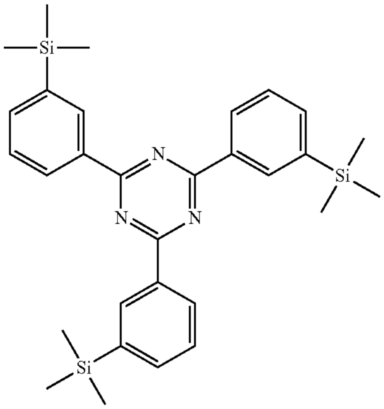
-continued
ET-07
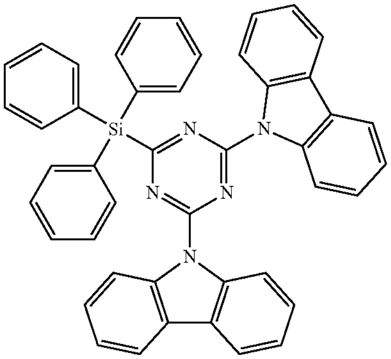
ET-08
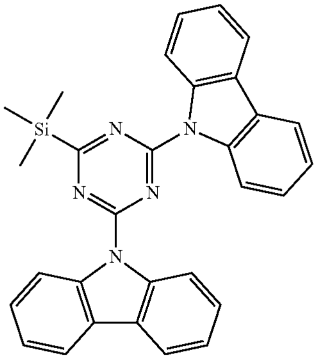
ET-09
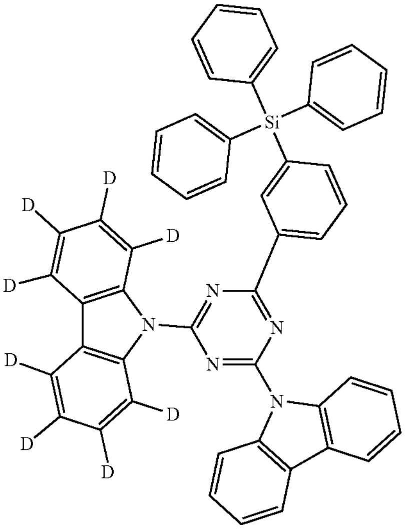

-continued
ET-10
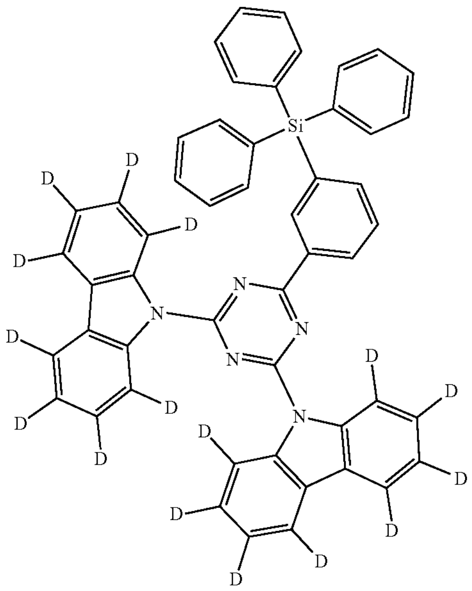
ET-11
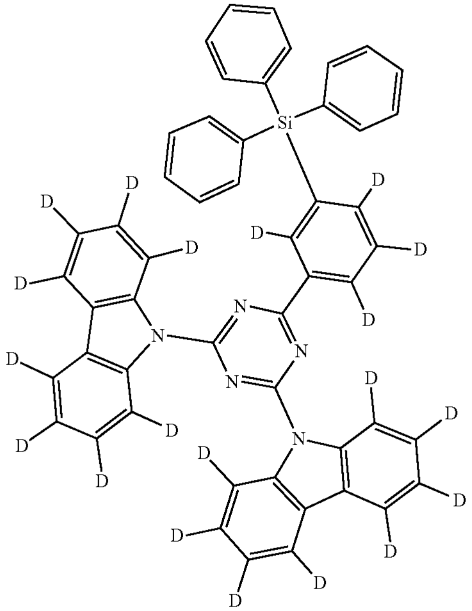
-continued
ET-12
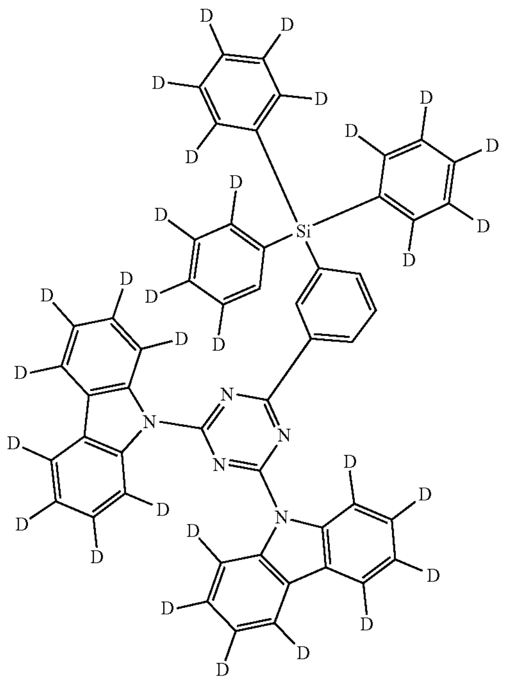
ET-13
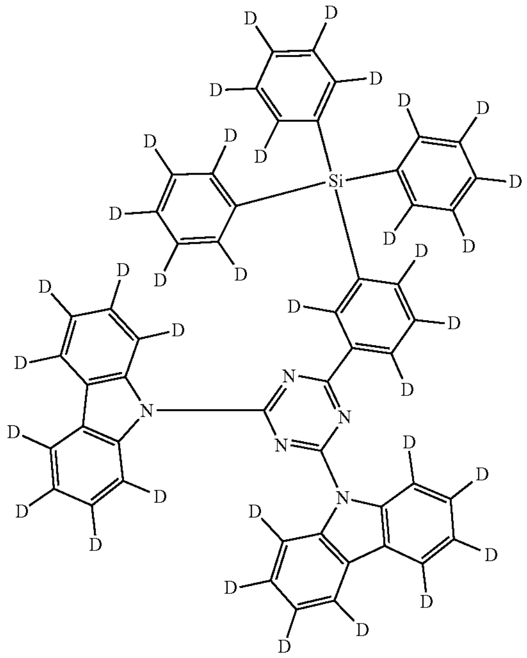

-continued
ET-14
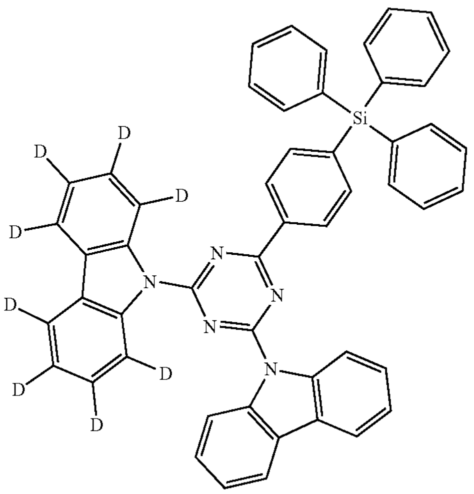
ET-15
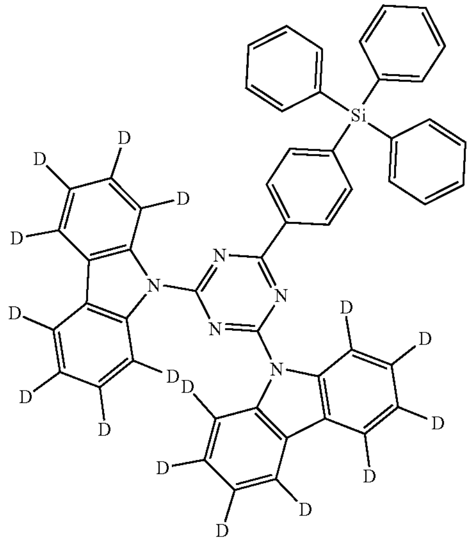
ET-16
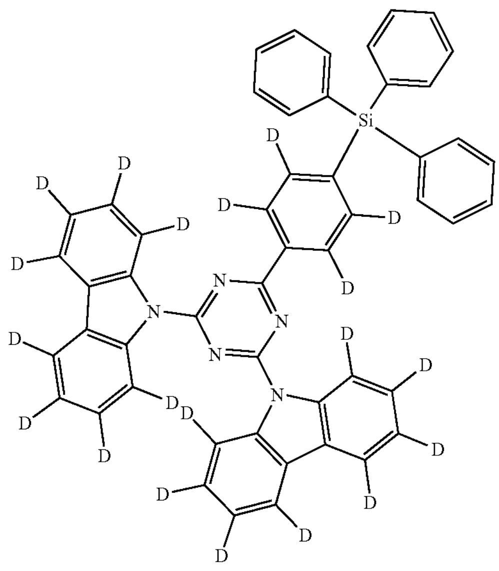
-continued
ET-17
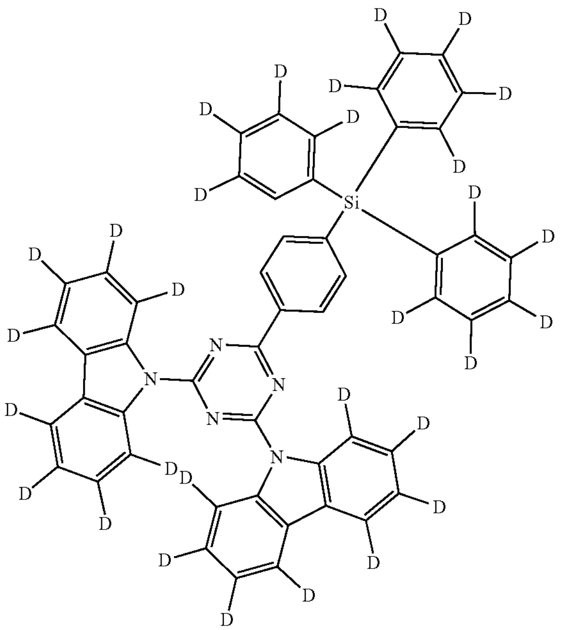
ET-18
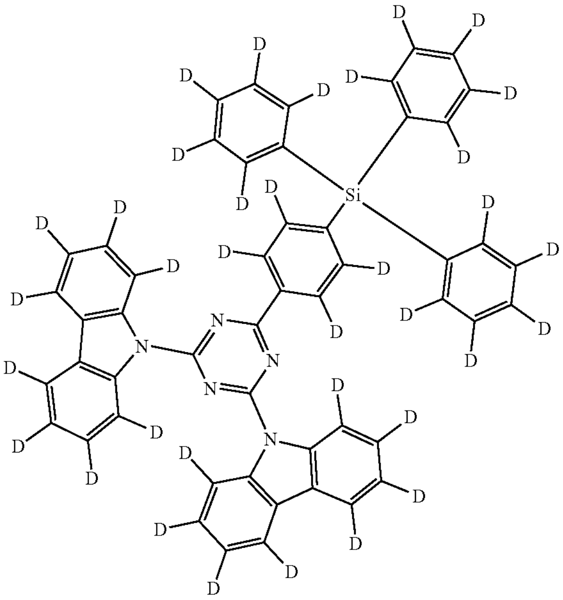

ET-19
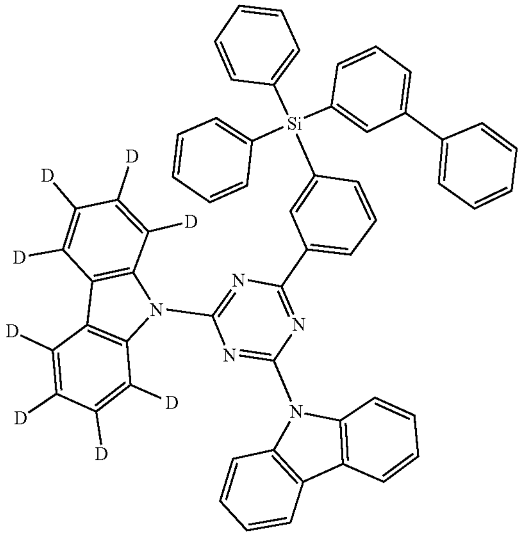
ET-20
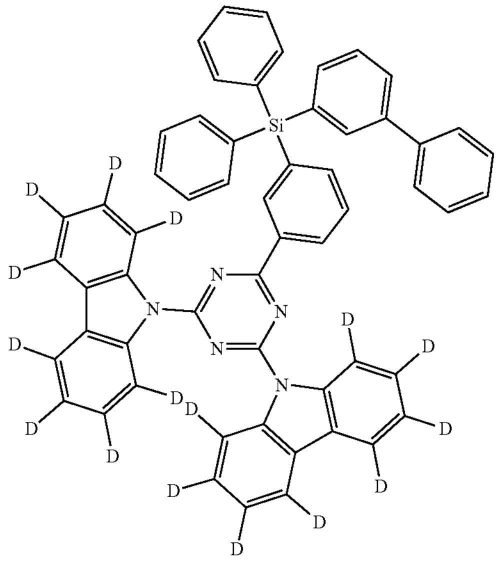
ET-21
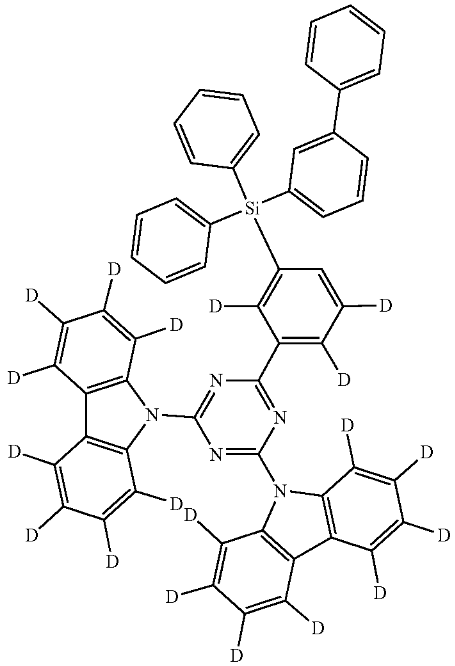
ET-22
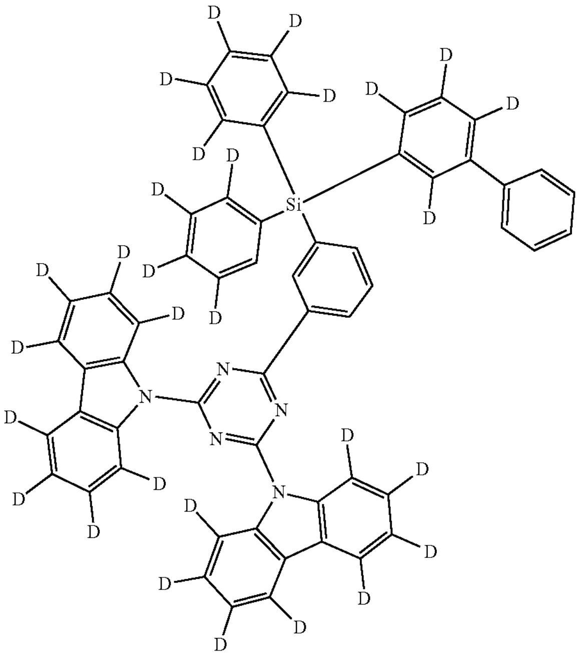

-continued
ET-23
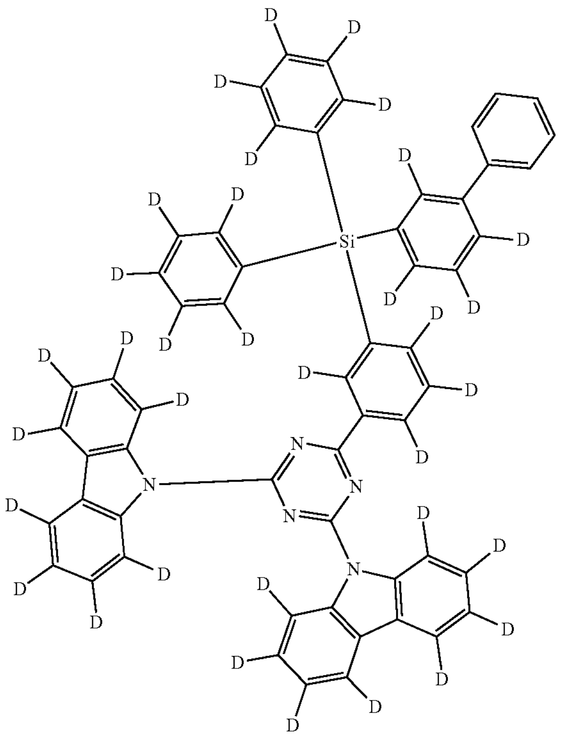
ET-24
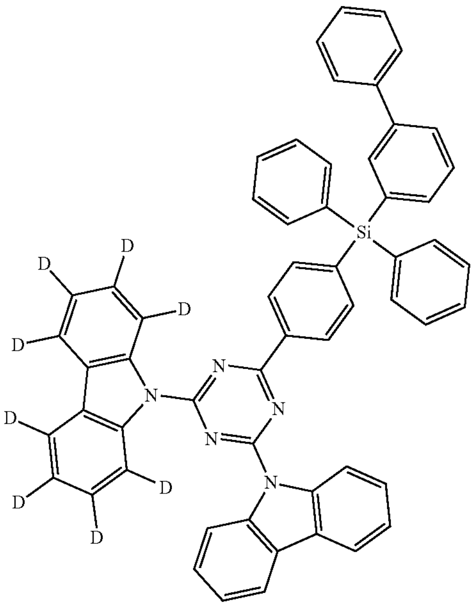
-continued
ET-25
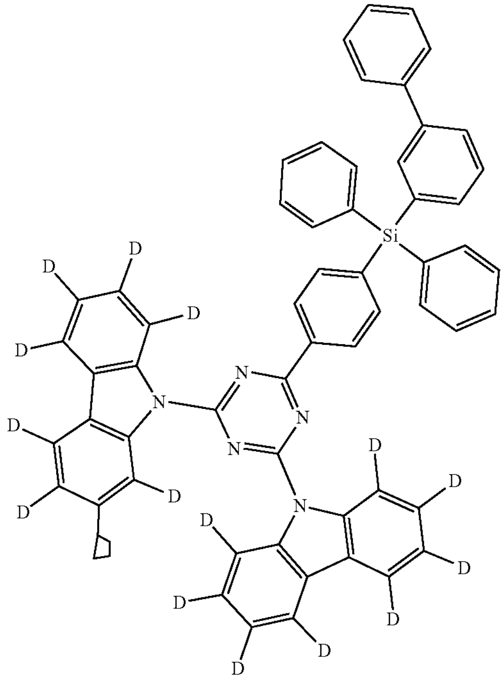
ET-26
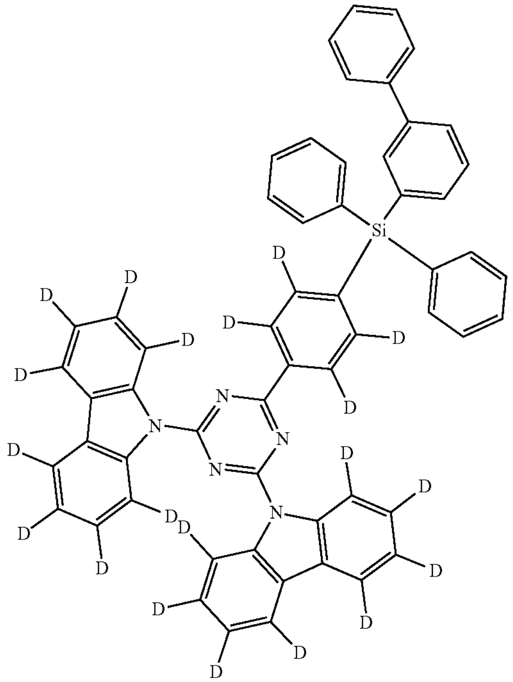

-continued
ET--27
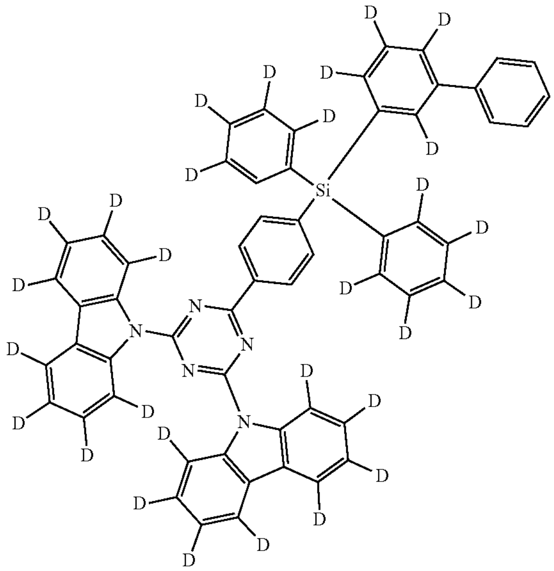
ET-28
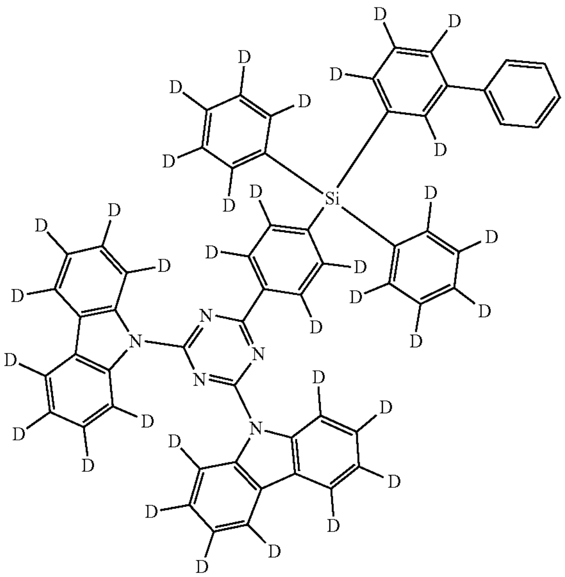
-continued
ET-29
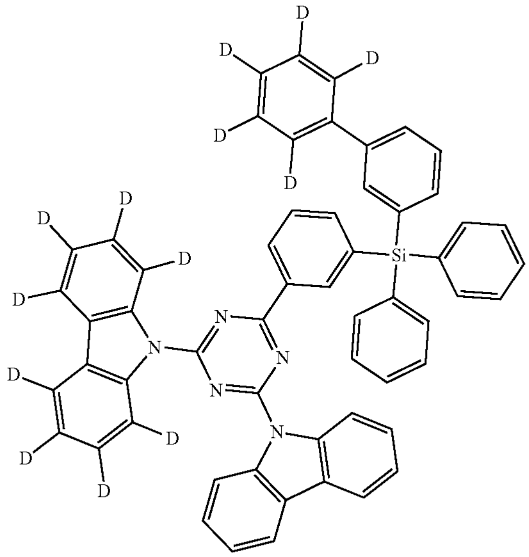
ET-30
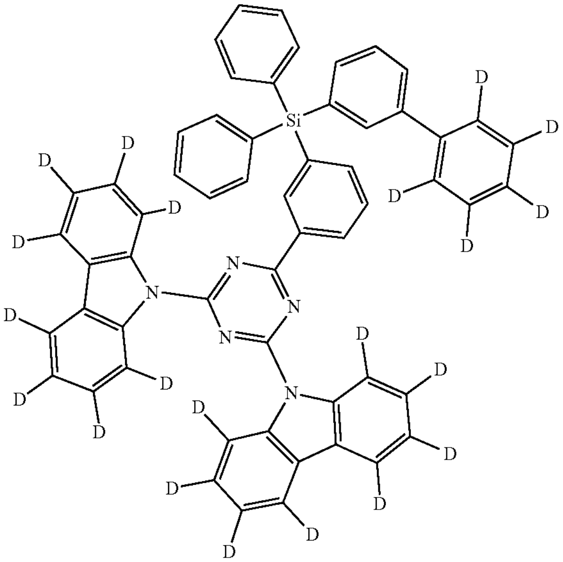

ET-31
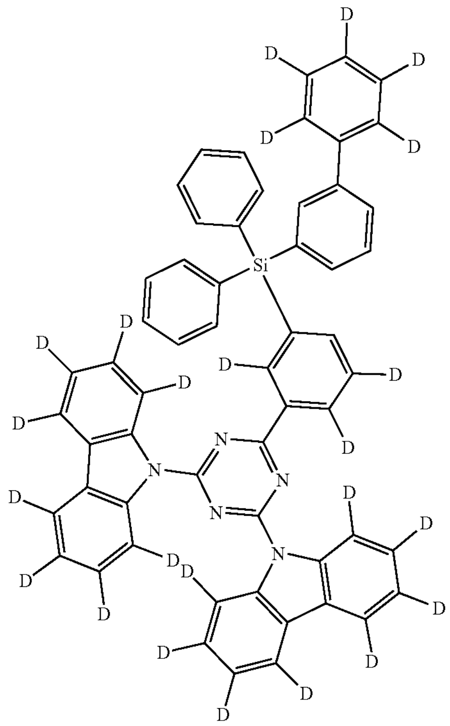
ET-32
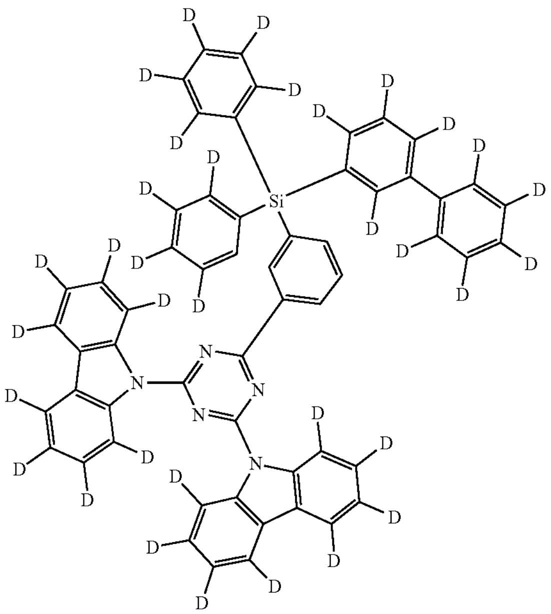
ET-33
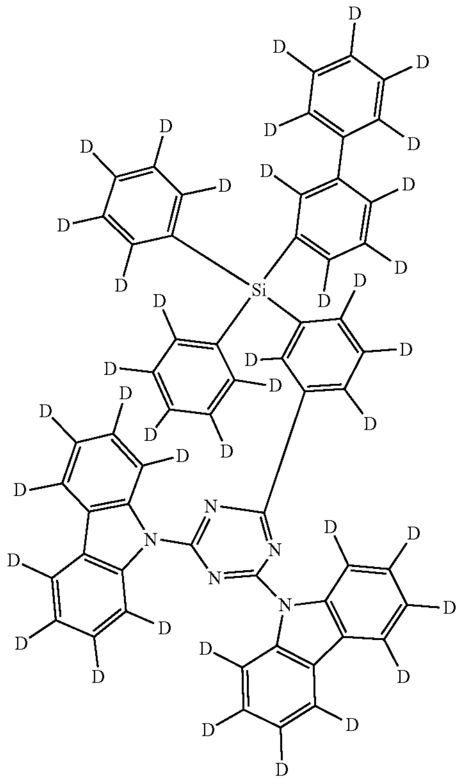
ET-34
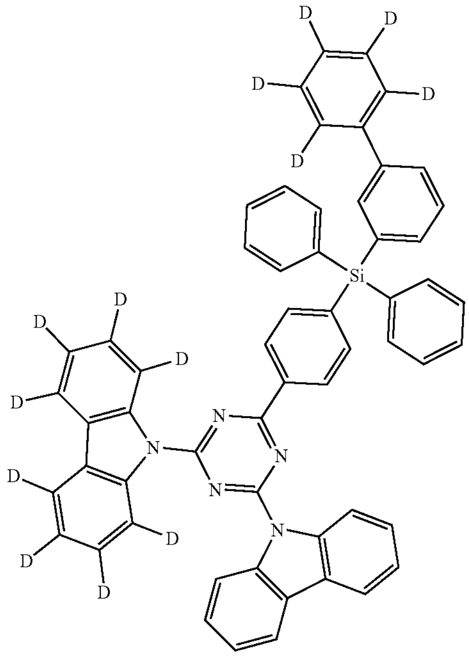

-continued
ET-35
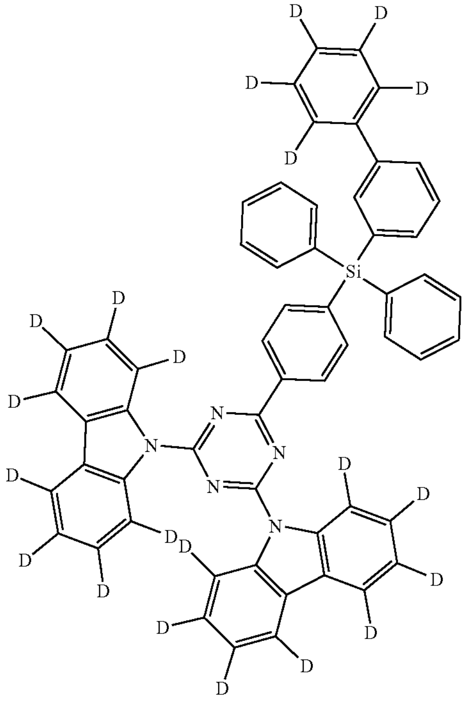
ET-36
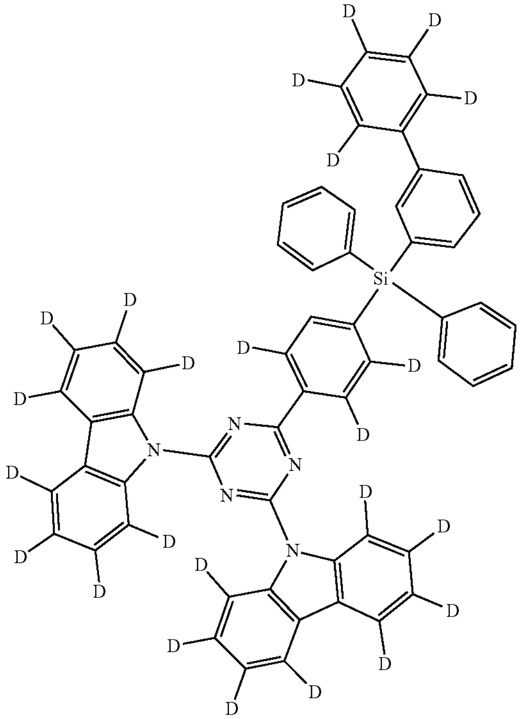
-continued
ET-37
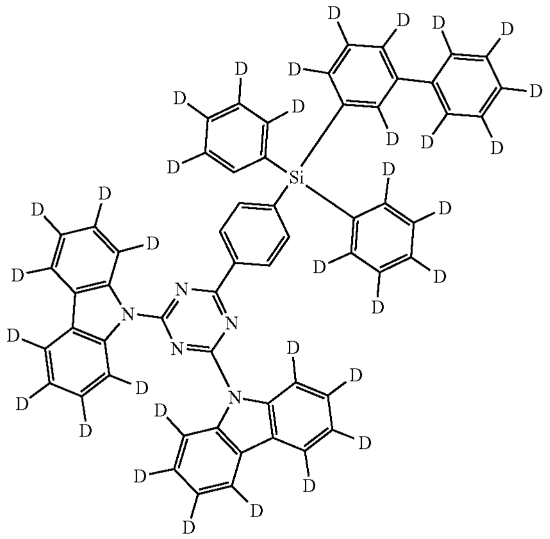
ET-38
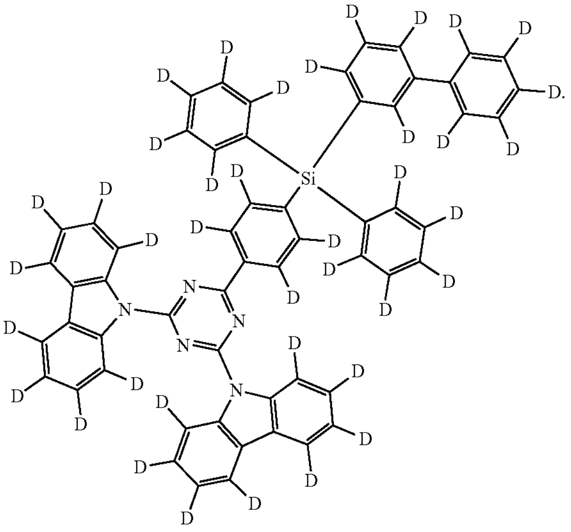
10. The organic electroluminescence device of claim 1, wherein the dopant compound represented by Formula 3 is any one selected from among compounds represented in Compound Group 3:

Compound Group 3
PBD-01
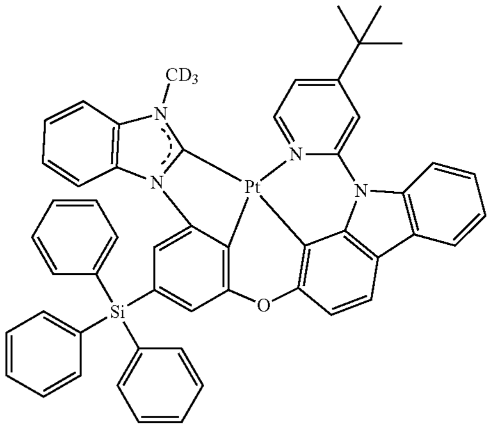
PBD-02
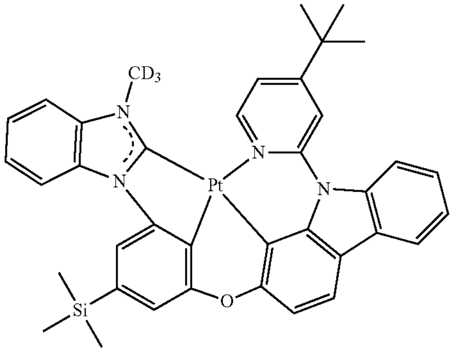
PBD-03
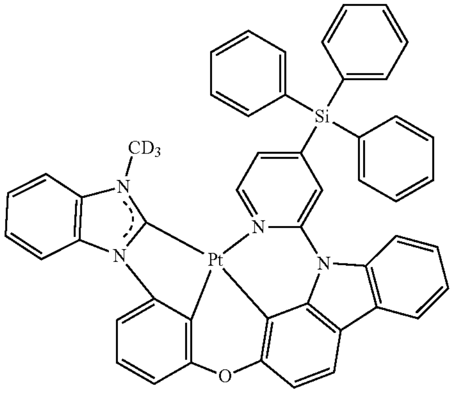
PBD-04
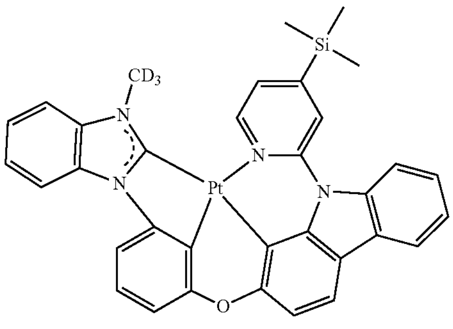
-continued
PBD-05
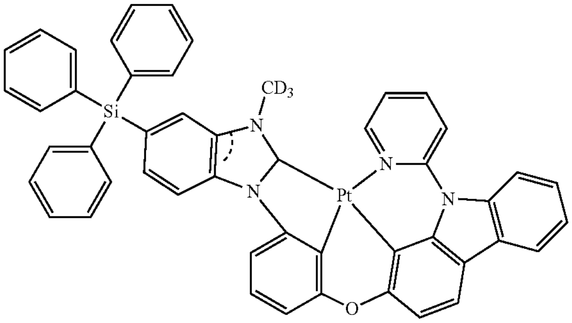
PBD-06
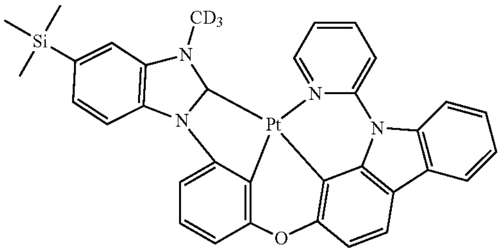
PBD-07
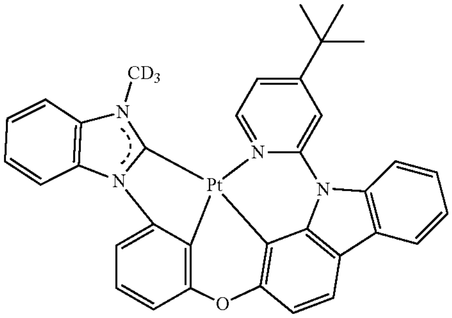
PBD-08
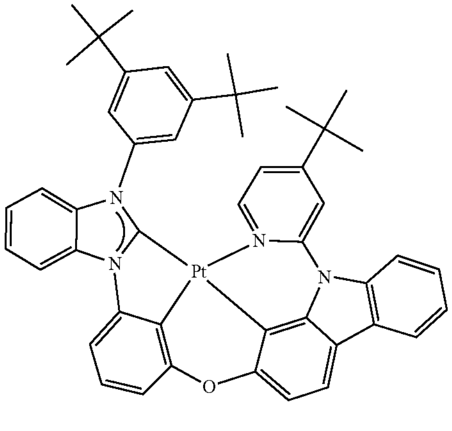

-continued
PBD-09
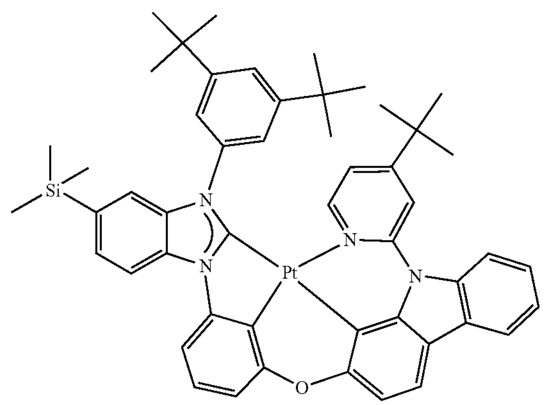
PBD-10
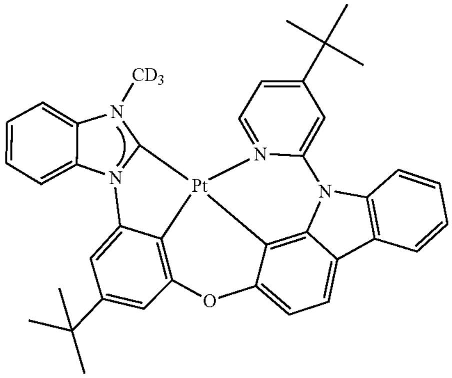
PBD-11
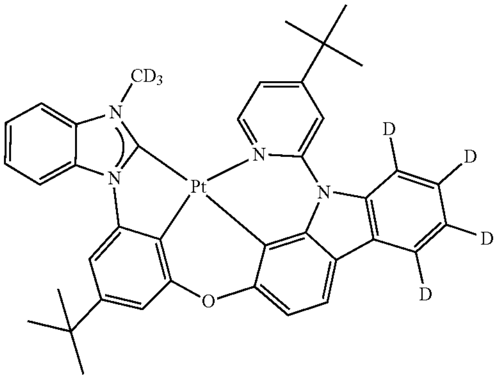
PBD-12
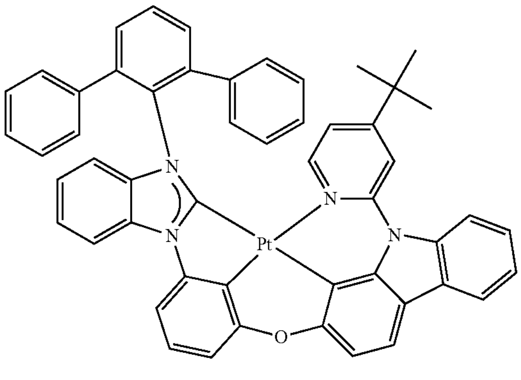
-continued
PBD-13
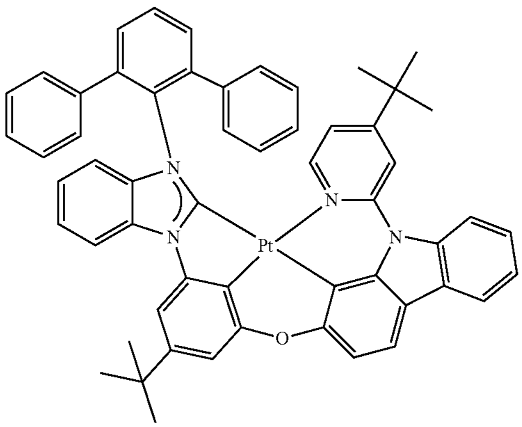
PBD-14
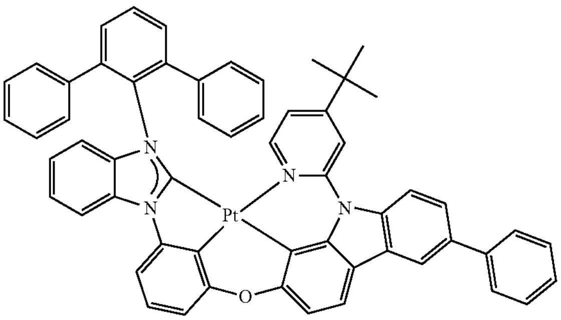
PBD-15
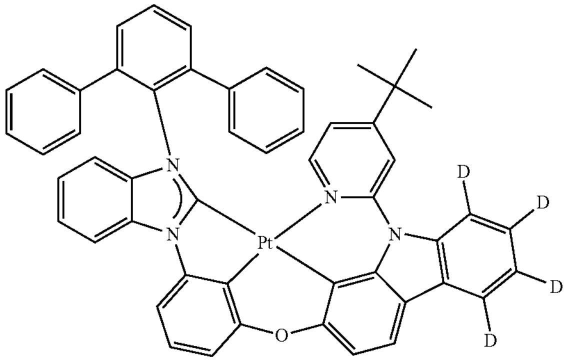
PBD-16
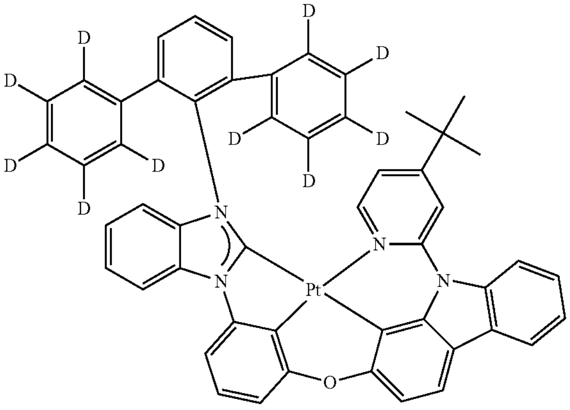

-continued

PBD-17

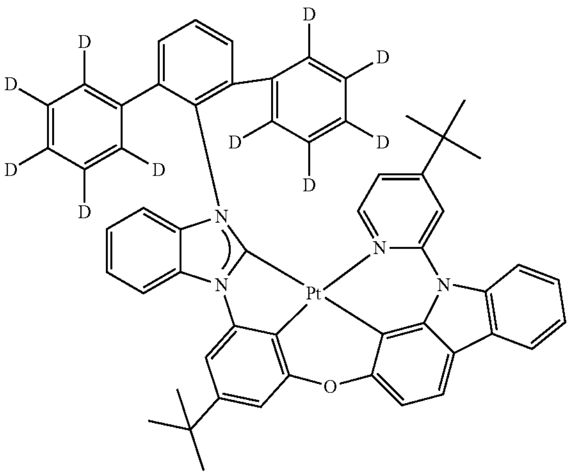

PBD-18

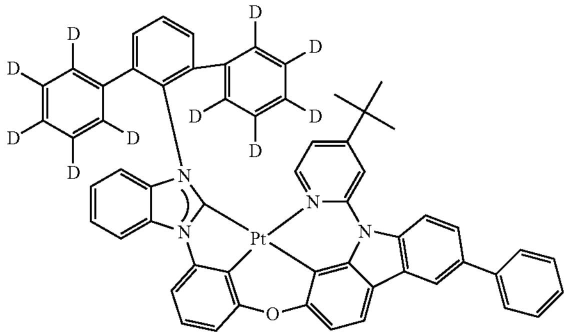

-continued

PBD-19

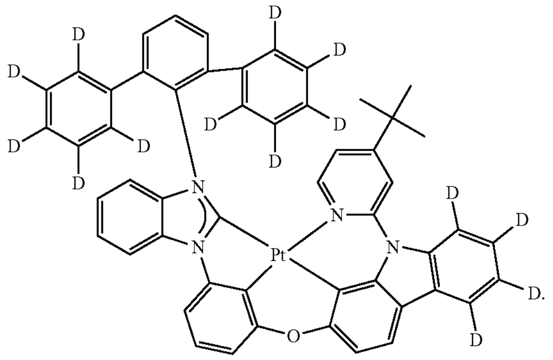

11. The organic electroluminescence device of claim 1, wherein at least one from among the first host compound, the second host compound, and the dopant compound comprises a deuterium atom.

12. The organic electroluminescence device of claim 11, wherein the first host compound comprises a deuterium atom.

13. The organic electroluminescence device of claim 11, wherein the second host compound comprises a deuterium atom.

14. The organic electroluminescence device of claim 11, wherein the dopant compound comprises a deuterium atom.

* * * * *